US012507589B2

(12) United States Patent
Lee et al.

(10) Patent No.: US 12,507,589 B2
(45) Date of Patent: Dec. 23, 2025

(54) ORGANIC LIGHT EMITTING DEVICE

(71) Applicant: LG CHEM, LTD., Seoul (KR)

(72) Inventors: Jungha Lee, Daejeon (KR); Min Woo Jung, Daejeon (KR); Su Jin Han, Daejeon (KR); Seulchan Park, Daejeon (KR); Dong Hoon Lee, Daejeon (KR); Boon Jae Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 966 days.

(21) Appl. No.: 17/042,812

(22) PCT Filed: Sep. 4, 2019

(86) PCT No.: PCT/KR2019/011395

§ 371 (c)(1),
(2) Date: Sep. 28, 2020

(87) PCT Pub. No.: WO2020/050622

PCT Pub. Date: Mar. 12, 2020

(65) Prior Publication Data

US 2021/0020852 A1 Jan. 21, 2021

(30) Foreign Application Priority Data

Sep. 4, 2018 (KR) ........................ 10-2018-0105516
Sep. 3, 2019 (KR) ........................ 10-2019-0109119

(51) Int. Cl.

| | |
|---|---|
| ***H01L 51/00*** | (2006.01) |
| ***H10K 85/60*** | (2023.01) |
| *H10K 50/11* | (2023.01) |

(52) U.S. Cl.

CPC ....... *H10K 85/6572* (2023.02); *H10K 85/654* (2023.02); *H10K 85/656* (2023.02); *H10K 85/6574* (2023.02); *H10K 85/6576* (2023.02); *H10K 50/11* (2023.02)

(58) Field of Classification Search

None

See application file for complete search history.

(56) References Cited

U.S. PATENT DOCUMENTS

2004/0251816 A1 12/2004 Leo et al.
2006/0134461 A1 * 6/2006 Huo ....................... H05B 33/14 313/506

(Continued)

FOREIGN PATENT DOCUMENTS

CN 108323172 7/2018
KR 10-2000-0051826 8/2000

(Continued)

*Primary Examiner* — Jay Yang

(74) *Attorney, Agent, or Firm* — Bryan Cave Leighton Paisner LLP

(57) ABSTRACT

An organic light emitting device having improved driving voltage, efficiency and lifetime, the organic light emitting device having an anode, a cathode, and a light emitting layer disposed between the anode and the cathode, wherein the (Continued)

light emitting layer includes a compound of the following Chemical Formula 1, and a compound of the following Chemical Formula 2:

Chemical Formula 1

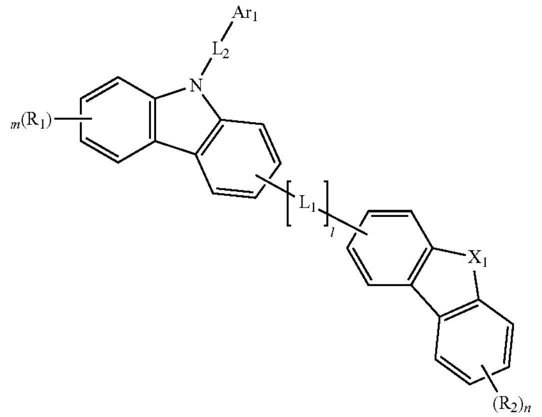

Chemical Formula 2

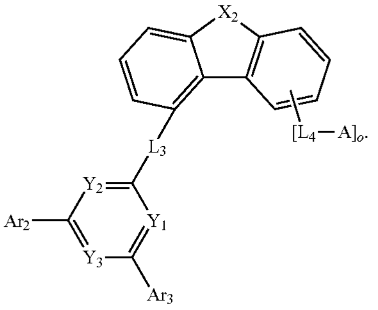

5 Claims, 2 Drawing Sheets

(56) References Cited

U.S. PATENT DOCUMENTS

| | | | | |
|---|---|---|---|---|
| 2012/0223295 | A1* | 9/2012 | Inoue | C09K 11/06 548/440 |
| 2013/0256644 | A1 | 10/2013 | Kim et al. | |
| 2015/0098015 | A1 | 4/2015 | Ueda et al. | |
| 2016/0093808 | A1 | 3/2016 | Adamovich et al. | |
| 2016/0226001 | A1 | 8/2016 | Parham et al. | |
| 2017/0054087 | A1 | 2/2017 | Zeng et al. | |
| 2017/0186965 | A1 | 6/2017 | Parham et al. | |
| 2017/0207399 | A1 | 7/2017 | Parham et al. | |
| 2017/0237017 | A1 | 8/2017 | Parham et al. | |
| 2018/0037546 | A1 | 2/2018 | Sugino et al. | |
| 2019/0006590 | A1 | 1/2019 | Park et al. | |
| 2019/0084967 | A1 | 3/2019 | Parham et al. | |
| 2019/0165282 | A1 | 5/2019 | Parham et al. | |
| 2019/0194219 | A1 | 6/2019 | Kawamura et al. | |
| 2019/0214573 | A1 | 7/2019 | Ryu et al. | |
| 2019/0372012 | A1 | 12/2019 | Cho et al. | |
| 2020/0251660 | A1 | 8/2020 | Parham et al. | |
| 2020/0270235 | A1 | 8/2020 | Parham et al. | |
| 2024/0023355 | A1 | 1/2024 | Cho et al. | |

FOREIGN PATENT DOCUMENTS

| | | |
|---|---|---|
| KR | 10-2014-0132244 | 11/2014 |
| KR | 10-2015-0022615 | 3/2015 |
| KR | 10-2016-0019587 | 2/2016 |
| KR | 10-2016-0107975 | 9/2016 |
| KR | 10-1741415 | 5/2017 |
| KR | 10-1744248 | 6/2017 |
| KR | 10-2017-0089599 | 8/2017 |
| KR | 10-2017-0094774 | 8/2017 |
| KR | 10-2017-0111387 | 10/2017 |
| KR | 10-2018-0028179 | 3/2018 |
| KR | 10-2018-0029429 | 3/2018 |
| KR | 10-2018-0038834 | 4/2018 |
| KR | 10-1856728 | 5/2018 |
| KR | 10-2018-0073239 | 7/2018 |
| KR | 20180098122 | 9/2018 |
| WO | 2003-012890 | 2/2003 |
| WO | 2010-126270 | 11/2010 |
| WO | 2011-126224 | 10/2011 |
| WO | 2012-074195 | 6/2012 |
| WO | 2014-061991 | 4/2014 |
| WO | 2015-036080 | 3/2015 |
| WO | 2015-053524 | 4/2015 |
| WO | 2015-169412 | 11/2015 |
| WO | 2016-015810 | 2/2016 |
| WO | 2016-023608 | 2/2016 |
| WO | 2016-089080 | 6/2016 |
| WO | 2016-129672 | 8/2016 |
| WO | 2017-076485 | 5/2017 |
| WO | 2017-178311 | 10/2017 |
| WO | 2018-041769 | 3/2018 |
| WO | 2018-043435 | 3/2018 |
| WO | 2018-048074 | 3/2018 |

* cited by examiner

ORGANIC LIGHT EMITTING DEVICE

CROSS-REFERENCE TO RELATED APPLICATION(S)

This application is a National Stage Application of International Application No. PCT/KR2019/011395, filed on Sep. 4, 2019, which claims the benefit of the filing dates of Korean Patent Application No. 10-2018-0105516 filed with Korean Intellectual Property Office on Sep. 4, 2018 and Korean Patent Application No. 10-2019-0109119 filed with Korean Intellectual Property Office on Sep. 3, 2019, the entire contents of which are incorporated herein by reference.

TECHNICAL FIELD

The present invention relates to an organic light emitting device having improved driving voltage, efficiency and lifetime.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

In the organic light emitting device as described above, there is a continuing demand for developing an organic light emitting device having improved driving voltage, efficiency and lifetime.

PRIOR ART LITERATURE (Patent Literature 1) Korean Patent Laid-open Publication No. 10-2000-0051826

Technical Problem

It is an object of the present invention to provide an organic light emitting device having improved driving voltage, efficiency and lifetime.

Technical Solution

In one aspect of the invention, there is provided an organic light emitting device including:

an anode;

a cathode; and a light emitting layer disposed between the anode and the cathode;

wherein the light emitting layer includes a compound of the following Chemical Formula 1, and a compound of the following Chemical Formula 2:

Chemical Formula 1

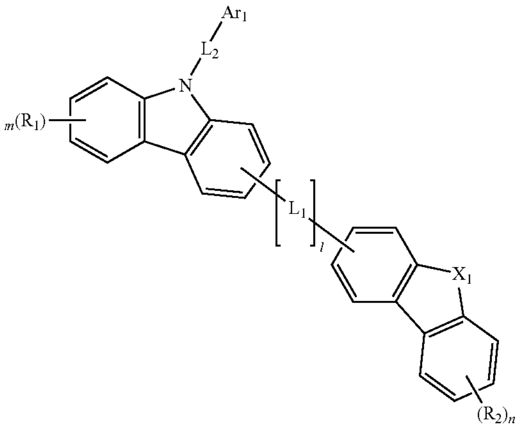

in Chemical Formula 1, $L_1$ and $L_2$ are each independently a single bond; a substituted or unsubstituted $C_{6-60}$ arylene; or a substituted or unsubstituted $C_{2-60}$ heteroarylene containing one or more heteroatoms selected from the group consisting of N, O and S, $X_1$ is O, S, $NR_3$, or $CR_4R_5$, $R_1$ to $R_5$ are each independently hydrogen; deuterium, halogen; cyano; nitro; amino; a substituted or unsubstituted $C_{1-60}$ alkyl; a substituted or unsubstituted $C_{3-60}$ cycloalkyl; a substituted or unsubstituted $C_{2-60}$ alkenyl; a substituted or unsubstituted $C_{6-60}$ aryl; or a substituted or unsubstituted $C_{2-60}$ heteroaryl containing one or more heteroatoms selected from the group consisting of N, O and S, wherein $R_4$ and $R_5$ are optionally linked together to form a ring, $Ar_1$ is a substituted or unsubstituted $C_{6-60}$ aryl; or a substituted or unsubstituted $C_{2-60}$ heteroaryl containing one or more heteroatoms selected from the group consisting of N, O and S, and l, m and n are each independently an integer of 0 to 4, Chemical Formula 2

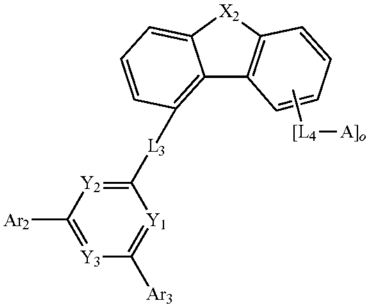

in Chemical Formula 2, $L_3$ and $L_4$ are each independently a single bond; a substituted or unsubstituted $C_{6-60}$ arylene; or a substituted or unsubstituted $C_{2-60}$ heteroarylene containing one or more heteroatoms selected from the group consisting of N, O and S, $X_2$ is O, or S, A is

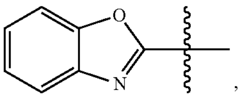
,
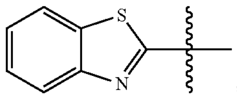
, or
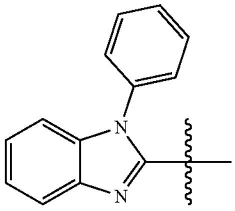
, $Y_1$, $Y_2$ and $Y_3$ are each independently N or CH, with the proviso that at least two of $Y_1$, $Y_2$ and $Y_3$ are N, $Ar_2$ and $Ar_3$ are each independently a substituted or unsubstituted $C_{6-60}$ aryl; or a substituted or unsubstituted $C_{2-60}$ heteroaryl containing one or more heteroatoms selected from the group consisting of N, O and S, and is an integer of 0 to 4.

Advantageous Effects

The organic light emitting device described above is excellent in driving voltage, efficiency and lifetime.

DETAILED DESCRIPTION

Figure 1:
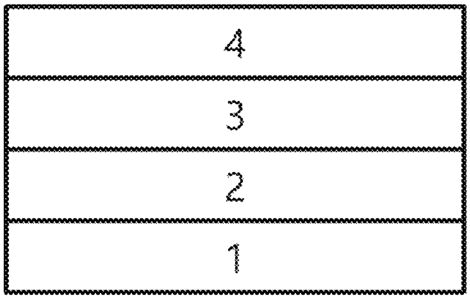
FIG. 1 shows an example of an organic light emitting device comprising a substrate 1, an anode 2, a light emitting layer 3, and a cathode 4.

Hereinafter, embodiments of the present invention will be described in more detail to facilitate understanding of the present invention.

As used herein, the notation  means a bond linked to another substituent group.

As used herein, the term "substituted or unsubstituted" means being unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heterocyclic group containing at least one of N, O and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may be interpreted as a substituent to which two phenyl groups are linked.

In the present specification, the number of carbon atoms of a carbonyl group is not particularly limited, but is preferably 1 to 40. Specifically, the carbonyl group may be a compound having the following structural formulas, but is not limited thereto.

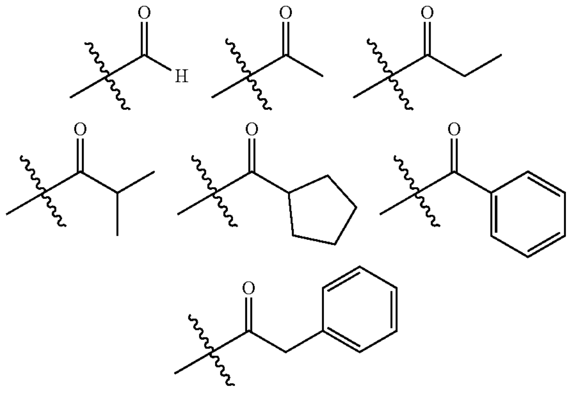

In the present specification, for an ester group, the oxygen of the ester group may be substituted with a straight-chain, branched-chain, or cyclic alkyl group having 1 to 25 carbon atoms, or an aryl group having 6 to 25 carbon atoms. Specifically, the ester group may be a compound having the following structural formulas, but is not limited thereto.

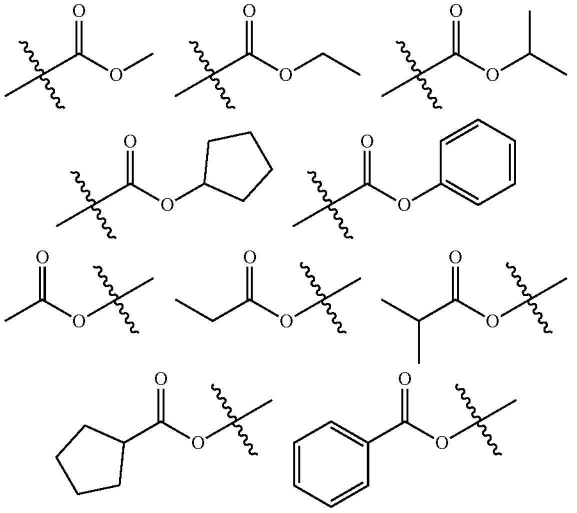

In the present specification, the number of carbon atoms of an imide group is not particularly limited, but is preferably 1 to 25. Specifically, the imide group may be a compound having the following structural formulas, but is not limited thereto.

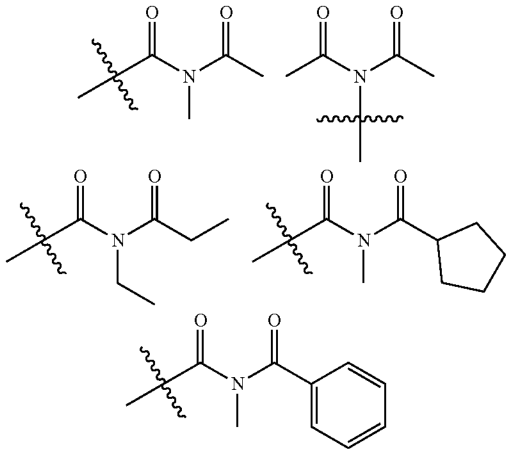

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group may be a straight chain or branched chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkenyl group may be a straight chain or branched chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and may be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group and a fluorenyl group or the like, but is not limited thereto.

In the present specification, a fluorenyl group may be substituted, and two substituent groups may be bonded to each other to form a spiro structure. In the case where the fluorenyl group is substituted,

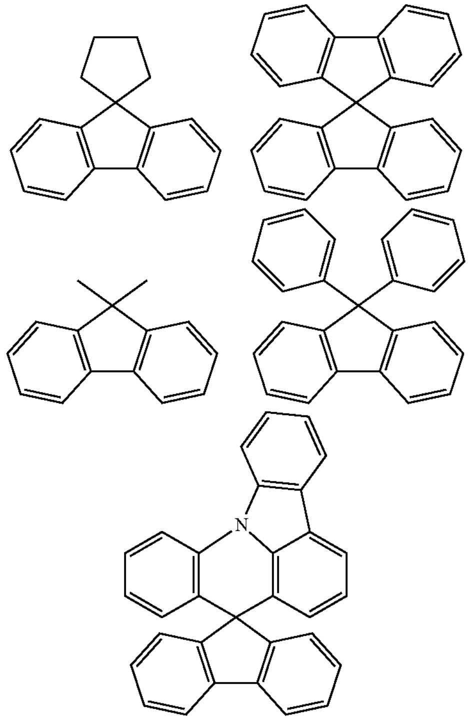

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, a triazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

Hereinafter, the present invention will be described in detail for each configuration.

Anode and Cathode

The anode and cathode used in the present invention mean electrodes used in an organic light emitting device.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

Hole Injection Layer

The organic light emitting device according to the present invention may further include a hole injection layer between the anode and a hole transport layer described below.

The hole injection layer is a layer injecting holes from an electrode, and the hole injection material is preferably a compound which has an ability of transporting the holes, a hole injection effect in the anode and an excellent hole injection effect to the light emitting layer or the light emitting material, prevents movement of an exciton generated in the light emitting layer to the electron injection layer or the electron injection material, and has an excellent thin film forming ability. It is preferable that a HOMO (highest occupied molecular orbital) of the hole injection material is between the work function of the anode material and a HOMO of a peripheral organic material layer.

Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Hole Transport Layer

The hole transport layer used in the present invention is a layer that receives holes from an anode or a hole injection layer formed on the anode and transports the holes to the light emitting layer. The hole transport material is suitably a material having large mobility to the holes, which may receive holes from the anode or the hole injection layer and transfer the holes to the light emitting layer.

Specific examples of the hole transport material include an arylamine-based organic material, a conductive polymer, a block copolymer in which a conjugate portion and a non-conjugate portion are present together, and the like, but are not limited thereto.

Electron Blocking Layer

The organic light emitting device according to the present invention may include an electron blocking layer between the anode and a light emitting layer described below.

The electron blocking layer is a layer provided between the hole transport layer and the light emitting layer in order to prevent the electrons injected in the cathode from being transferred to the hole transport layer without being recombined in the light emitting layer, which may also be referred to as an electron inhibition layer. The electron blocking layer is preferably a material having a smaller electron affinity than the electron transport layer.

Light Emitting Layer

The light emitting layer used in the present invention is a layer that can emit light in the visible light region by combining holes and electrons transported from the anode and the cathode, and is preferably a material having good quantum efficiency for fluorescence or phosphorescence.

Generally, the light emitting layer includes a host material and a dopant material, and in the present invention, the compound of Chemical Formula 1 and Chemical Formula 2 is included as a host.

Preferably, $L_1$ and $L_2$ may be a single bond.

Preferably, $R_1$ and $R_2$ may be each independently hydrogen, phenyl, pyridinyl, or phenyl substituted with cyano.

More preferably, $R_1$ may be hydrogen and $R_2$ may be hydrogen, phenyl, pyridinyl, or phenyl substituted with cyano.

Preferably, $Ar_1$ may be a substituted or unsubstituted $C_{6-20}$ aryl; or a substituted or unsubstituted $C_{6-20}$ heteroaryl containing any one or more heteroatoms selected from the group consisting of N, O and S.

More preferably, $Ar_1$ may be phenyl, biphenylyl, terphenylyl, naphthyl, phenanthrenyl, triphenylenyl, fluorenyl, dibenzofuranyl, dibenzothiophenyl, or phenyl substituted with cyano.

Preferably, $X_1$ may be 0, S, $C(CH_3)_2$, or any one selected from the group consisting of the following:

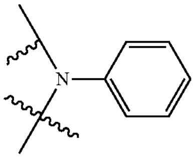
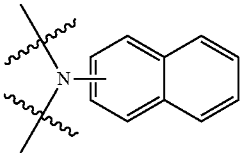
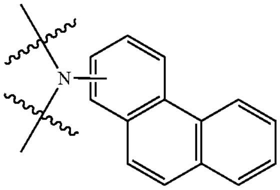
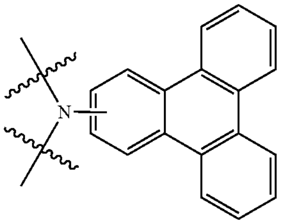
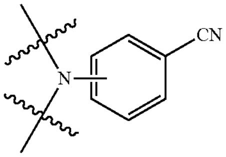
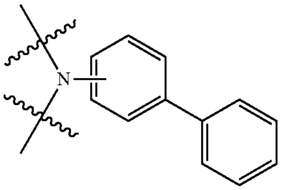
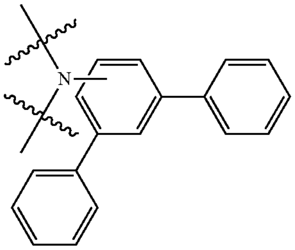
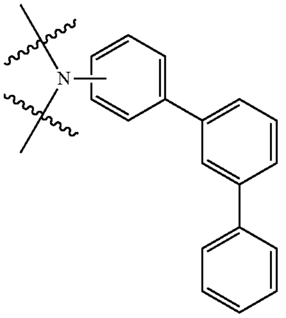
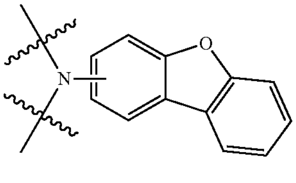

-continued

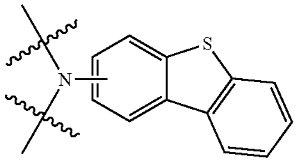

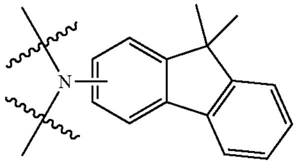

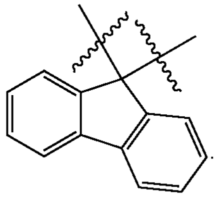

In this case, l represents the number of $L_1$. When 1 is 2 or more, two or more $L_1$ may be the same as or different from each other. Description of m and n can be understood with reference to the description of l above and the structure of the chemical formula.

Preferably, l, m and n may be each independently 0 or 1.

More preferably, 1 and m may be 0 and n may be 0 or 1.

Preferably, the Chemical Formula 1 may be of the following Chemical Formula 1-1 or Chemical Formula 1-2:

Chemical Formula 1-1

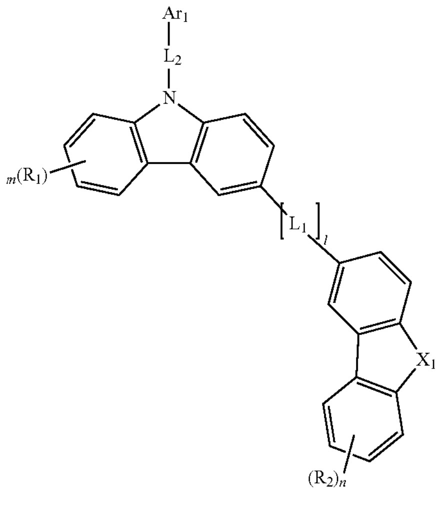

-continued
Chemical Formula 1-2
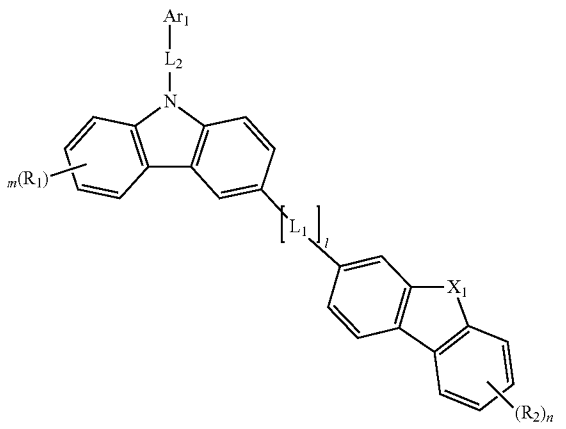
in Chemical Formula 1-1 and Chemical Formula 1-2,
$L_1$, $L_2$, $R_1$, $R_2$, $Ar_1$, $X_1$, l, m and n are as defined in Chemical Formula 1.
Representative examples of the compound of Chemical Formula 1 are as follows:
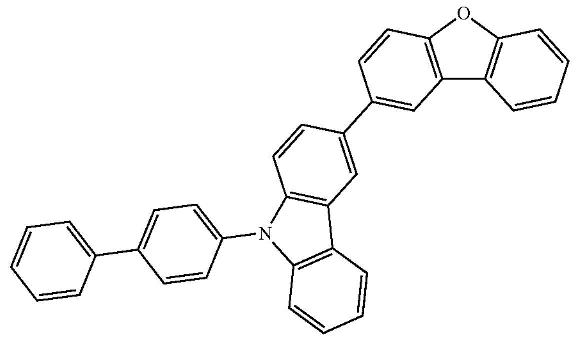
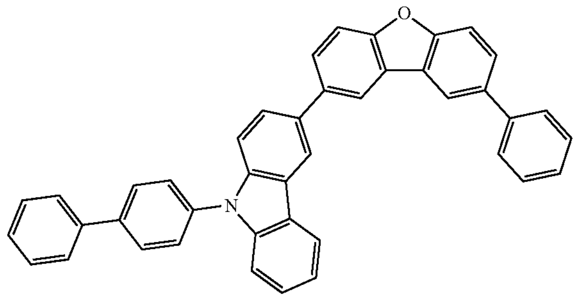
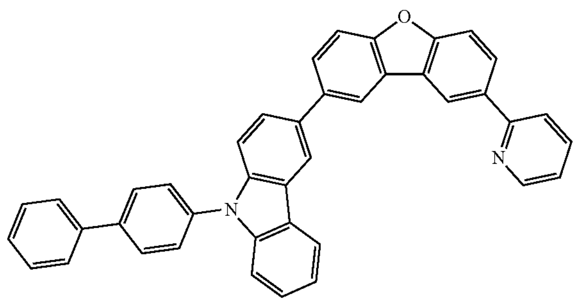
-continued
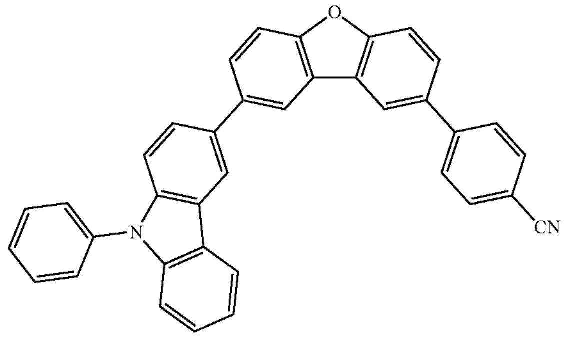
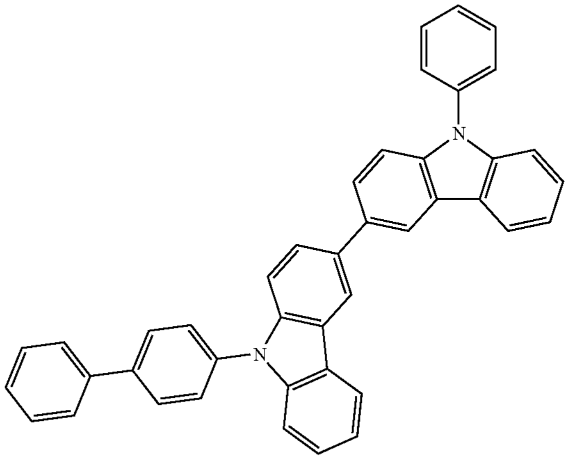
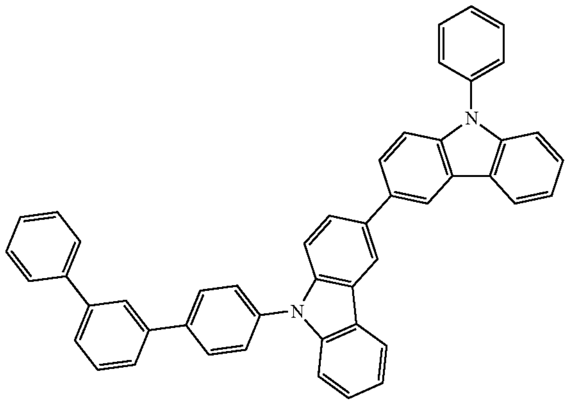
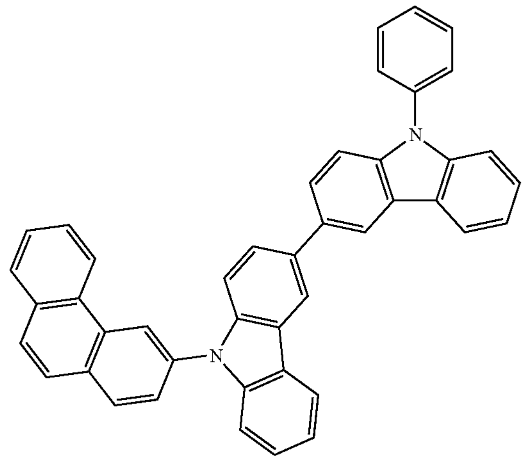

-continued
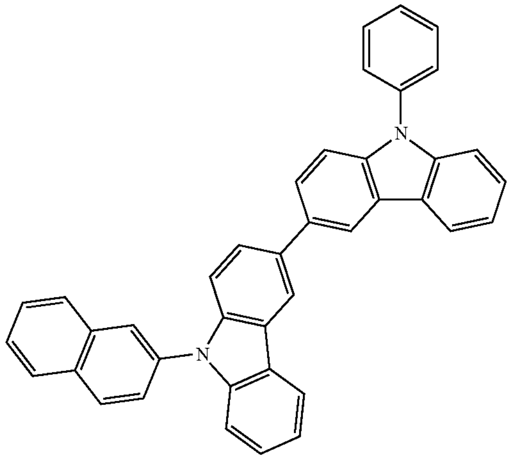
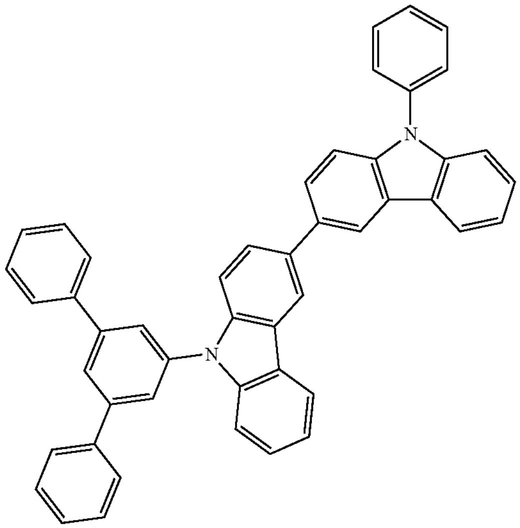
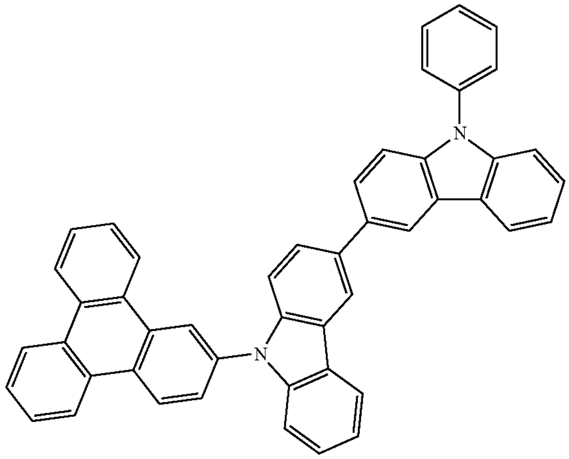
-continued
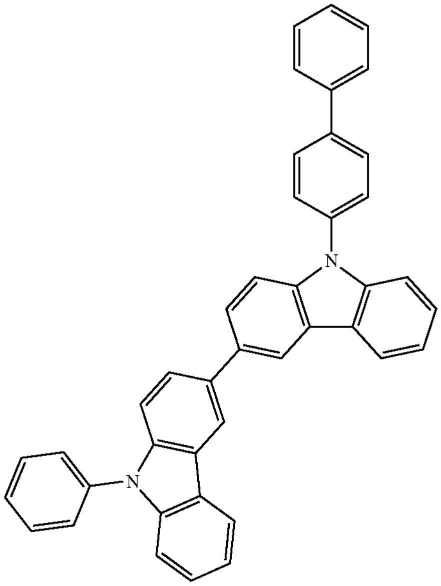
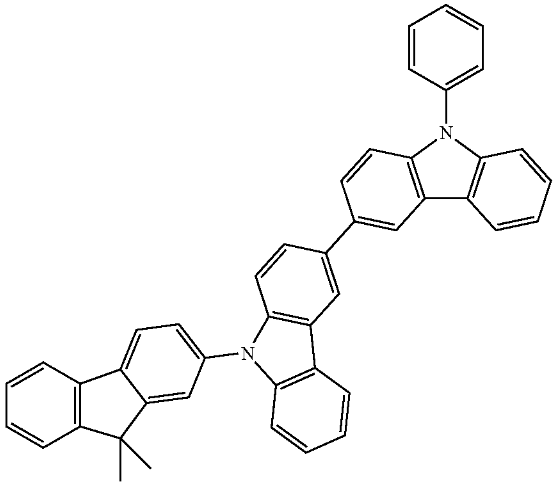
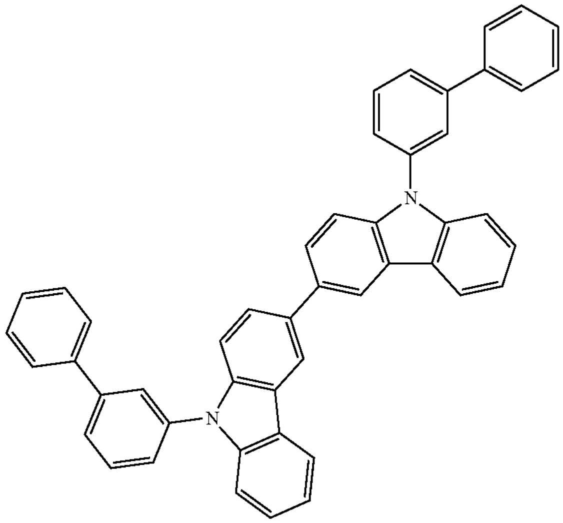

-continued
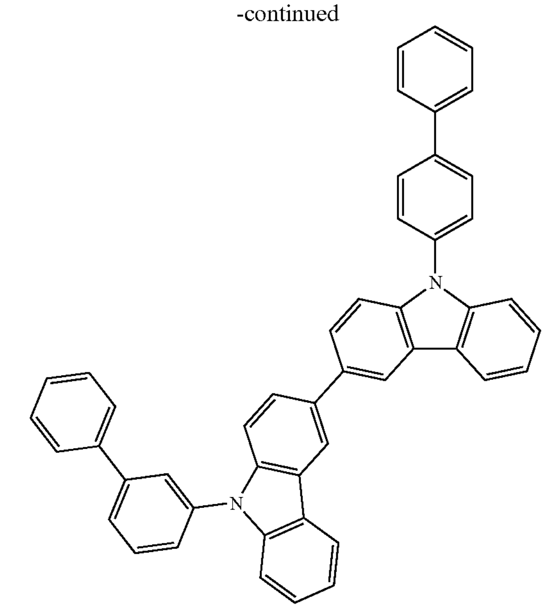
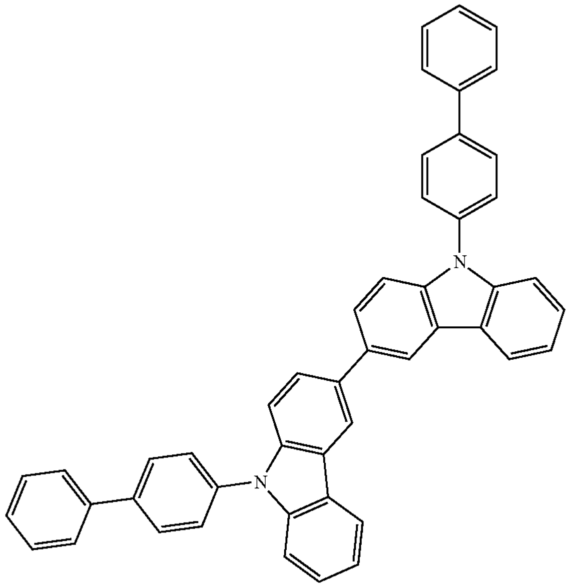
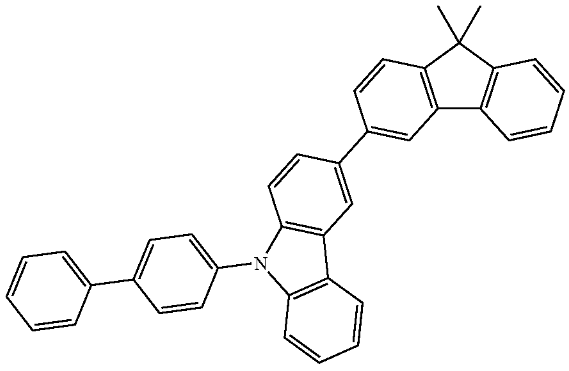
-continued
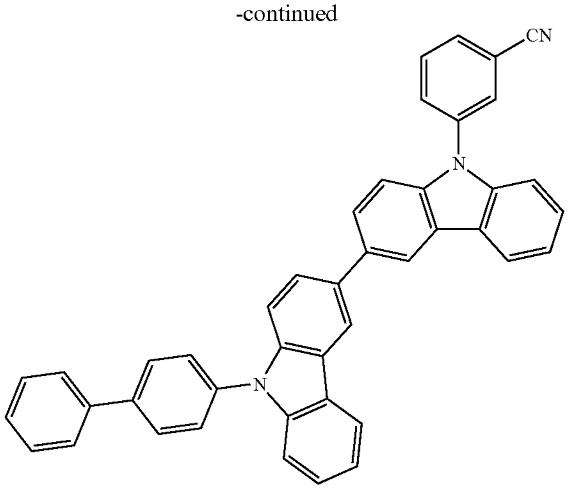
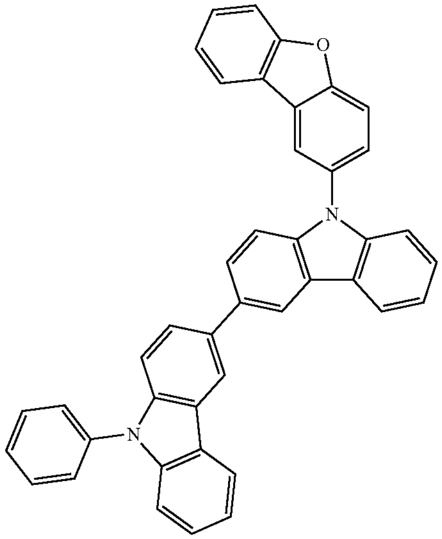
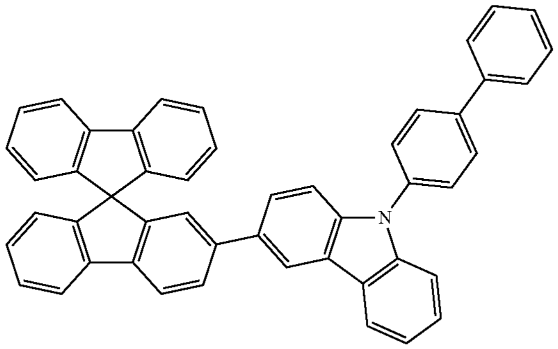
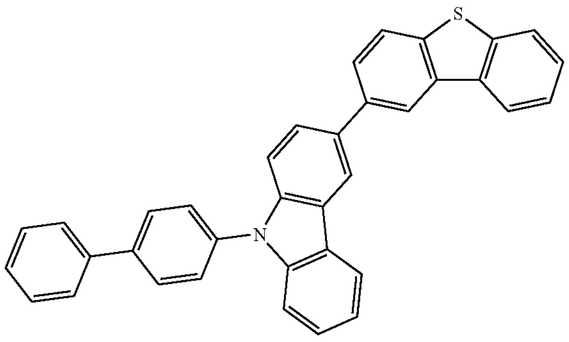

-continued
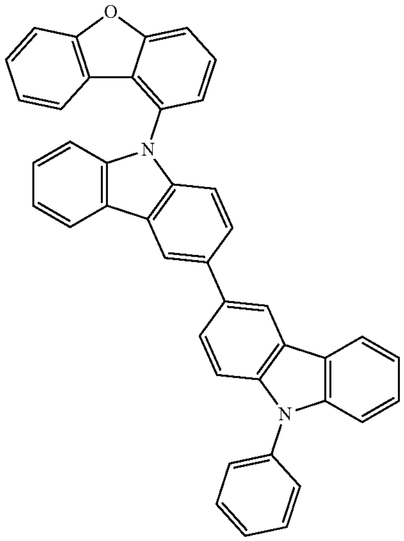
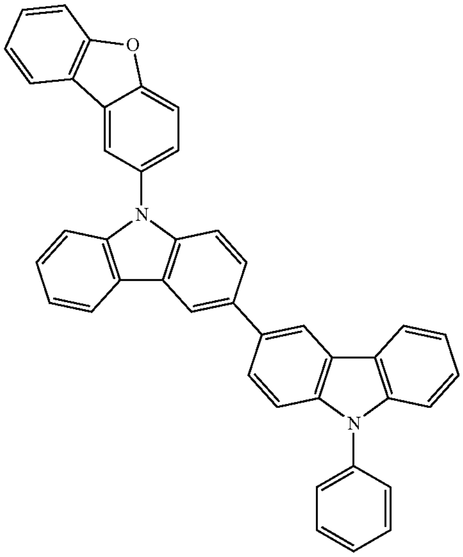
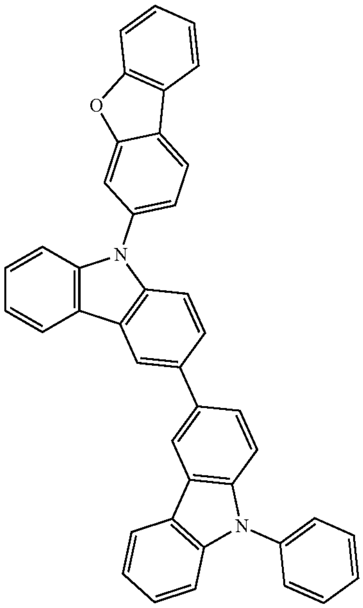
-continued
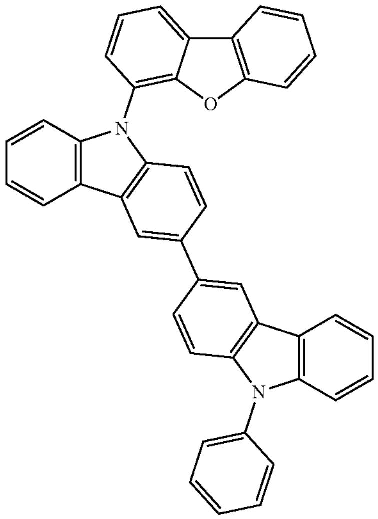
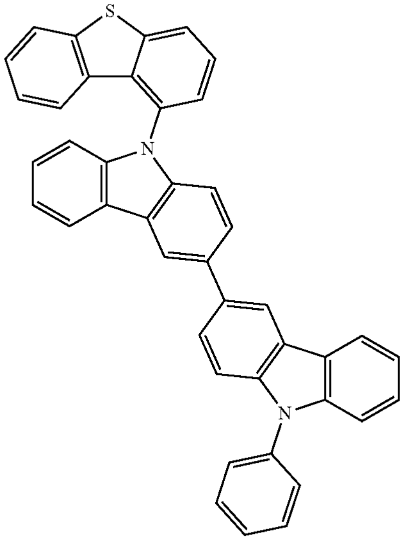
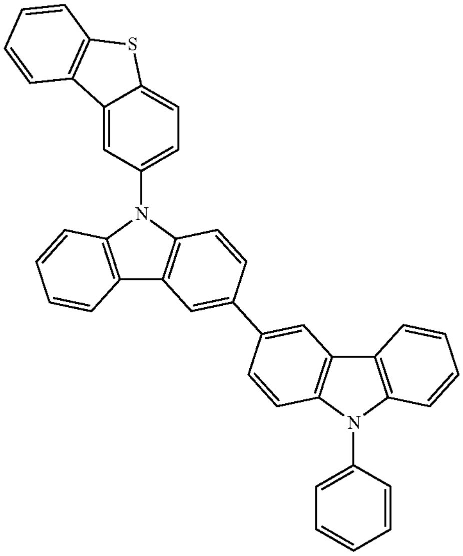

-continued
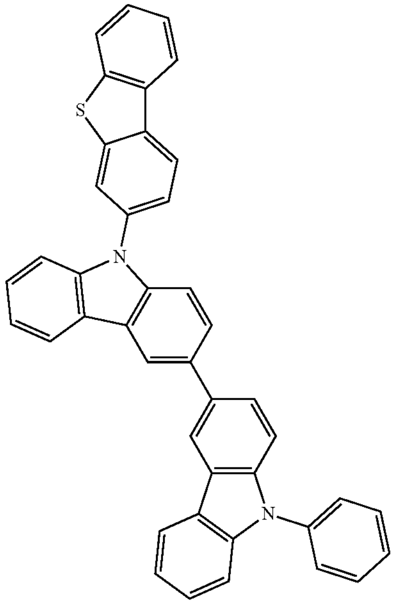
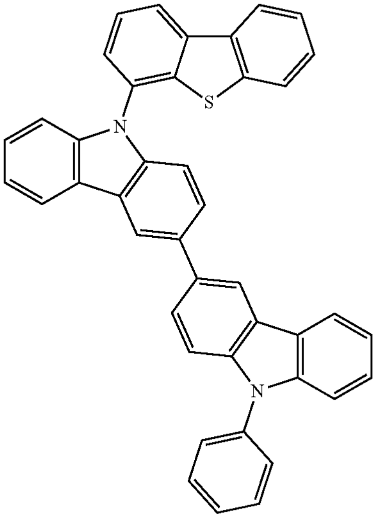
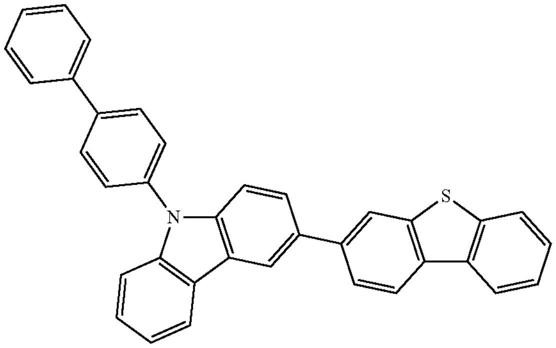
-continued
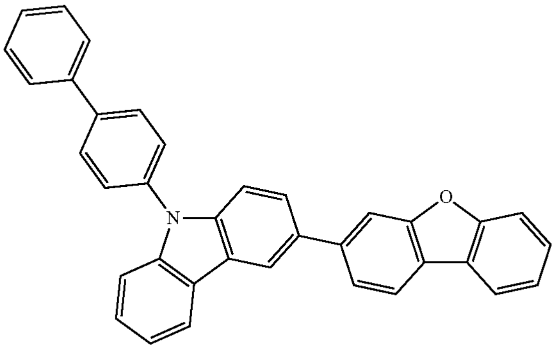
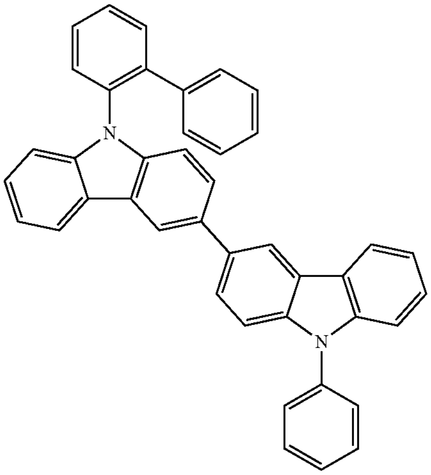
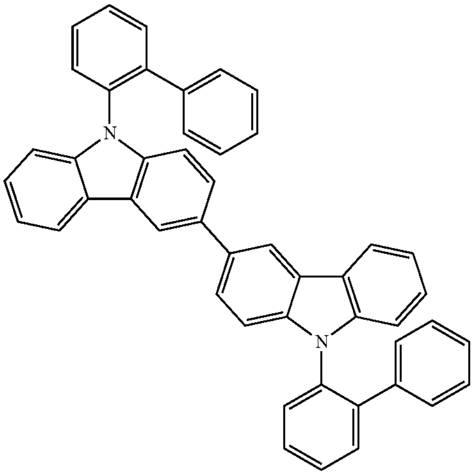

-continued

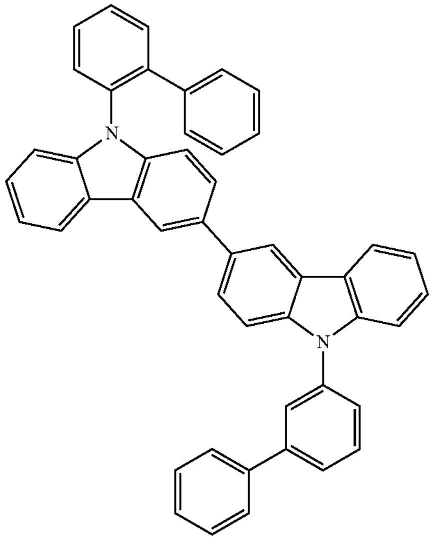

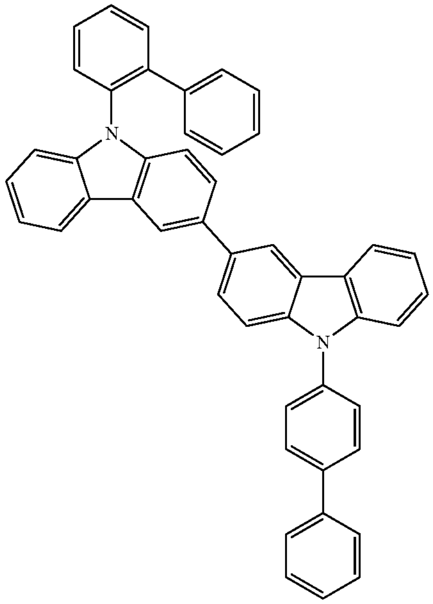

The compound of Chemical Formula 1 may be prepared, for example, according to the preparation method as shown in the following Reaction Scheme 1-1 or 1-2, and the other remaining compounds can be prepared in a similar manner.

Reaction Scheme 1-1

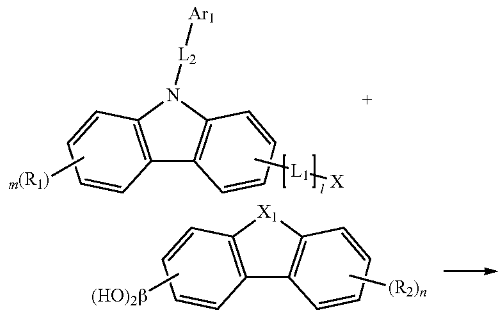

-continued

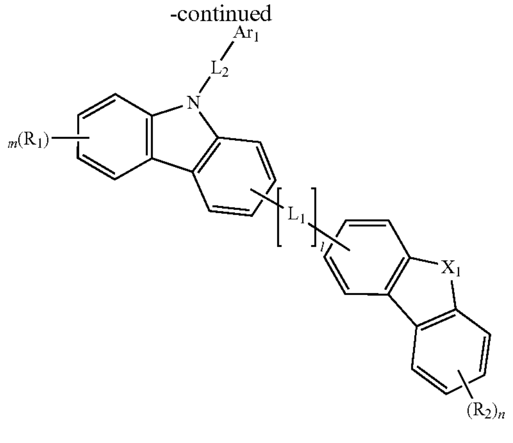

Reaction Scheme 1-2

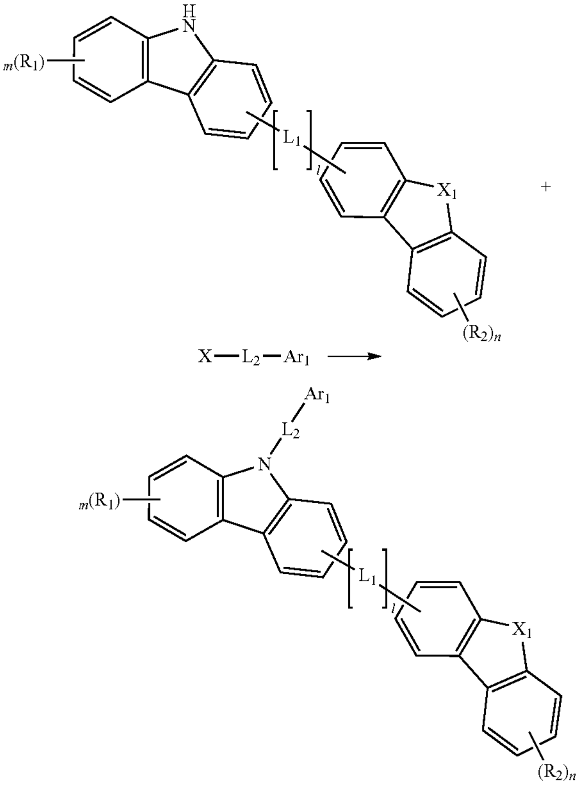

in Reaction Schemes 1-1 and 1-2 above, $L_1$, $L_2$, $R_1$, $R_2$, $Ar_1$, $X_1$, l, m and n are as defined in Chemical Formula 1, and X is halogen, preferably X is chloro or bromo.

The Reaction Scheme 1-1 is a Suzuki coupling reaction, which is preferably carried out in the presence of a palladium catalyst and a base, and a reactive group for the Suzuki coupling reaction can be modified as known in the art. In addition, the Reaction Scheme 1-2 is an amine substitution reaction, which is preferably carried out in the presence of a palladium catalyst and a base, and a reactive group for the amine substitution reaction can be modified as known in the art. The above preparation method may be further specified in the Preparation Examples described hereinafter.

Preferably, $L_3$ and $L_4$ may be each independently a single bond; a substituted or unsubstituted $C_{6-20}$ arylene; or a substituted or unsubstituted $C_{6-20}$ heteroarylene containing any one or more heteroatoms selected from the group consisting of N; O and S.

More preferably, $L_3$ and $L_4$ may be each independently a single bond, phenylene, biphenylylene, or terphenylylene.

Most preferably, $L_3$ may be a single bond or phenylene and $L_4$ may be a single bond.

Preferably, at least one of $Ar_2$ and $Ar_3$ may be a substituted or unsubstituted $C_{6-60}$ aryl.

More preferably, at least one of $Ar_2$ and $Ar_3$ may be a substituted or unsubstituted $C_{6-20}$ aryl.

Preferably, $Ar_2$ and $Ar_3$ may be each independently phenyl, biphenylyl, terphenylyl triphenylenyl, diphenylfluorenyl, carbazolyl, phenylcarbazolyl, dibenzofuranyl, dibenzothiophenyl, phenyl substituted with carbazole, phenyl substituted with dibenzofuranyl, phenyl substituted with dibenzothiophenyl, or phenyl substituted with benzothiazolyl.

More preferably, $Ar_2$ and $Ar_3$ may be each independently phenyl, biphenylyl, terphenylyl, triphenylenyl, 9,9-diphenyl-9H-fluorenyl, 9-phenyl-9H-carbazolyl, carbazolyl, dibenzofuranyl, dibenzothiophenyl, phenyl substituted with carbazole, phenyl substituted with dibenzofuranyl, phenyl substituted with dibenzothiophenyl, or phenyl substituted with benzothiazolyl.

In this case, o represents the number of *-$L_4$-A. When o is 2 or more, two or more *-$L_4$-A may be the same as or different from each other.

Preferably, o may be 1 or 2, more preferably o may be 1.

Preferably, the Chemical Formula 2 may be the following Chemical Formula 2-1 to Chemical Formula 2-4:

Chemical Formula 2-1

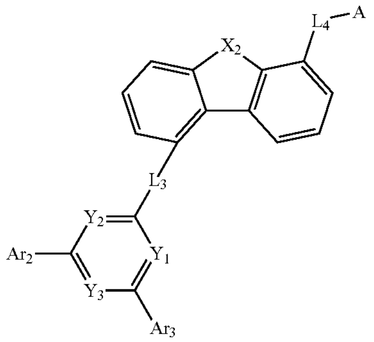

Chemical Formula 2-2

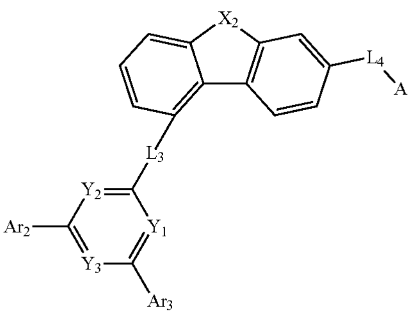

-continued

Chemical Formula 2-3

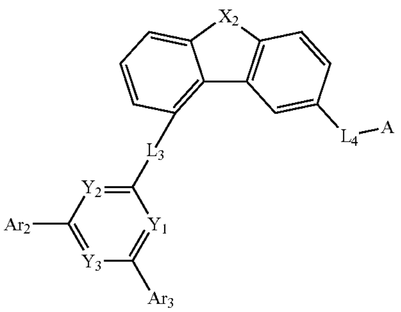

Chemical Formula 2-4

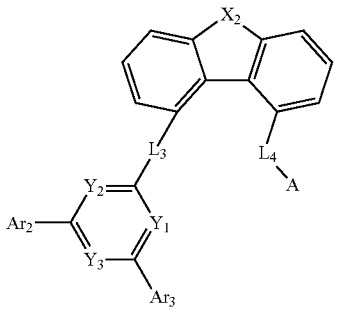

in Chemical Formula 2-1 to Chemical Formula 2-4.

$L_3$, $L_4$, $X_2$, A, $Y_1$, $Y_2$, $Y_3$, $Ar_2$ and $Ar_3$ are as defined in Chemical Formula 2.

Representative examples of the compound of Chemical Formula 2 are as follows:

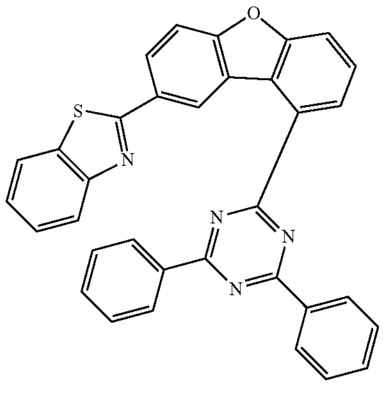

-continued
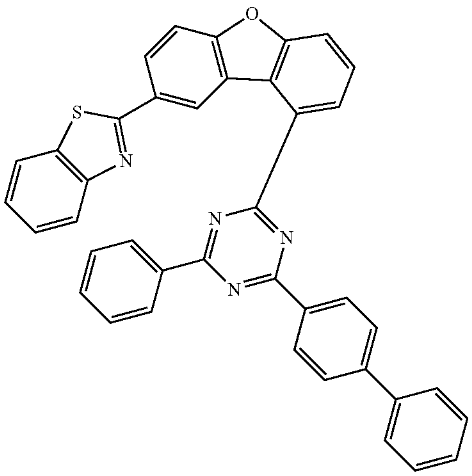
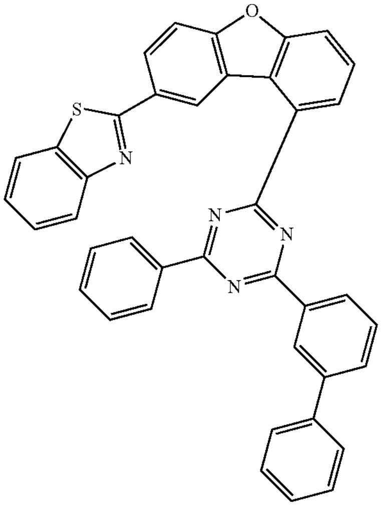
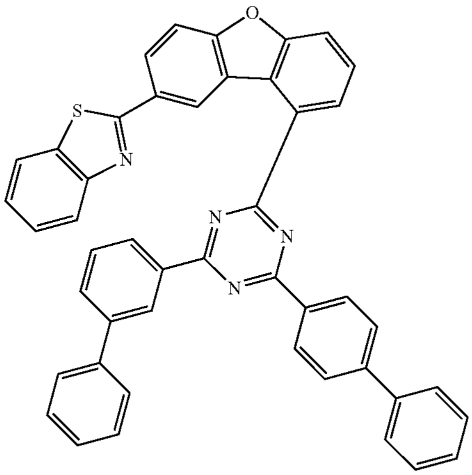
-continued
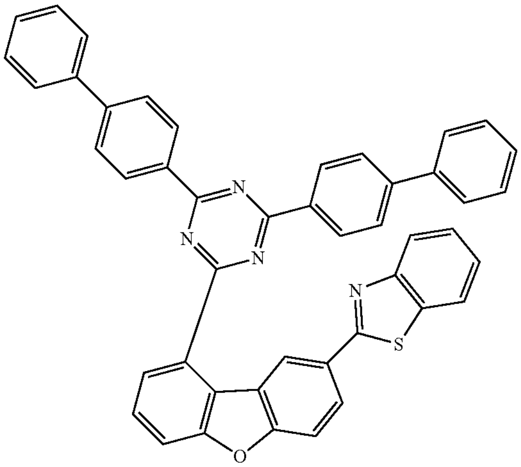
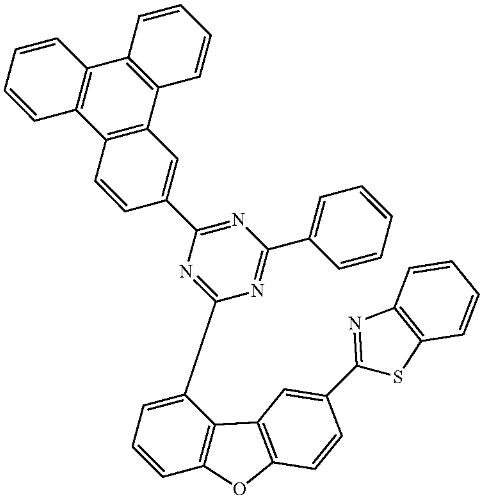
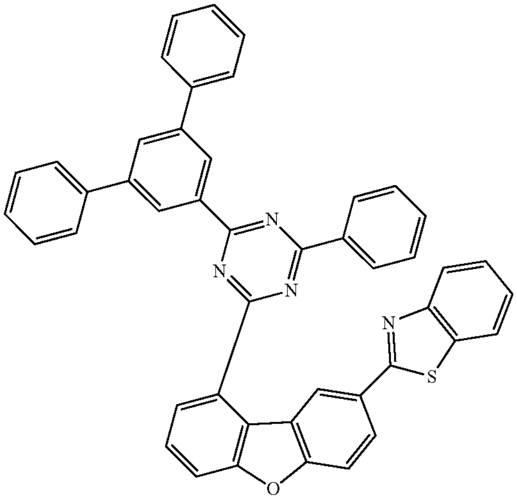

-continued
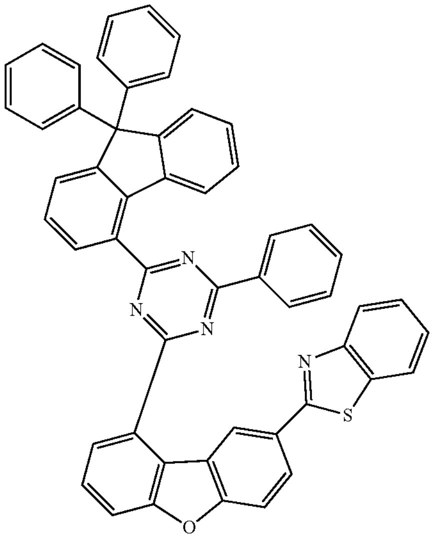
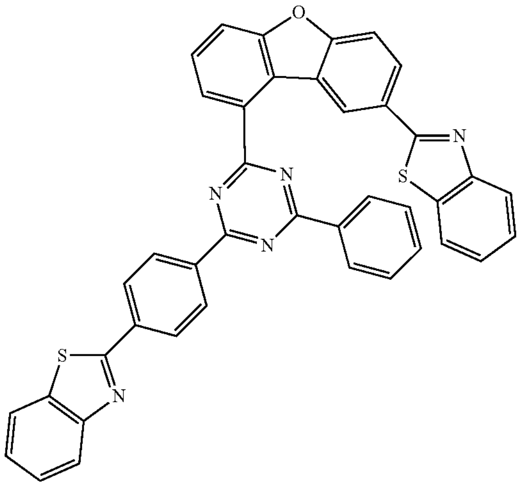
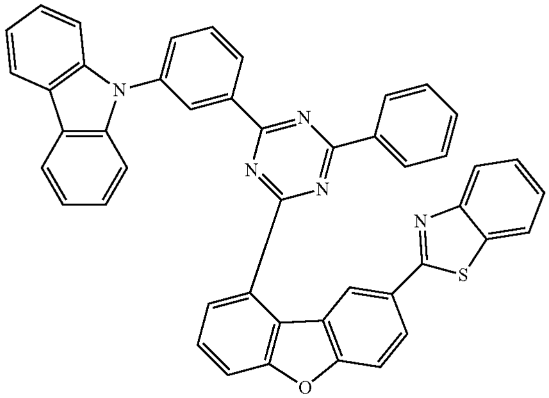
-continued
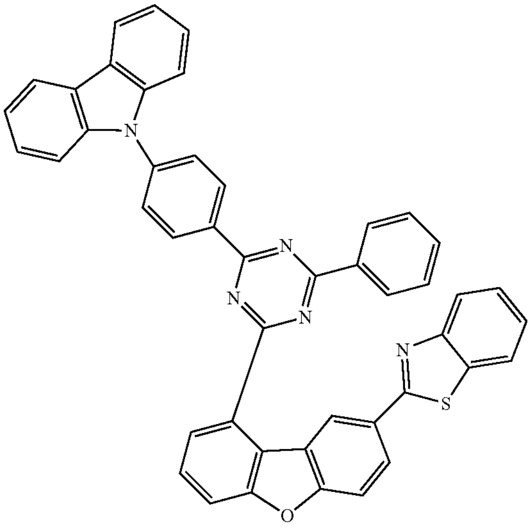
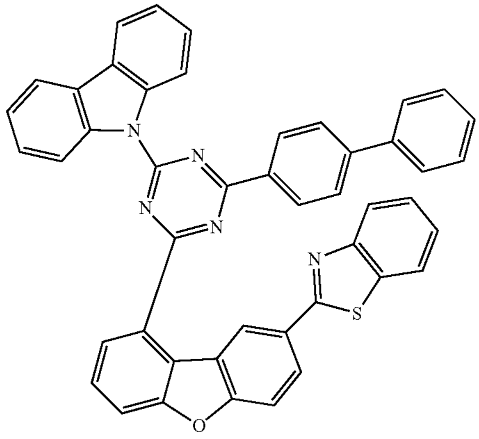
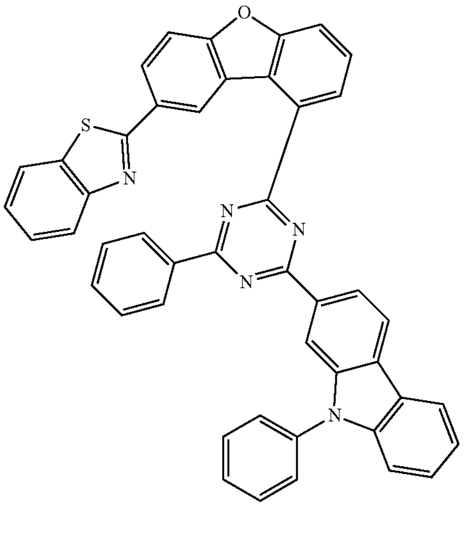

-continued
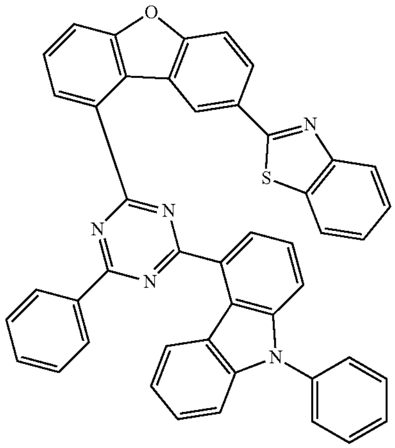
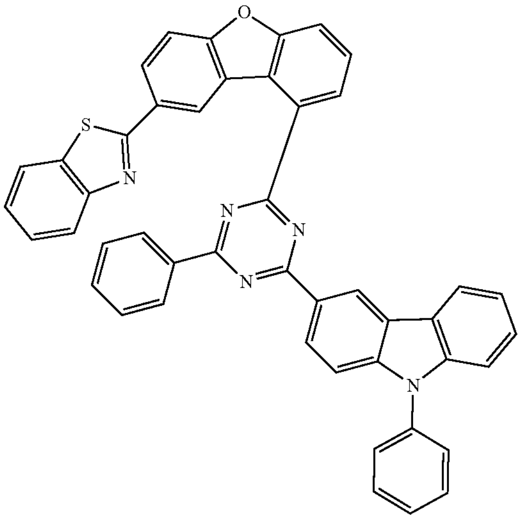
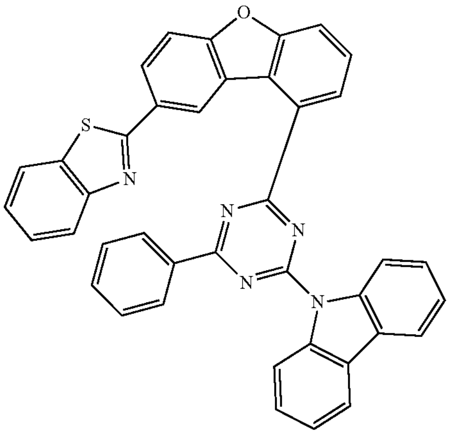
-continued
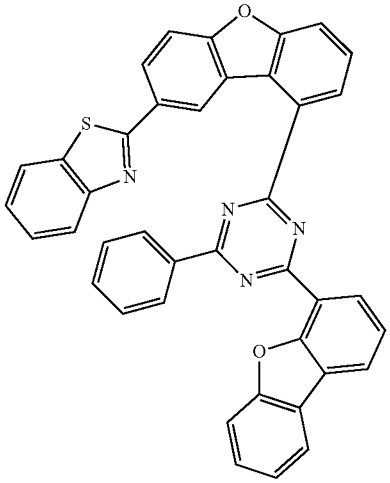
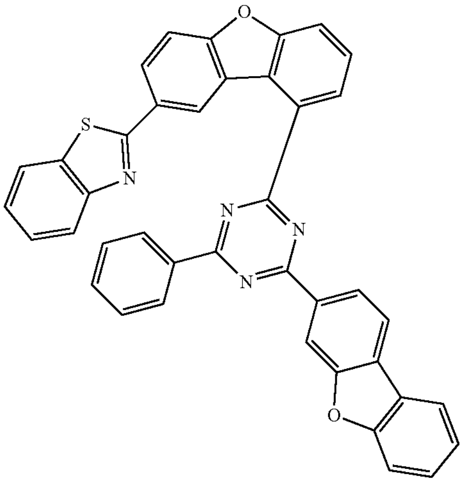
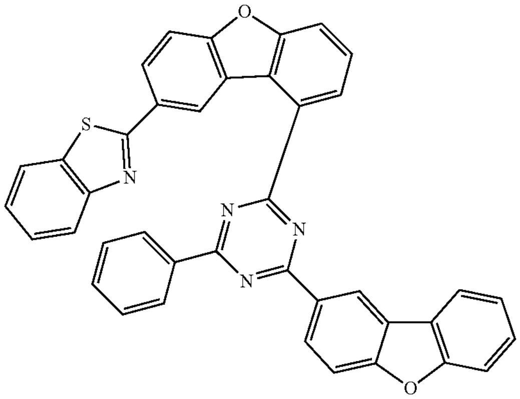

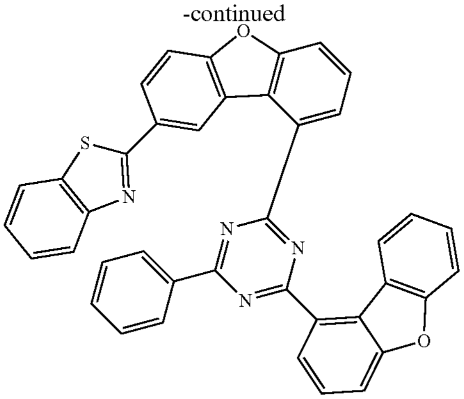
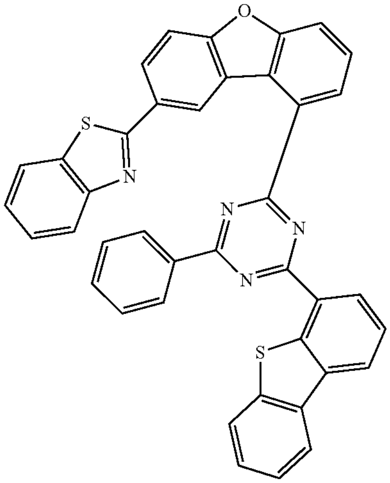
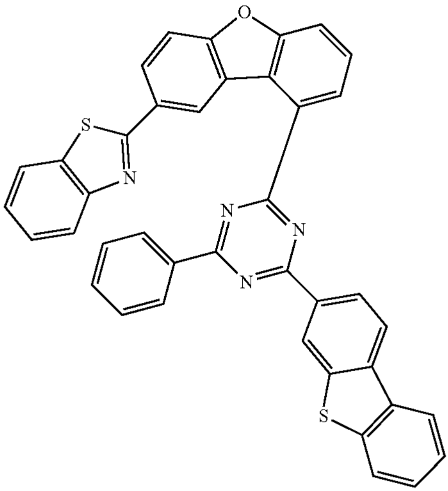
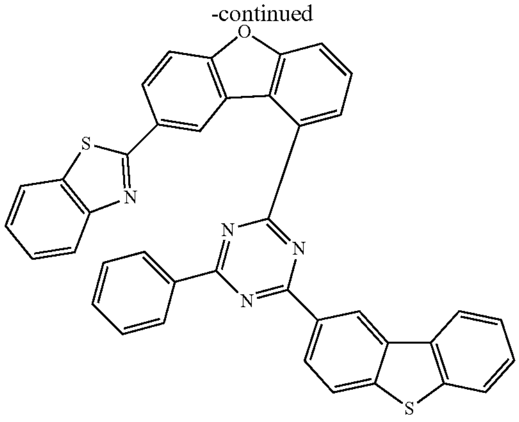
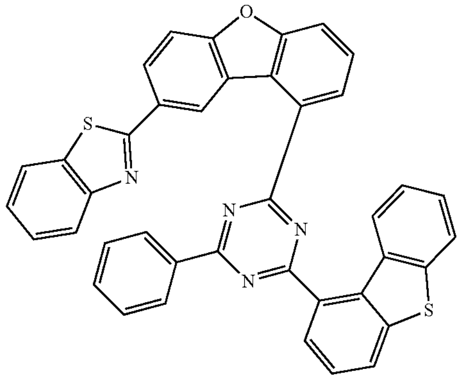
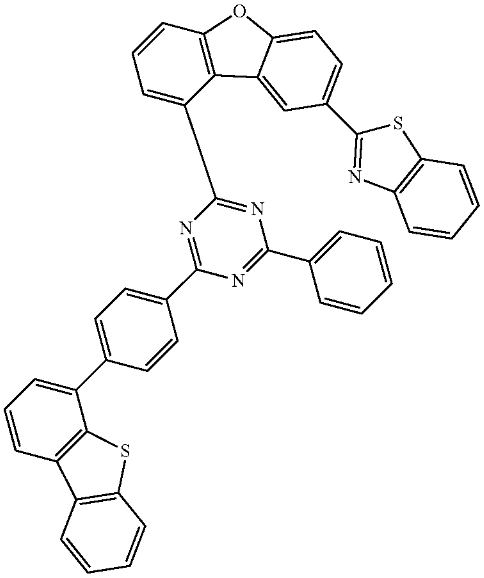

-continued
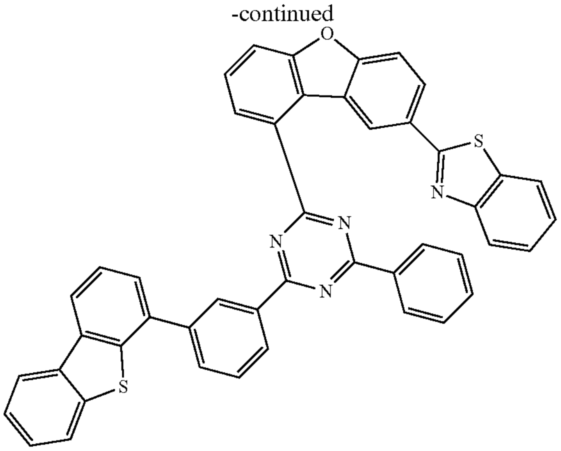
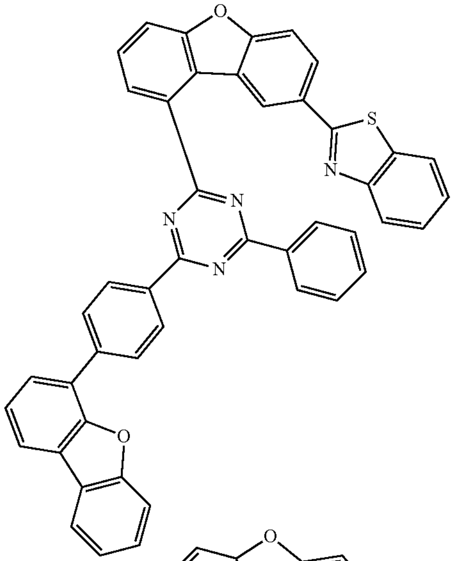
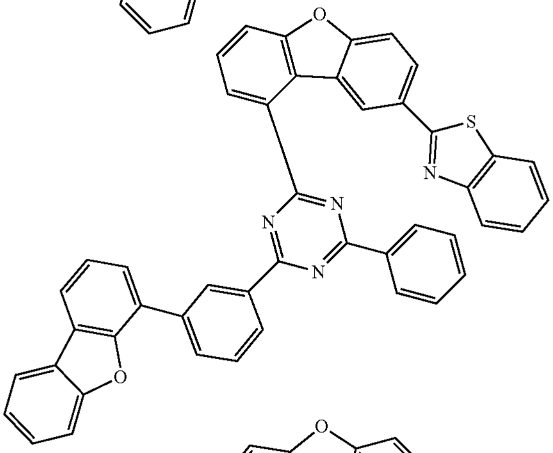
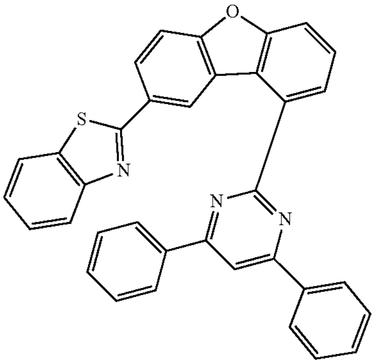
-continued
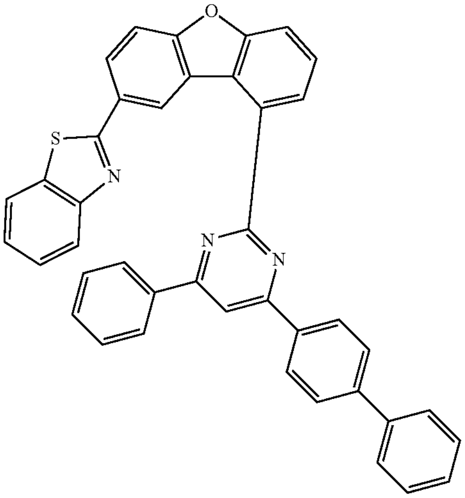
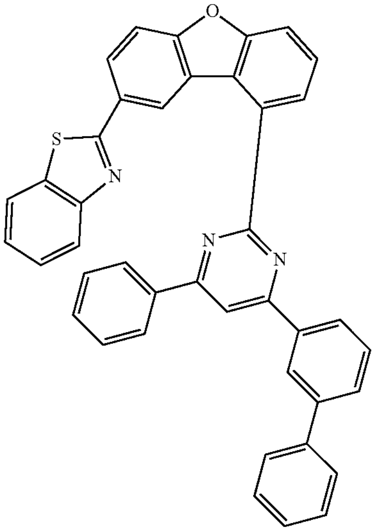
9
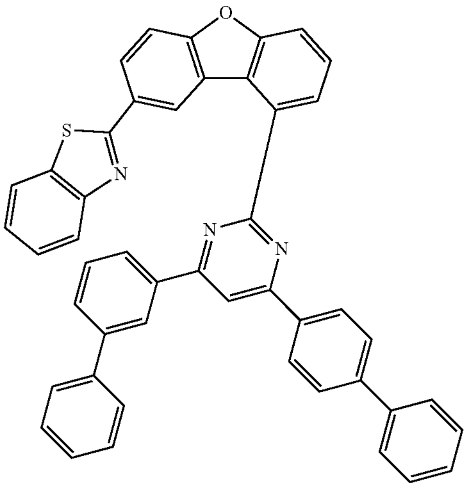

-continued
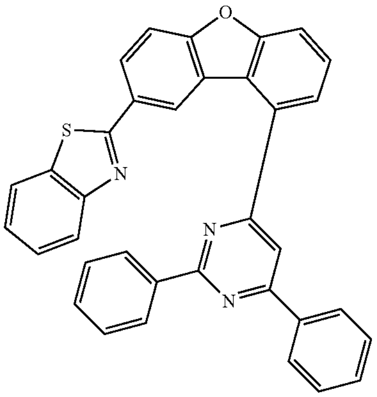
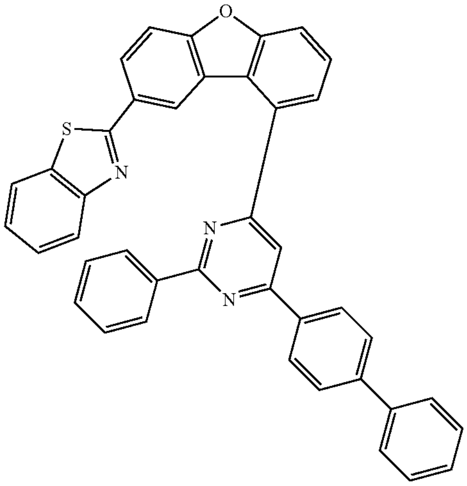
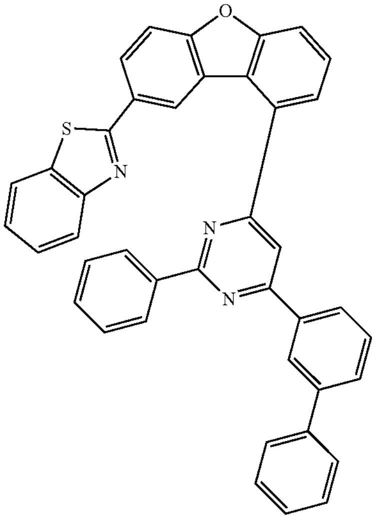
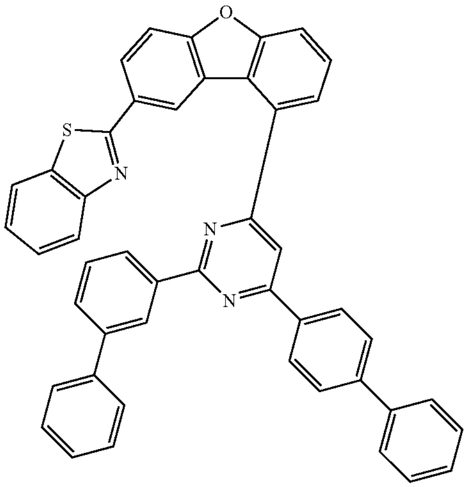
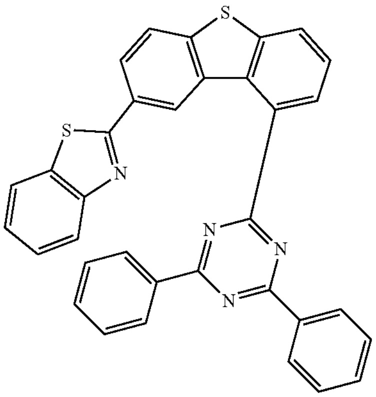
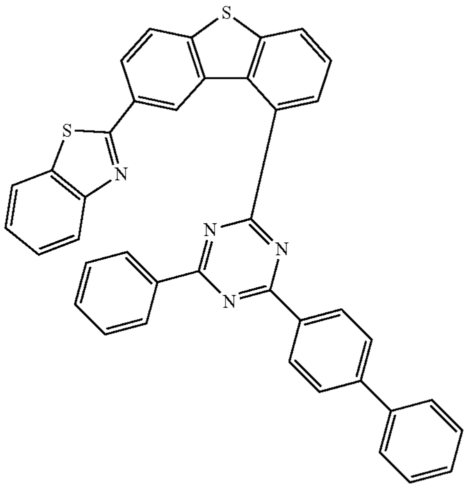
-continued -continued
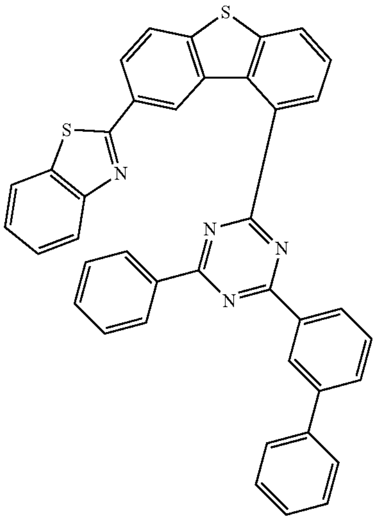
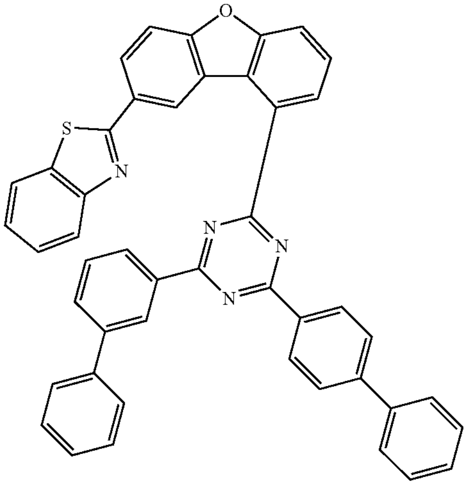
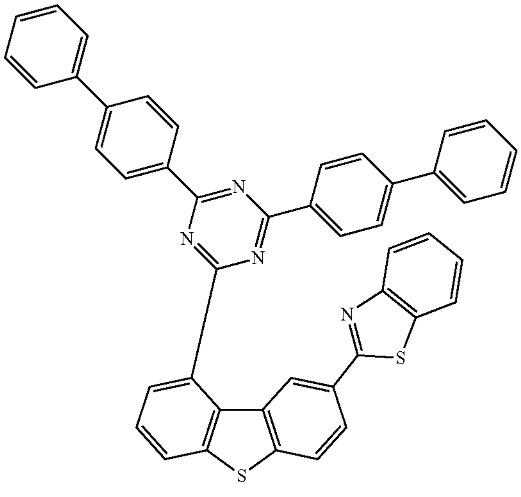
-continued
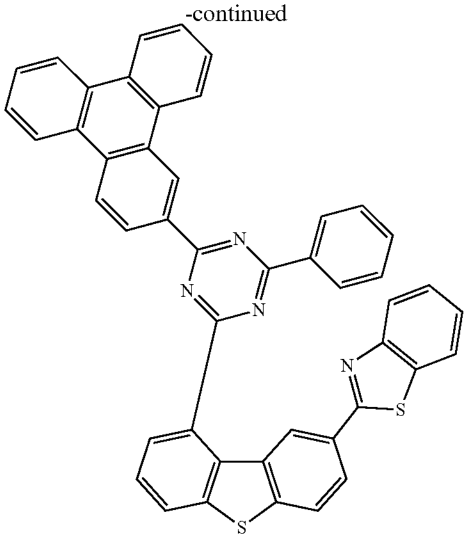
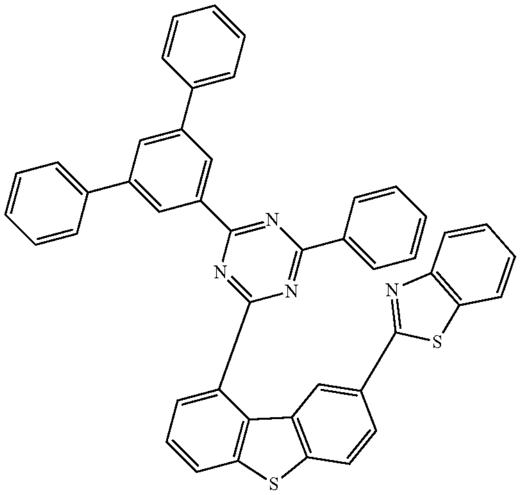
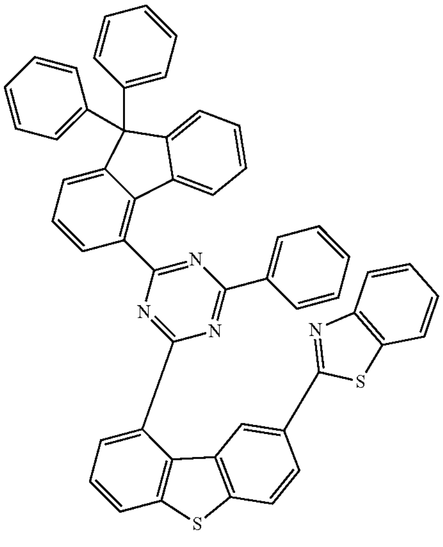

-continued
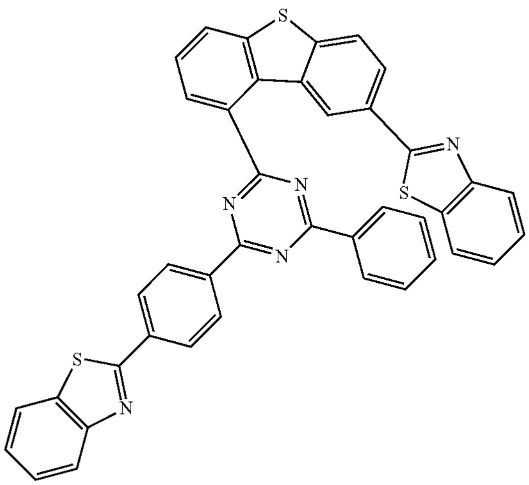
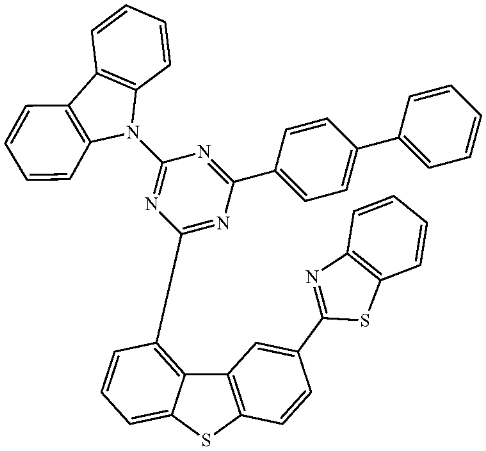
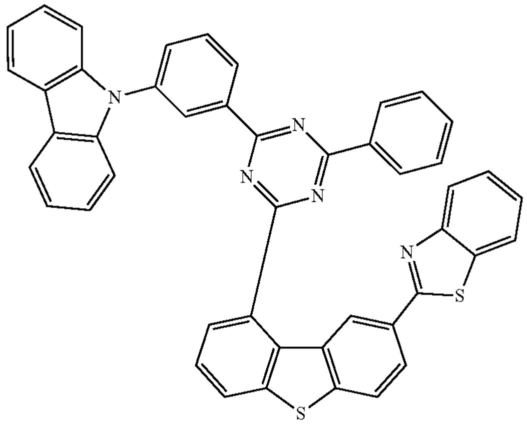
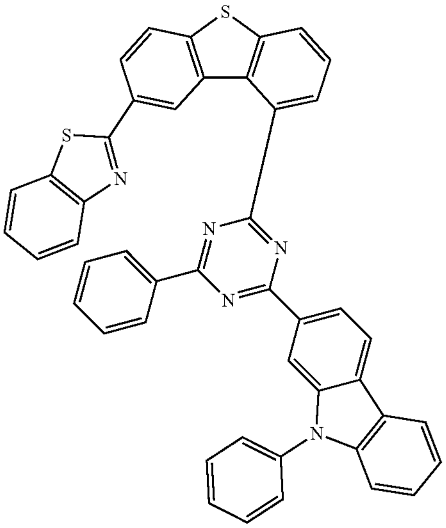
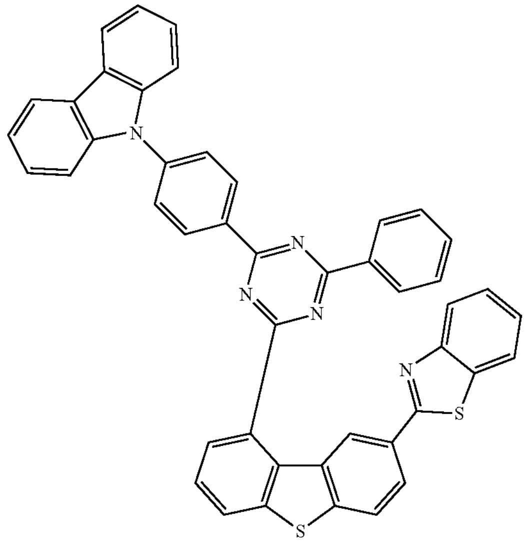
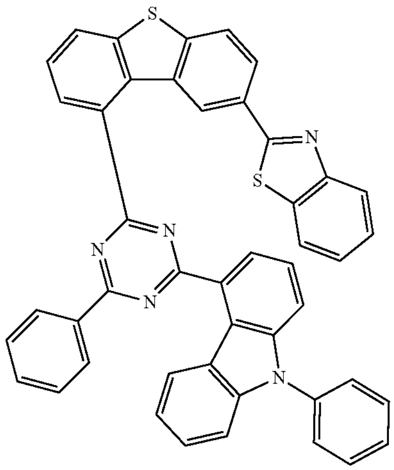

-continued
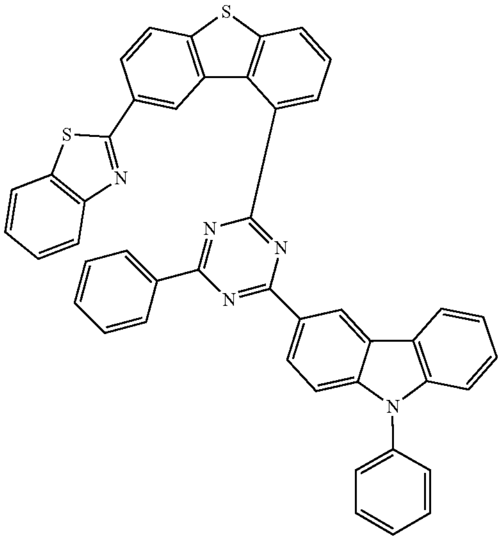
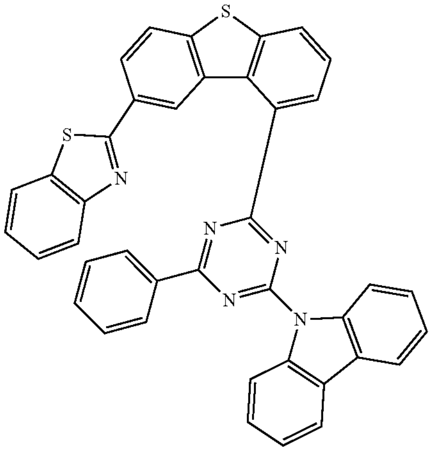
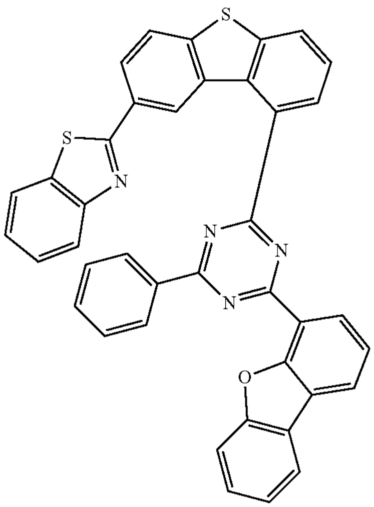
-continued
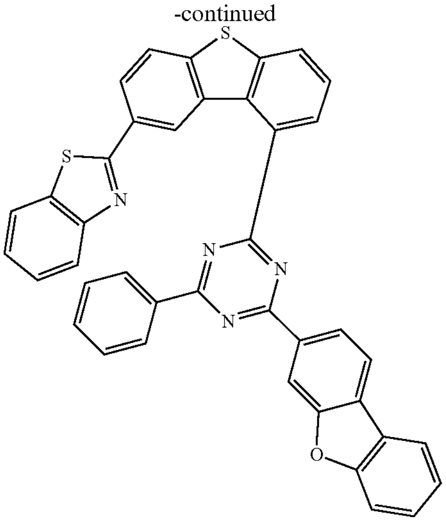
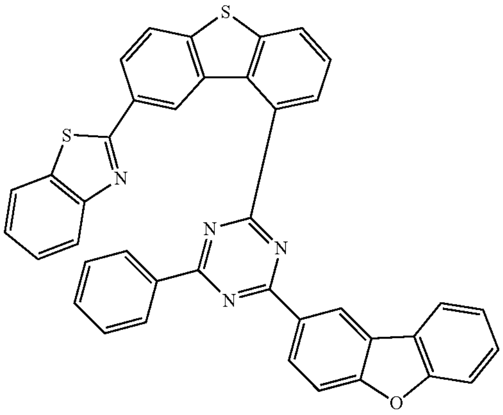
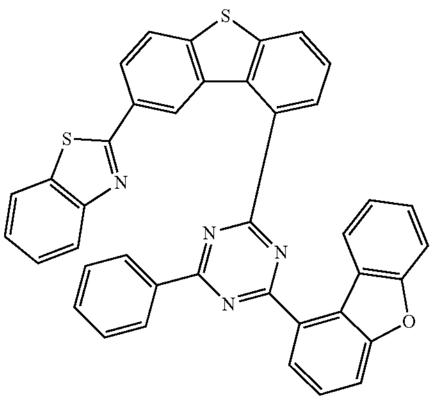

-continued
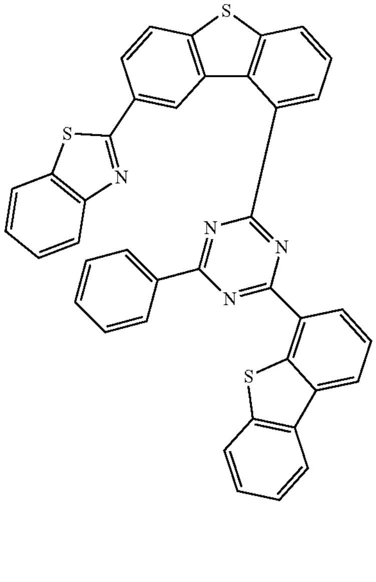
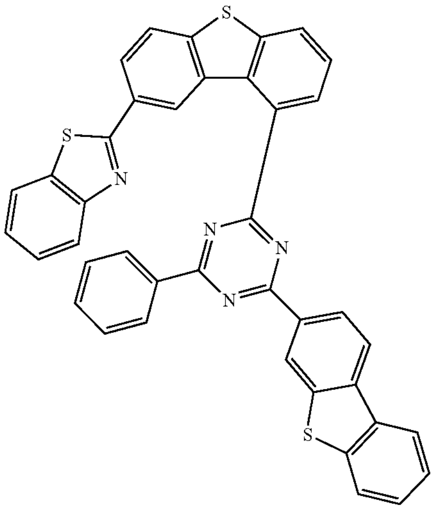
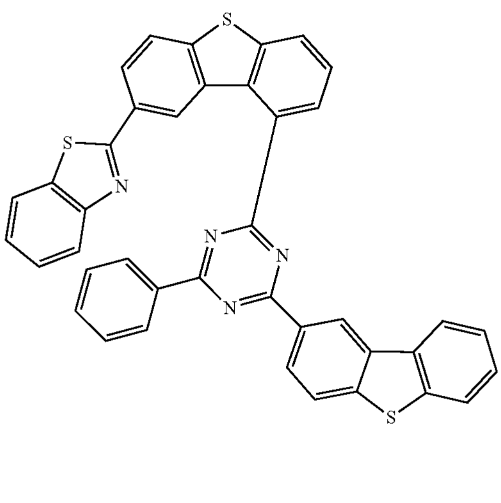
-continued
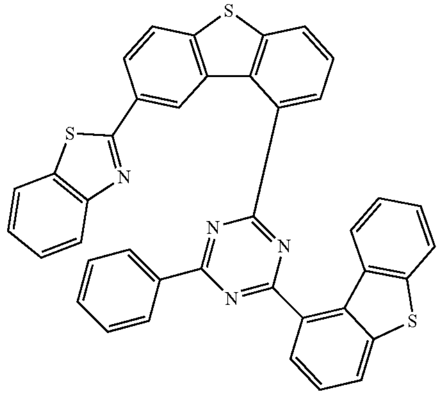
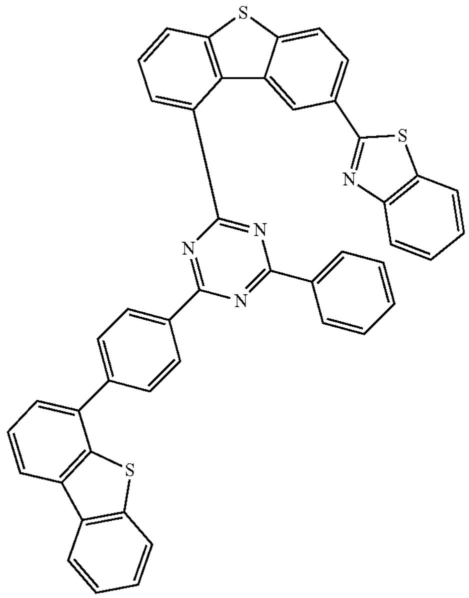
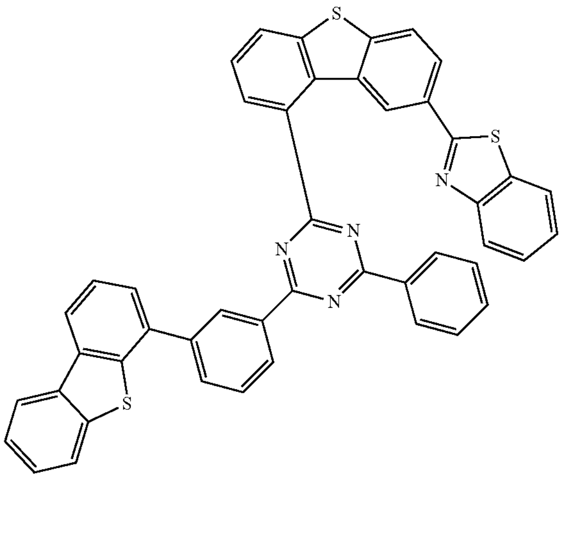

-continued
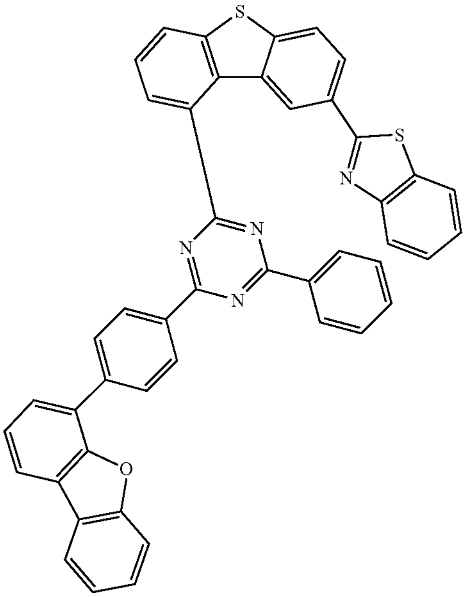
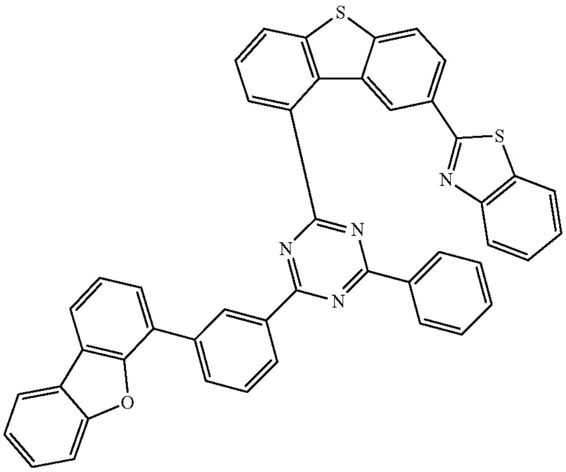
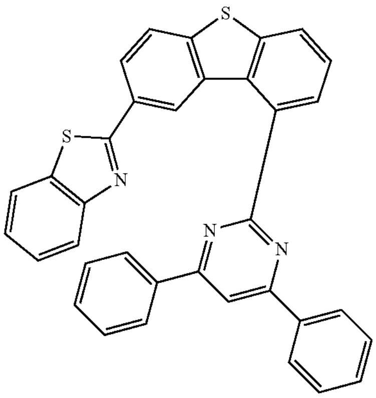
-continued
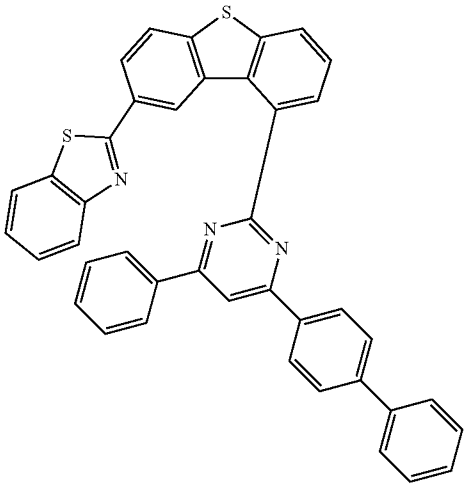
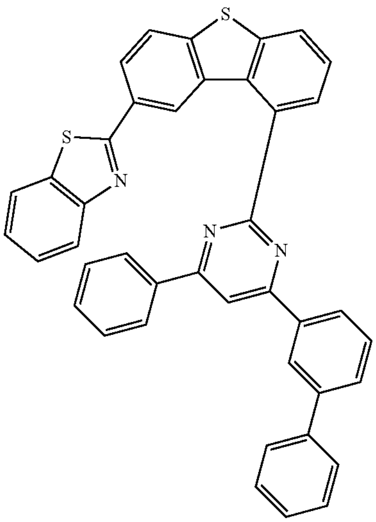
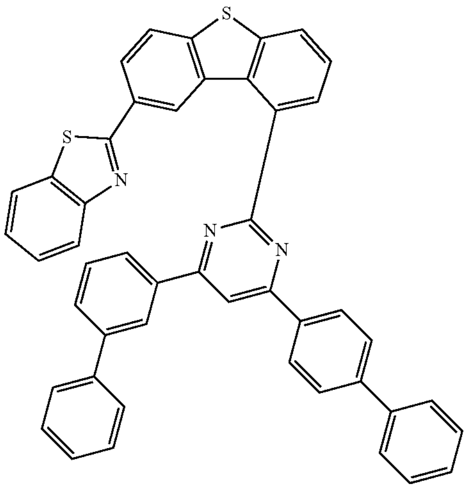

-continued
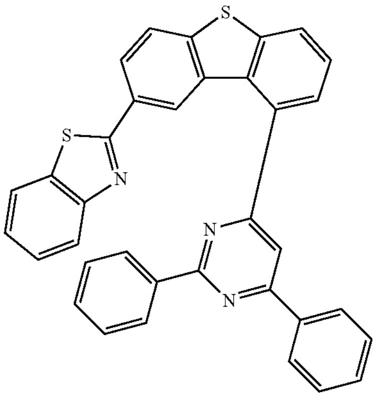
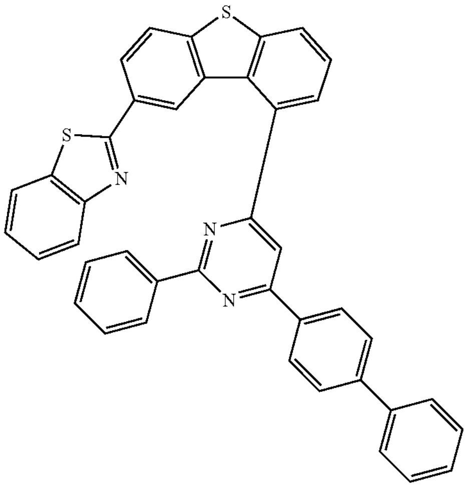
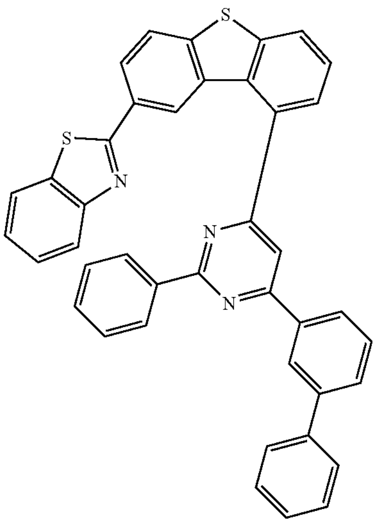
-continued
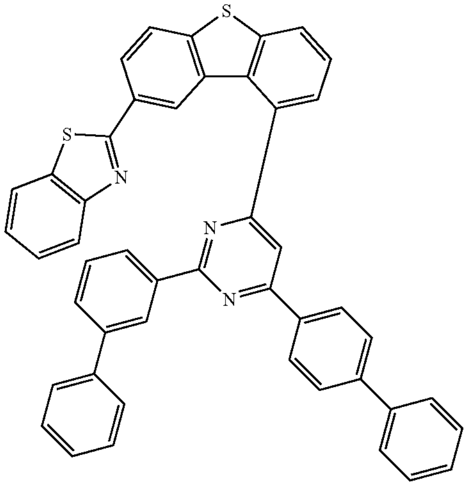
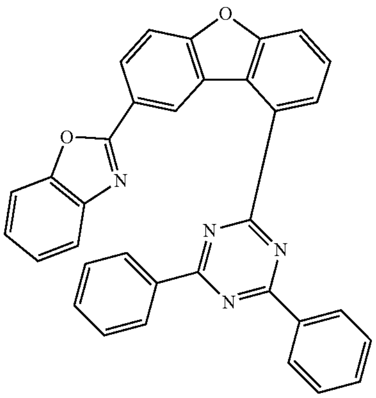
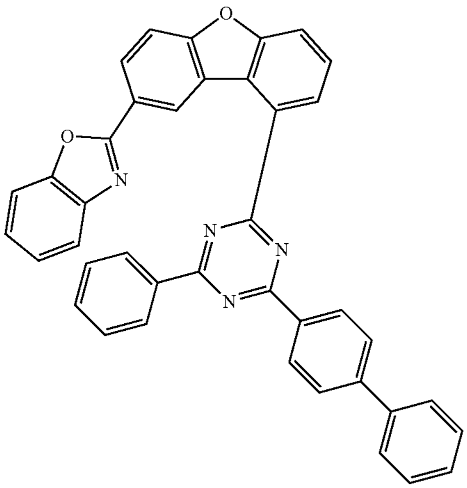

-continued
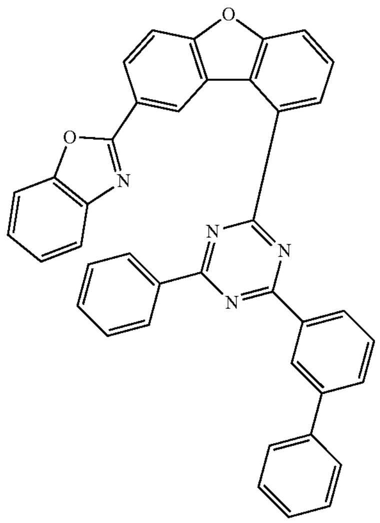
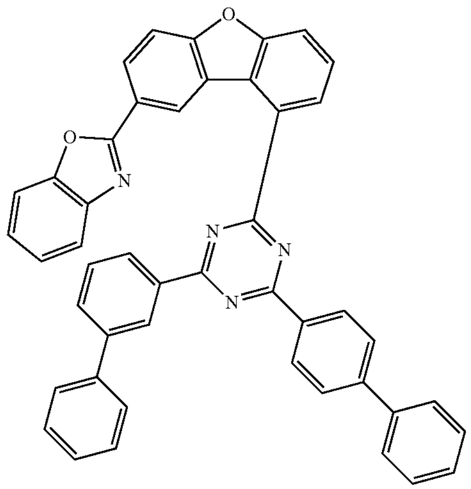
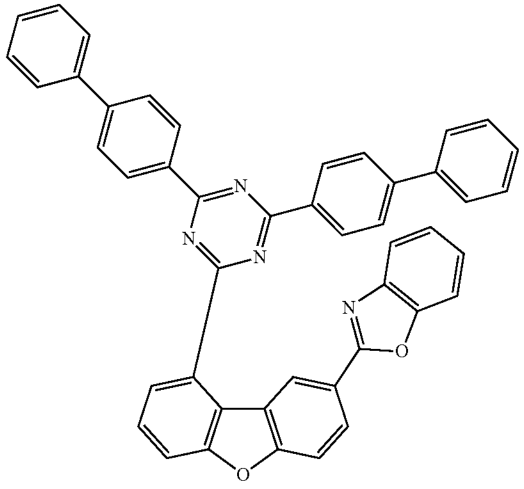
-continued
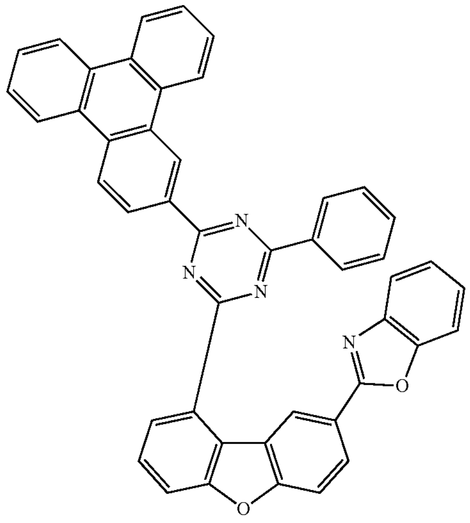
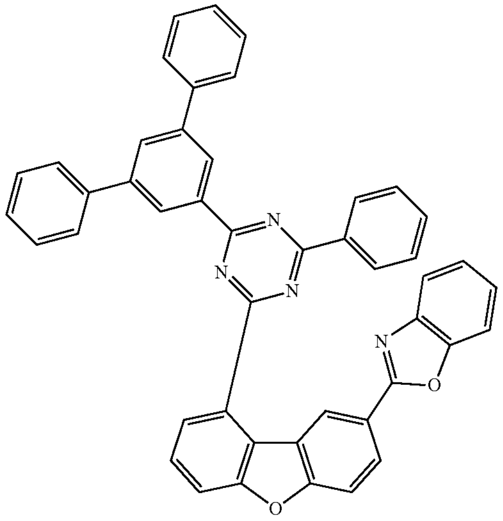
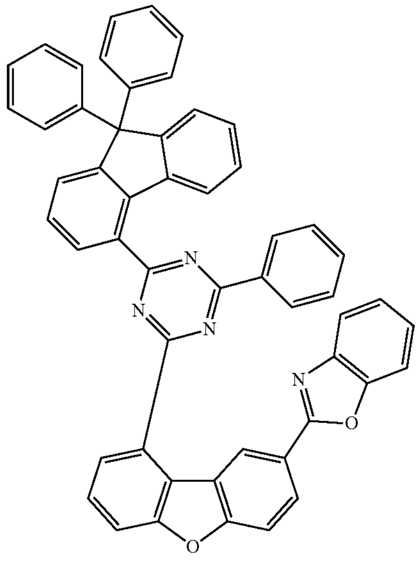

-continued
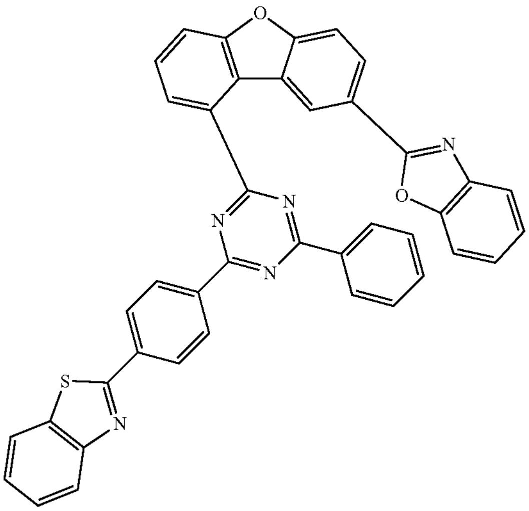
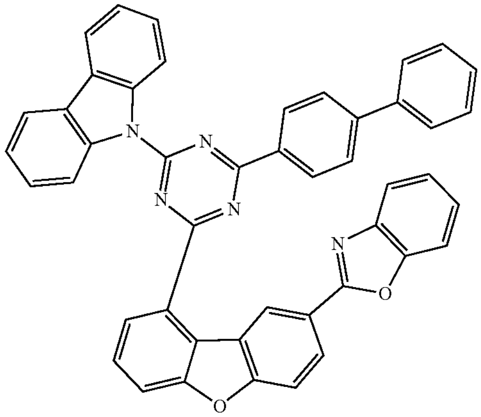
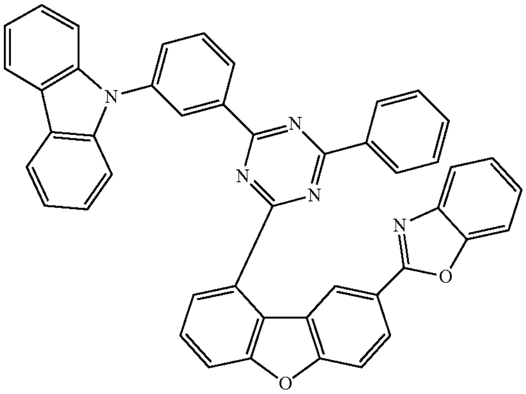
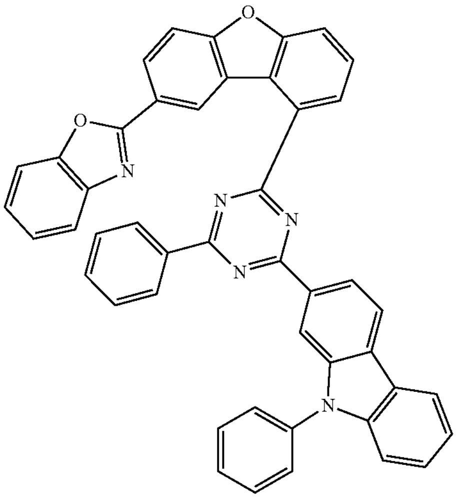
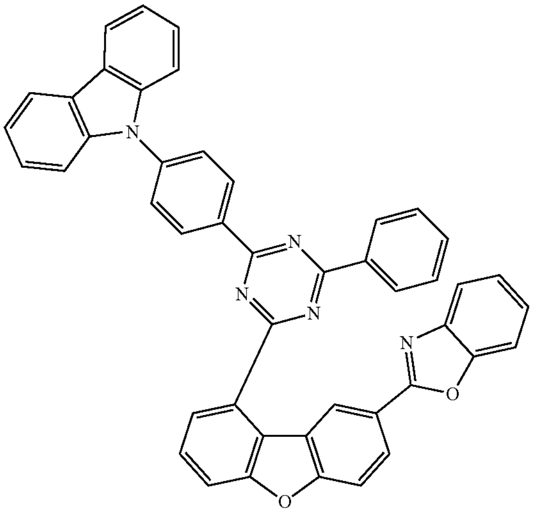
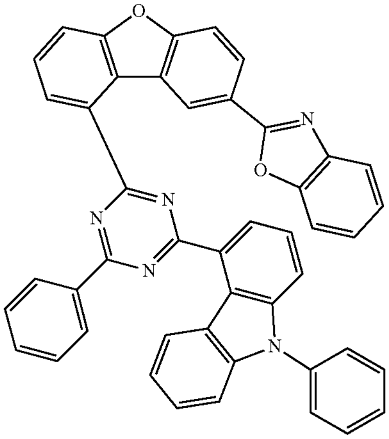
-continued -continued
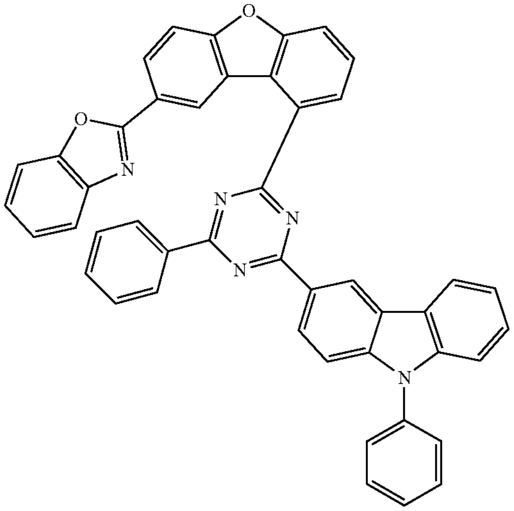
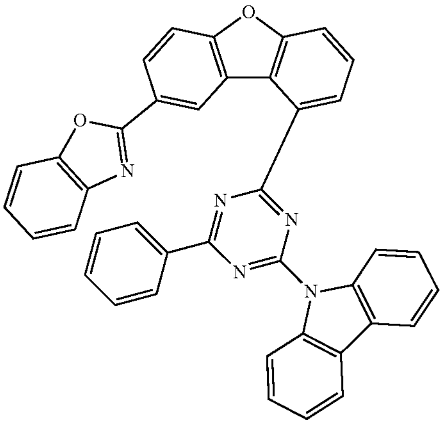
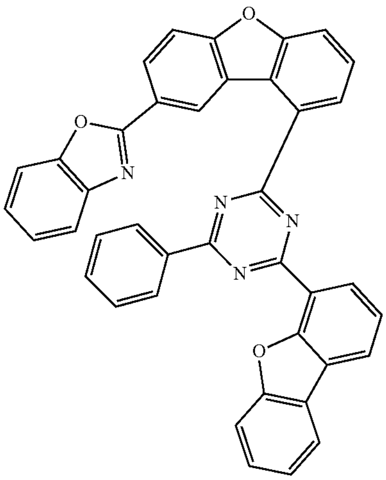
-continued
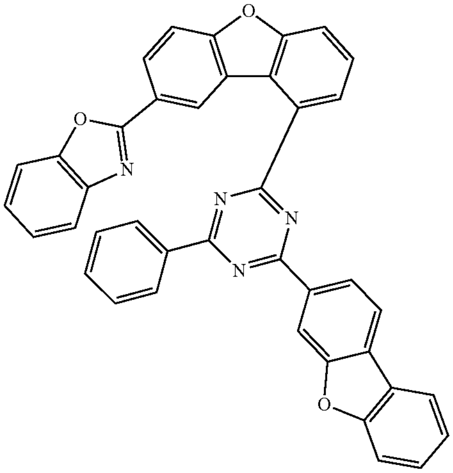
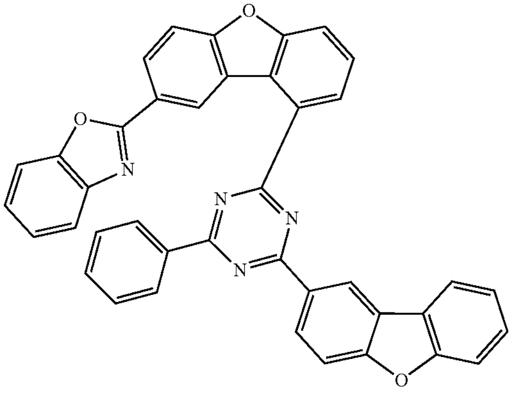
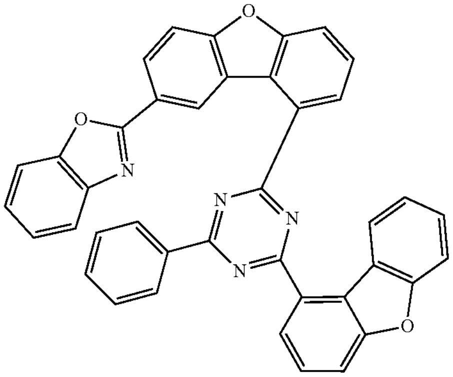
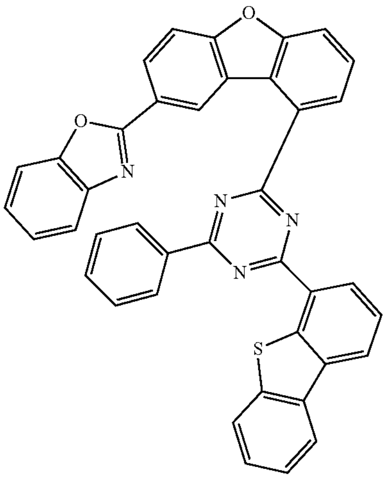

-continued
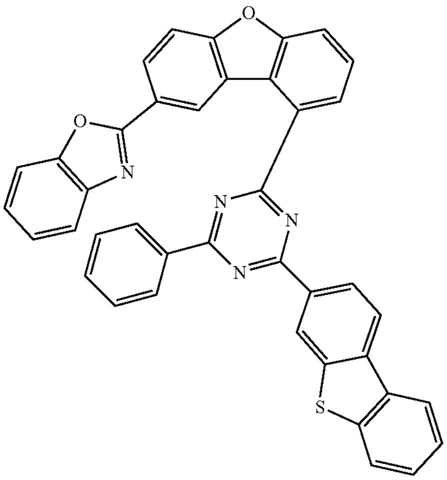
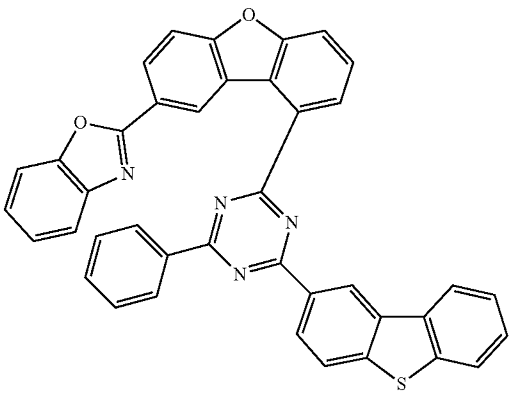
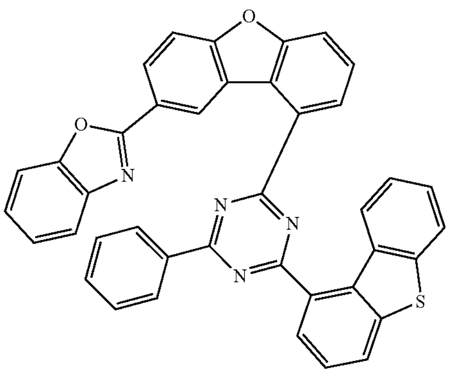
-continued
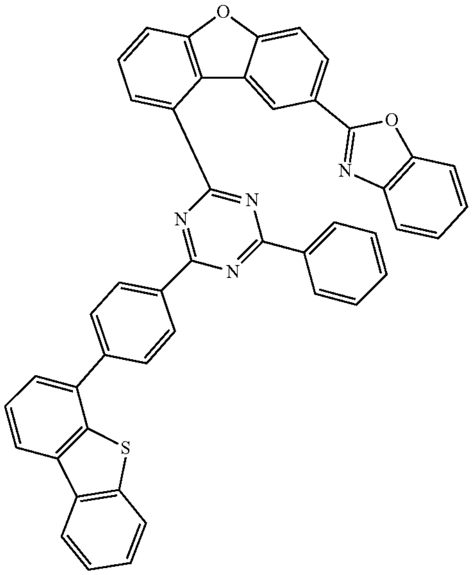
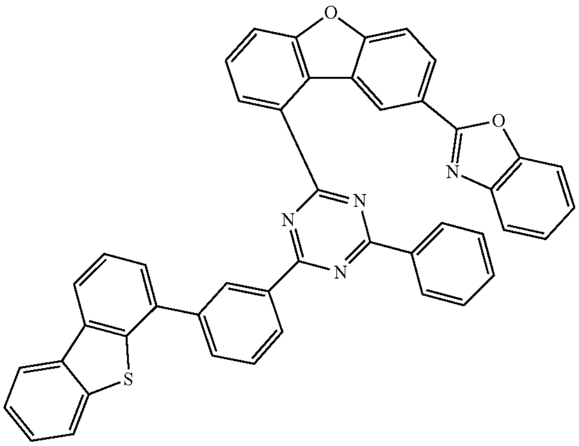
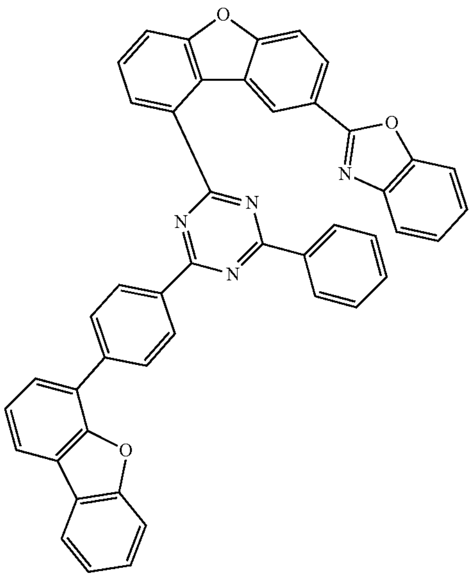

-continued
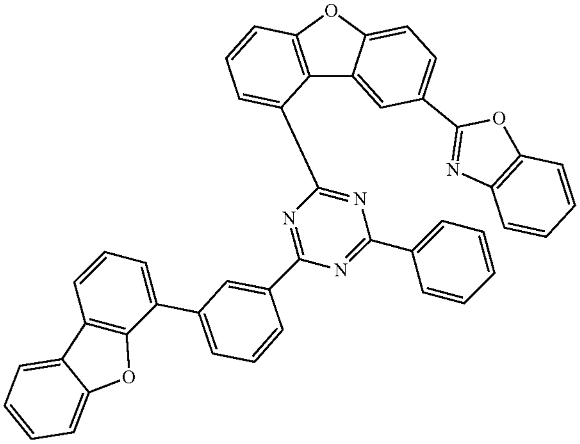
-continued
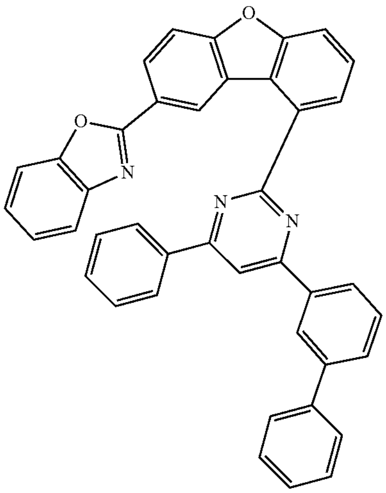
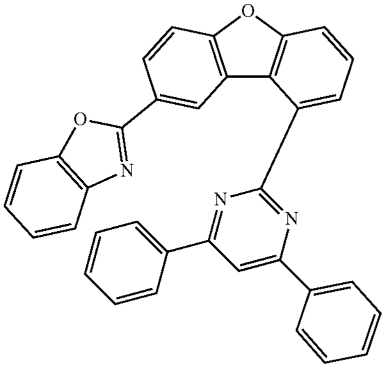
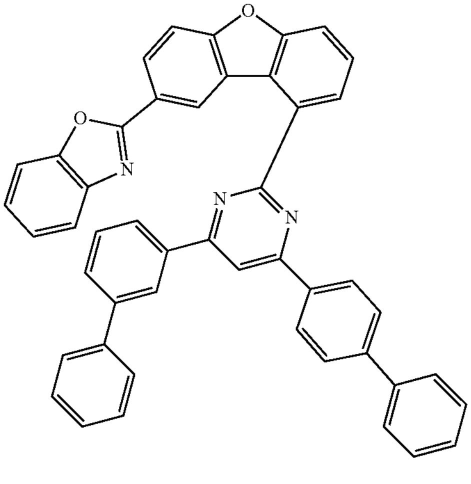
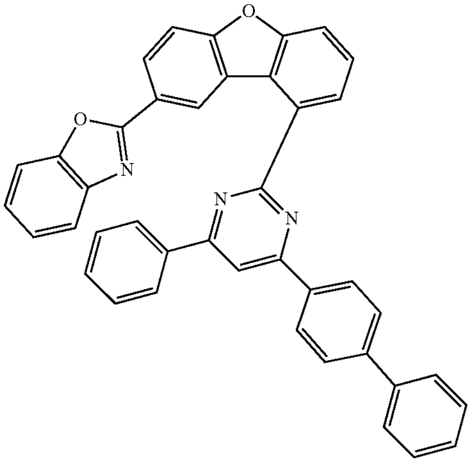
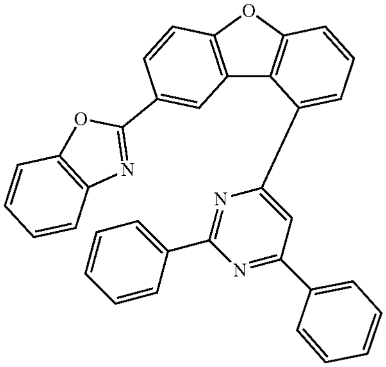

-continued
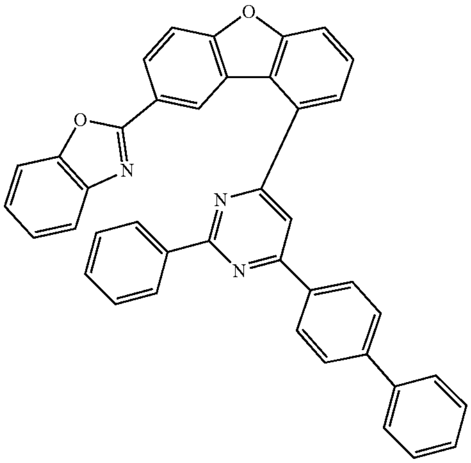
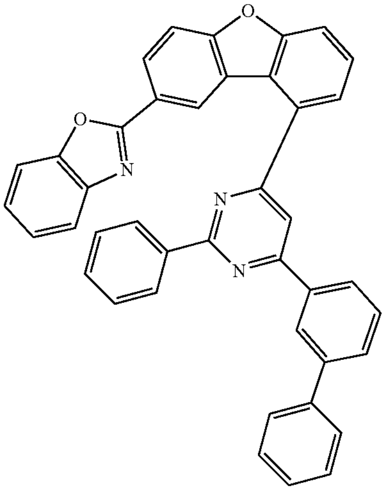
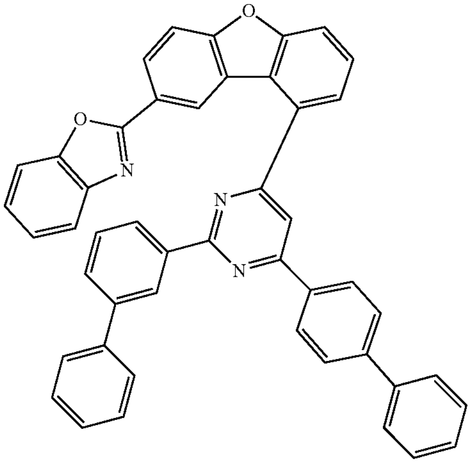
-continued
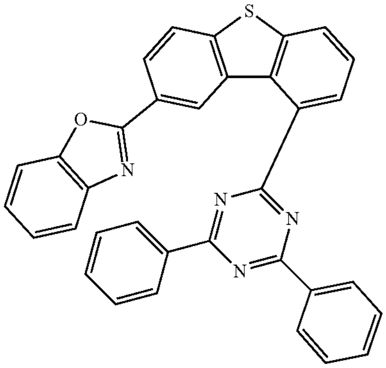
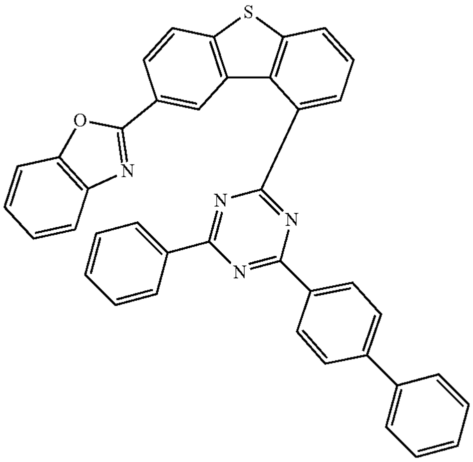
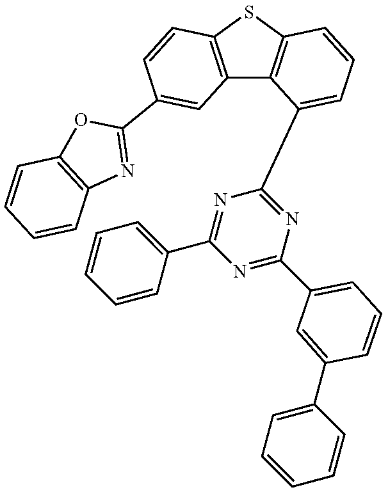

-continued
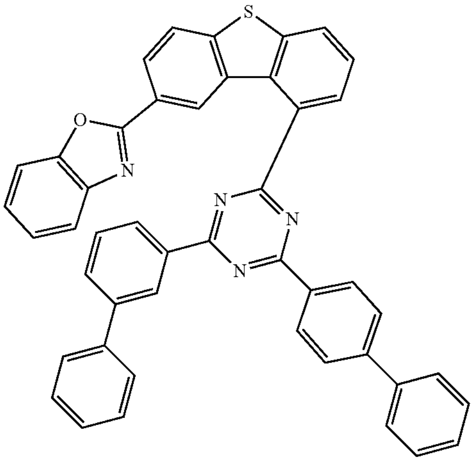
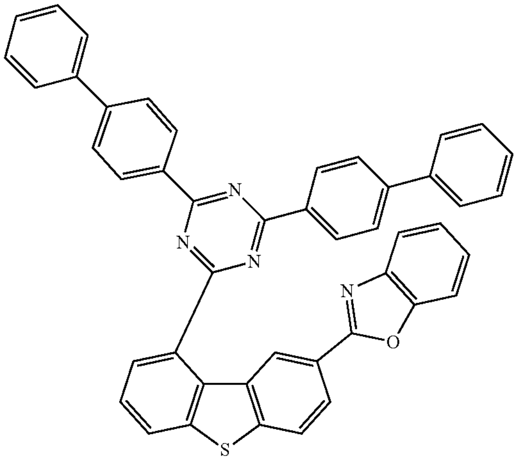
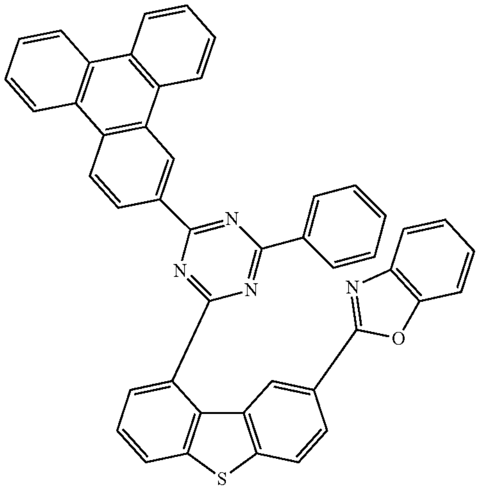
-continued
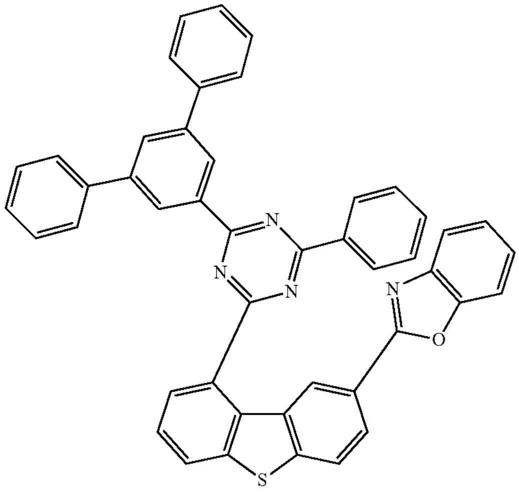
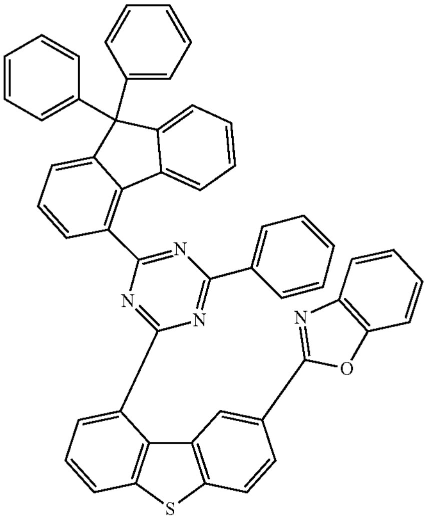
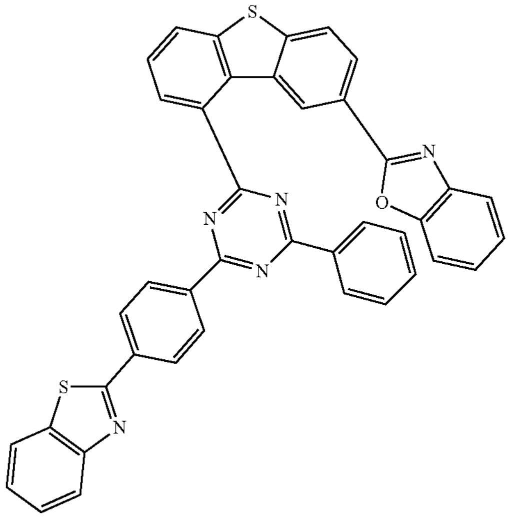

-continued
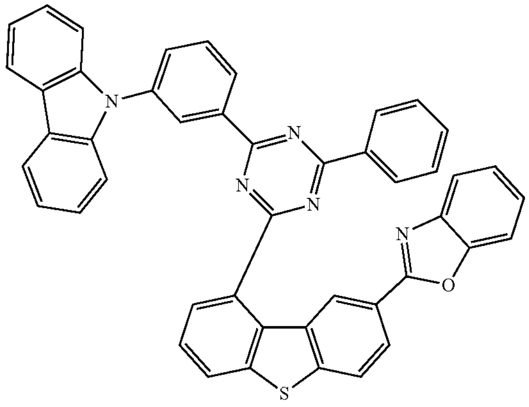
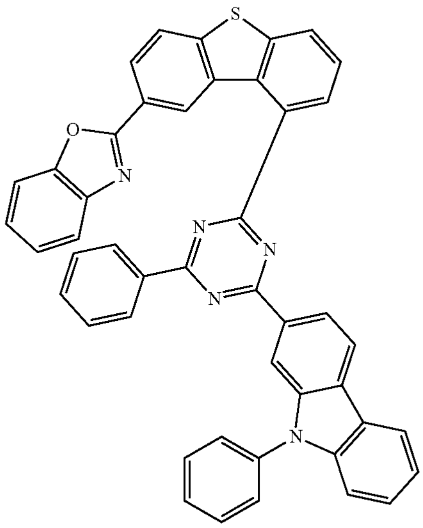
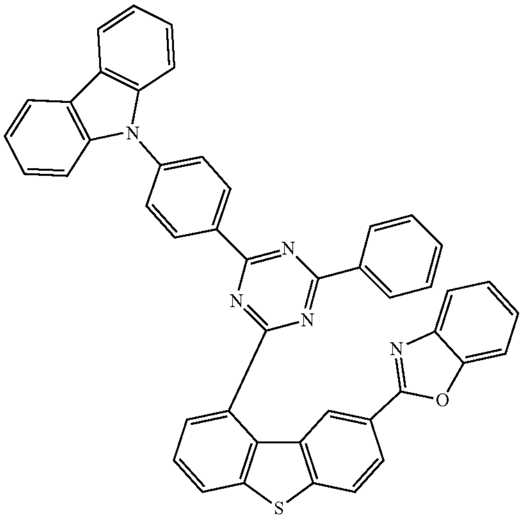
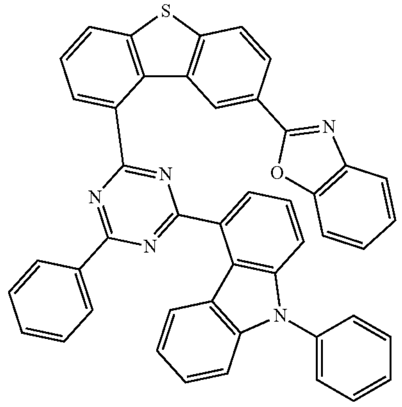
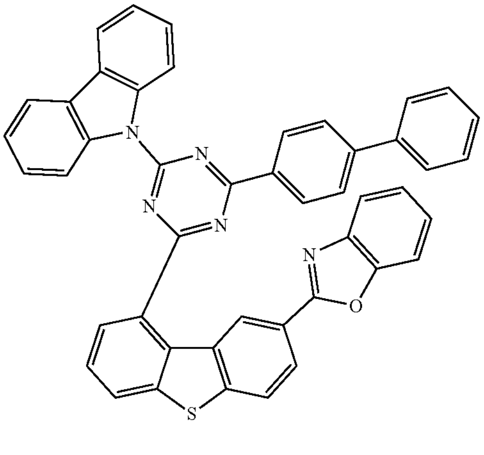
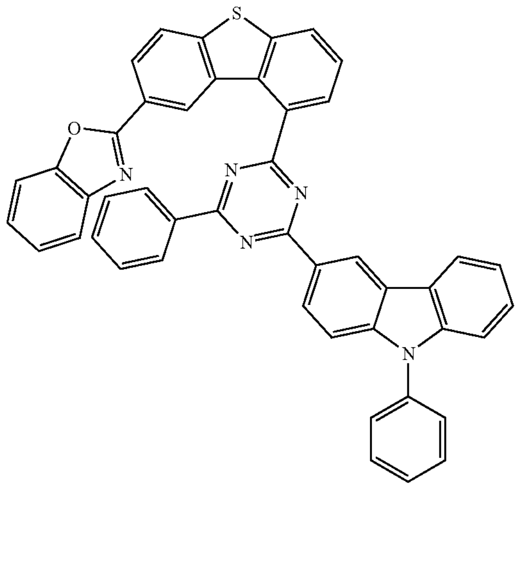

-continued
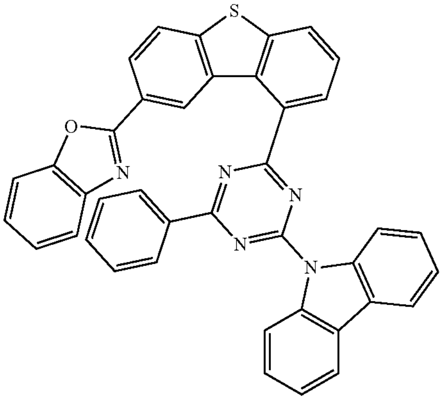
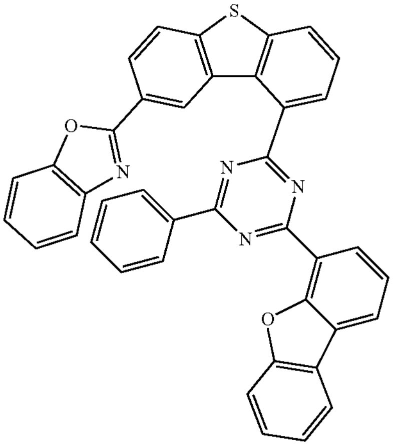
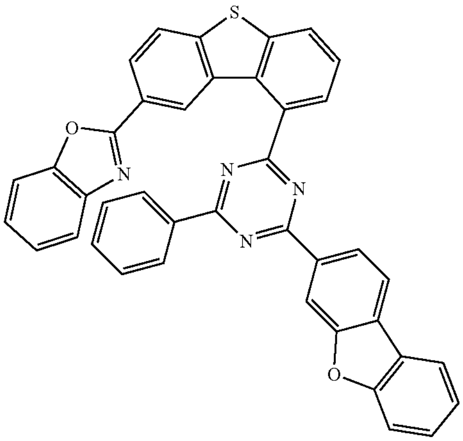
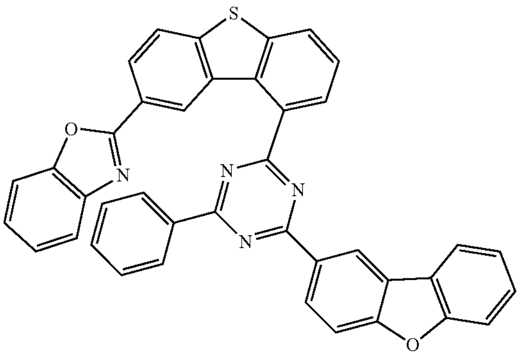
-continued
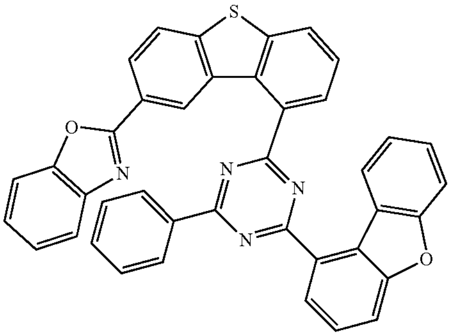
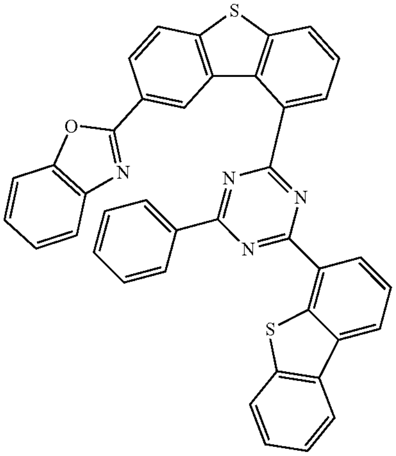
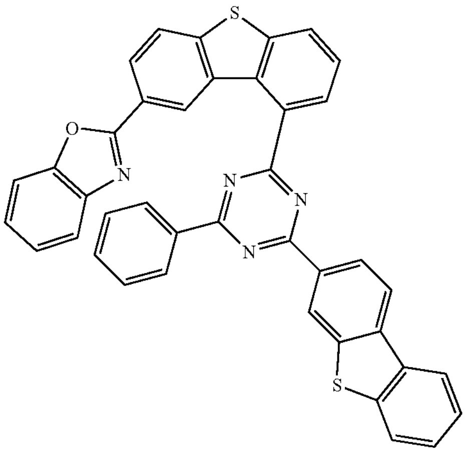
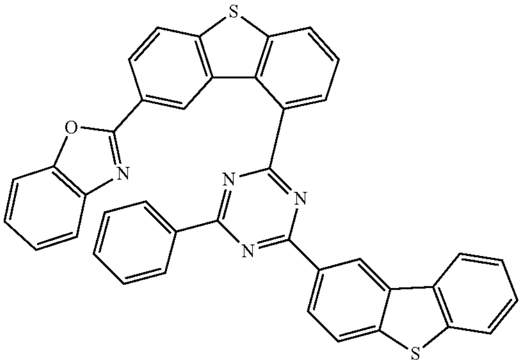

-continued
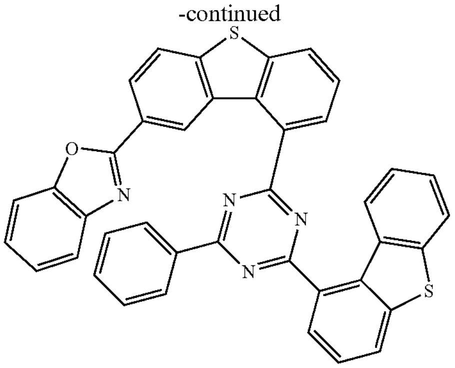
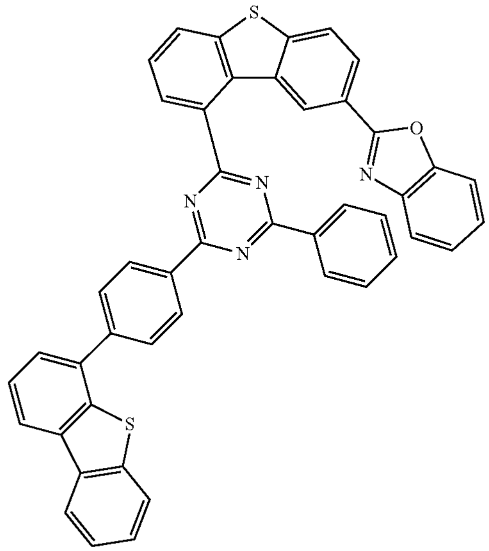
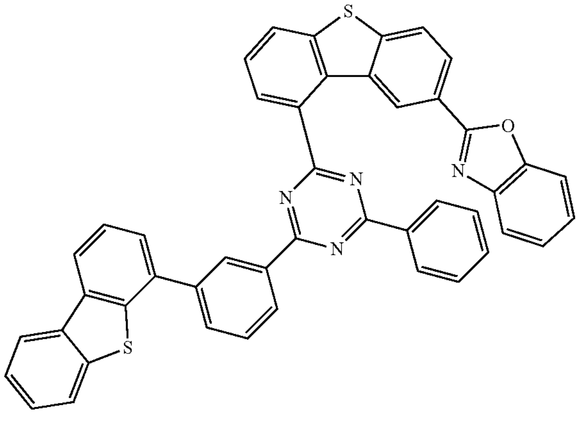
-continued
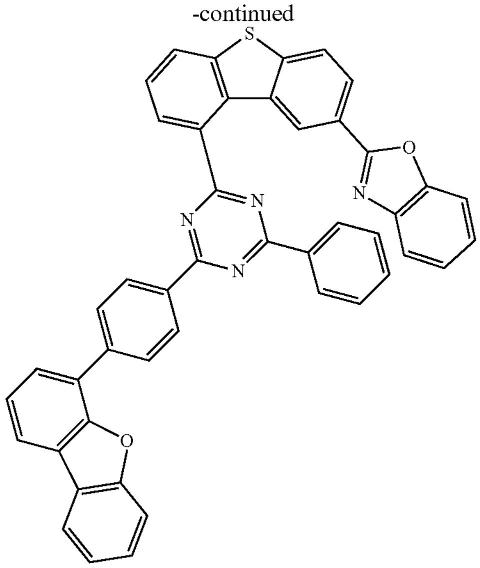
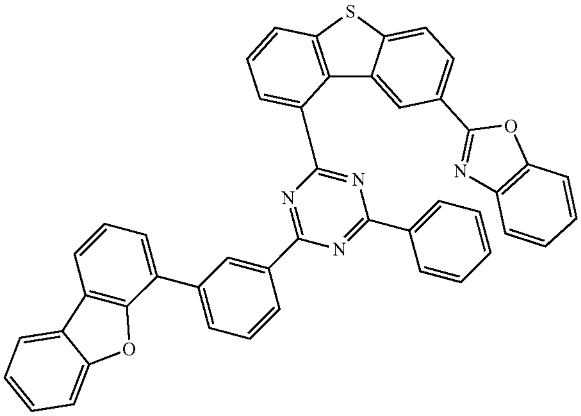
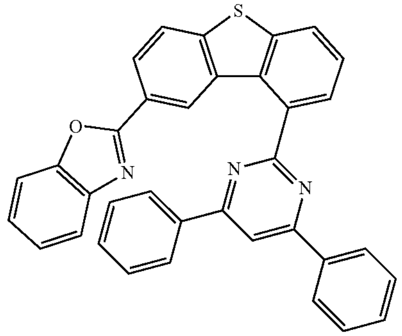
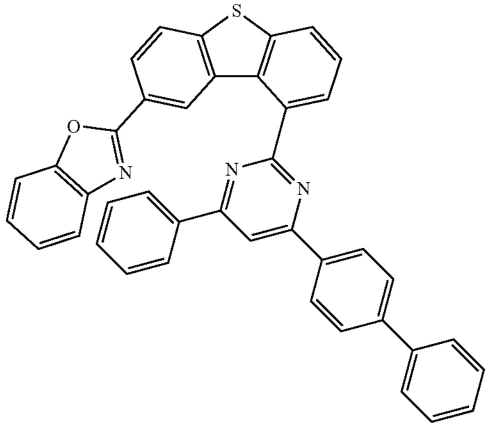

-continued
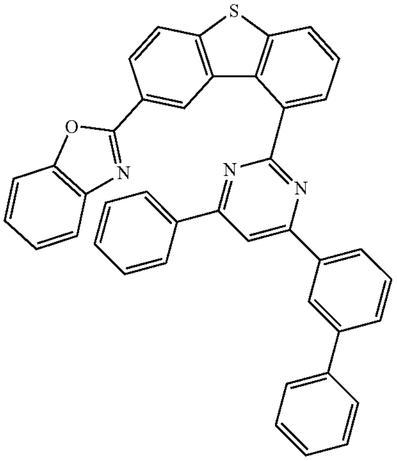
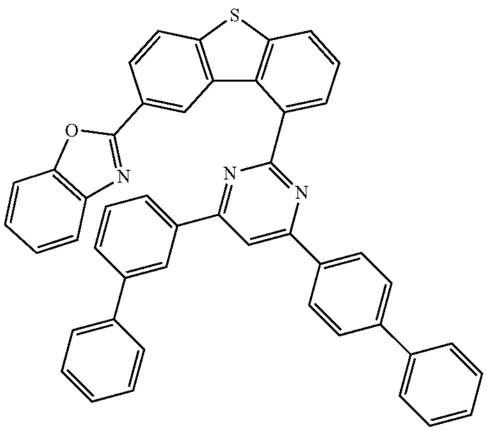
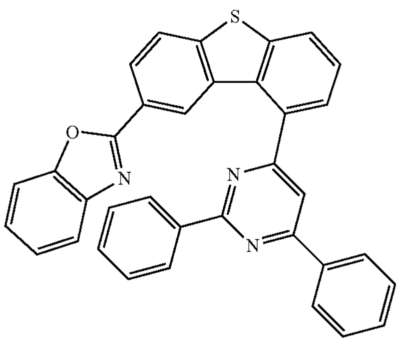
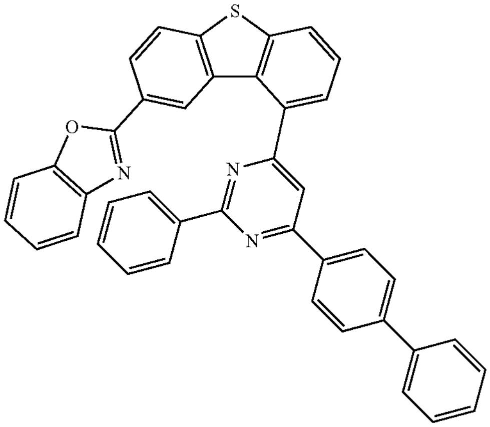
-continued
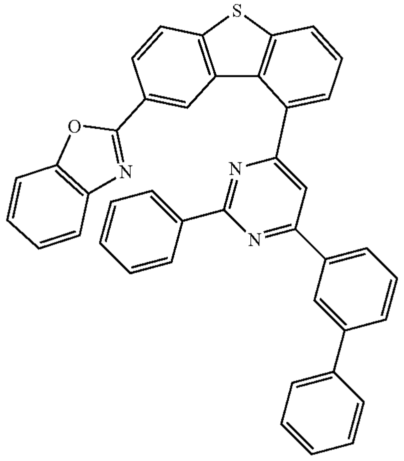
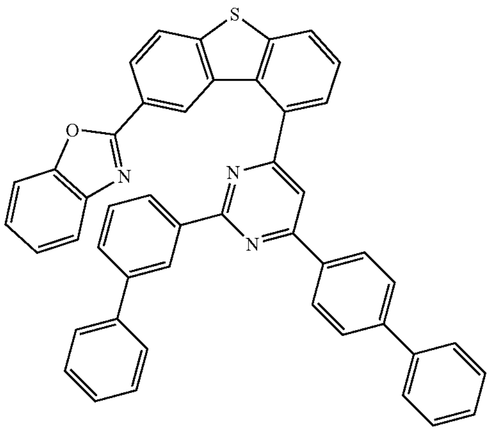
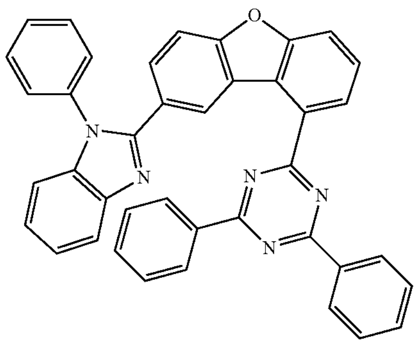
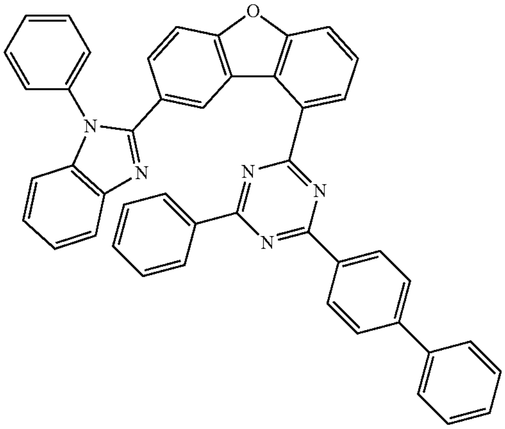

-continued
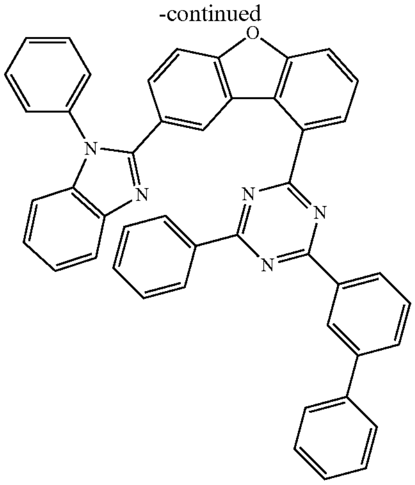
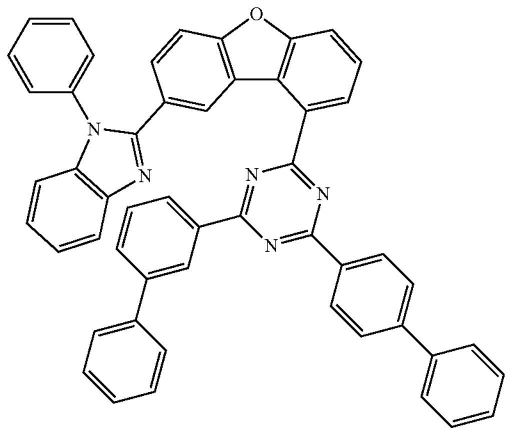
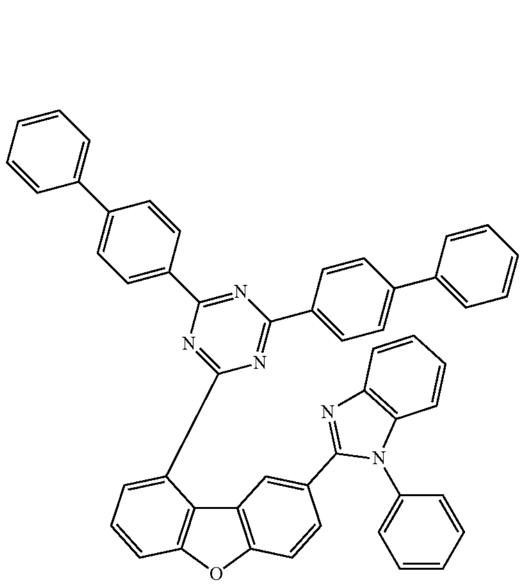
-continued
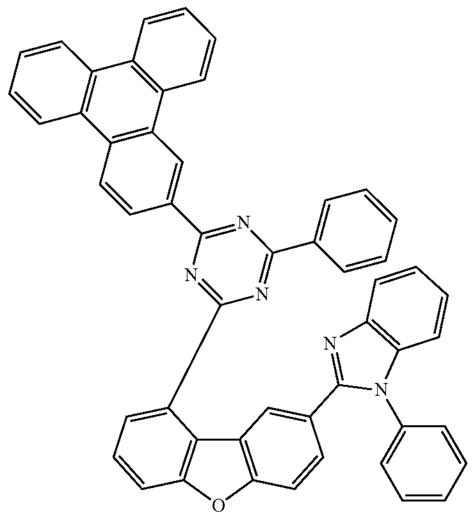
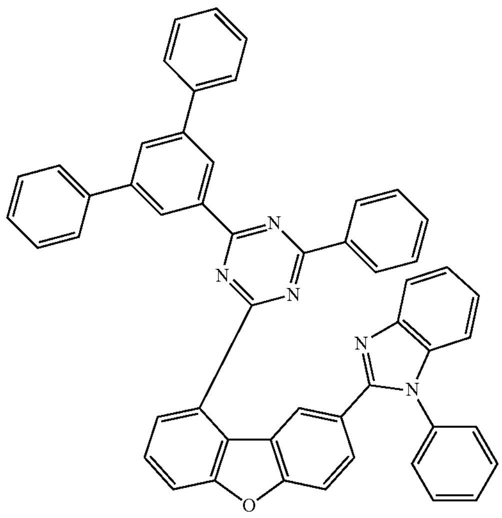
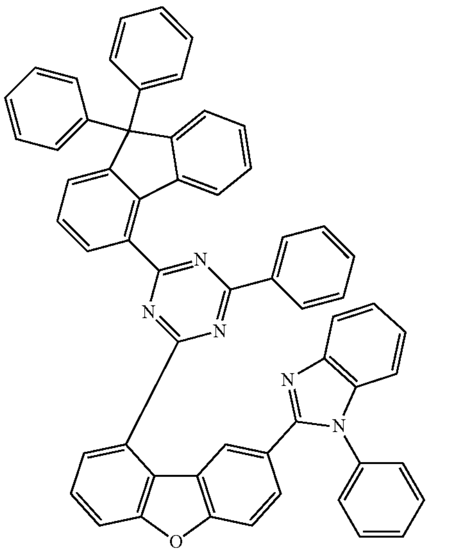

-continued
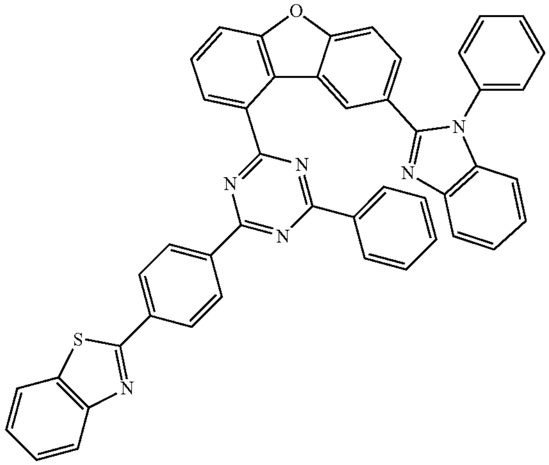
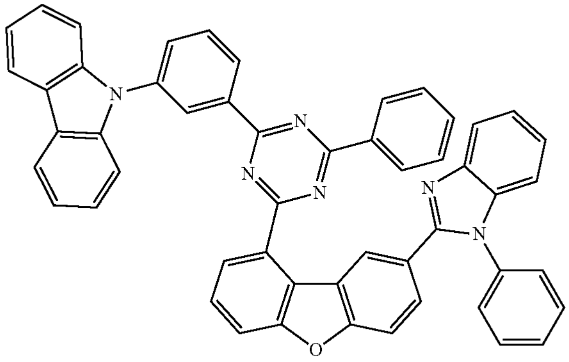
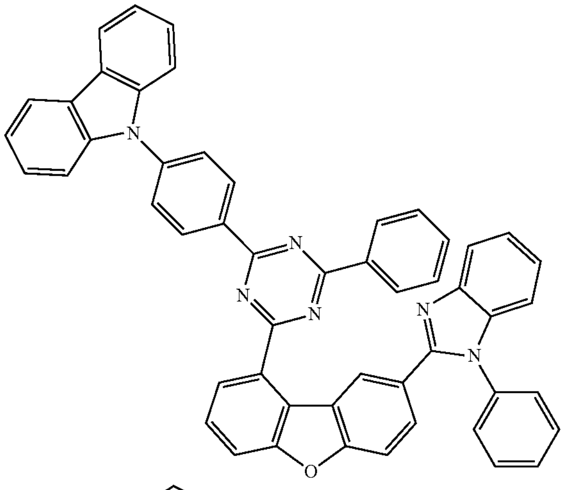
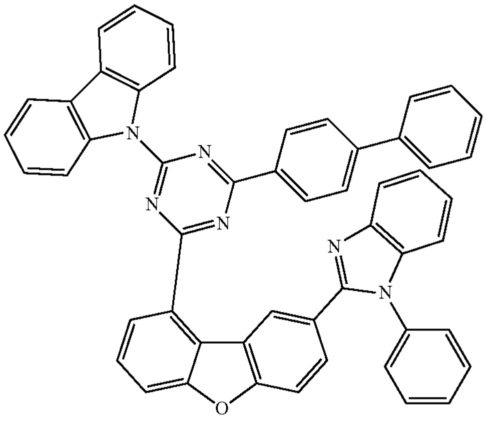
-continued
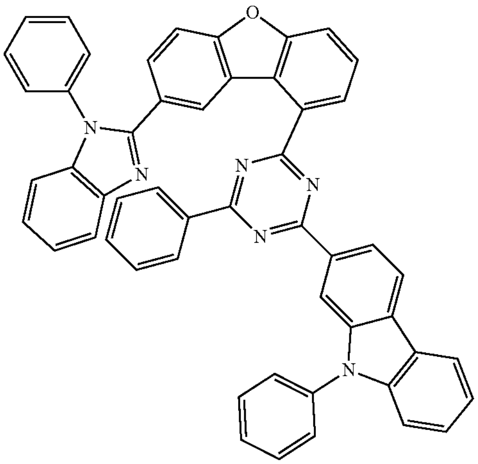
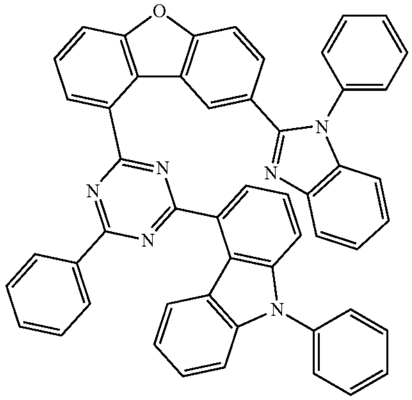
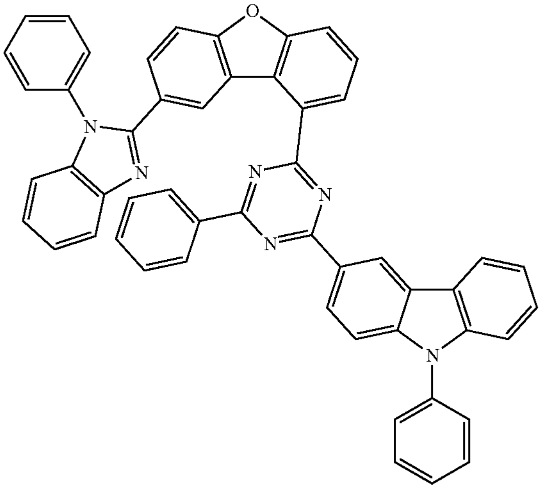

-continued
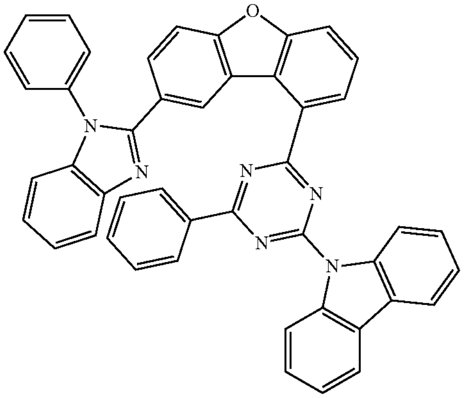
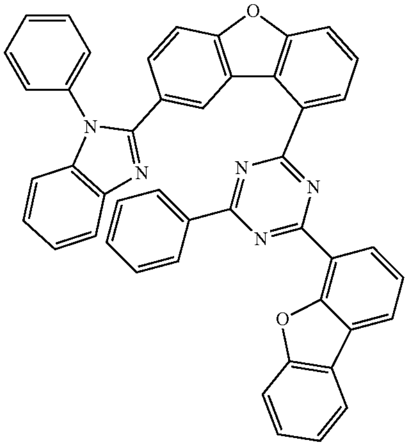
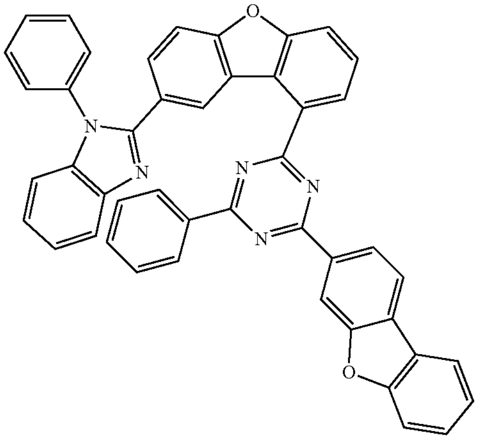
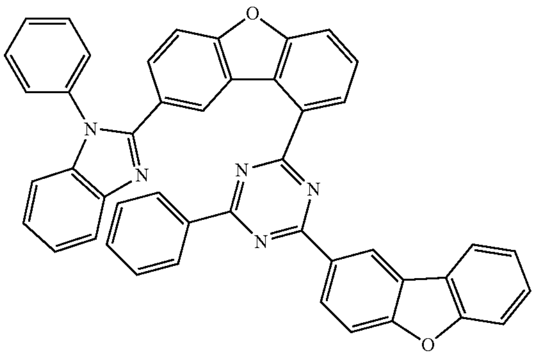
-continued
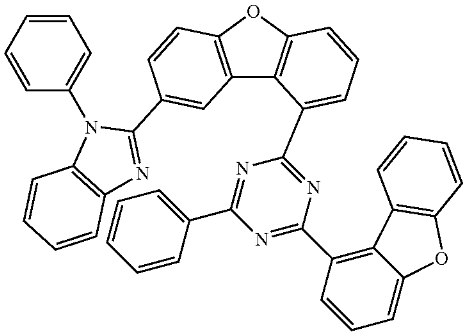
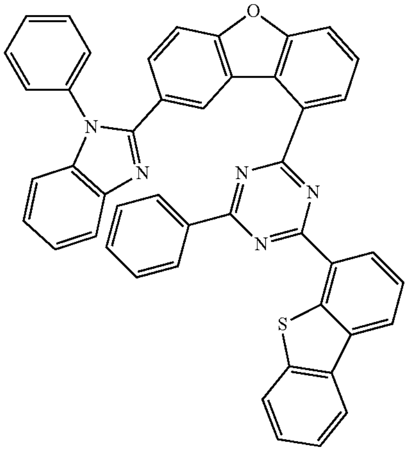
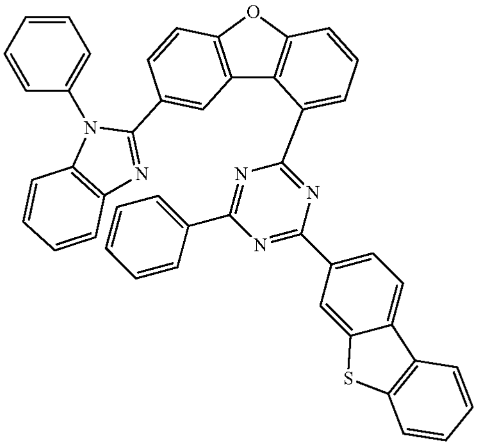
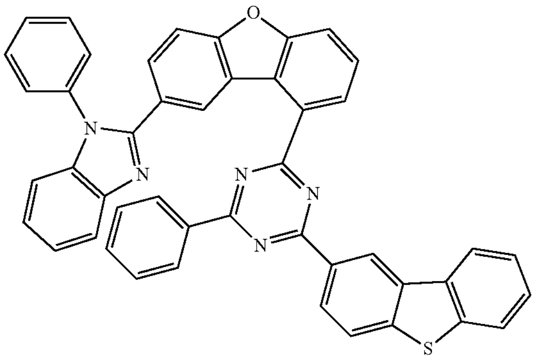

-continued
-continued
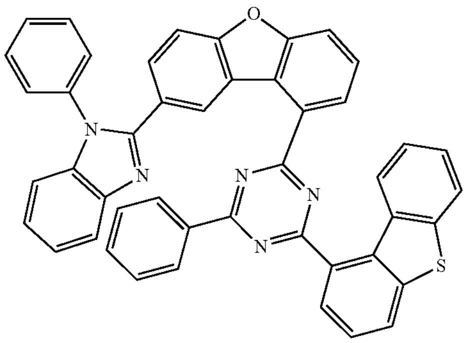
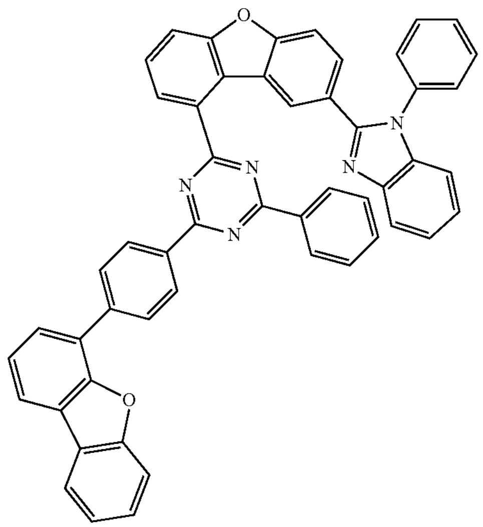
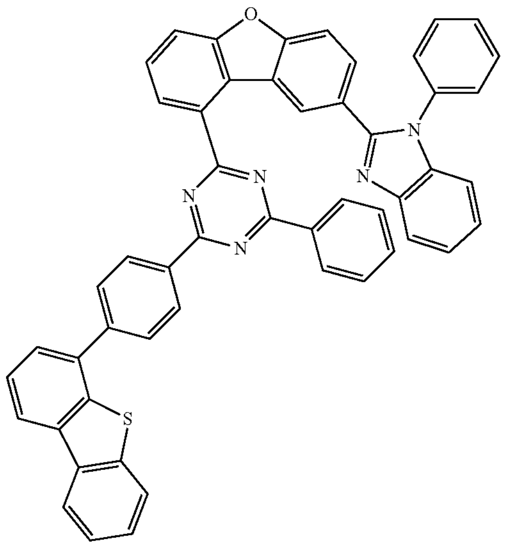
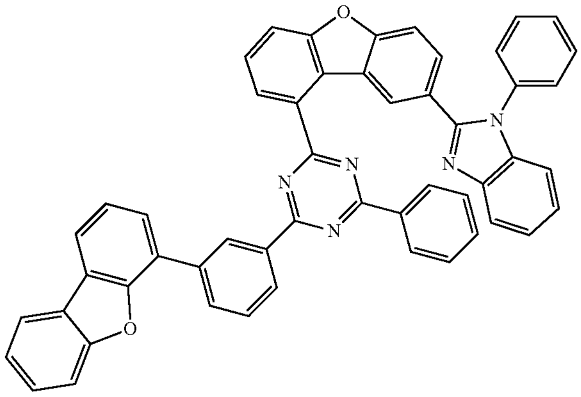
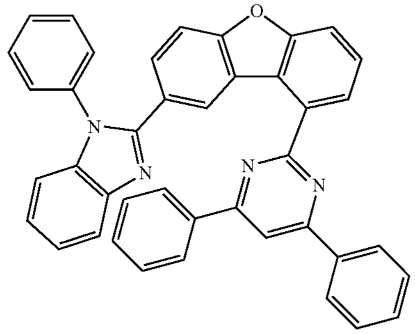
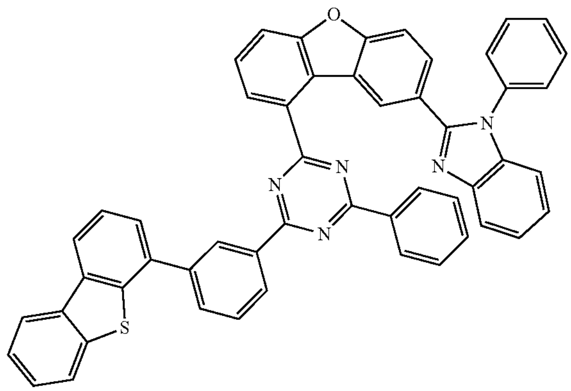
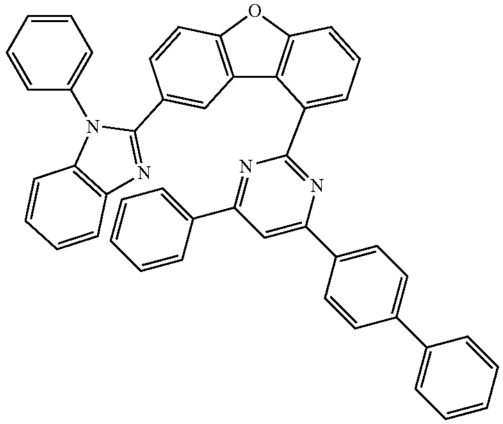

-continued
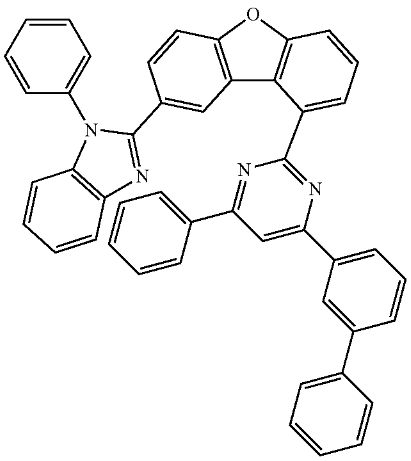
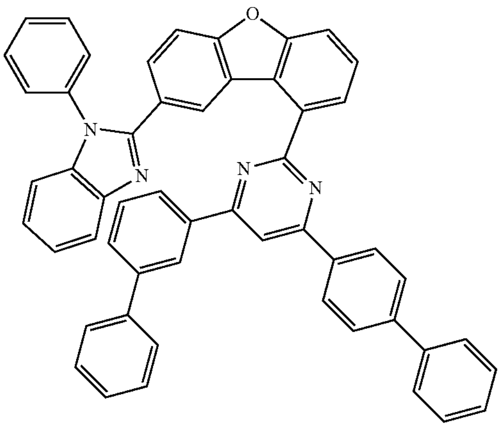
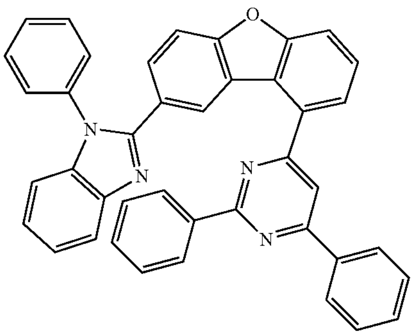
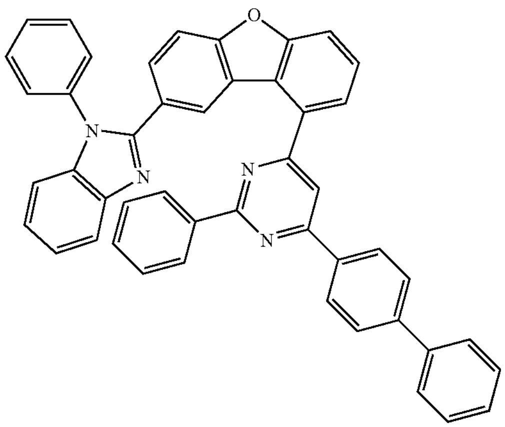
-continued
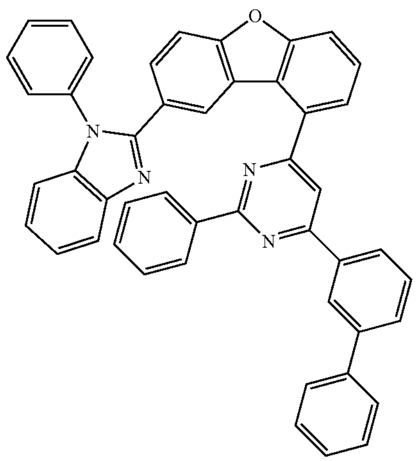
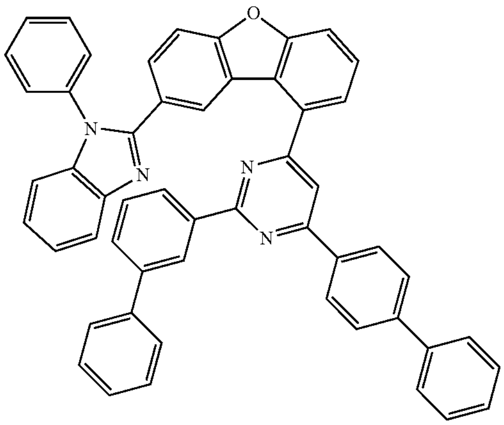
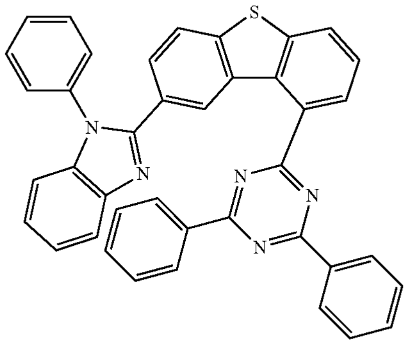
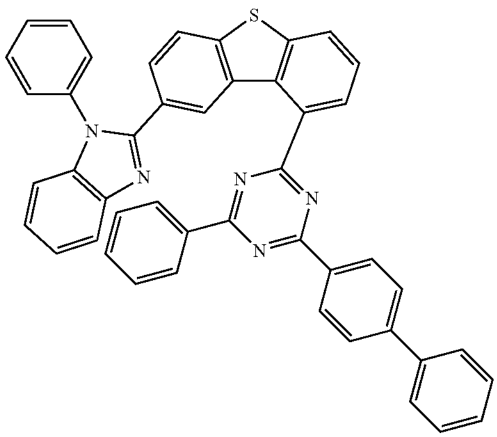

-continued
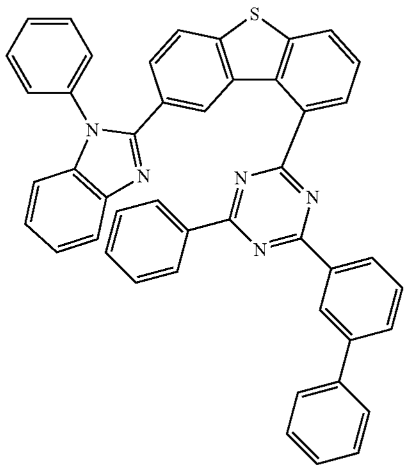
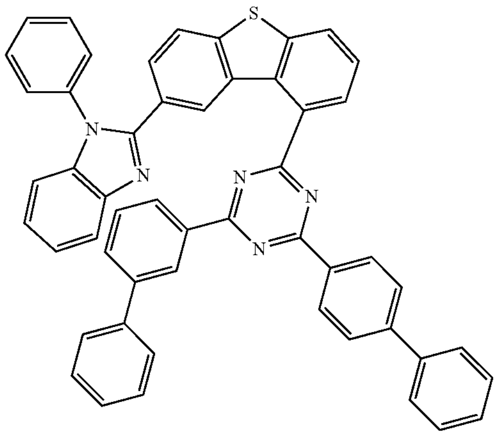
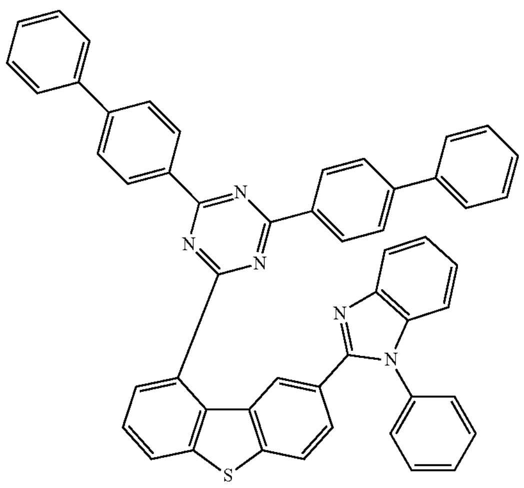
-continued
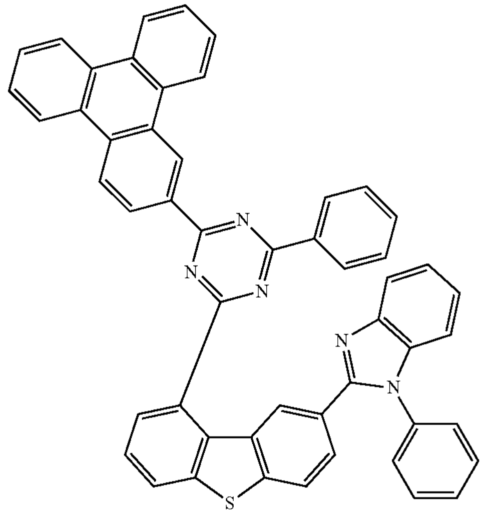
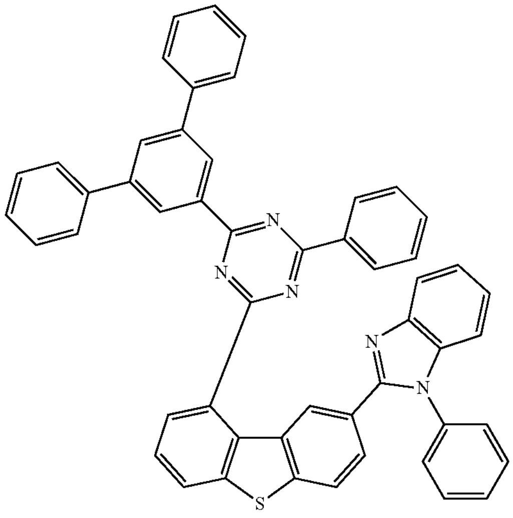
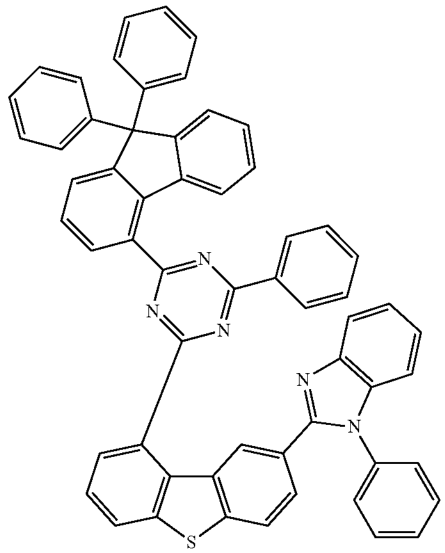

-continued
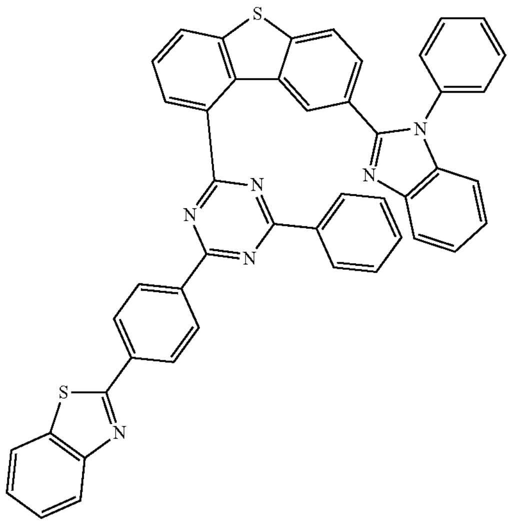
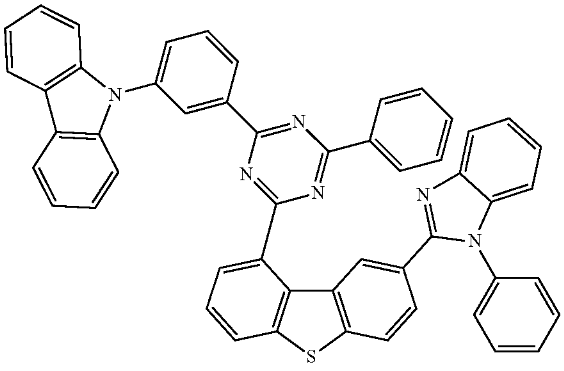
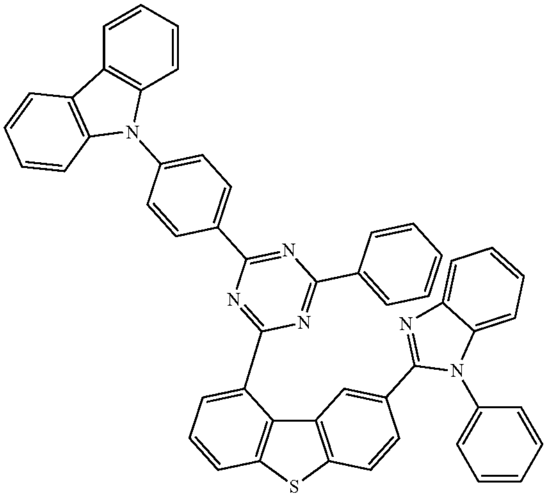
-continued
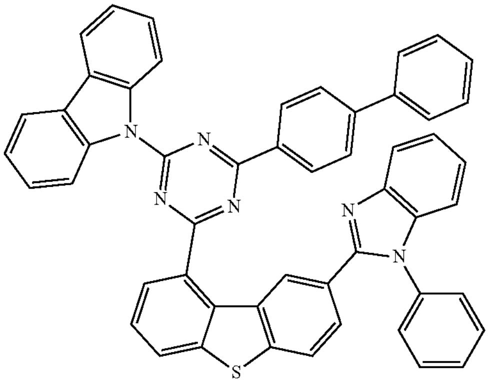
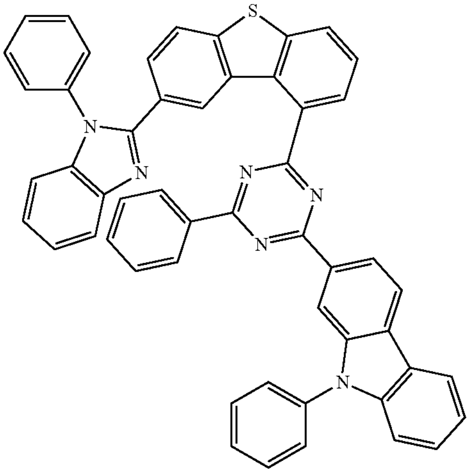
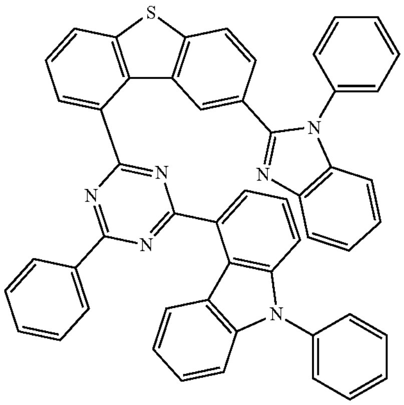

-continued
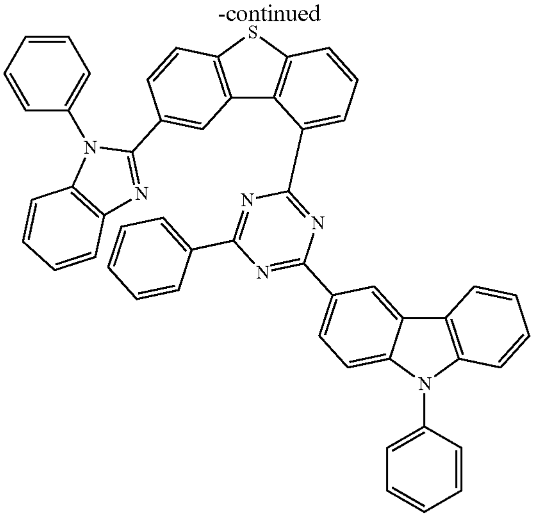
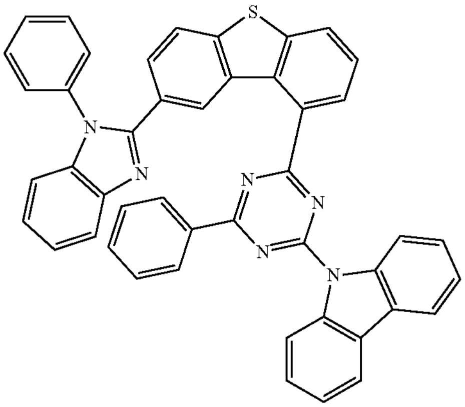
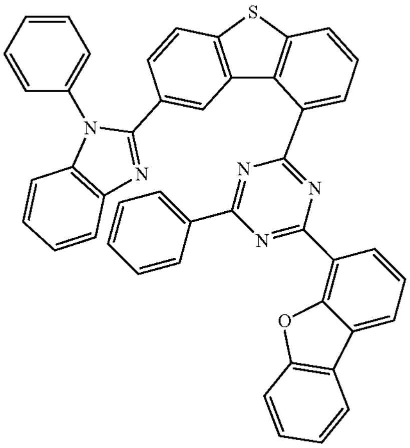
-continued
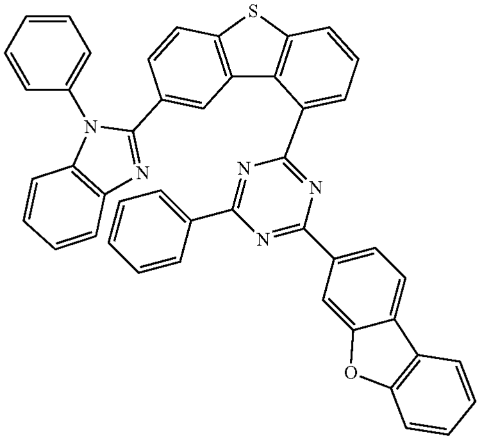
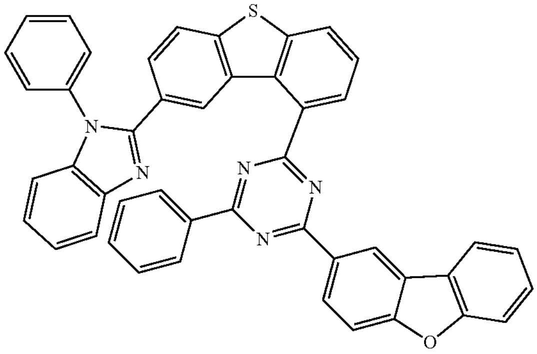
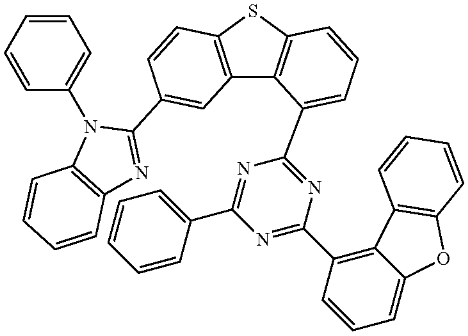
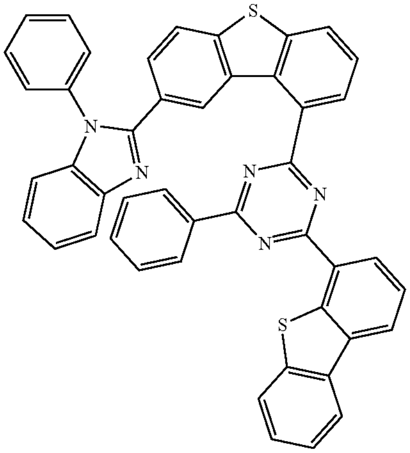

-continued
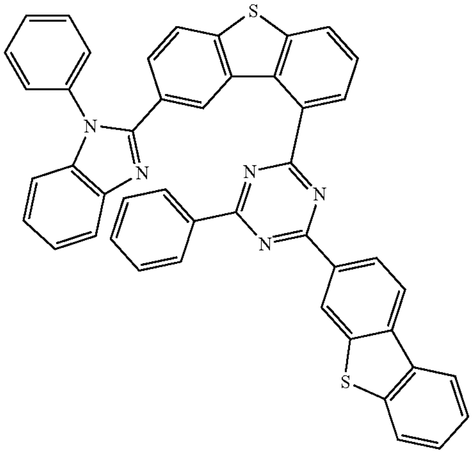
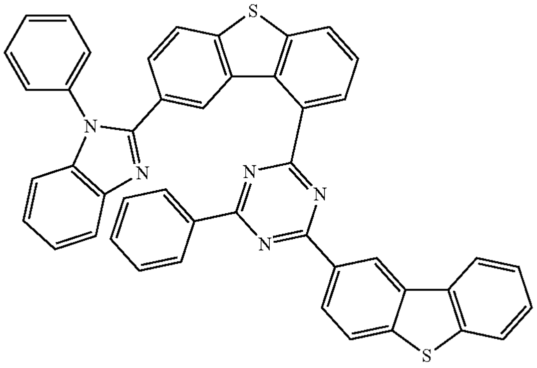
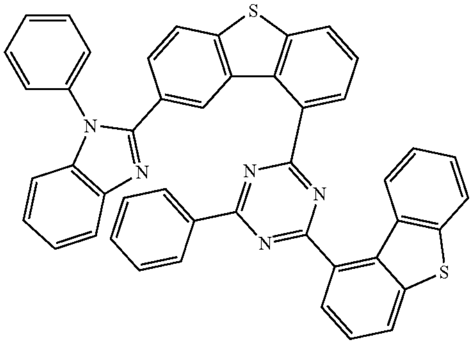
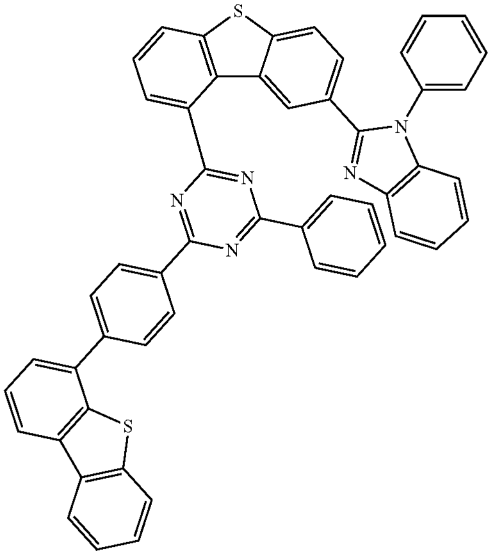
-continued
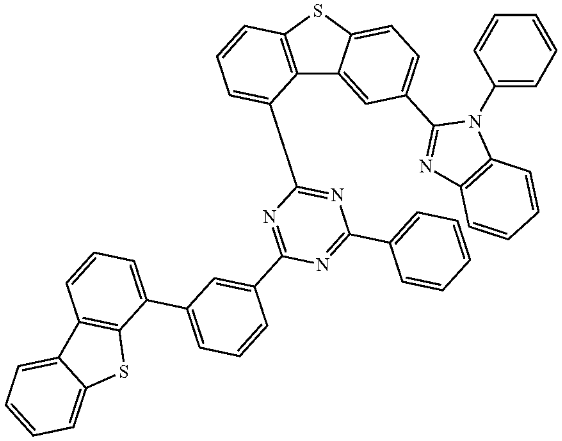
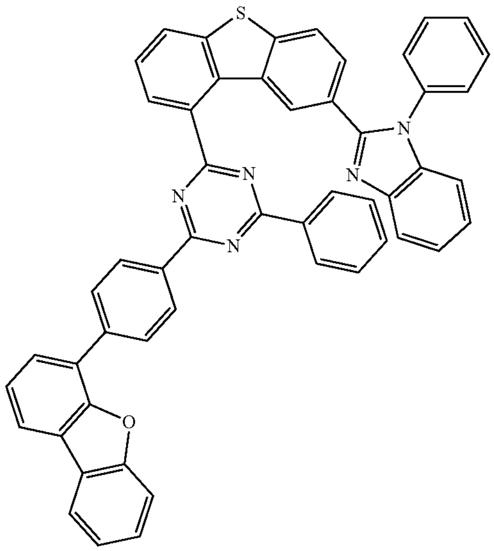
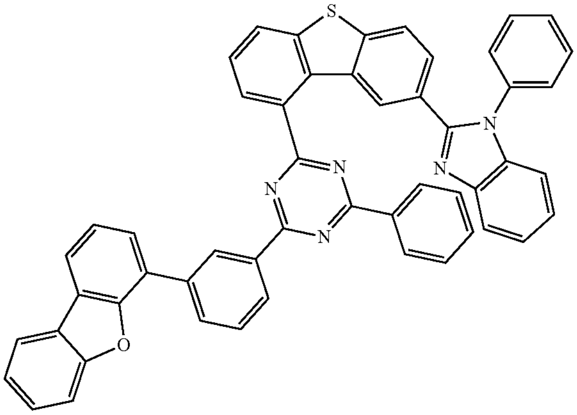

-continued
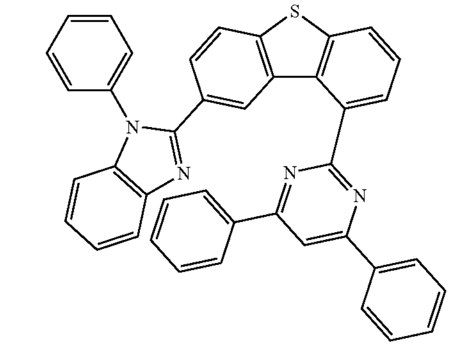
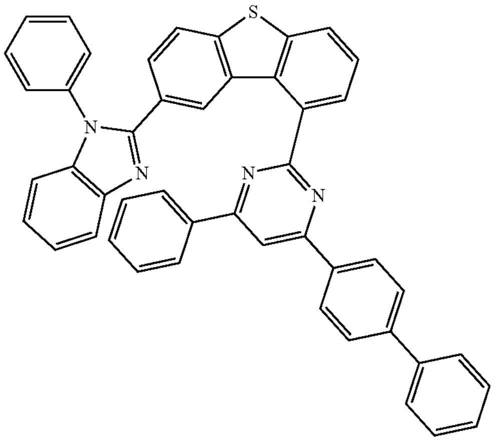
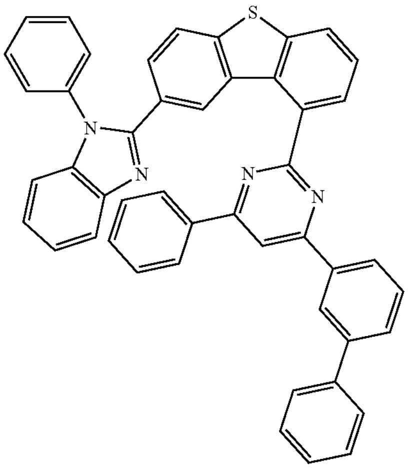
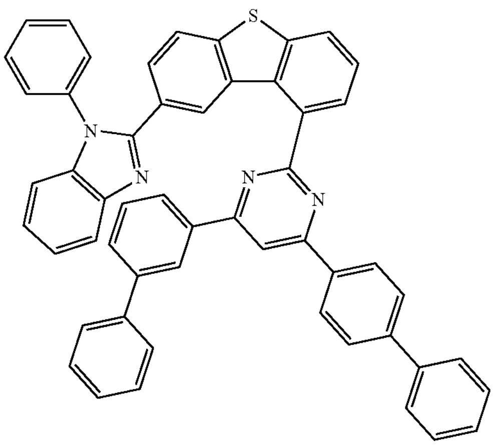
-continued
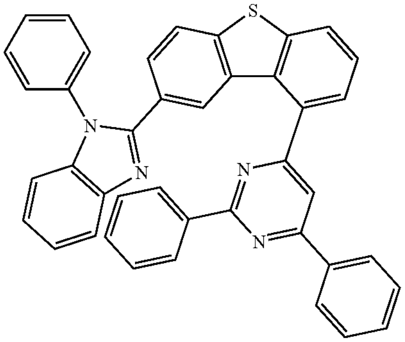
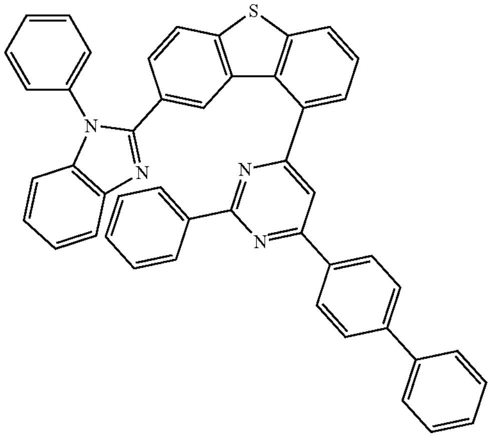
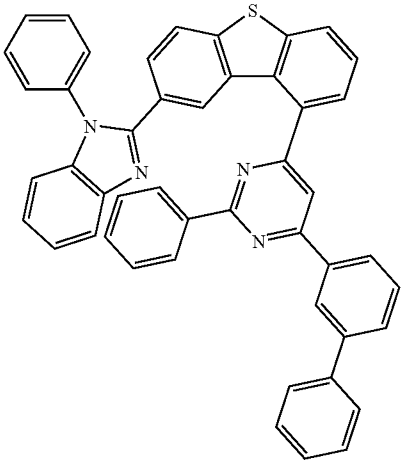
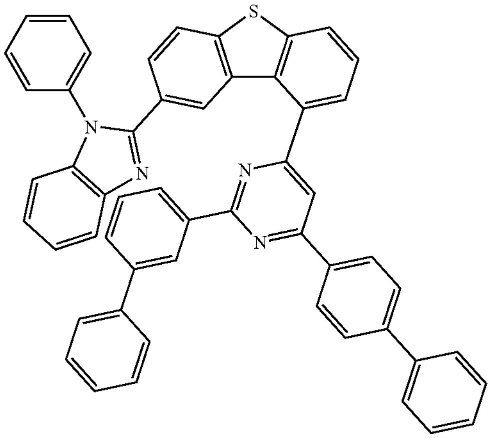

-continued
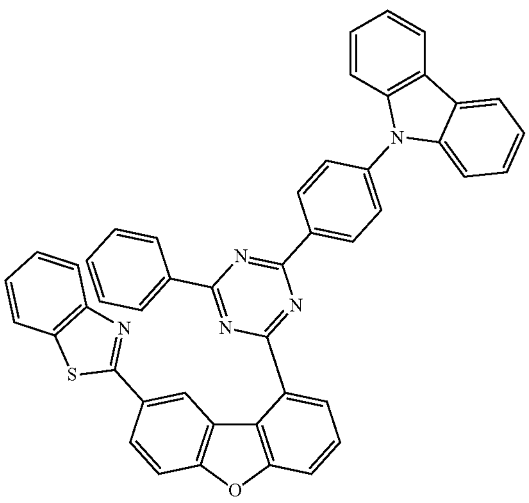
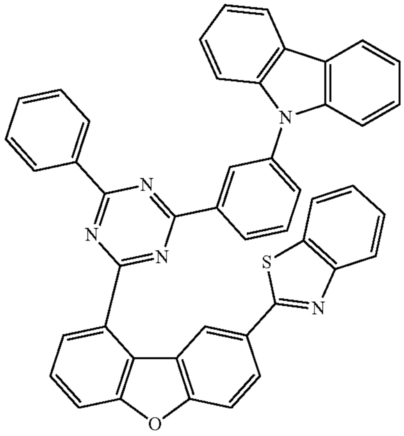
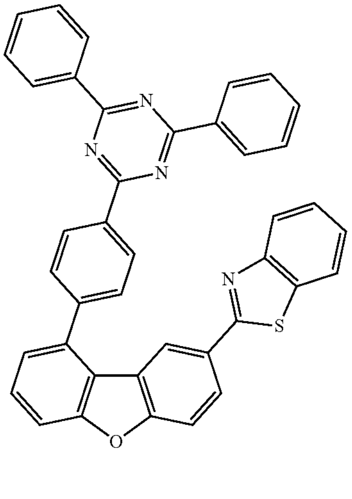
-continued
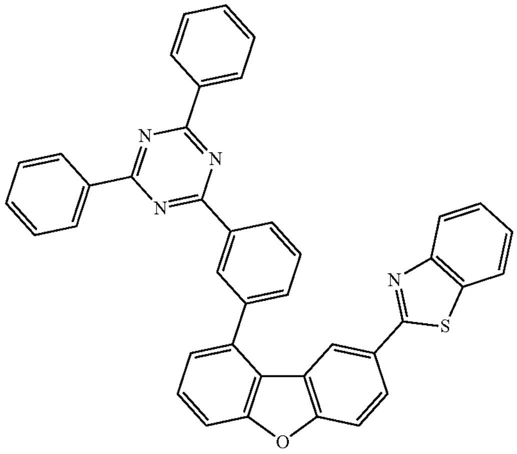
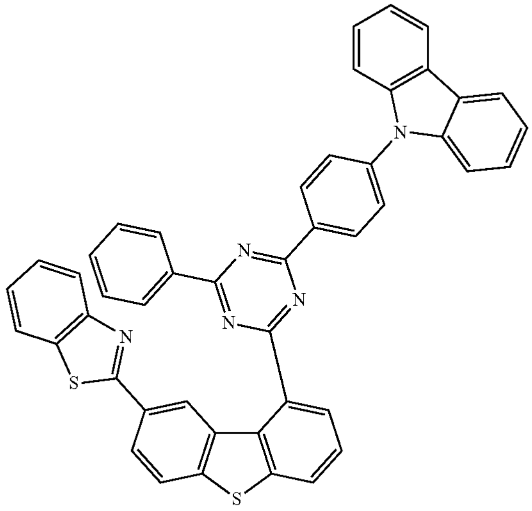
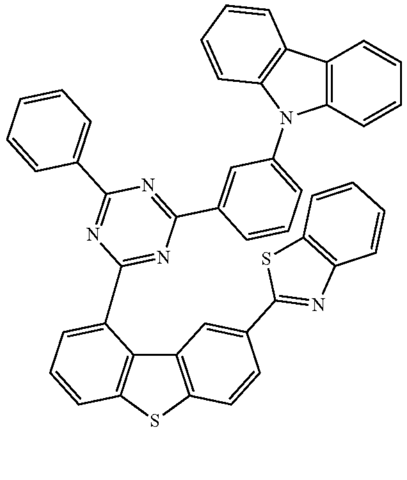

-continued
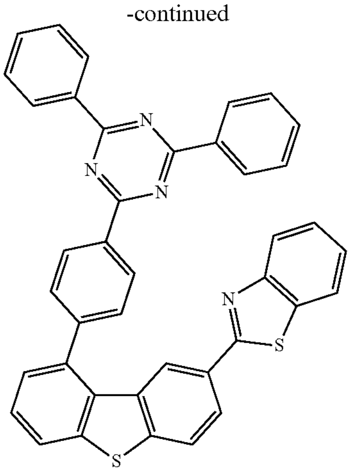
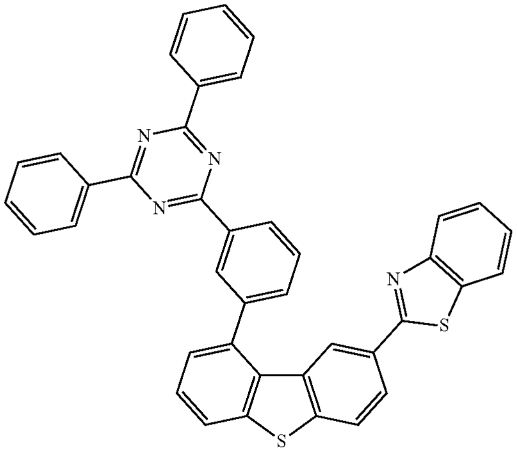
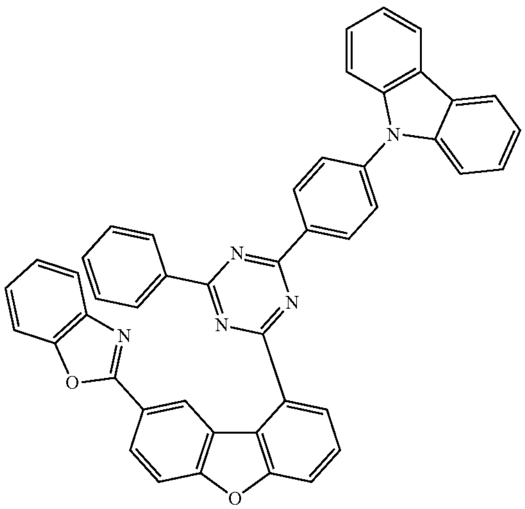
-continued
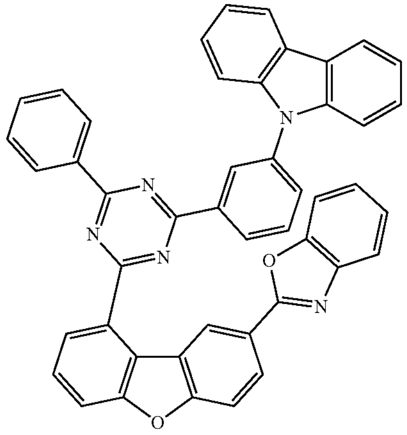
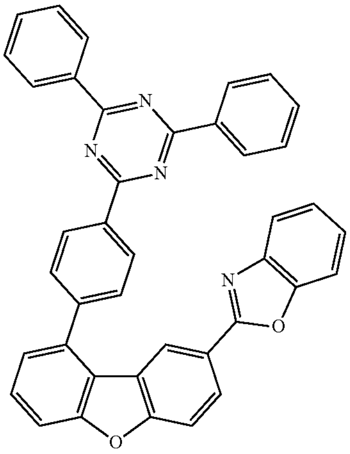
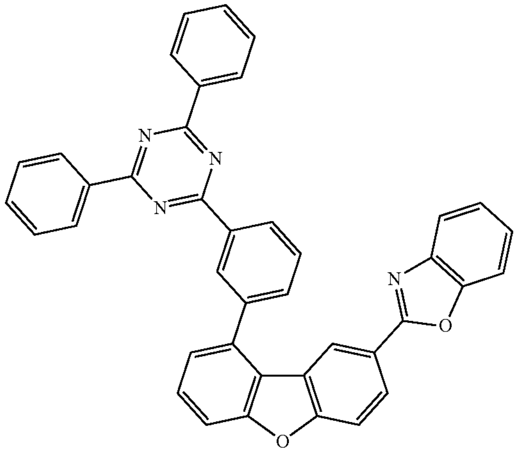

-continued
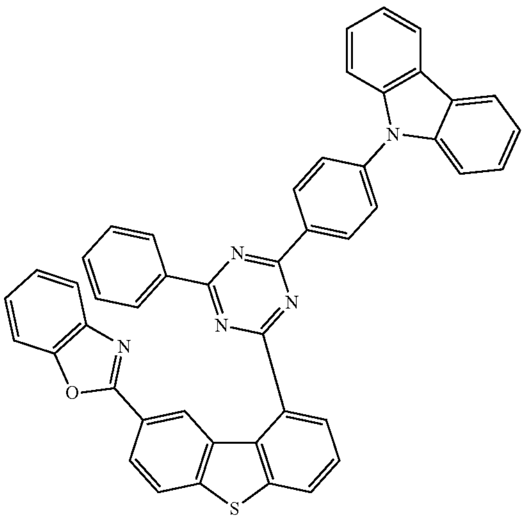
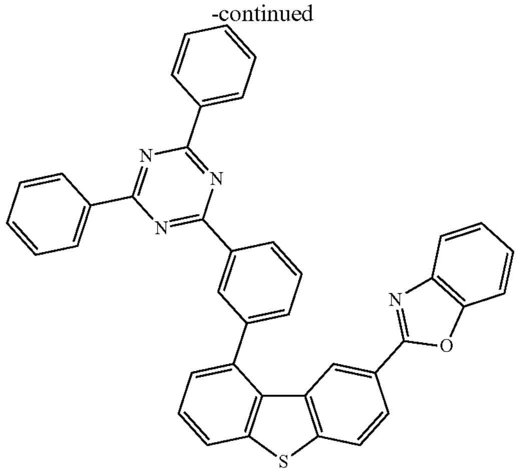
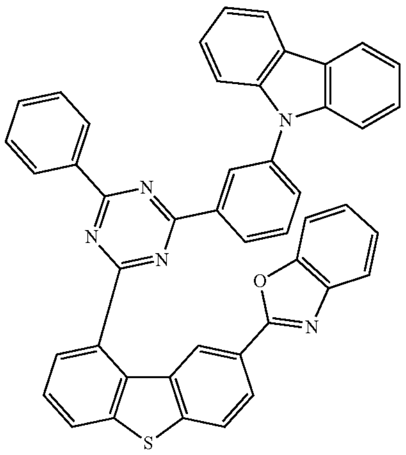
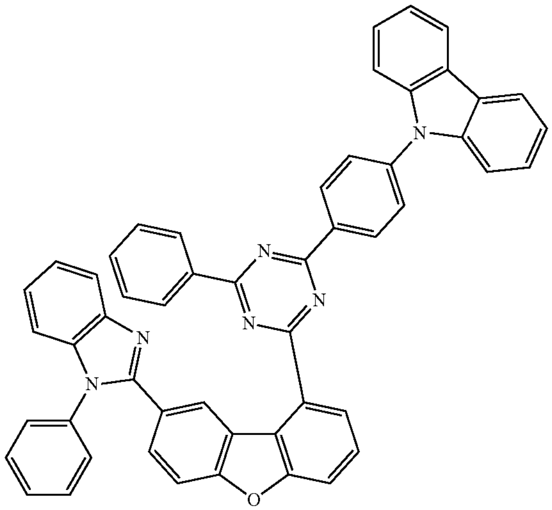
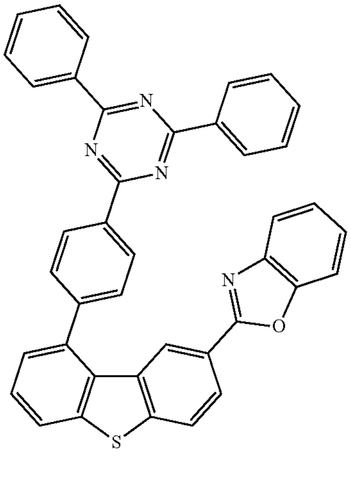
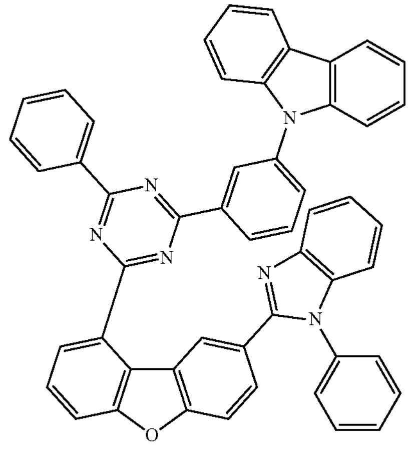
-continued -continued
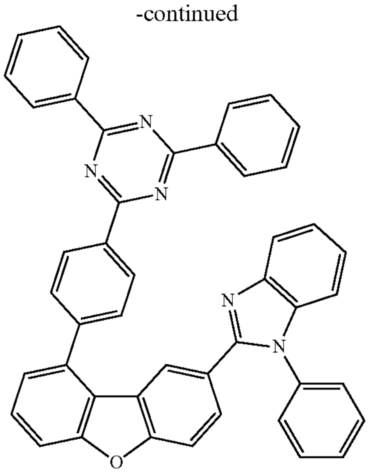
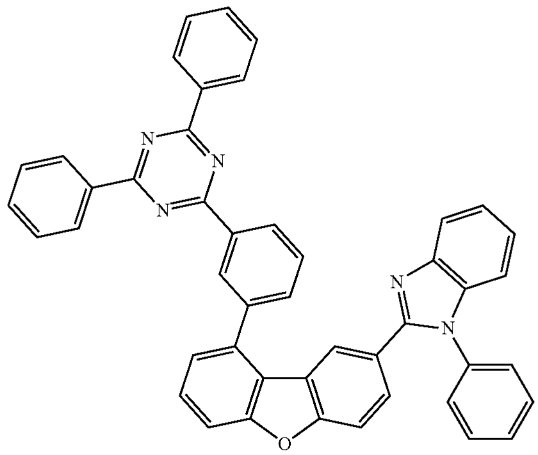
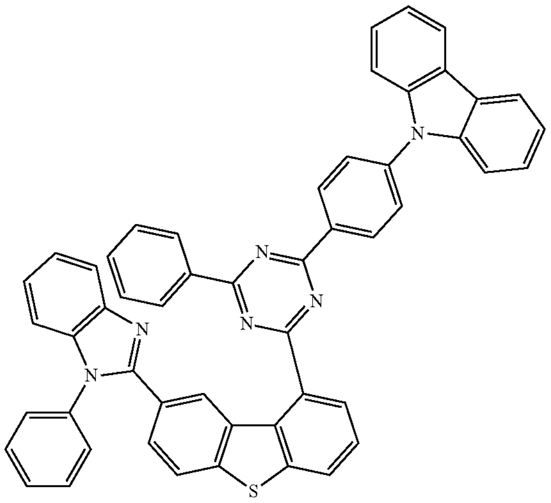
-continued
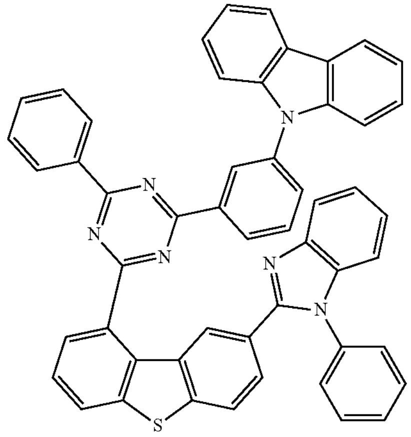
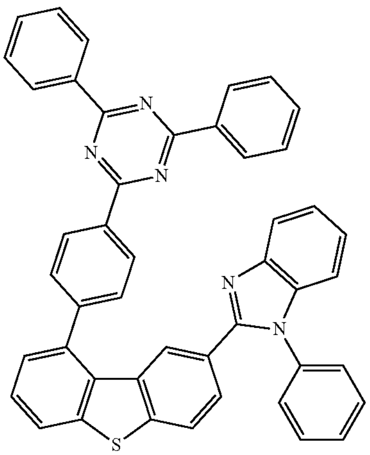
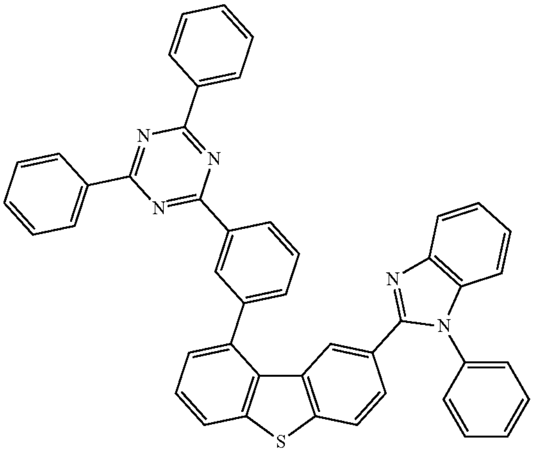

-continued
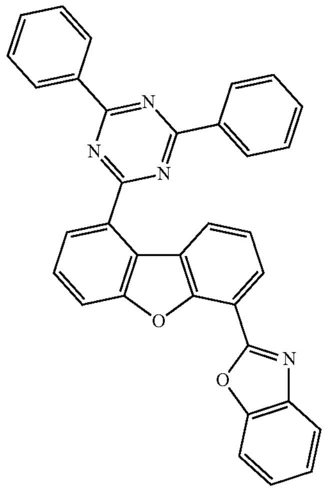
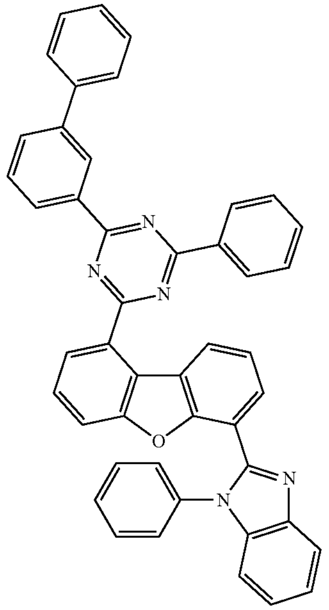
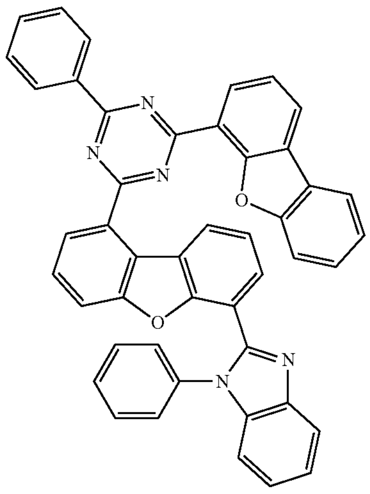
-continued
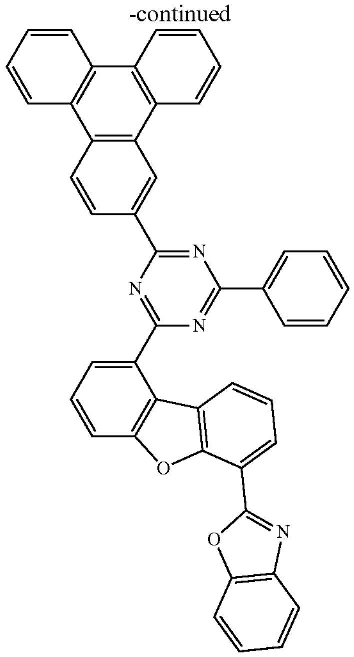
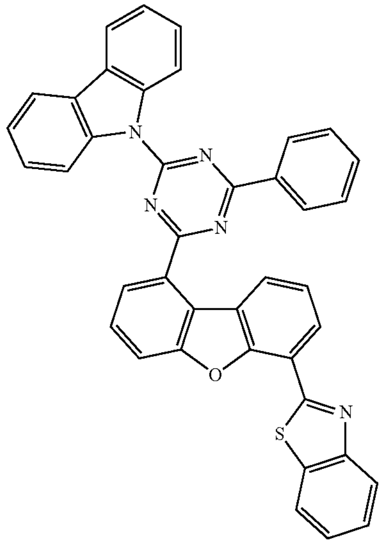

-continued
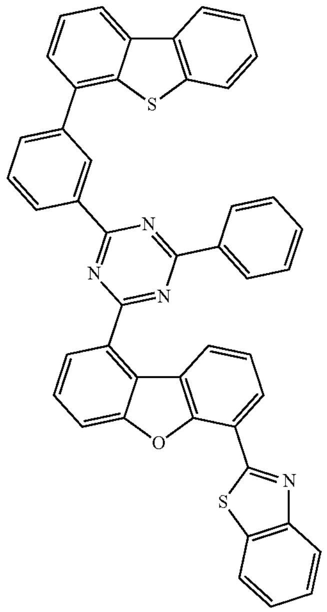
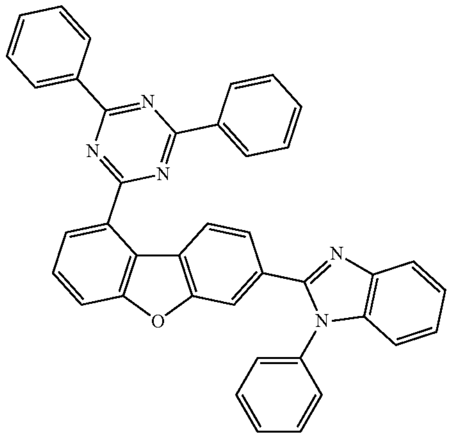
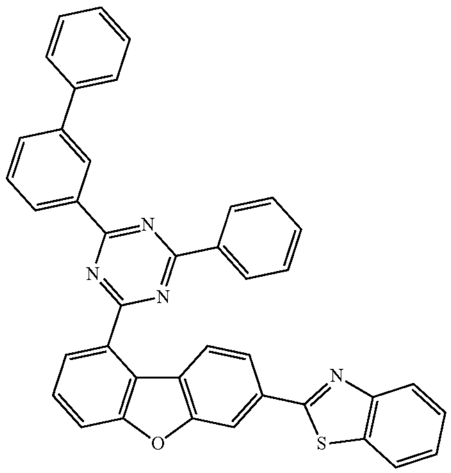
-continued
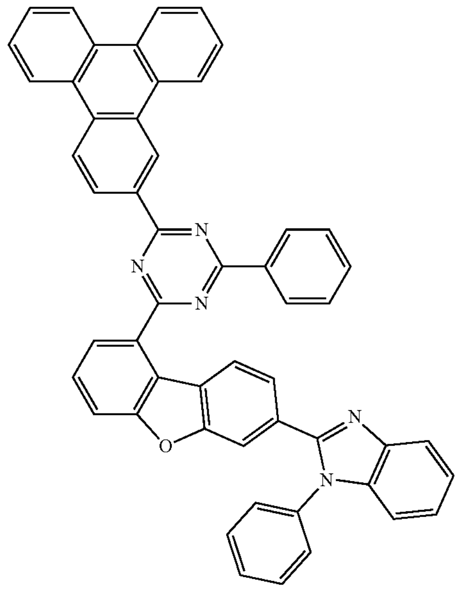
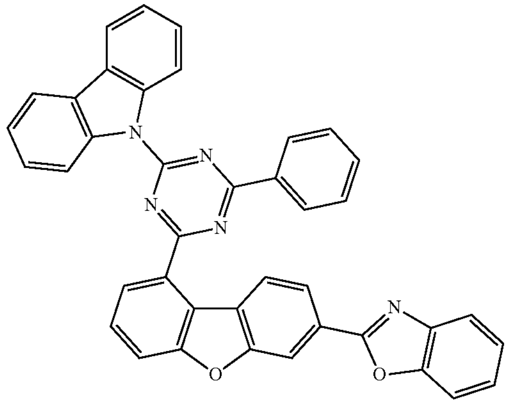
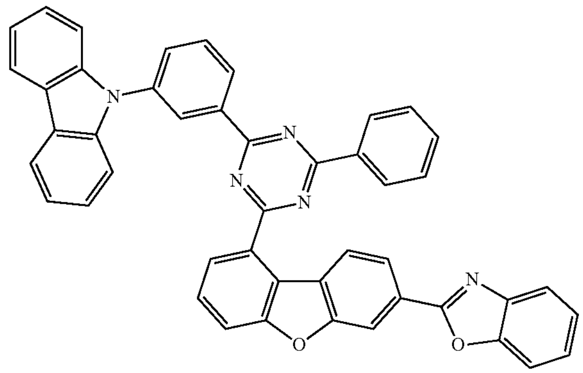

-continued

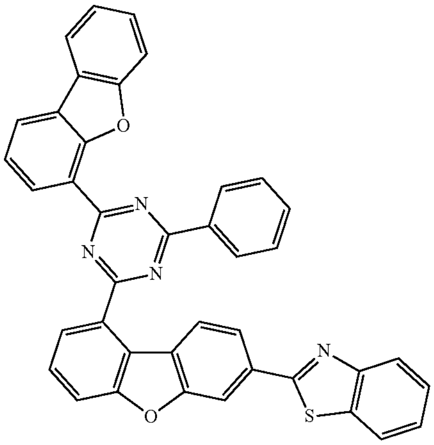

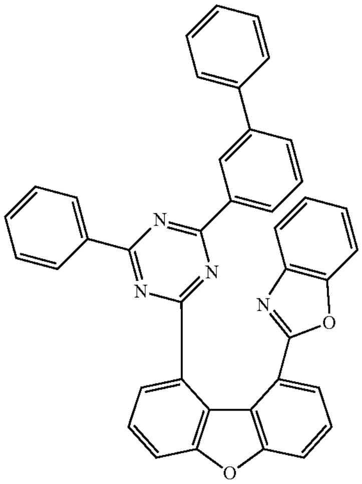

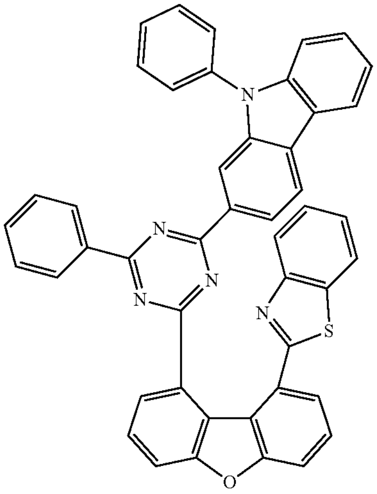

When o is 1 among the compound of Chemical Formula 2, for example, the compound may be prepared by the same method as shown in the following Reaction Scheme 2, and the other remaining compounds can be prepared in a similar manner.

Reaction Scheme 2

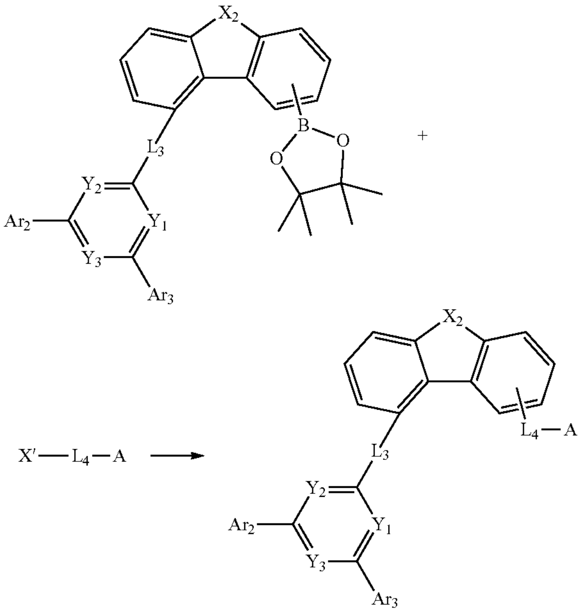

in Reaction Scheme 2 above, $L_3$, $L_4$, $X_2$, A, $Y_1$, $Y_2$, $Y_3$, $Ar_2$ and $Ar_3$ are as defined in Chemical Formula 1, and X' is halogen, preferably X' is chloro or bromo.

The Reaction Scheme 2 is a Suzuki coupling reaction, which is preferably carried out in the presence of a palladium catalyst and a base, and a reactive group for the Suzuki coupling reaction can be modified as known in the art. The above preparation method may be further specified in the Preparation Examples described hereinafter.

The dopant material is not particularly limited as long as it is a material used for the organic light emitting, device. As an example, an aromatic amine derivative, a styrylamine compound, a boron complex, a fluoranthene compound, a metal complex, and the like can be mentioned. Specific examples of the aromatic amine derivatives include substituted or unsubstituted fused aromatic ring derivatives having an arylamino group, examples thereof include pyrene, anthracene, chrysene, and periflanthene having the arylamino group, and the like. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

Hole Blocking Layer

The organic light emitting device according to the present invention may include a hole blocking layer between the light emitting layer and a cathode described above.

The hole blocking layer is a layer provided between the electron transport layer and the light emitting layer in order to prevent the holes injected in the anode from being transferred to the electron transport layer without being recombined in the light emitting layer, which may also be referred to as a hole inhibition layer or a hole blocking layer. The hole blocking layer is preferably a material having the large ionization energy.

Electron Transport Layer

The organic light emitting device according to the present invention may include an electron transport layer between the light emitting layer and the cathode.

The electron transport layer is a layer that receives the electrons from the electron injection layer formed on the cathode or cathode and transports the electrons to the light emitting layer, and that suppress the transfer of holes from the light emitting layer, and an electron transport material is suitably a material which may receive electrons well from a cathode and transfer the electrons to a light emitting layer, and has a large mobility for electrons.

Specific examples of the electron transport material include: an Al complex of 8-hydroxyquinoline; a complex including $Alq_3$; an organic radical compound; a hydroxyflavone-metal complex, and the like, but are not limited thereto. The electron transport layer may be used with any desired cathode material, as used according to a conventional technique. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

Electron Injection Layer

The organic light emitting device according to the present invention may further include an electron injection layer between the electron transport layer and the cathode. The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film.

Specific examples of the electron injection layer include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Organic Light Emitting Device

Figure 2:
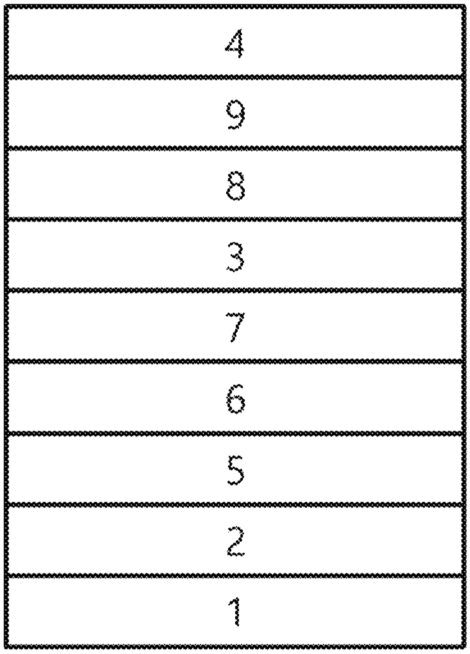
FIG. 2 shows an example of an organic light emitting device comprising a substrate 1, an anode 2, a hole injection layer 5, a hole transport layer 6, an electron blocking layer 7, a light emitting layer 3, an electron transport layer 8, an electron injection layer 9, and a cathode 4.
Figure 3:
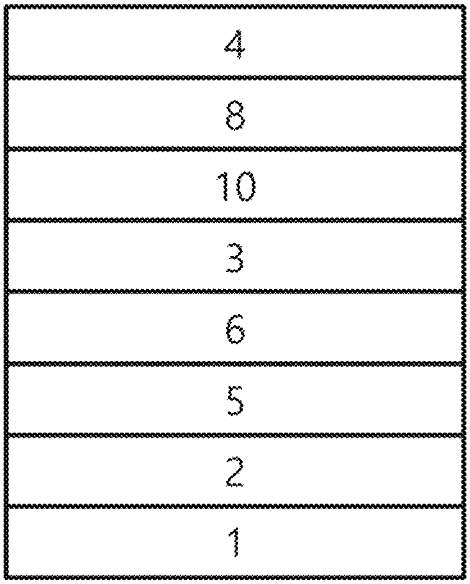
FIG. 3 shows an example of an organic light emitting device comprising a substrate 1, an anode 2, a hole injection layer 5, a hole transport layer 6, a light emitting layer 3, a hole blocking layer 10, an electron transport layer 8, and a cathode 4.

The structure of the organic light emitting device according to the present invention is illustrated in FIG. 1. FIG. 1 shows an example of an organic light emitting device comprising a substrate 1, an anode 2, a light emitting layer 3, and a cathode 4. Also, FIG. 2 shows an example of an organic light emitting device comprising a substrate 1, an anode 2, a hole injection layer 5, a hole transport layer 6, an electron blocking layer 7, a light emitting layer 3, an electron transport layer 8, an electron injection layer 9, and a cathode 4. In addition, FIG. 3 shows an example of an organic light emitting device comprising a substrate 1, an anode 2, a hole injection layer 5, a hole transport layer 6, a light emitting layer 3, a hole blocking layer 10, an electron transport layer 8, and a cathode 4.

The organic light emitting device according to the present invention can be manufactured by sequentially stacking the above-described structures. In this case, the organic light emitting device may be manufactured by depositing a metal, metal oxides having conductivity, or an alloy thereof on the substrate by using a PVD (physical vapor deposition) method such as a sputtering method or an e-beam evaporation method to form the anode, forming the respective layers described above thereon, and then depositing a material that can be used as the cathode thereon. In addition to such a method, the organic light emitting device may be manufactured by sequentially depositing a cathode material, an organic material layer and an anode material on a substrate. Further, the light emitting layer may be formed by subjecting hosts and dopants to a vacuum deposition method and a solution coating method. Herein, the solution coating method means a spin coating, a dip coating, a doctor blading, an inkjet printing, a screen printing, a spray method, a roll coating, or the like, but is not limited thereto.

In addition to such a method, the organic light emitting device may be manufactured by sequentially depositing a cathode material, an organic material layer, and an anode material on a substrate (International Publication WO 2003/012890). However, the manufacturing method is not limited thereto.

On the other hand, the organic light emitting device according to the present invention may be a front side emission type, a back side emission type, or a double side emission type according to the used material.

The preparation of the compound of Chemical Formula 1, the compound of Chemical Formula 2, and the organic light emitting device containing the same will be described in detail in the following examples. However, these examples are presented for illustrative purposes only, and are not intended to limit the scope of the present invention.

Preparation Example 1: Preparation of Compound 1-1

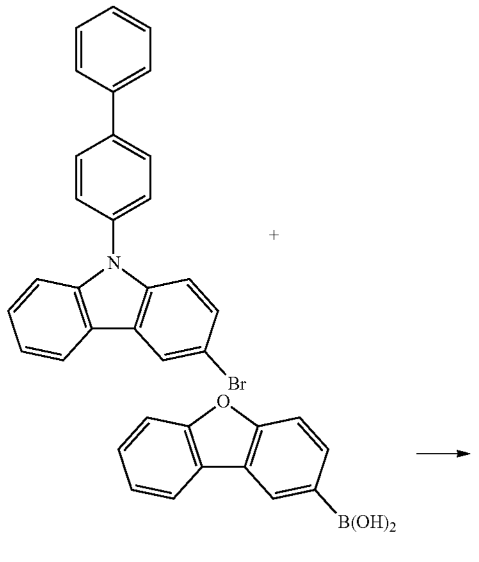

-continued

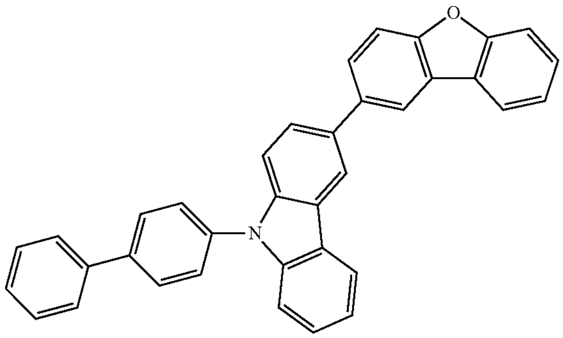

1-1

After 9-(1,1'-biphenyl)-4-yl)-3-bromo-9H-carbazole (15 g, 27 mmol) and dibenzo[b,d]furan-2-ylboronic acid (5.7 g, 27 mmol) were dispersed in tetrahydrofuran (80 ml), 2M aqueous potassium carbonate solution (aq. $K_2CO_3$) (40 ml, 81 mmol) was added and tetrakistriphenylphosphinopalladium [$Pd(PPh_3)_4$] (0.3 g, 1 mol % was added, and then the resulting mixture was stirred and refluxed for 6 hours. The temperature of the mixture was lowered to room temperature, and the aqueous layer was removed and concentrated under reduced pressure. Ethyl acetate was added thereto, stirred at reflux for 1 hour, cooled to room temperature, and the solid was filtered. Chloroform was added to the resulting solid, and the mixture was dissolved under reflux, to which ethyl acetate was added and recrystallized to give Compound 1-1 (11.5 g, yield: 73%, MS: $[M+H]^+$=486).

Preparation Example 2 Preparation of Compound 1-2

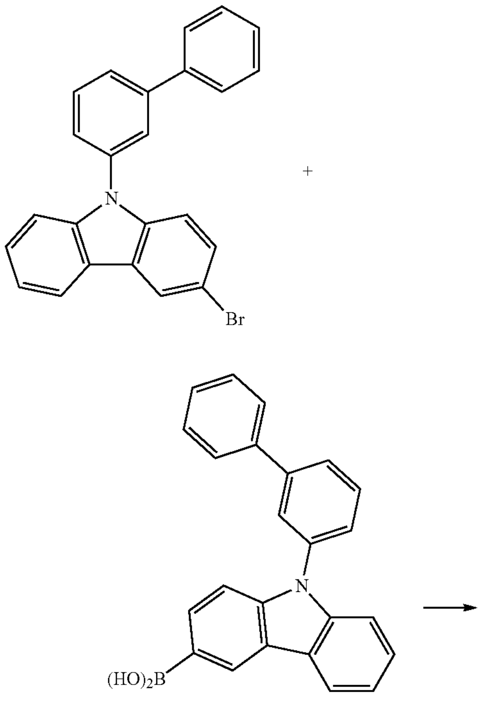

-continued

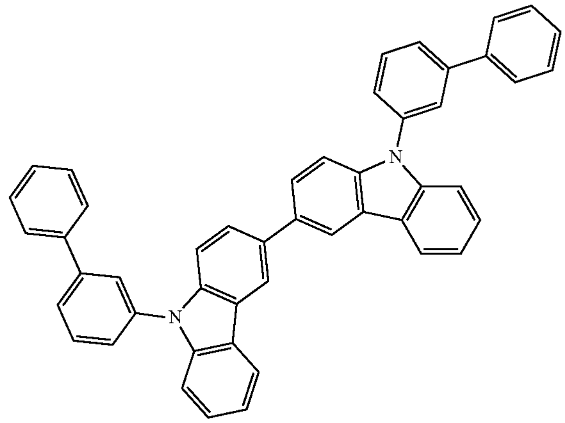

1-2

Compound 1-2 (19.7 g, yield: 77%, MS: $[M+H]^+$=637) was prepared in the same manner as in Preparation Example 1 by using 9-([1,1'-biphenyl]-3-yl)-3-bromo-9H-carbazole (16 g, 40 mmol) and 9-([1,1'-biphenyl]-3-yl)-9H-carbazol-3-yl)boronic acid (14.6 g, 40 mmol).

Preparation Example 3: Preparation of Compound 1-3

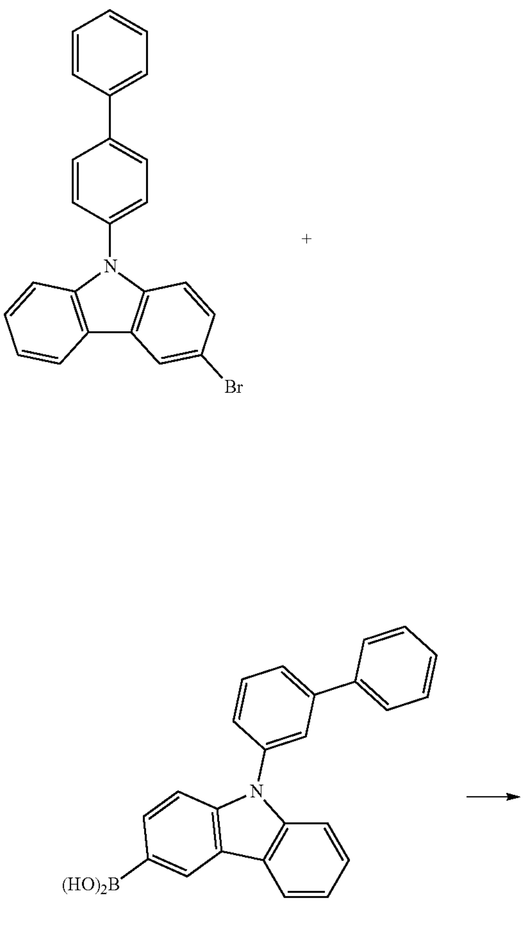

-continued

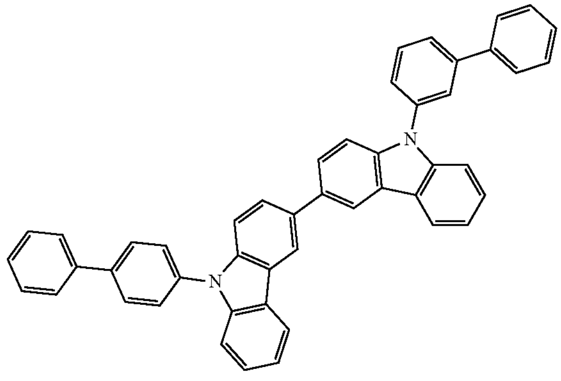

1-3

Compound 1-3 (20.6 g, yield: 80%, MS: $[M+H]^+=637$) was prepared in the same manner as in Preparation Example 1 by using 9-([1,1'-biphenyl]-4-yl)-3-bromo-9H-carbazole (16 g, 40 mmol) and 9-([1,1'-biphenyl]-3-yl)-9H-carbazol-3-yl)boronic acid (14.6 g, 40 mmol).

Preparation Example 4: Preparation of Compound 1-4

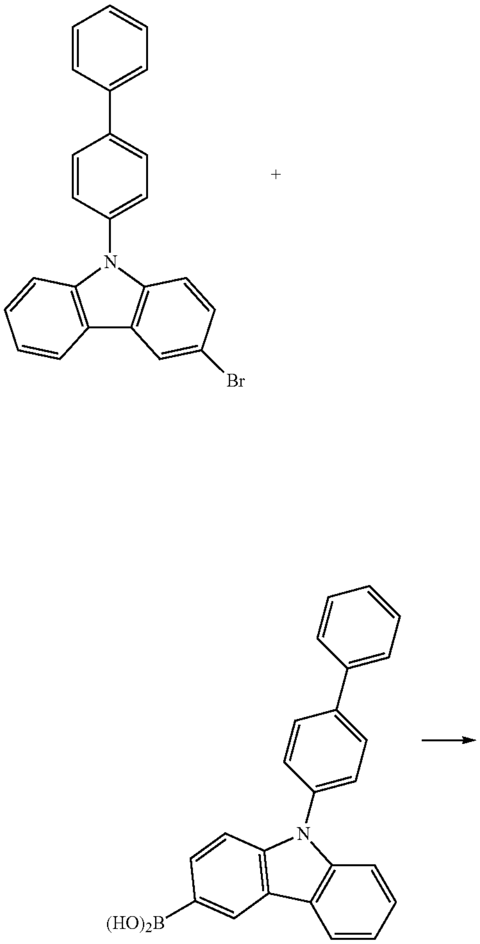

-continued

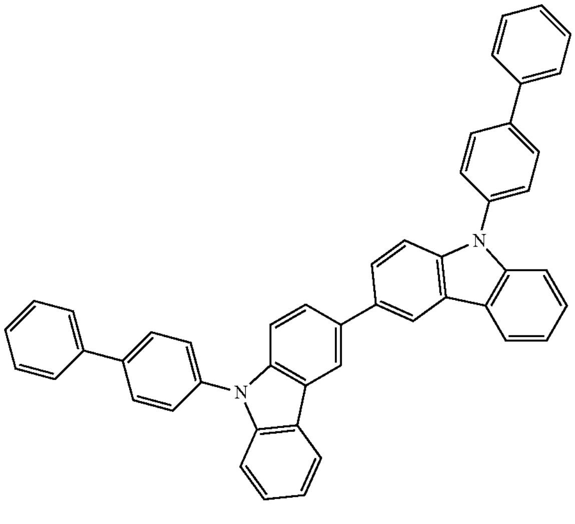

1-4

Compound 1-4 (22.5 g, yield: 88%, MS: $[M+H]^+=637$) was prepared in the same manner as in Preparation Example 1 by using 9-([1,1'-biphenyl]-4-yl)-3-bromo-9H carbazole (16 g, 40 mmol) and 9-([1,1'-biphenyl]-4-yl)-9H-carbazol-3-yl)boronic acid (14.6 g, 40 mmol).

Preparation Example 5: Preparation of Compound 1-5

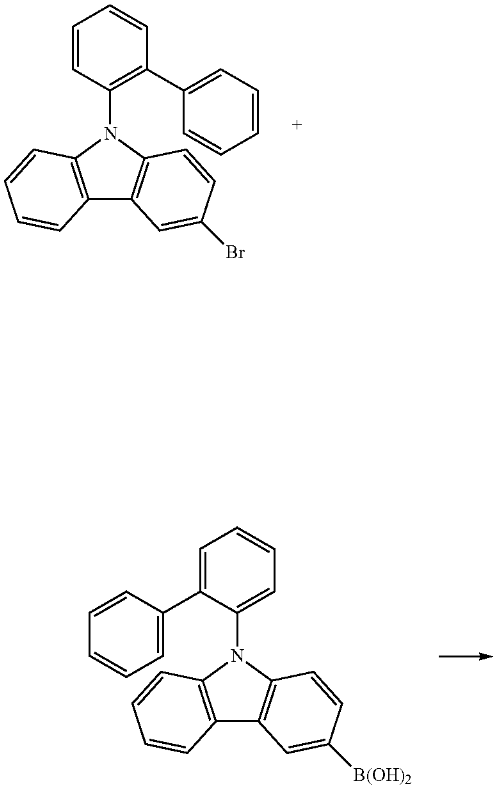

-continued

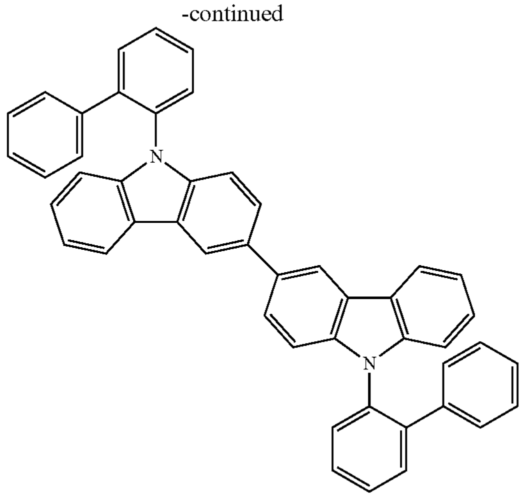

1-5

Compound 1-5 (7.2 g, yield: 28%, MS: $[M+H]^+=637$) was prepared in the same manner as in Preparation Example 1 by using 9-([1,1'-biphenyl]-2-yl)-3-bromo-9H-carbazole (16 g, 50 mmol) and 9-([1,1'-biphenyl]-2-yl)-9H-carbazol-3-yl)boronic acid (146 g, 40 mmol).

Preparation Example 6: Preparation of Compound 1-6

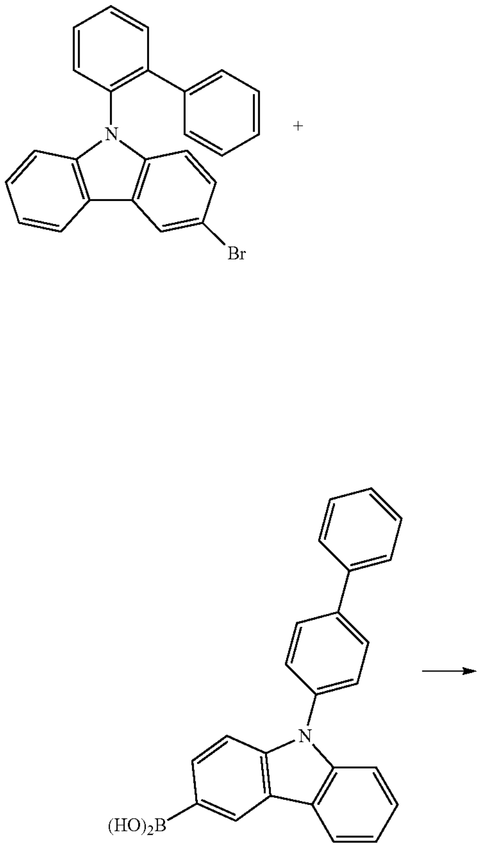

-continued

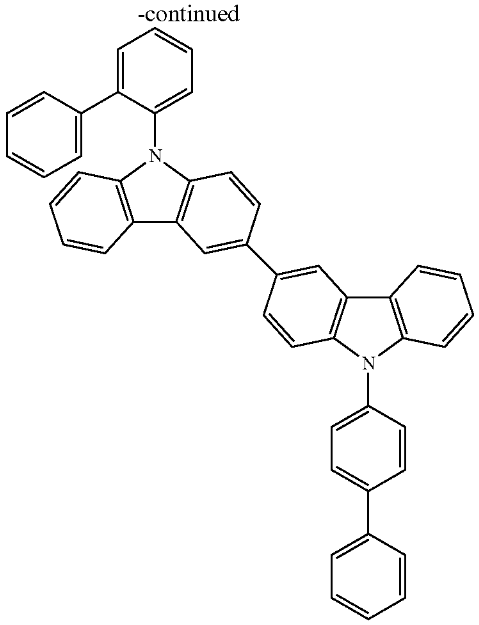

1-6

Compound 1-6 (10.3 g, yield: 40%, MS: $[M+H]^+=637$) was prepared in the same manner as in Preparation Example 1 by using 9-([1,1'-biphenyl]-2-yl)-3-bromo-9H-carbazole (16 g, 50 mmol) and 9-([1,1'-biphenyl]-4-yl)-9H-carbazol-3-yl)boronic acid (14.6 g, 40 mmol).

Preparation Example 7: Preparation of Compound 1-7

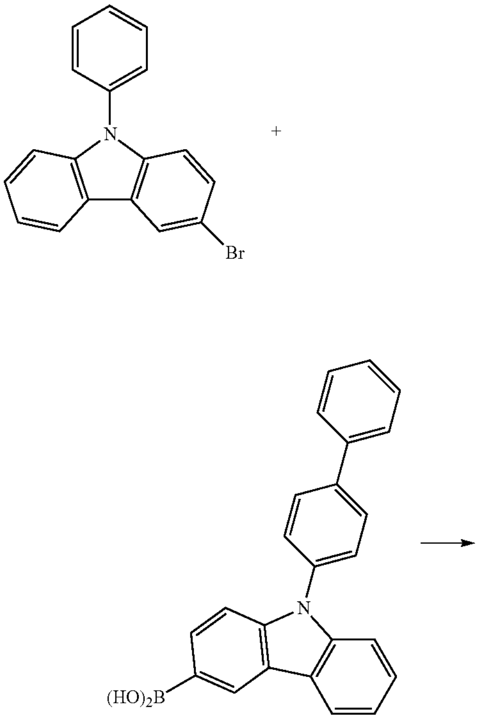

-continued

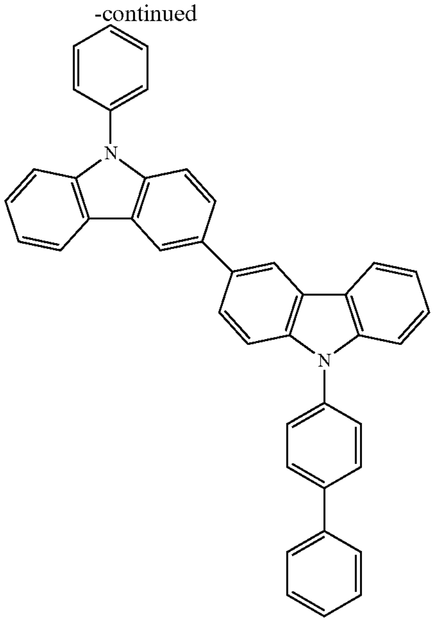

1-7

Compound 1-7 (19.7 g, yield: 71%, MS: [M+H]$^+$=561) was prepared in the same manner as in Preparation Example 1 by using 3-bromo-9-phenyl-9H-carbazole (16 g, 50 mmol) and 9-([1,1'-biphenyl]-4-yl)-9H-carbazol-3-yl)boronic acid (18.03 g, 50 mmol).

Preparation Example 8: Preparation of Compound 1-8

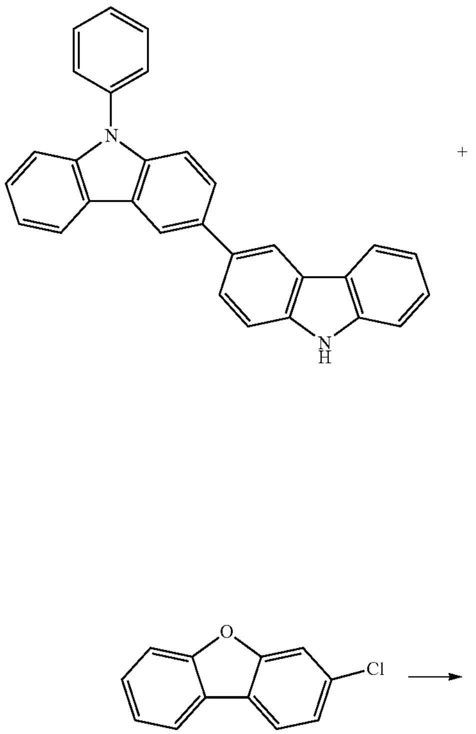

-continued

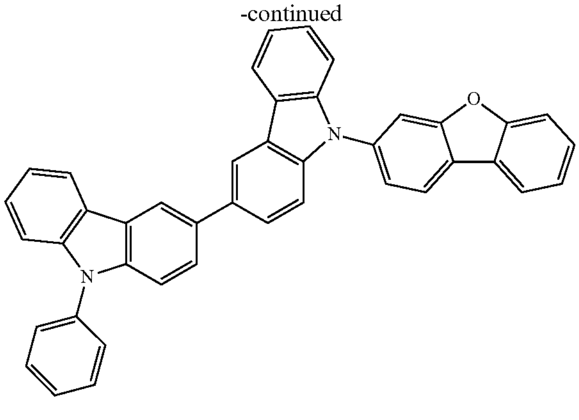

1-8

9-Phenyl-9H,9'H-3,3'-bicarbazole (15 g, 40 mmol), 3-chlorodibenzofuran (7.44 g, 36 mmol), bis(tri-tert-butylphosphine)palladium(0) (0.18 g, 0.37 mmol), and sodium tert-butoxide (5.29 g, 55 mmol) were added to 120 mL of xylene under a nitrogen atmosphere, and the resulting mixture was heated and stirred for 5 hours. The reaction mixture was cooled to room temperature and filtered to remove the base, and then xylene was concentrated under reduced pressure, which was then dissolved in chloroform and washed with water, and then water was removed with $MgSO_4$ and the solvent was removed. Subsequently, the resulting material was recrystallized from a mixture of ethyl acetate and toluene to give Compound 1-8 (13.6 g, yield: 64%, MS: [M+H]$^+$=575).

Preparation Example 9-1: Preparation of Compound A-4

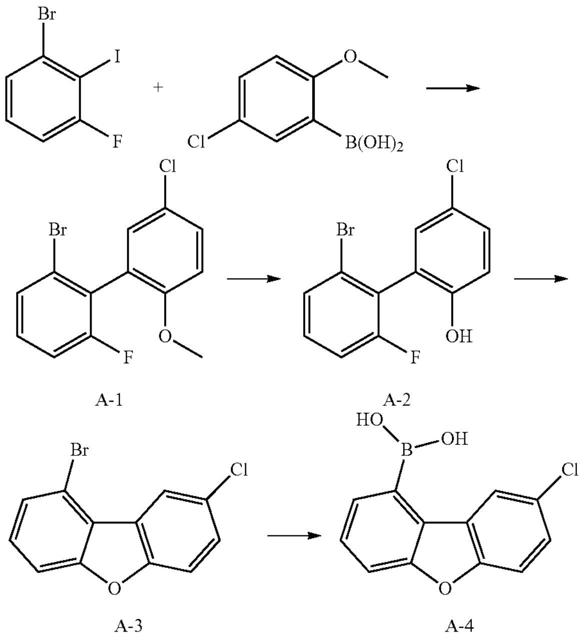

1) Preparation of Compound A-1

1-Bromo-3-fluoro-2-iodobenzene (75 g, 249.3 mmol) and (5-chloro-2-methoxyphenyl)boronic acid (51.1 g, 249.3 mmol) were dissolved in 550 mL of tetrahydrofuran. Sodium carbonate ($Na_2CO_3$) 2M solution (350 mL) and tetrakis(triphenylphosphine)palladium(0) (2.88 g, 2.49 mmol) were added thereto and refluxed for 11 hours. After completion of the reaction, the reaction mixture was cooled to room temperature, and the aqueous layer was separated and removed, dried over anhydrous magnesium sulfate, and concentrated under reduced pressure. The resulting mixture was recrystallized from chloroform and ethanol to give Compound A-1 (63.2 g, yield: 80%; MS: $[M+H]^+$=314).

2) Preparation of Compound A-2

Compound A-1 (63.2 g, 200.3 mmol) was dissolved in 750 mL of dichloromethane and then cooled to 0° C. Boron tribromide (20.0 mL, 210.3 mmol) was slowly added dropwise and then stirred for 12 hours. After completion of the reaction, the reaction mixture was washed three times with water, dried over magnesium sulfate and filtered. The filtrate was distilled under reduced pressure and purified by column chromatography to give Compound A-2 (57.9 g, yield: 96%; MS: $[M+H]^+$=300).

3) Preparation of Compound A-3

Compound A-2 (57.9 g, 192.0 mmol) and calcium carbonate (79.6 g, 576.0 mol) were dissolved in 350 mL of N-methyl-2-pyrrolidone and then heated and stirred for 2 hours. The reaction mixture was cooled to room temperature, subjected to reverse precipitation in water and filtered. It was completely dissolved in dichloromentane, washed with water, dried over anhydrous magnesium sulfate, then concentrated under reduced pressure, recrystallized using ethanol and dried to give compound A-3 (42.1 g, yield: 78%; MS: [M+]+=280).

4) Preparation of Compound A-4

After Compound A-3 (42.1 g, 149.5 mmol) was dissolved in tetrahydrofuran (330 mL), the temperature was lowered to −78° C. and 2.5 M Cert-butyllithium (t-BuLi) (60.4 mL, 151.0 mmol) was slowly added thereto. After stirring at the same temperature for 1 hour, triisopropylborate (51.8 mL, 224.3 mmol) was added thereto and then stirred for 3 hours while gradually raising the temperature to room temperature. 2N aqueous hydrochloric acid solution (300 mL) was added to the reaction mixture and stirred at room temperature for 1.5 hours. The resulting precipitate was filtered, washed sequentially with water and ethyl ether and then dried in vacuo to give compound A-4 (34.3 g, yield: 93%; MS: $[M+H]^+$=247).

Preparation Example 9-2: Preparation of Compound B-5

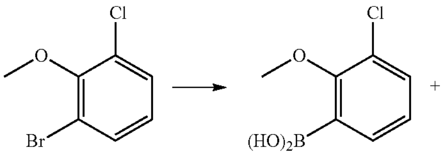

B-1

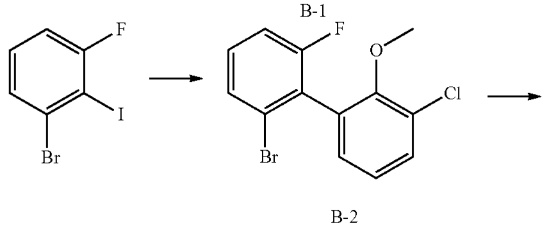

B-2

-continued

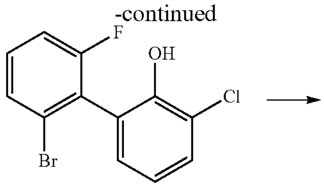

B-3

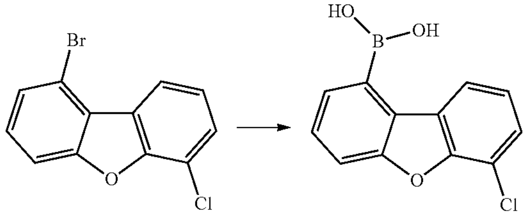

B-4 B-5

1) Preparation of Compound B-1

After 1-bromo-3-chloro-2-methoxybenzene (100.0 g, 451.5 mmol) was dissolved in tetrahydrofuran (1000 mL), the temperature was lowered to −78° C. and 2.5 M tert-butyllithium (t-BuLi) (182.4 mL, 456.0 mmol) was slowly added dropwise. After stirring at the same temperature for 1 hour, triisopropylborate ($B(OiPr)_3$, 156.3 mL, 677.3 mmol) was added thereto and then stirred for 3 hours while gradually raising the temperature to room temperature. 2N aqueous hydrochloric acid solution (150 mL) was added to the reaction mixture, and stirred at room temperature for 1.5 hours. The resulting precipitate was filtered, washed sequentially with water and ethyl ether, and dried in vacuo After drying, the result was recrystallized with chloroform and ethyl acetate and dried to give Compound B-1 (84.2 g, yield: 90%; MS: $[M+H]^+$=230).

2) Preparation of Compound B-2

Compound B-2 (74.6 g, yield: 52%; MS: $[M+H]^+$=314) was prepared in the same manner as in Preparation of Compound A-1 in Preparation Example 9-1, except that Compound B-1 (84.2 g, 451.7 mmol) was used instead of (5-chloro-2-methoxyphenyl)boronic acid.

3) Preparation of Compound B-3

Compound B-3 (60.3 g, yield: 85%; MS: $[M+H]^+$=300) was prepared in the same manner as in Preparation of compound A-2, except that Compound B-2 (74.6 g, 236.4 mmol) was used instead of Compound A-1.

4) Preparation of Compound B-4

Compound B-4 (48.1 g, yield: 85%; MS: $[M+H]^+$=280) was prepared in the same manner as in Preparation of Compound A-3, except that Compound B-3 (60.3 g, 199.9 mmol) was used instead of Compound A-2.

5) Preparation of Compound B-5

Compound B-5 (40.1 g, yield: 95%; MS: $[M+H]^+$=247) was prepared in the same manner as in Preparation of Compound A-4, except that Compound B-4 (48.1 g, 170.9 mmol) was used instead of Compound A-3.

Preparation Example 9-3: Preparation of Compound C-4

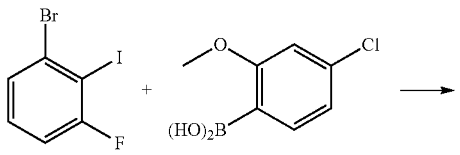

-continued

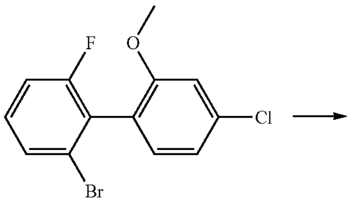

C-1

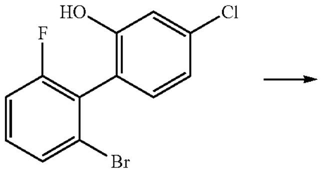

C-2

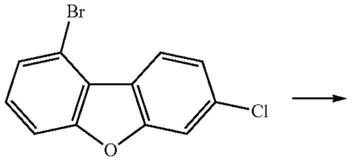

C-3

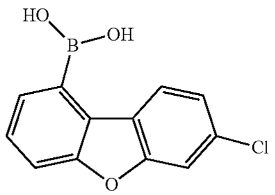

C-4

1) Preparation of Compound C-1

Compound C-1 (60.1 g, yield: 76%; MS: $[M+H]^+$=314) was prepared in the same manner as in Preparation of Compound A-1 of Preparation Example 9-1, except that (4-chloro-2-methoxyphenyl)boronic acid (51.1 g, 249.3 mmol) was used instead of (5-chloro-2-methoxyphenyl) boronic acid.

2) Preparation of Compound C-2

Compound C-2 (54.0 g, yield: 94%; MS: $[M+H]^+$=300) was prepared in the same manner as in Preparation of Compound A-2, except that Compound C-1 (60.1 g, 190.4 mmol) was used instead of Compound A-1.

3) Preparation of Compound C-3

Compound. C-3 (42.2 g, yield: 83%; MS: $[M+H]^+$=280) was prepared in the same manner as in Preparation of Compound A-3, except that Compound C-2 (54.0 g, 179.1 mmol) was used instead of Compound A-2.

4) Preparation of Compound C-4

Compound C-4 (34.1 g, yield: 92%; MS: $[M+H]^+$=247) was prepared in the same manner as in Preparation of Compound A-4, except that Compound C-3 (42.2 g, 170.9 mmol) was used instead of Compound A-3.

Preparation Example 9-4: Preparation of Compound D-4

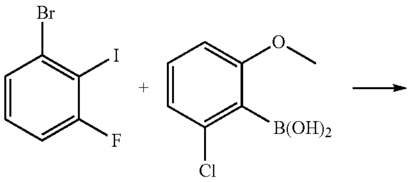

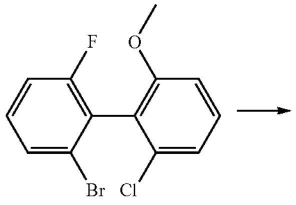

D-1

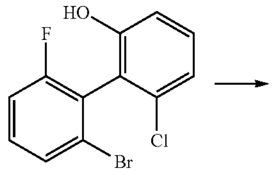

D-2

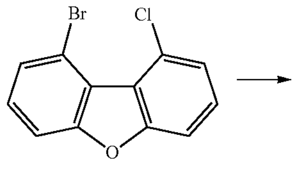

D-3

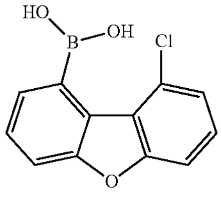

D-4

1) Preparation of Compound D-1

Compound D-1 (63.5 g, yield: 81%; MS: $[M+H]^+$=314) was prepared in the same manner as in Preparation of Compound A-1 of Preparation Example 9-1, except that (2-chloro-6-methoxyphenyl)boronic acid (51.1 g, 249.3 mmol) was used instead of (5-chloro-2-methoxyphenyl) boronic acid.

2) Preparation of Compound D-2

Compound D-2 (55.1 g, yield: 91%; MS: $[M+H]^+$=300) was prepared in the same manner as in Preparation of Compound A-2, except that Compound (63.5 g, 201.2 mmol) was used instead of Compound A-1.

3) Preparation of Compound D-3

Compound D-3 (42.0 g, yield: 82%; MS: $[M+H]^+$=280) was prepared in the same manner as in Preparation of Compound A-3, except that Compound D-2 (55.1 g, 182.7 mmol) was used instead of Compound A-2, 4) Preparation of Compound D-4

Compound D-4 (35.7 g, yield: 85%; MS: $[M+H]^+$=247) was prepared in the same manner as in Preparation of Compound A-4, except that Compound D-3 (42.0 g, 149.2 mmol) was used instead of Compound A-3, Preparation Example 10-1: Preparation of Compound A-6

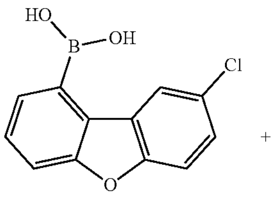

A-4

-continued

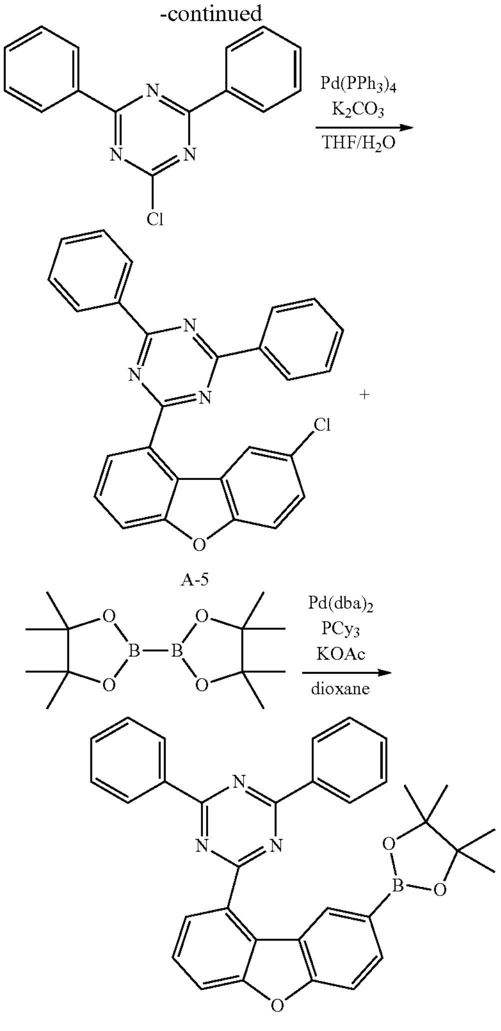

A-5

A-6

1) Preparation of Compound A-5

Compound A-4 (20.0 g, 61 mmol) and 2-chloro-4,6-diphenyltriazine (16.3 g, 61 mmol) were dissolved in 200 mL of tetrahydrofuran in a 500 mL round bottom flask under a nitrogen atmosphere, to which 1.5 M aqueous potassium carbonate solution (100 mL) was added and tetrakis-(triphenylphosphine)palladium (0.93 g, 1.8 mmol) was added, and then the resulting mixture was heated and stirred for 7 hours. The temperature was lowered to room temperature, and the aqueous layer was separated and removed, dried over anhydrous magnesium sulfate, then concentrated under reduced pressure, and recrystallized with tetrahydrofuran and ethyl acetate mixed solution and dried to give Compound A-5 (20.5 g, yield: 78%, MS: $[M+H]^+$=434).

2) Preparation of Compound A-6

Compound A-5 (20.5 g, 47 mmol), bis(pinacolato)diboron (13.2 g, 52 mmol) and potassium acetate (16.2 g, 165 mmol) were mixed under a nitrogen atmosphere, which was then added to 250 ml of dioxane and heated with stirring. Bis(dibenzylideneacetone)palladium (0.81 g, 1 mmol) and tricyclohexylphosphine (0.8 g, 2 mmol) were added thereto under refluxing conditions, and the mixture was heated and stirred for 13 hours. After completion of the reaction, the reaction mixture was cooled to room temperature and then filtrated. Water was poured into the filtrate and extracted with chloroform, and the organic layer was dried over anhydrous magnesium sulfate. After distillation under reduced pressure, recrystallization from ethyl acetate yielded Compound A-6 (20.7 g, yield: 83%).

Preparation Example 10-2: Preparation of Compound A-8

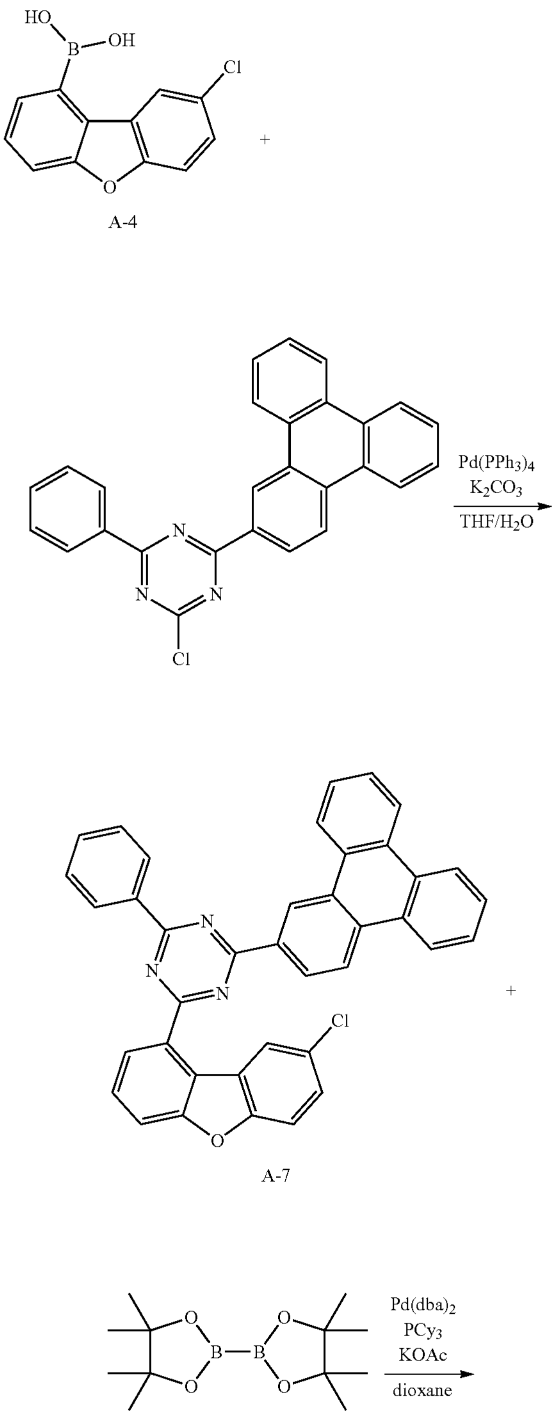

A-4

A-7

-continued

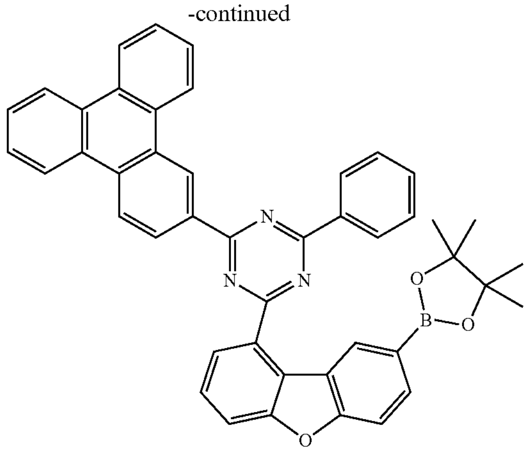

A-8

1) Preparation of Compound A-7

Compound A-7 (17.3 g, yield: 86%, MS: $[M+H]^+$=584) was prepared in the same manner as in Preparation of Compound A-5, except that 2-chloro-4-phenyl-6-(triphenylene-2)-1,3,5-triazine was used instead of 2-chloro-4,6-diphenyltriazine.

2) Preparation of Compound A-8

Compound A-8 (16.9 g, yield: 84%, MS: $[M+H]^+$=676) was prepared in the same manner as in Preparation of Compound A-6, except that Compound A-7 was used instead of Compound A-5.

Preparation Example 10-3: Preparation of Compound A-10

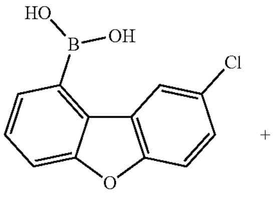

A-4

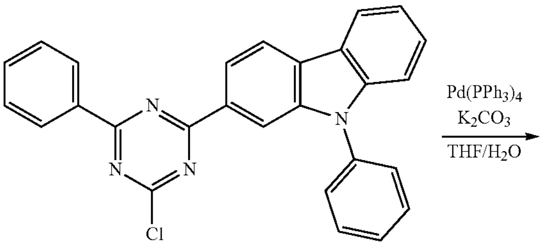

-continued

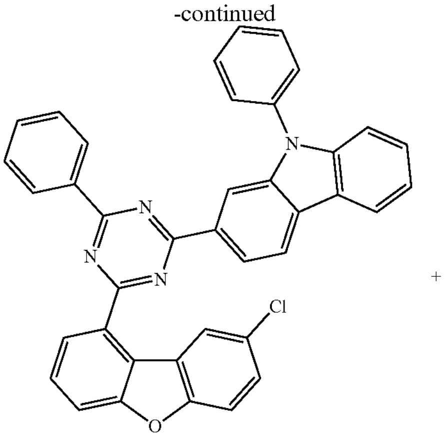

A-9

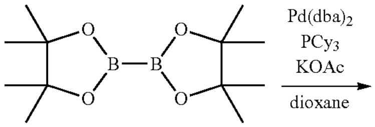

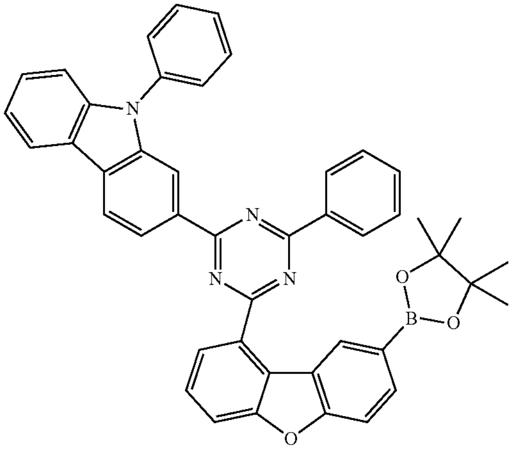

A-10

1) Preparation of Compound A-9

Compound A-9 (15.1 g, yield: 82%, MS: $[M+H]^+$=599) was prepared in the same manner as in Preparation of Compound A-5, except that 2-(4-chloro-6-phenyl-1,3,5-triazin-2-yl)-9-phenyl-9H-carbazole was used instead of 2-chloro-4,6-diphenyltriazine.

2) Preparation of Compound A-10

Compound A-10 (14.5 g, yield: 83%, MS: $[M+H]^+$=691) was prepared in the same manner as in Preparation of Compound A-6, except that Compound A-9 was used instead of Compound A-5.

Preparation Example 10-4: Preparation of Compound A-12

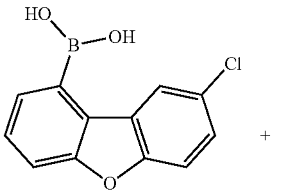

A-4

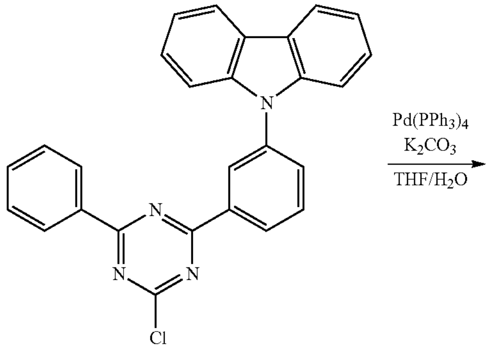

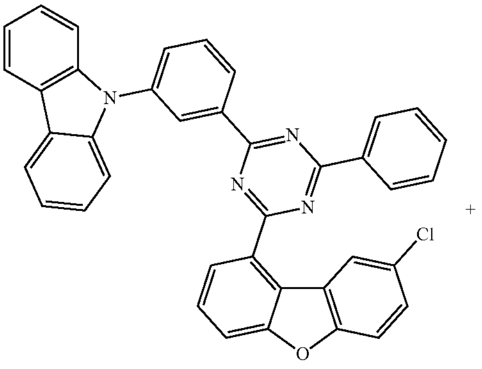

A-11

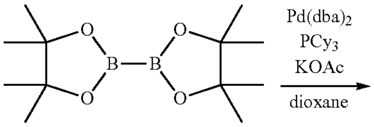

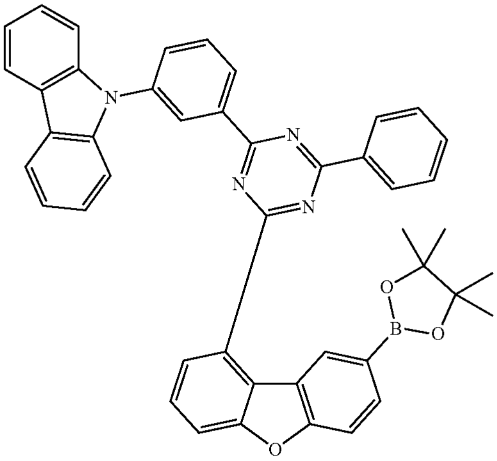

A-12

1) Preparation of Compound A-11

Compound A-11 (18.4 g, yield: 82%, MS: $[M+H]^+$=599) was prepared in the same manner as in Preparation of Compound A-5, except that 9-(3-(4-chloro-6-phenyl-1,3,5-triazin-2-yl)phenyl)-9H-carbazole was used instead of 2-chloro-4,6-diphenyltriazine.

2) Preparation of Compound A-12

Compound A-12 (17.7 g, yield: 83%, MS: $[M+H]^+$=691) was prepared in the same manner as in Preparation of Compound A-6, except, that Compound A-1.1 was used instead of Compound A-5,

Preparation Example 10-5: Preparation of Compound A-14

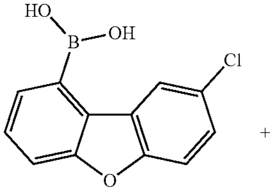

A-4

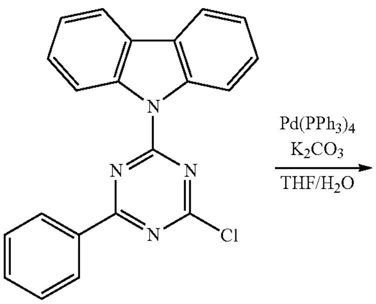

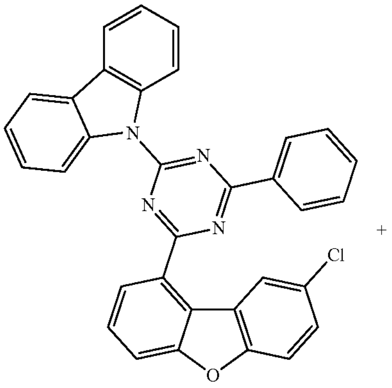

A-13

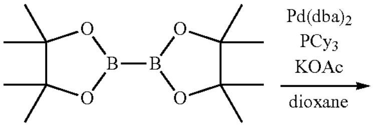

-continued

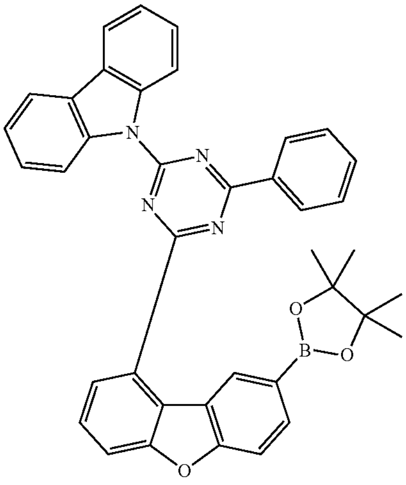

A-14

1) Preparation of Compound A-13

Compound A-13 (16.8 g, yield: 82%, MS: $[M+H]^+=523$) was prepared in the same manner as in Preparation of Compound A-5, except that 9-(4-chloro-6-phenyl-1,3,5-triazin-2-yl)-9H-carbazole was used instead of 2-chloro-4,6-diphenyltriazine.

2) Preparation of Compound A-14

Compound A-14 (16.3 g, yield: 82%, MS: $[M+H]^+=615$) was prepared in the same manner as in Preparation of Compound A-6, except that Compound A-13 was used instead of Compound A-5.

Preparation Example 10-6: Preparation of Compound A-16

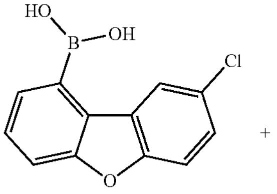

A-4

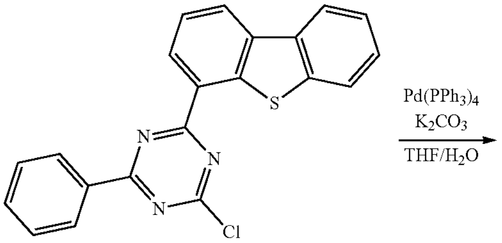

-continued

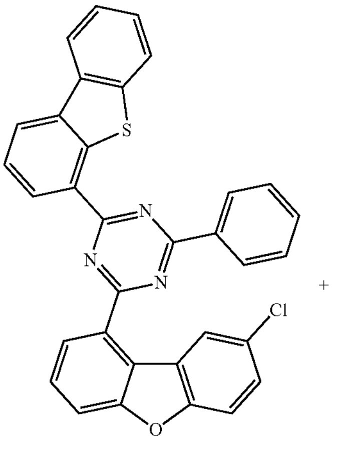

A-15

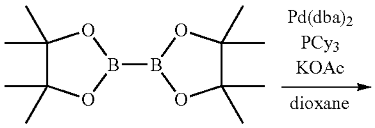

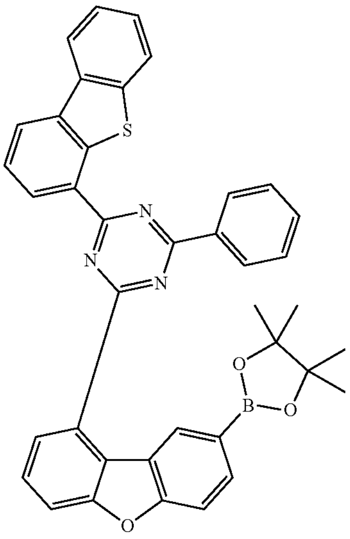

A-16

1) Preparation of Compound A-15

Compound A-15 (16.0 g, yield: 85%, MS: $[M+H]^+=540$) was prepared in the same manner as in Preparation of Compound A-5, except that 2-chloro-4-(dibenzothiophen-4-yl)-6-phenyl-1,3,5-triazine was used instead of 2-chloro-4,6-diphenyltriazine.

2) Preparation of Compound A-16

Compound A-16 (15.6 g, yield: 86%, MS: $[M+H]^+=632$) was prepared in the same manner as in Preparation of Compound A-6, except that Compound A-15 was used instead of Compound A-5.

Preparation Example 10-7: Preparation of Compound A-18

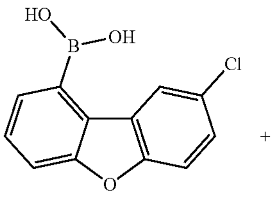

A-4

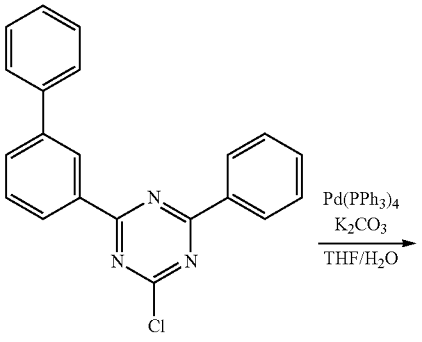

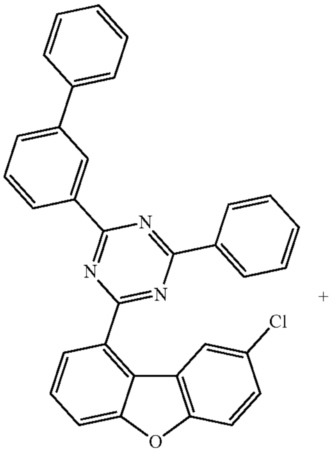

A-17

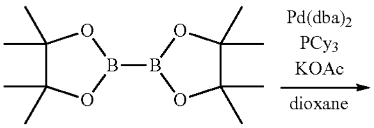

-continued

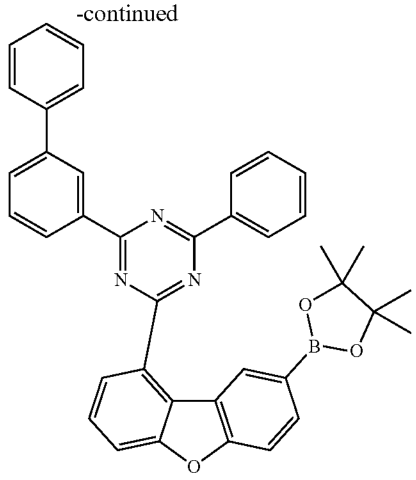

A-18

1) Preparation of Compound A-17

Compound A-17 (14.2 g, yield: 77%, MS: $[M+H]^+=510$) was prepared in the same manner as in Preparation of Compound A-5, except that 2-([1,1'-biphenyl]-3-yl)-4-chloro-6-phenyl-1,3,5-triazine was used instead of 2-chloro-4,6-diphenyltriazine.

2) Preparation of Compound A-18

Compound A-18 (13.9 g, yield: 83%, MS: $[M+H]^+=602$) was prepared in the same manner as in Preparation of Compound A-6, except that Compound A-17 was used instead of Compound A-5.

Preparation Example 11-1: Preparation of Compound B-7

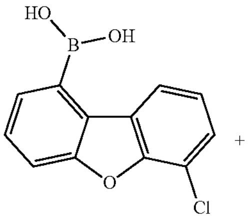

B-5

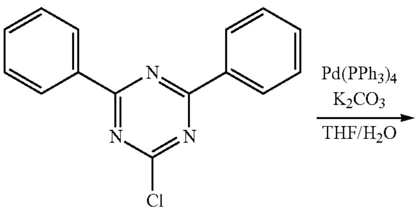

-continued

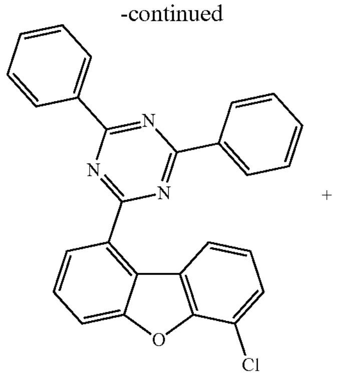

B-6

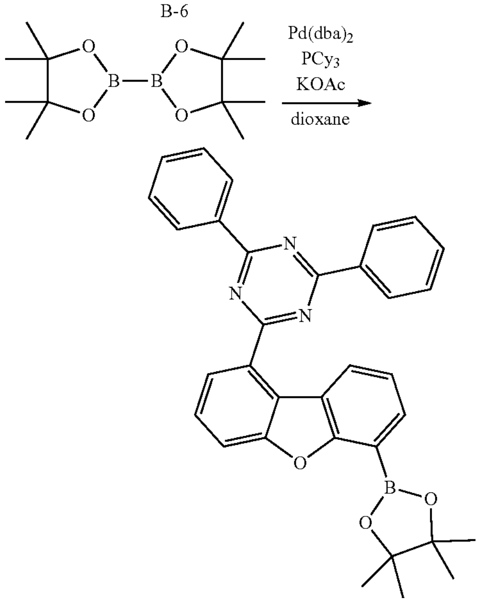

A-18

1) Preparation of Compound B-6

Compound B-6 (14.2 g, yield: 82%, MS: $[M+H]^+$=434) was prepared in the same manner as in Preparation of Compound A-5, except that Compound B-5 was used instead of Compound A-4.

2) Preparation of Compound B-7

Compound B-7 (15.0 g, yield: 82%, MS: $[M+H]^+$=526) was prepared in the same manner as in Preparation of Compound A-6, except that Compound B-6 was used instead of Compound A-5.

Preparation Example 11-2: Preparation of Compound B-9

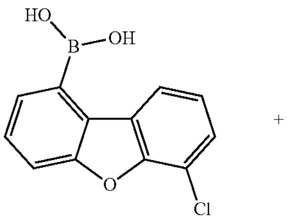

B-5

-continued

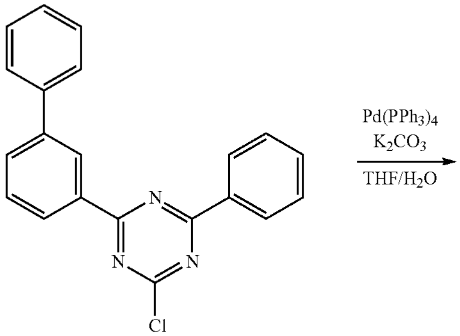

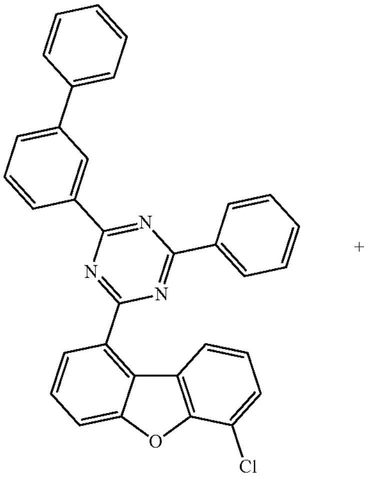

B-8

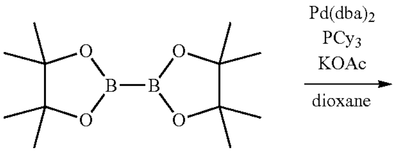

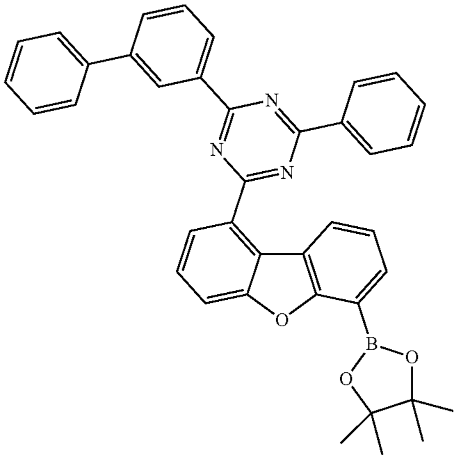

B-9

1) Preparation of Compound B-8

Compound B-8 (17.5 g, yield: 80%, MS: $[M+H]^+$=510) was prepared in the same manner as in Preparation of Compound A-5, except that Compound B-5 and 2-([1,1'-biphenyl]-3-yl)-4-chloro-6-phenyl-1,3,5-triazine were used instead of Compound A-4 and 2-chloro-4,6-diphenyltriazine.

2) Preparation of Compound B-9

Compound B-9 (16.2 g, yield: 78%, MS: $[M+H]^+$=602) was prepared in the same manner as in Preparation of Compound A-6, except that Compound B-8 was used instead of Compound A-5.

Preparation Example 11-3: Preparation of Compound B-11

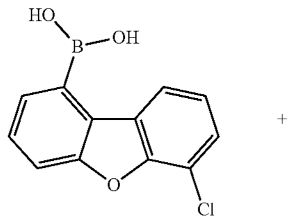

B-5

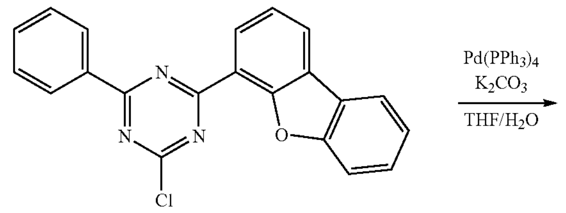

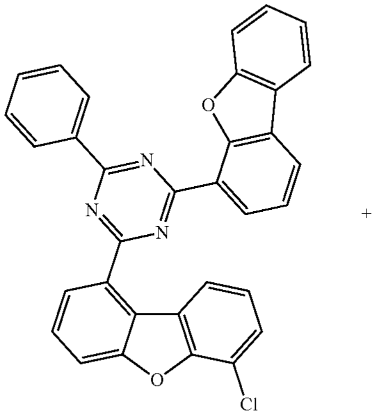

B-10

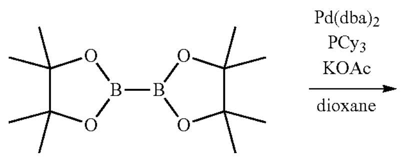

-continued

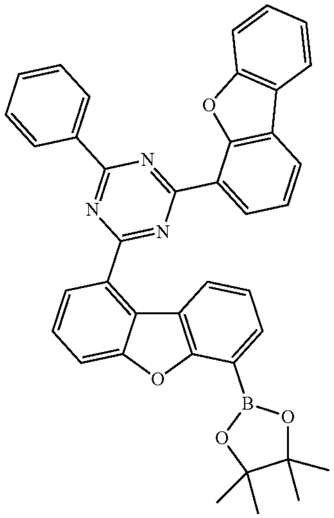

B-11

1) Preparation of Compound B-10

Compound B-10 (15.0 g, yield: 79%, MS: $[M+H]^+$=524) was prepared in the same manner as in Preparation of Compound A-5, except that Compound B-5 and 2-chloro-4-(dibenzofuran-4-yl)-6-phenyl-1,3,5-triazine were used instead of Compound A-4 and 2-chloro-4,6-diphenyltriazine.

2) Preparation of Compound B-11

Compound B-11 (14.1 g, yield: 80%, MS: $[M+H]^+$=616) was prepared in the same manner as in Preparation of Compound A-6, except that Compound B-10 was used instead of Compound A-5.

Preparation Example 11-4: Preparation of Compound B-13

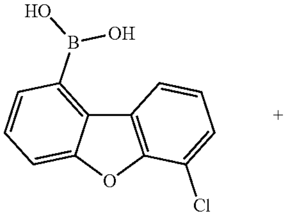

B-5

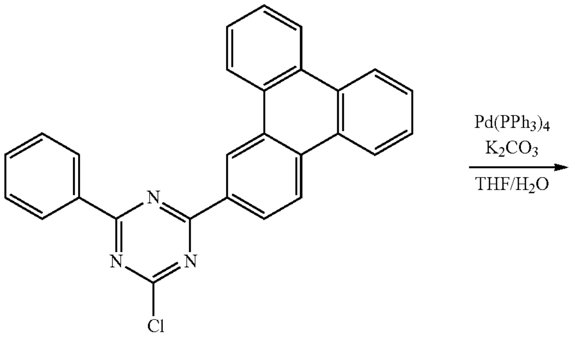

-continued

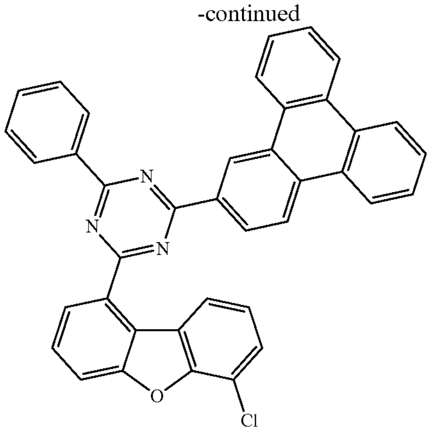

B-12

+

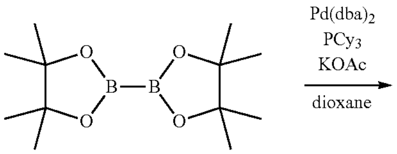

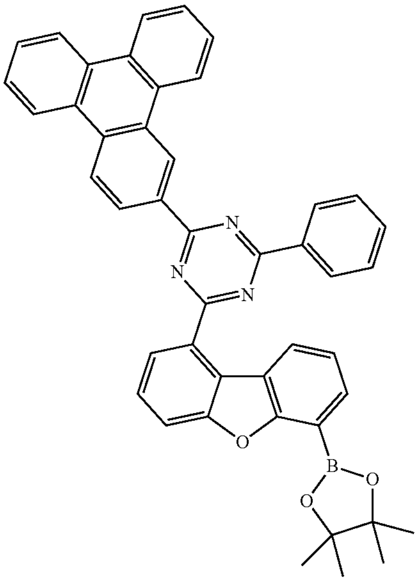

B-13

1) Preparation of Compound B-12

Compound B-12 (19.5 g, yield: 86%, MS: $[M+H]^+=584$) was prepared in the same manner as in Preparation of Compound A-5, except that Compound B-5 and 2-chloro-4-phenyl-6-(tri phenyl ene-2)-1,3,5-triazine was used instead of Compound A-4 and 2-chloro-4,6-diphenyltriazine.

2) Preparation of Compound B-13

Compound B-13 (20.1 g, yield: 89%, MS: $[M+H]^+=676$) was prepared in the same manner as in Preparation of Compound A-6, except that Compound 13-12 was used instead of Compound A-5.

Preparation Example 11-5: Preparation of Compound B-15

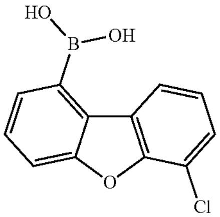

B-5

+

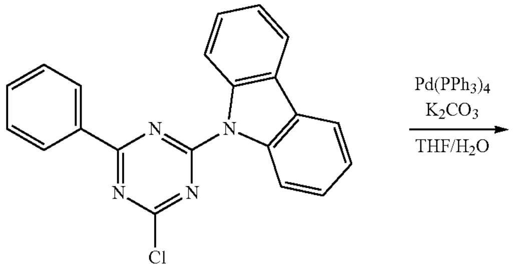

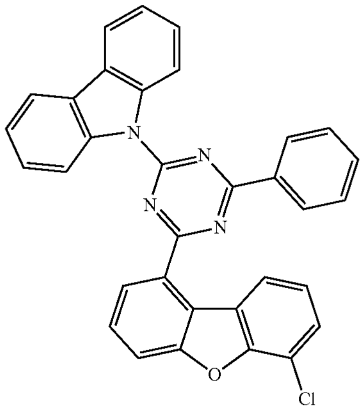

B-14

+

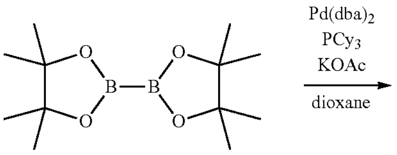

-continued

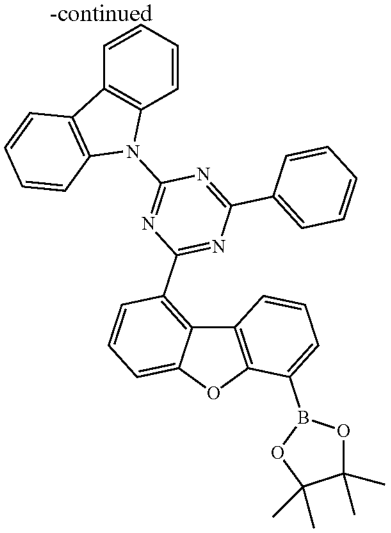

B-15

1) Preparation of Compound B-14

Compound B-14 (14.4 g, yield: 76%, MS: [M+H]$^+$=523) was prepared in the same manner as in Preparation of Compound A-5, except that Compound B-5 and 9-(4-chloro-6-phenyl-1,3,5-triazine-2-yl)-9H-carbozole was used instead of Compound A-4 and 2-chloro-4,6-diphenyltriazine.

2) Preparation of Compound B-15

Compound B-15 (12.2 g, yield: 72%, MS: [M+H]$^+$=615) was prepared in the same manner as in Preparation of Compound A-6, except that Compound 13-14 was used instead of Compound A-5.

Preparation Example 11-6: Preparation of Compound B-17

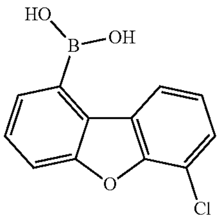

B-5

+

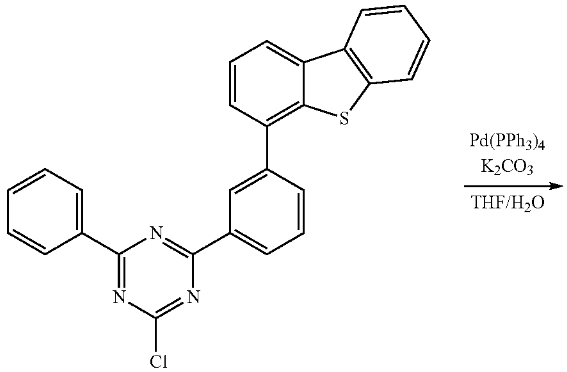

-continued

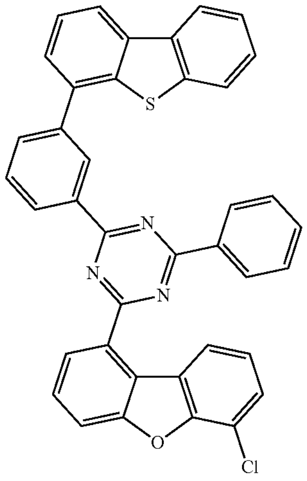

B-16

+

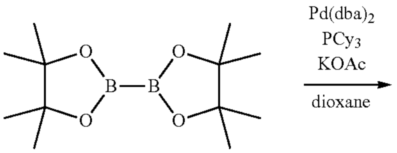

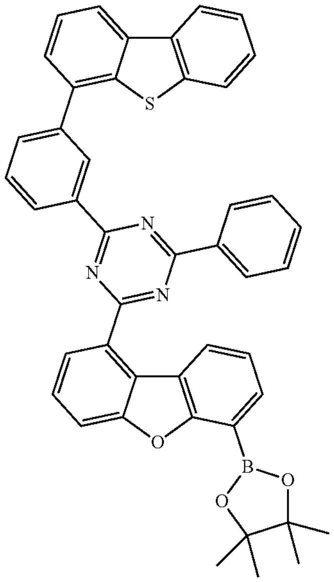

B-17

1) Preparation of Compound B-16

Compound B-16 (16.2 g, yield: 76%, MS: [M+H]$^+$=616) was prepared in the same manner as in Preparation of Compound A-5, except that Compound B-5 and 2-chloro-4-(3-(dibenzothiophen-4-yl)phenyl)-6-phenyl-1,3,5-triazine was used instead of Compound A-4 and 2-chloro-4,6-diphenyltriazine.

2) Preparation of Compound B-17

Compound B-17 (14.7 g, yield: 79%, MS: [M+H]$^+$==708) was prepared in the same manner as in Preparation of Compound A-6, except that Compound B-16 was used instead of Compound A-5.

Preparation Example 12-1: Preparation of Compound C-6

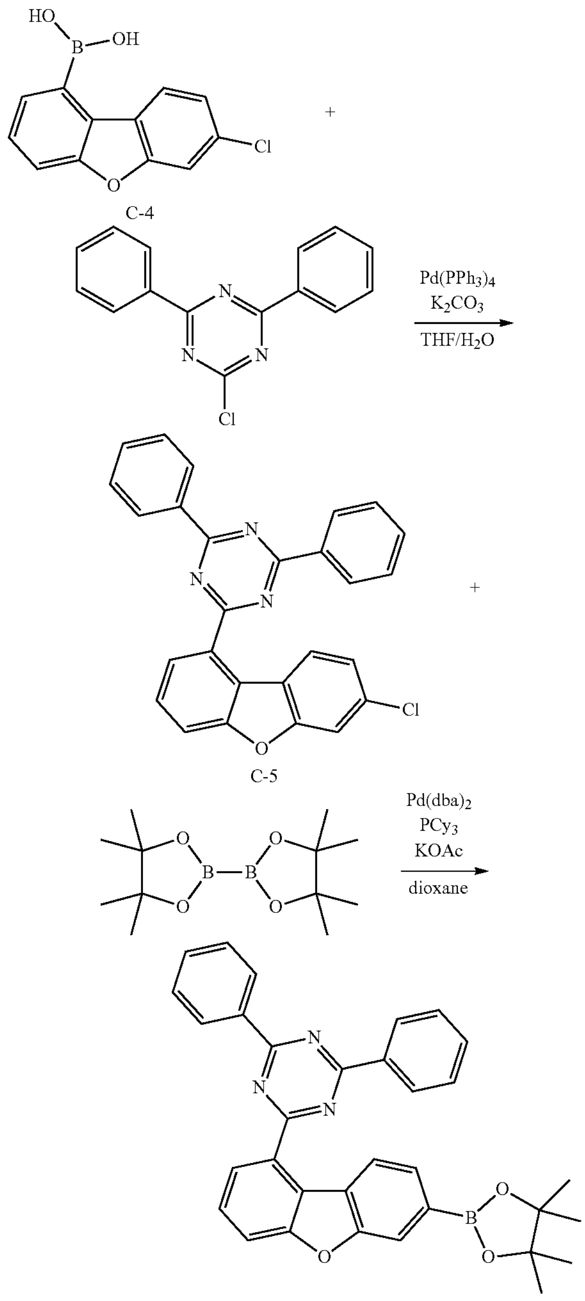

C-6

1) Preparation of Compound C-5

Compound C-5 (13.0 g, yield: 77%, MS: $[M+H]^+=434$) was prepared in the same manner as in Preparation of Compound A-5, except that Compound C-4 was used instead of Compound A-4.

2) Preparation of Compound C-6

Compound C-6 (12.8 g, yield: 82%, MS: $[M+H]^+=526$) was prepared in the same manner as in Preparation of Compound A-6, except that Compound C-5 was used instead of Compound A-5.

Preparation Example 12-2: Preparation of Compound C-8

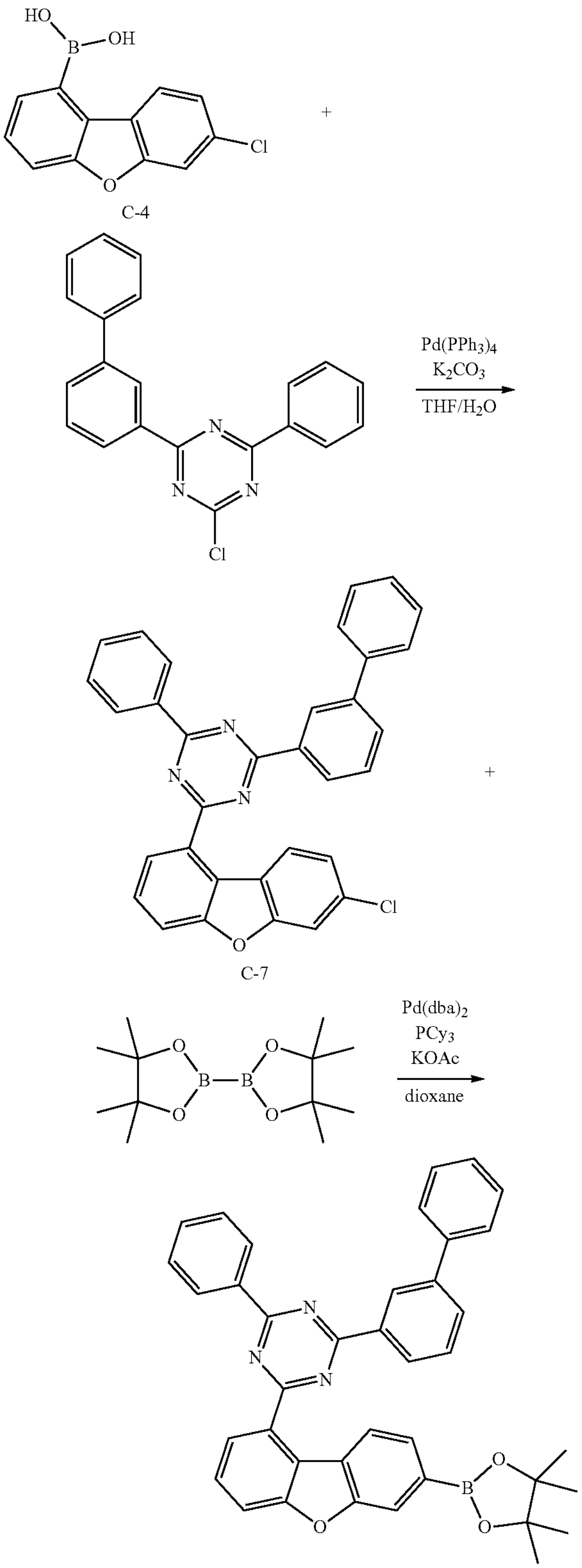

C-8

1) Preparation of Compound C-7

Compound C-7 (14.0 g, yield: 76%, MS: $[M+H]^+=510$) was prepared in the same manner as in Preparation of Compound A-5, except that Compound. C-4 and 2-([1,1'-biphenyl]-3-yl)-4-chloro-6-phenyl-1,3,5-triazine was used instead of Compound A-4 and 2-chloro-4,6-diphenyltriazine.

2) Preparation of Compound C-8

Compound C-8 (12.2 g, yield: 74%, MS: $[M+H]^+=602$) was prepared in the same manner as in Preparation of Compound A-6, except that Compound C-7 was used instead of Compound A-5.

Preparation Example 12-3: Preparation of Compound C-10

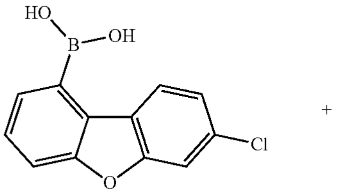

C-4

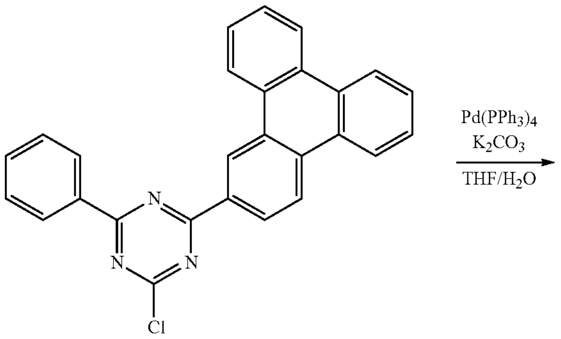

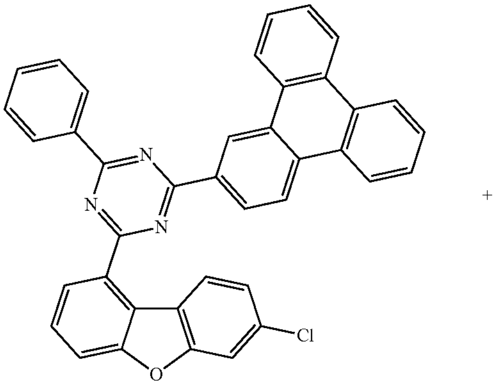

C-9

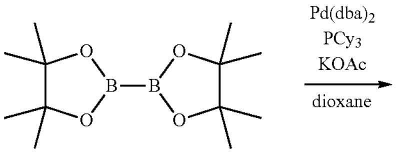

-continued

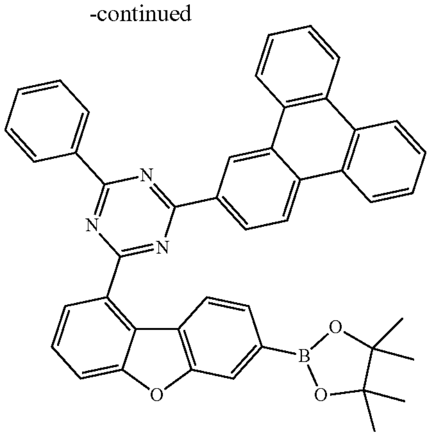

C-10

1) Preparation of Compound C-9

Compound C-9 (16.6 g, yield: 82%, MS: $[M+H]^+=584$) was prepared in the same manner as in Preparation of Compound A-5, except that Compound C-4 and 2-chloro-4-phenyl-6-(triphenylene-2)-1,3,5-triazine was used instead of Compound A-4 and 2-chloro-4,6-diphenyltriazine.

2) Preparation of Compound C-10

Compound C-10 (16.5 g, yield: 85%, MS: $[M+H]^+=676$) was prepared in the same manner as in Preparation of Compound A-6, except that Compound C-9 was used instead of Compound A-5.

Preparation Example 12-4: Preparation of Compound C-12

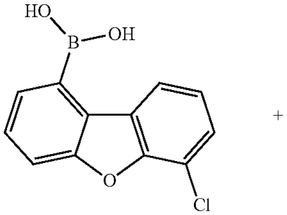

C-4

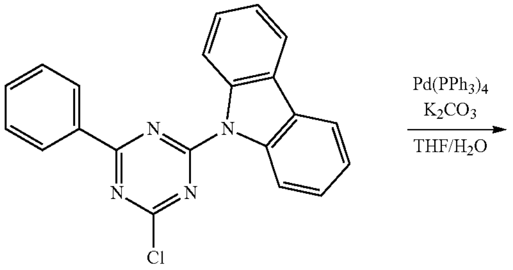

-continued

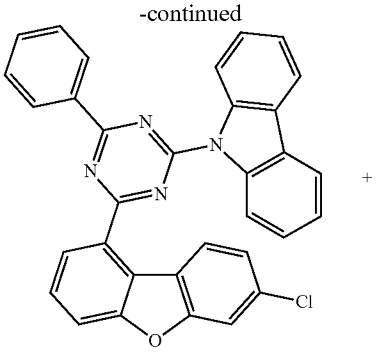

C-11

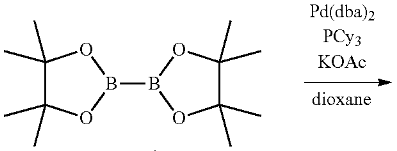

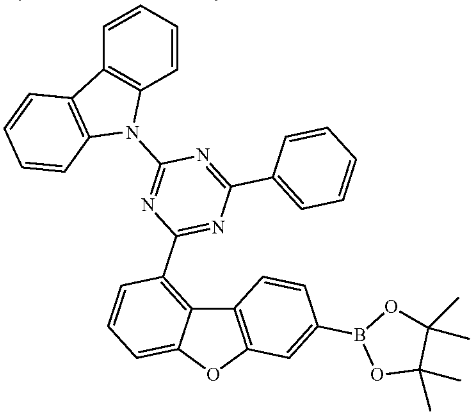

C-12

1) Preparation of Compound C-11

Compound C-11 (11.9 g, yield: 76%, MS: $[M+H]^+=523$) was prepared in the same manner as in Preparation of Compound A-5, except that Compound C-4 and 9-(4-chloro-6-phenyl-1,3,5-triazine-2-yl)-9H-carbazole was used instead of Compound A-4 and 2-chloro-4,6-diphenyltriazine.

2) Preparation of Compound C-12

Compound C-12 (10.8 g, yield: 77%, MS: $[M+H]^+=615$) was prepared in the same manner as in Preparation of Compound A-6, except that Compound C-11 was used instead of Compound A-5.

Preparation Example 12-5: Preparation of Compound C-14

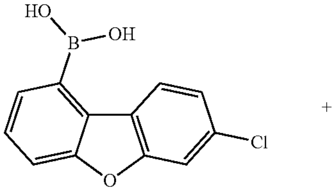

C-4

-continued

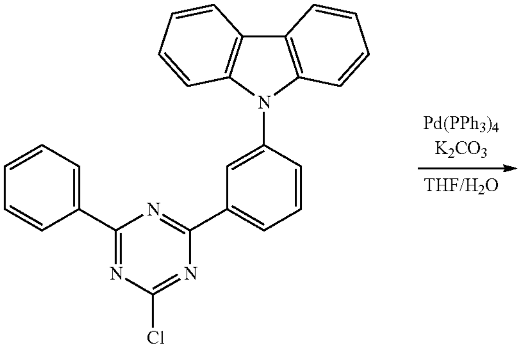

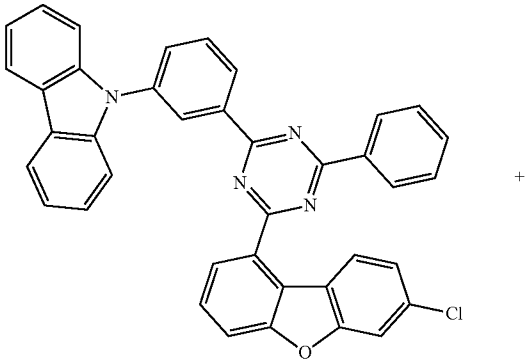

C-13

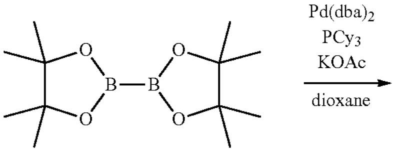

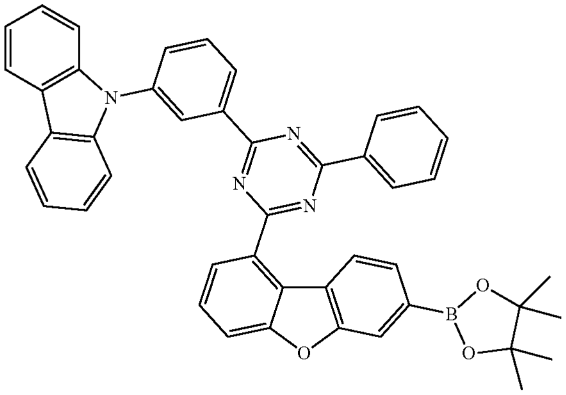

C-14

1) Preparation of Compound C-13

Compound C-13 (13.6 g, yield: 77%, MS: $[M+H]^+=599$) was prepared in the same manner as in Preparation of Compound A-5, except that Compound C-4 and 9-(3-(4-chloro-6-phenyl-1,3,5-triazine-2-yl)phenyl)-9H-carbazole were used instead of Compound A-4 and 2-chloro-4,6-diphenyltriazine.

2) Preparation of Compound C-14

Compound C-14 (11.8 g, yield: 75%, MS: $[M+H]^+=691$) was prepared in the same manner as in Preparation of Compound A-6, except that Compound C-13 was used instead of Compound A-5.

Preparation Example 12-6: Preparation of Compound C-16

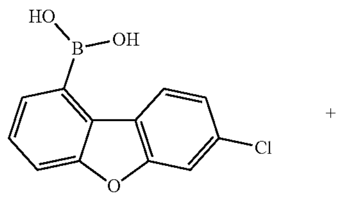

C-4

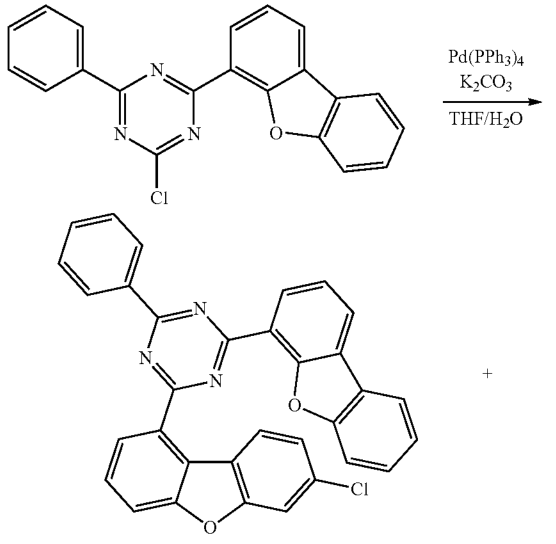

C-15

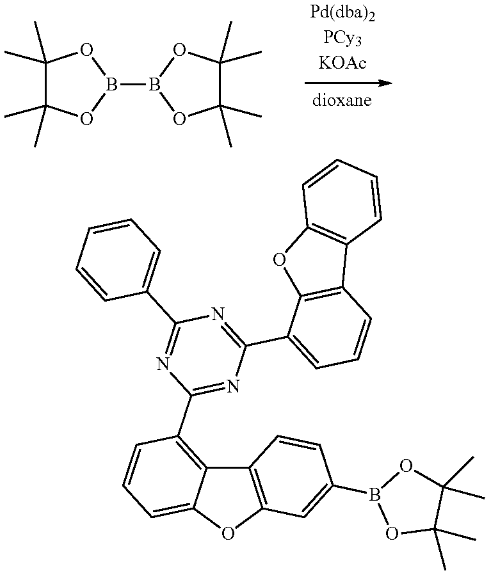

C-16

1) Preparation of Compound C-15

Compound C-15 (12.1 g, yield: 74%, MS: $[M+H]^+=524$) was prepared in the same manner as in Preparation of Compound A-5, except that Compound C-4 and 2-chloro-4-(dibenzofuran-4-yl)-6-phenyl-1,3,5-triazine were used instead of Compound A-4 and 2-chloro-4,6-diphenyltriazine, 2) Preparation of Compound C-16

Compound C-16 (12.5 g, yield: 73%, MS: $[M+H]^+=616$) was prepared in the same manner as in Preparation of Compound A-6, except that Compound. C-15 was used instead of Compound A-5.

Preparation Example 13-1: Preparation of Compound D-6

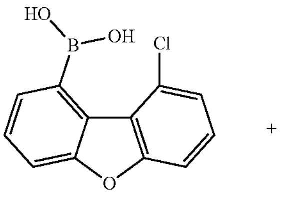

D-4

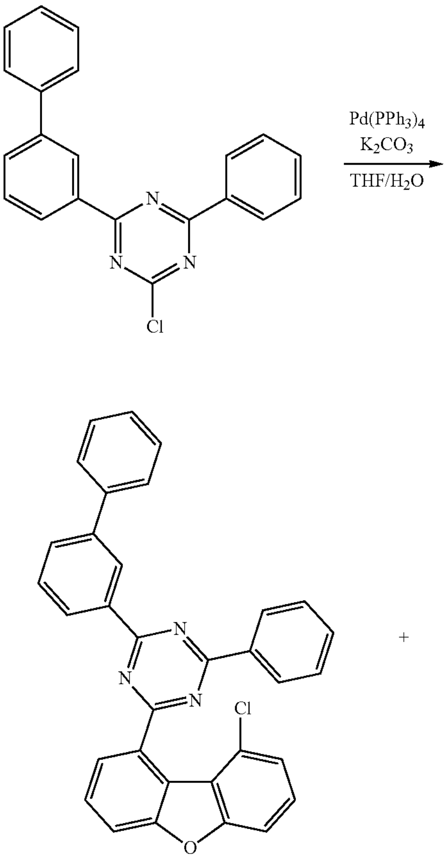

D-5

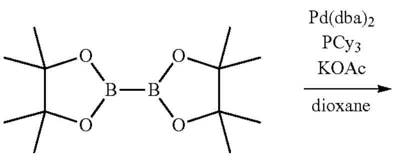

-continued

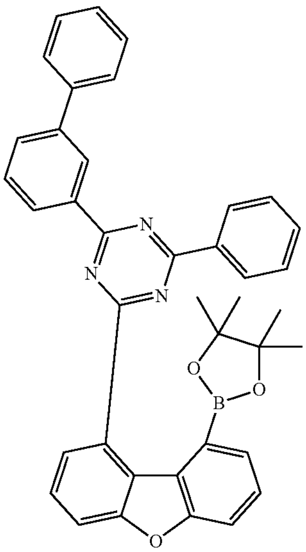

D-6

1) Preparation of Compound D-5

Compound D-5 (10.6 g, yield: 76%, MS: $[M+H]^+=510$) was prepared in the same manner as in Preparation of Compound A-5, except that Compound D-4 and 2-([1,1'-biphenyl]-3-yl)-4-chloro-6-phenyl-1,3,5-triazine were used instead of Compound A-4 and 2-chloro-4,6-diphenyltriazine, 2) Preparation of Compound D-6

Compound (10.0 g, yield: 80%, MS: $[M+H]^+=602$) was prepared in the same manner as in Preparation of Compound A-6, except that Compound D-5 was used instead of Compound A-5.

Preparation Example 13-2: Preparation of Compound D-8

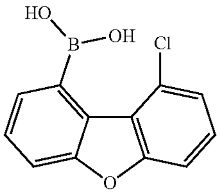

+

D-4

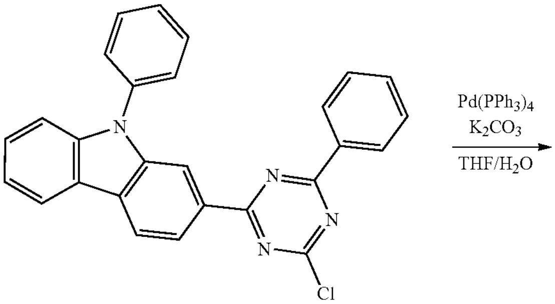

-continued

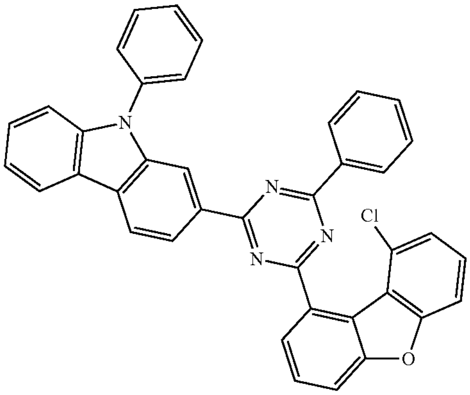

+

D-7

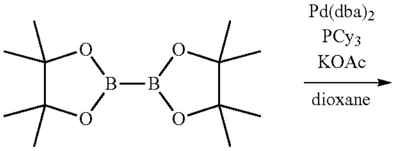

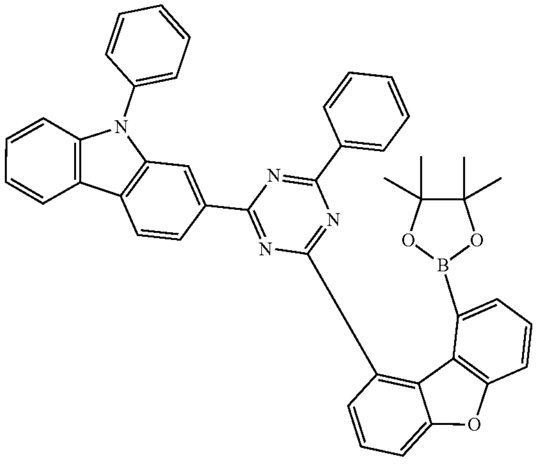

D-8

1) Preparation of Compound D-7

Compound D-7 (12.7 g, yield: 77%, MS: $[M+H]^+$=599) was prepared in the same manner as in Preparation of Compound A-5, except that Compound D-4 and 2-(4-chloro-6-phenyl-1,3,5-triazine-2-yl)-9-phenyl-9H-carbazole were used instead of Compound A-4 and 2-chloro-4,6-diphenyltriazine.

2) Preparation of Compound D-8

Compound D-8 (11.3 g, yield: 77%, MS: $[M+H]^+$=691) was prepared in the same manner as in Preparation of Compound A-6, except that Compound was used instead of Compound A-5.

Preparation Example 14: Preparation of Compound 24

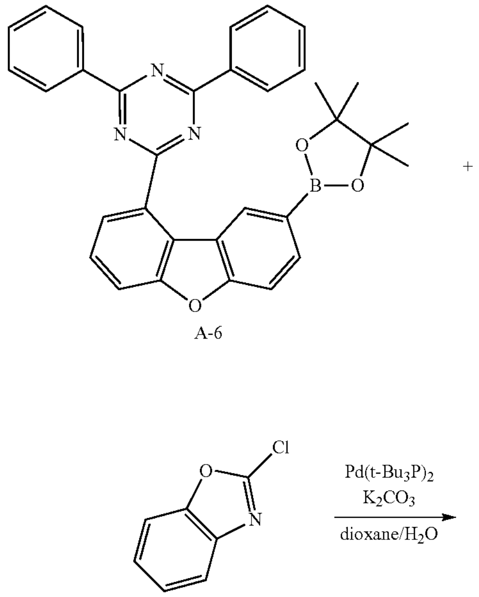

-continued

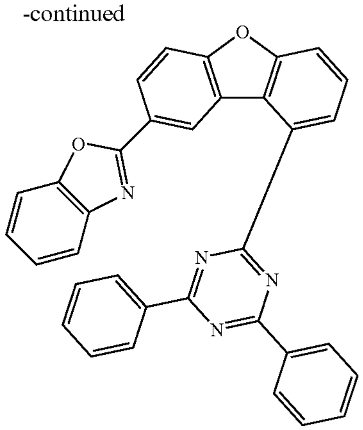

2-1

Compound A-6 (10 g, 19 mmol) and 2-chloro-oxazole (3.51 g, 23 mmol) were added to 100 ml of dioxane under a nitrogen atmosphere, and the mixture was stirred and refluxed. Then, potassium carbonate (7.89 g, 57 mmol) was dissolved in 50 ml of water, added thereto and stirred sufficiently, to which bis(tri-t-butylphosphine)palladium(0) (0.1 g, 0.2 mmol) was added. After reaction for 20 hours, the reaction mixture was cooled to room temperature and filtered. The filtrate was extracted with chloroform and water, and the organic layer was dried over magnesium sulfate. Then, the organic layer was distilled under reduced pressure, and recrystallized from a mixture of tetrahydrofuran and ethyl acetate. The resulting solid was filtered and dried to give Compound 2-1 (6.6 g, yield: 67%, MS: $[M+H]^+$=517).

Preparation Examples 15 to 37

Compounds 2-2 to 2-24 were prepared in the same manner as in Preparation Example 14, except that the compounds shown in Table 1 below were used instead of Compound A-6 and/or 2-chloro-oxazole. The structure, shape, yield and MS thereof are summarized in Table below.

TABLE 1

| Preparation Example | Intermediate 1 | Intermediate 2 | Compound | Shape | Yield (%) | MS [M + H] |
|---|---|---|---|---|---|---|
| Preparation Example 15 | A-6 | 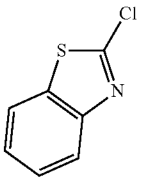 | 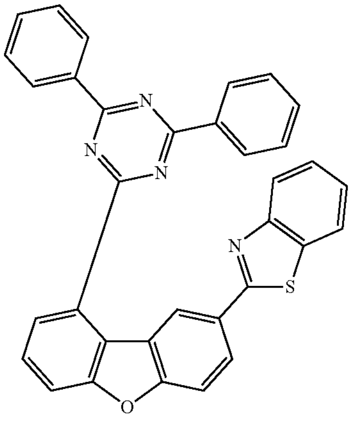 Compound 2-2 | White | 66% | 533 |

TABLE 1-continued
| Preparation Example | Intermediate 1 | Intermediate 2 | Compound | Shape | Yield (%) | MS [M + H] |
|---|---|---|---|---|---|---|
| Preparation Example 16 | A-8 | 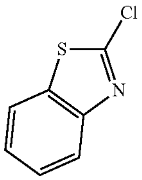 | 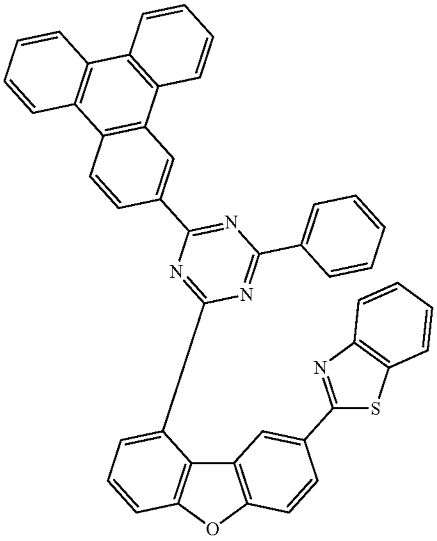 Compound 2-3 | White | 72% | 683 |
| Preparation Example 17 | A-8 | 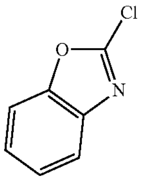 | 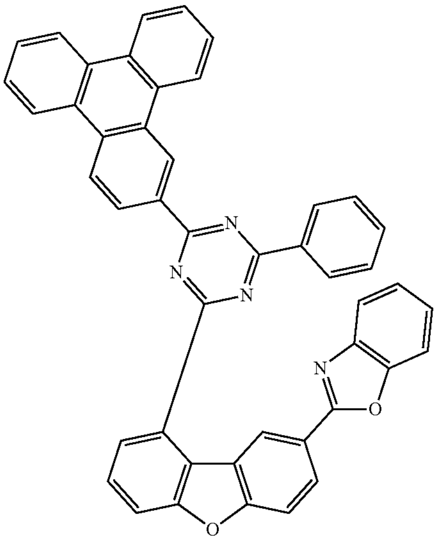 Compound 2-4 | White | 75% | 683 |

TABLE 1-continued
| Preparation Example | Intermediate 1 | Intermediate 2 | Compound | Shape | Yield (%) | MS [M + H] |
|---|---|---|---|---|---|---|
| Preparation Example 18 | A-10 | 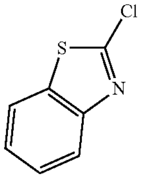 | 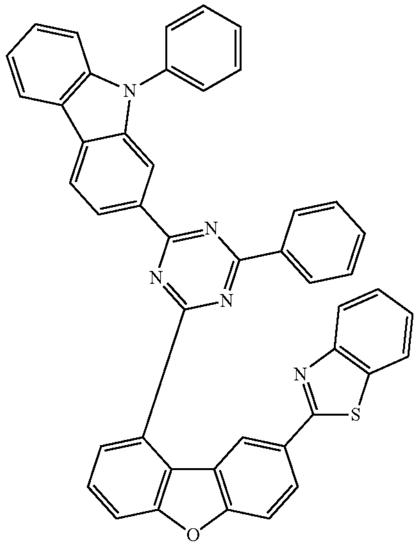 Compound 2-5 | Pale yellow | 64% | 698 |
| Preparation Example 19 | A-12 | 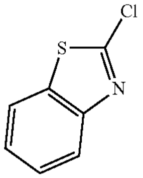 | 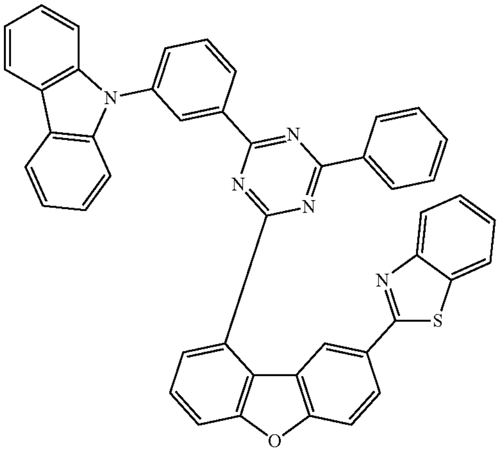 Compound 2-6 | Pale yellow | 60% | 698 |
| Preparation Example 20 | A-14 | 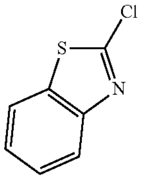 | 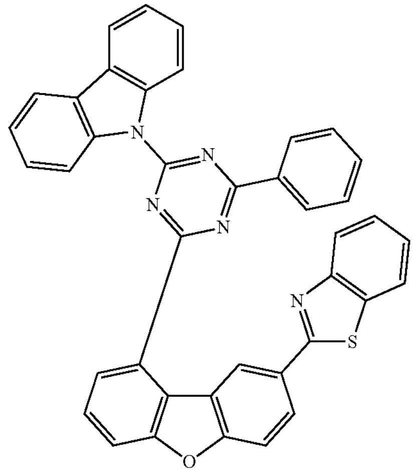 Compound 2-7 | White | 58% | 622 |

TABLE 1-continued
| Preparation Example | Intermediate 1 | Intermediate 2 | Compound | Shape | Yield (%) | MS [M + H] |
|---|---|---|---|---|---|---|
| Preparation Example 21 | A-14 | 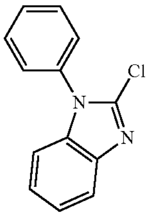 [SMILES: Clc1nc2ccccc2n1-c1ccccc1] | 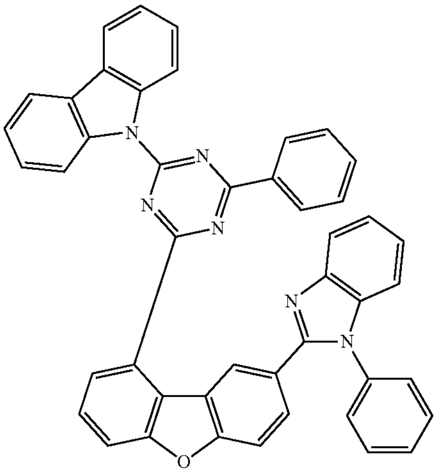 Compound 2-8 | White | 63% | 681 |
| Preparation Example 22 | A-16 | 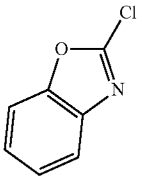 | 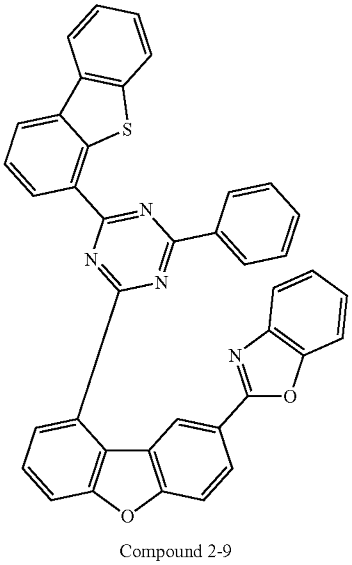 [SMILES: c1ccc(-c2nc(-c3cccc4c3sc3ccccc34)nc(-c3cccc4oc5ccc(-c6nc7ccccc7o6)cc5c34)n2)cc1] Compound 2-9 | Pale yellow | 68% | 623 |

TABLE 1-continued
| Preparation Example | Intermediate 1 | Intermediate 2 | Compound | Shape | Yield (%) | MS [M + H] |
|---|---|---|---|---|---|---|
| Preparation Example 23 | A-18 | 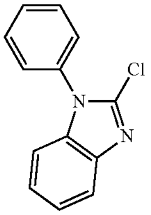 [SMILES: Clc1nc2ccccc2n1-c1ccccc1] | 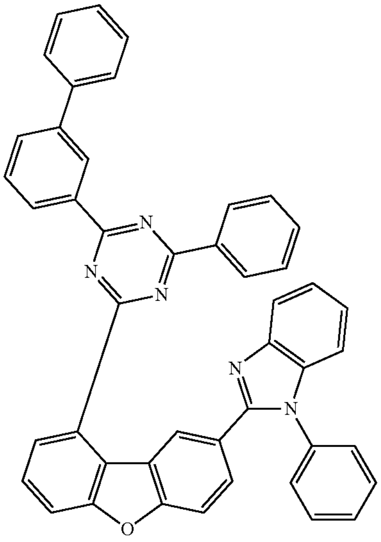 Compound 2-10 | White | 61% | 668 |
| Preparation Example 24 | B-7 | 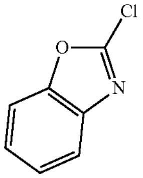 | 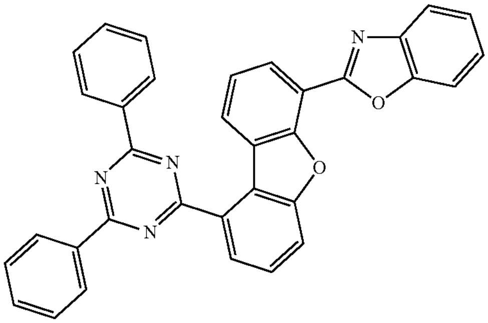 Compound 2-11 | White | 68% | 517 |
| Preparation Example 25 | B-9 | 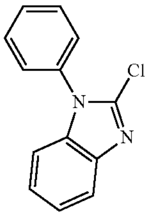 [SMILES: Clc1nc2ccccc2n1-c1ccccc1] | 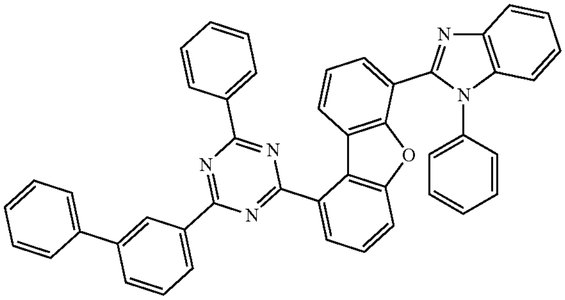 Compound 2-12 | White | 62% | 668 |

TABLE 1-continued
| Preparation Example | Intermediate 1 | Intermediate 2 | Compound | Shape | Yield (%) | MS [M + H] |
|---|---|---|---|---|---|---|
| Preparation Example 26 | B-11 | 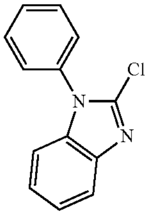 [SMILES: Clc1nc2ccccc2n1-c1ccccc1] | 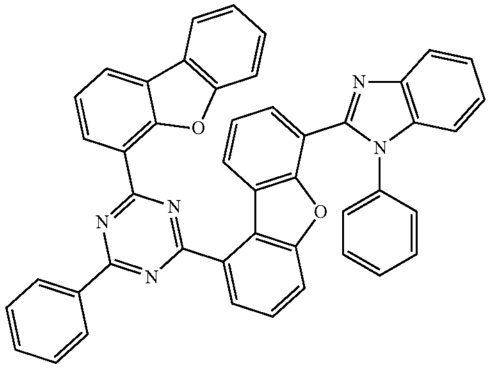 Compound 2-13 | Ivory | 66% | 682 |
| Preparation Example 27 | B-13 | 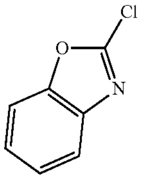 | 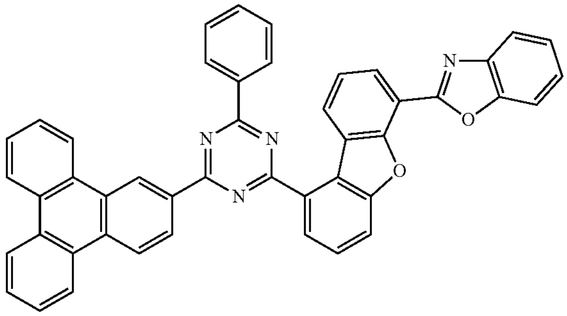 Compound 2-14 | White | 70% | 667 |
| Preparation Example 28 | B-15 | 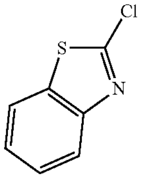 | 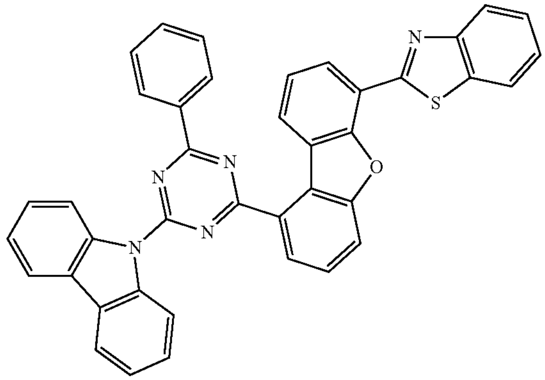 Compound 2-15 | Ivory | 64% | 622 |
| Preparation Example 29 | B-17 | 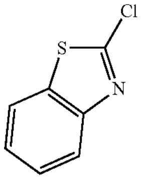 | 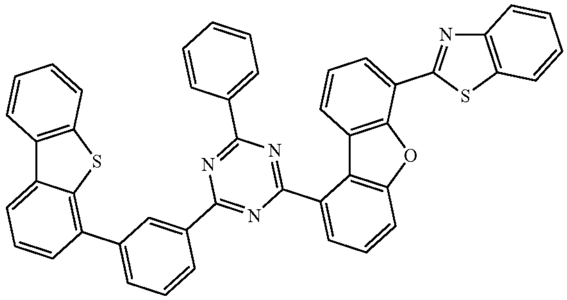 Compound 2-16 | White | 61% | 715 |

TABLE 1-continued
| Preparation Example | Intermediate 1 | Intermediate 2 | Compound | Shape | Yield (%) | MS [M + H] |
|---|---|---|---|---|---|---|
| Preparation Example 30 | C-6 | 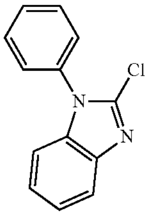 [SMILES: Clc1nc2ccccc2n1-c1ccccc1] | 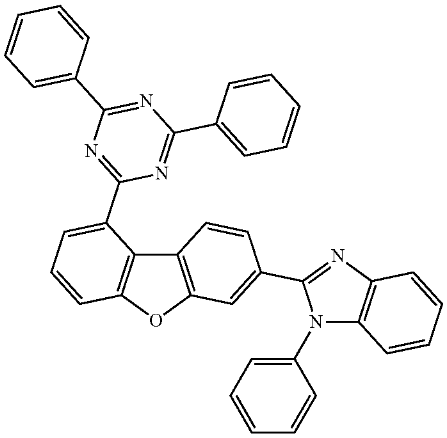 Compound 2-17 | White | 64% | 592 |
| Preparation Example 31 | C-8 | 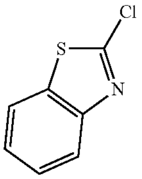 | 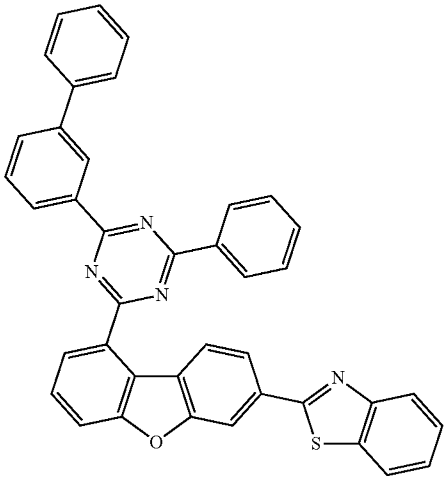 Compound 2-18 | White | 67% | 509 |
| Preparation Example 32 | C-10 | 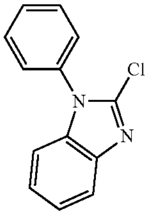 [SMILES: Clc1nc2ccccc2n1-c1ccccc1] | 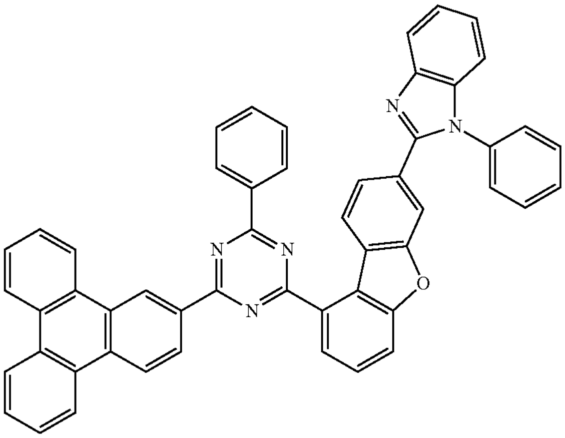 Compound 2-19 | White | 69% | 742 |

TABLE 1-continued
| Preparation Example | Intermediate 1 | Intermediate 2 | Compound | Shape | Yield (%) | MS [M + H] |
|---|---|---|---|---|---|---|
| Preparation Example 33 | C-12 | 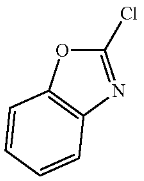 | 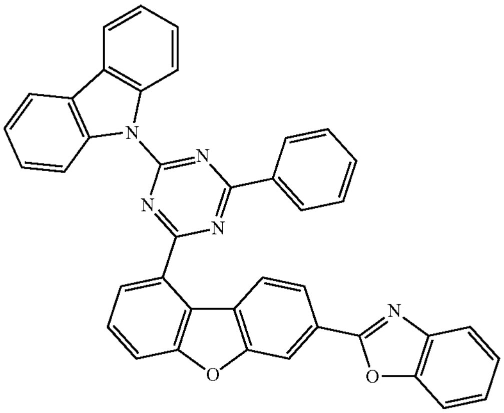 Compound 2-20 | Pale yellow | 67& | 606 |
| Preparation Example 34 | C-14 | 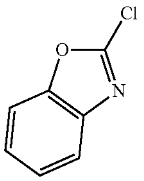 | 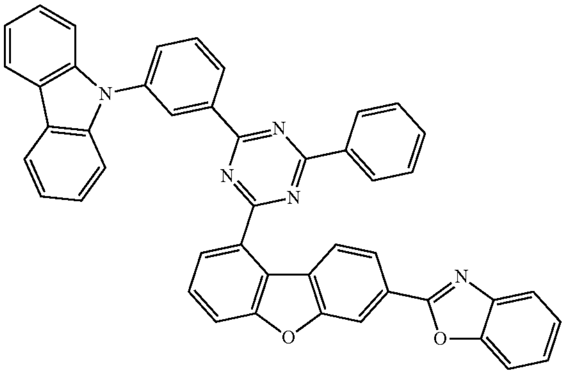 Compound 2-21 | Pale yellow | 66% | 682 |
| Preparation Example 35 | C-16 | 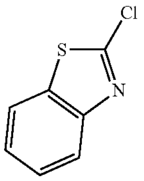 | 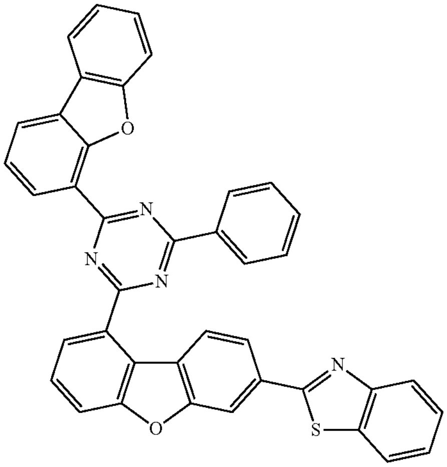 Compound 2-22 | White | 68% | 623 |

TABLE 1-continued

| Preparation Example | Intermediate 1 | Intermediate 2 | Compound | Shape | Yield (%) | MS [M + H] |
|---|---|---|---|---|---|---|
| Preparation Example 36 | D-6 | 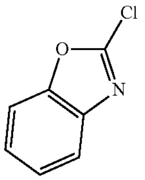 | 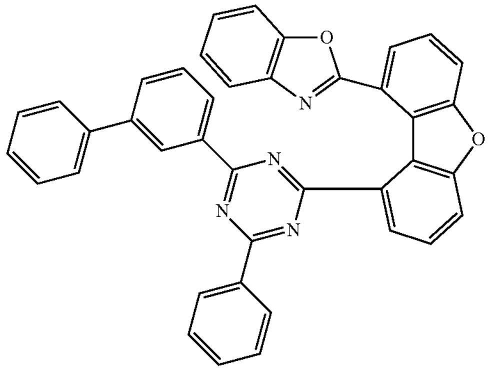 Compound 2-23 | White | 61% | 593 |
| Preparation Example 37 | D-8 | 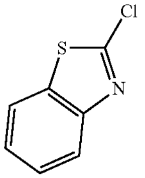 | 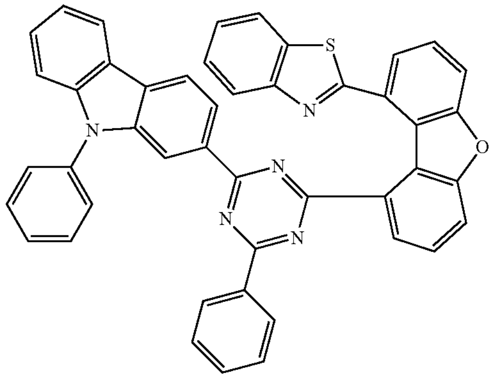 Compound 2-24 | Pale yellow | 62% | 698 |

Example 1

A glass substrate on which ITO (indium tin oxide) was coated as a thin film to a thickness of 1300 Å was put into distilled water in which a detergent was dissolved, and ultrasonically cleaned. In this case, a product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone, and methanol, then dried, and then transferred to a plasma cleaner. In addition, the substrate was cleaned for 5 minutes using oxygen plasma, and then transferred to a vacuum depositor.

On the ITO transparent electrode thus prepared, the following hexanitrile hexaazatriphenylene (HAT) compound was thermally vacuum-deposited to a thickness of 50 Å to form a hole injection layer. 4,4'-Bis[N-(1-naphthyl)-N-phenylamino]biphenyl (NPB; HT-1), a material for transporting holes, was thermally vacuum-deposited to a thickness of 250 Å thereon to form a hole transport layer, and Compound HT-2 was vacuum-deposited on the HT-1 deposited film to form an electron blocking layer to a thickness of 50 Å. Next, Compound 1-7 and Compound 2-2 previously prepared were co-deposited at a weight ratio shown in Table 2 below on the HT-2 vapor-deposited film to a thickness of 400 Å. At this time, phosphorescent dopant D1 was co-deposited at a ratio of 12% based on the total weight of the light emitting layer to form a light emitting layer. Compound ET-1 was vacuum-deposited on the light emitting layer to a thickness of 250 Å, and additionally Compound ET-2 was co-deposited with 2 wt % Li to a thickness of 100 Å to form an electron transport layer and an electron injection layer. Aluminum was deposited on the electron injection layer to a thickness of 1000 Å to form a cathode.

In the above-mentioned process, the vapor deposition rate of the organic material was maintained at 0.4 to 0.7 Å/sec, the deposition rate of aluminum was maintained at 2 Å/sec, and the degree of vacuum during the deposition was maintained at $1\times10^{-7}$ to $5\times10^{-8}$ torr, thereby manufacturing an organic light emitting device.

-continued
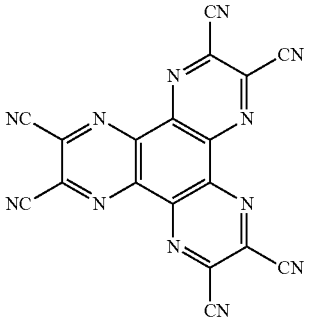
HAT
D1
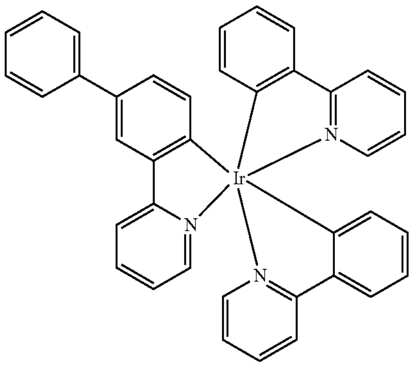
HT-1
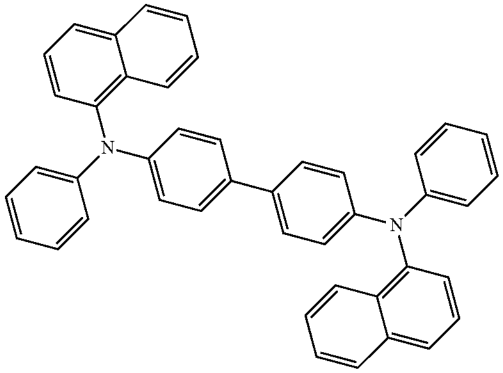
ET-1
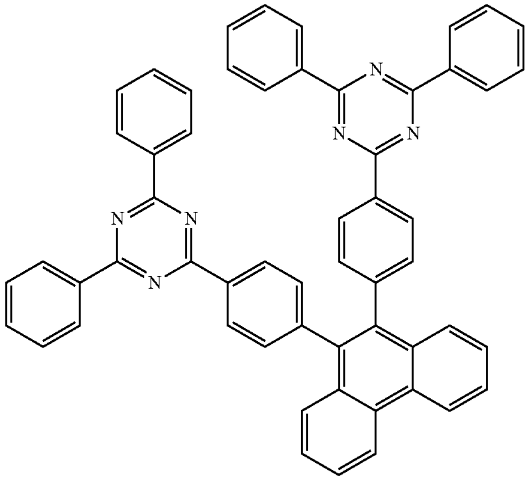
HT-2
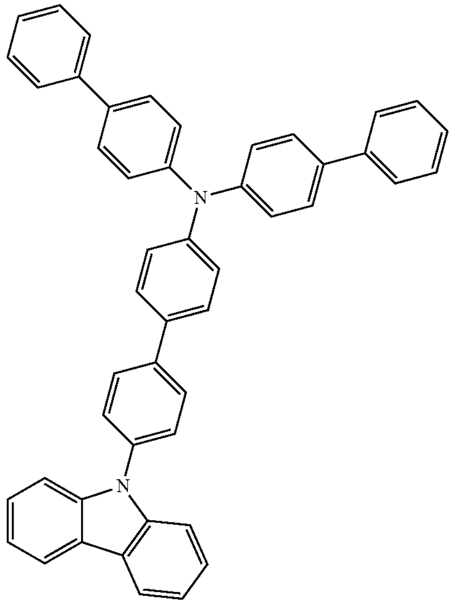
ET-2
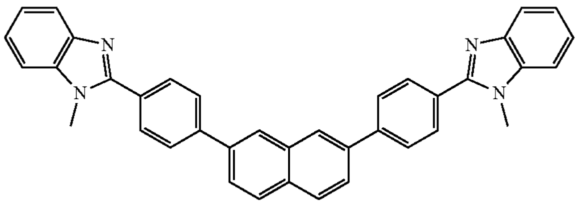

Examples 2 to 13

An organic light emitting device was manufactured in the same manner as in Example 1, except that the compounds shown in Table 2 below were used instead of Compound 1-7 and Compound 2-2.

Comparative Examples 1 to 13

An organic light emitting device was manufactured in the same manner as in Example 1, except that the compounds shown in Table 2 below were used instead of Compound 1-7 and Compound 2-2. Compounds C1 and C2 shown in Table 2 are as follows.

C1

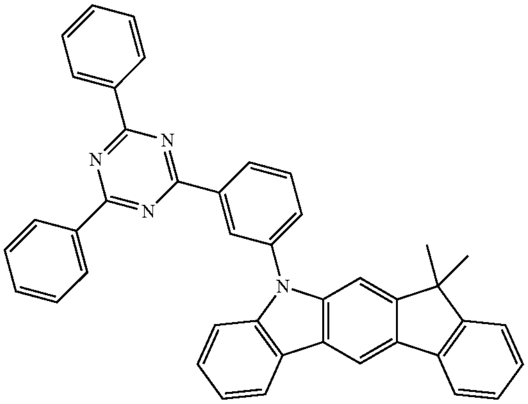

-continued

C2

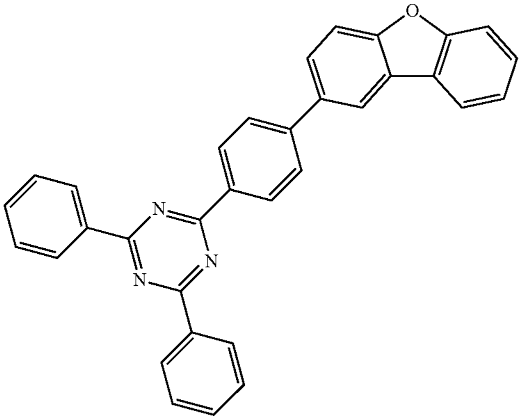

Experimental Example 1

The voltage, efficiency, color coordinate, and lifetime were measured by applying a current to the organic light emitting devices manufactured in Examples 1 to 13 and Comparative Examples 1 to 13, and the results are shown in Table 2 below. The voltage and efficiency were measured at a current density of 10 mA/cm$^2$ and the lifetime was measured at a current density of 50 mA/cm$^2$. LT95 means the time required for the luminance to be reduced to 95% of the initial luminance.

TABLE 2

| Category | Host material | Ratio | Voltage (V) (@ 10 mA/cm$^2$) | Efficiency (Cd/A) (@ 10 mA/cm$^2$) | Color coordinate (x, y) | Lifetime (hr) ($LT_{95}$ at 50 mA/cm$^2$) |
|---|---|---|---|---|---|---|
| Example 1 | Compound 1-7: Compound 2-2 | 5:5 | 3.7 | 77 | 0.46, 0.53 | 160 |
| Example 2 | Compound 1-7: Compound 2-5 | 5:5 | 3.8 | 76 | 0.45, 0.52 | 140 |
| Example 3 | Compound 1-7: Compound 2-8 | 5:5 | 3.7 | 78 | 0.45,0.53 | 135 |
| Example 4 | Compound 1-7: Compound 2-9 | 5:5 | 3.8 | 77 | 0.46, 0.54 | 110 |
| Example 5 | Compound 1-7: Compound 2-10 | 5:5 | 4.0 | 73 | 0.45, 0.53 | 120 |
| Example 6 | Compound 1-7: Compound 2-16 | 5:5 | 3.8 | 79 | 0.45, 0.54 | 150 |
| Example 7 | Compound 1-7: Compound 2-17 | 5:5 | 3.8 | 75 | 0.46, 0.53 | 130 |
| Example 8 | Compound 1-7: Compound 2-18 | 5:5 | 3.9 | 74 | 0.45, 0.52 | 145 |
| Example 9 | Compound 1-7: Compound 2-20 | 5:5 | 4.0 | 75 | 0.44, 0.53 | 120 |
| Example 10 | Compound 1-7: Compound 2-24 | 5:5 | 4.1 | 77 | 0.45, 0.53 | 130 |
| Example 11 | Compound 1-2: Compound 2-2 | 5:5 | 3.7 | 77 | 0.46, 0.53 | 175 |
| Example 12 | Compound 1-2: Compound 2-2 | 7:3 | 4.1 | 72 | 0.45 0.54 | 180 |
| Example 13 | Compound 1-2: Compound 2-5 | 7:3 | 4.1 | 68 | 0.46, 0.54 | 165 |
| Comparative Example 1 | Compound 1-7: Compound C1 | 5:5 | 3.6 | 68 | 0.45, 0.54 | 91 |
| Comparative Example 2 | Compound 1-7: Compound C2 | 5:5 | 4.0 | 60 | 0.46, 0.53 | 61 |

TABLE 2-continued

| Category | Host material | Ratio | Voltage (V) (@ 10 mA/cm$^2$) | Efficiency (Cd/A) (@ 10 mA/cm$^2$) | Color coordinate (x, y) | Lifetime (hr) ($LT_{95}$ at 50 mA/cm$^2$) |
|---|---|---|---|---|---|---|
| Comparative Example 3 | Compound C1 | 100 | 2.9 | 62 | 0.45, 0.54 | 30 |
| Comparative Example 4 | Compound 2-2 | 100 | 3.3 | 60 | 0.45, 0.54 | 60 |
| Comparative Example 5 | Compound 2-5 | 100 | 3.3 | 59 | 0.45, 0.53 | 70 |
| Comparative Example 6 | Compound 2-8 | 100 | 3.2 | 50 | 0.45, 0.53 | 30 |
| Comparative Example 7 | Compound 2-9 | 100 | 3.3 | 57 | 0.44, 0.54 | 65 |
| Comparative Example 8 | Compound 2-10 | 100 | 3.3 | 55 | 0.45, 0.53 | 35 |
| Comparative Example 9 | Compound 2-16 | 100 | 3.4 | 60 | 0.45, 0.53 | 45 |
| Comparative Example 10 | Compound 2-17 | 100 | 3.4 | 57 | 0.45, 0.52 | 37 |
| Comparative Example 11 | Compound 2-18 | 100 | 3.3 | 60 | 0.45, 0.53 | 45 |
| Comparative Example 12 | Compound 2-20 | 100 | 3.4 | 58 | 0.43, 0.54 | 60 |
| Comparative Example 13 | Compound 2-24 | 100 | 3.4 | 59 | 0.44, 0.52 | 40 |

As shown in Table 2, in the case of the organic light emitting device manufactured using the compounds according to the present invention as a host in the light emitting layer, it was confirmed that they exhibited excellent performance in terms of efficiency and lifetime as compared with the organic light emitting devices of Comparative Examples. In addition, when comparing Example 11 with Example 1, it was confirmed that there was a difference in lifetime depending on the type of Chemical Formula 1. Further, when comparing Examples 11 to 13 with Examples 1 to 2, it was confirmed that there were differences in the voltage and lifetime characteristics depending on the ratio of the compounds of Chemical Formula 1 and Chemical Formula 2. Finally, when the compounds of Chemical Formula 1 and Chemical Formula 2 were used together, it was confirmed that they had characteristics of high efficiency and long lifetime as compared with the case where it is not so.

Example 14

On the ITO transparent electrode prepared as in Example 1, the following hexanitrile hexaazatriphenylene (HAT) compound was thermally vacuum-deposited to a thickness of 500 Å to form a hole injection layer. On the hole injection layer, Compound HT-1 was thermally vacuum-deposited to a thickness of 800 Å and sequentially, Compound HT-3 was vacuum-deposited to a thickness of 500 Å to form a hole transport layer. Next, Compound 1-2 and Compound 2-2 previously prepared were co-deposited at a weight ratio shown in Table 3 below on the hole transport layer. At this time, phosphorescent dopant D2 was co-deposited at a ratio of 6% based on the total weight of the light emitting layer to form a light emitting layer with a thickness of 350 Å. Compound ET-3 was vacuum-deposited on the light emitting layer to a thickness of 50 Å to form a hole blocking layer, and Compound ET-4 and LiQ (Lithium Quinolate) were co-deposited at a weight ratio of 1:1 on the hole blocking layer to form an electron transport layer with a thickness of 250 Å. Lithium fluoride (LiF) and aluminum were sequentially deposited to have a thickness of 10 Å and 1000 Å, respectively, on the electron transport layer, thereby forming a cathode.

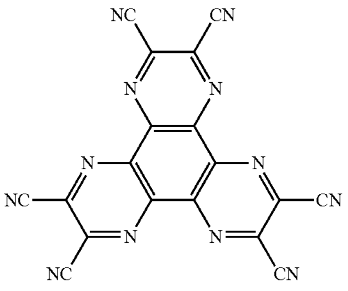

HAT

HT-1

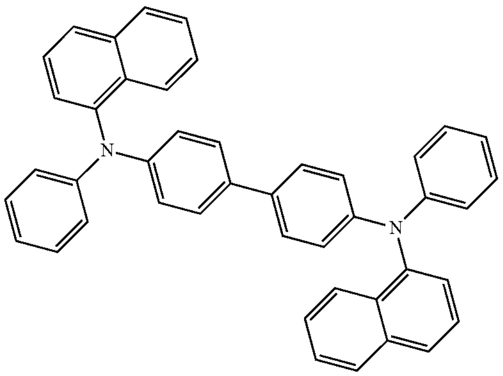

-continued

HT-3

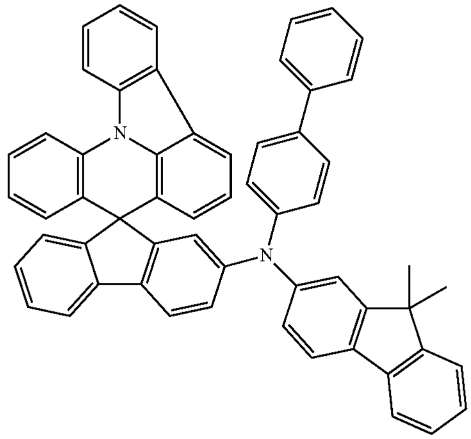

D2

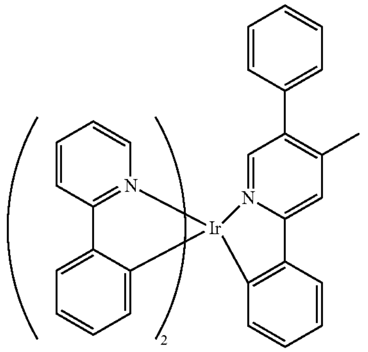

ET-3

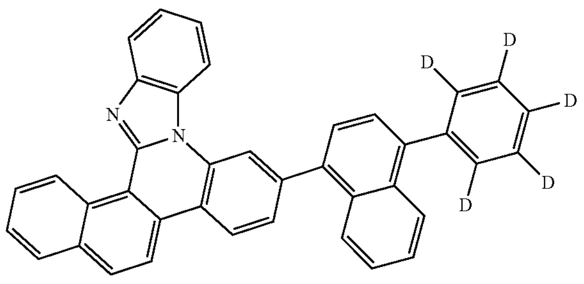

-continued

ET-4

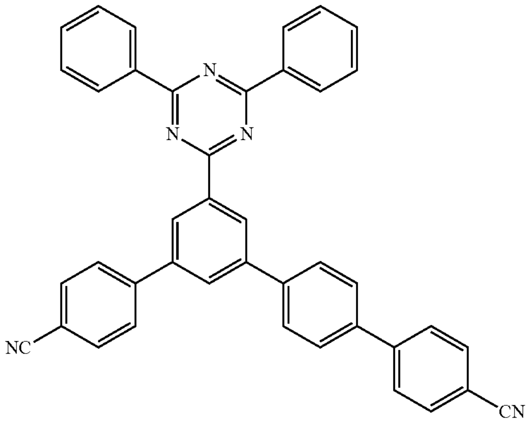

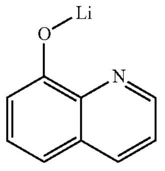

LiQ

In the above-mentioned process, the vapor deposition rate of the organic material was maintained at 0.4 to 0.7 Å/sec, the deposition rate of lithium fluoride of the cathode was maintained at 0.3 Å/sec, the deposition rate of aluminum was maintained at 2 Å/sec, and the degree of vacuum during the deposition was maintained at $1\times10^{-7}$ to $5\times10^{-8}$ tom Examples 15 to 27

An organic light emitting device was manufactured in the same manner as in Example 14, except that the compounds shown in Table 3 below were used instead of Compound 1-2 and Compound 2-2.

Comparative Examples 14 to 25

An organic light emitting device was manufactured in the same manner as in Example 14, except that the compounds shown in Table 3 below were used instead of Compound 1-2 and Compound 2-2.

Experimental Example 2

The voltage, efficiency, color coordinate and lifetime were measured by applying a current to the organic light emitting devices manufactured in Examples 14 to 27 and Comparative Examples 14 to 25, and the results are shown in Table 3 below. The voltage and efficiency were measured at a current density of 10 $mA/cm^2$ and the lifetime was measured at a current density of 50 $mA/cm^2$. LT95 means the time required for the luminance to be reduced to 95% of the initial luminance.

TABLE 3

| Category | Host material | Ratio | Voltage (V) (@ 10 mA/cm$^2$) | Efficiency (Cd/A) (@ 10 mA/cm$^2$) | Color coordinate (x, y) | Lifetime (hr) ($LT_{95}$ at 50 mA/cm$^2$) |
|---|---|---|---|---|---|---|
| Example 14 | Compound 1-2: Compound 2-2 | 5:5 | 3.7 | 77 | 0.36, 0.62 | 110 |
| Example 15 | Compound 1-2: Compound 2-3 | 5:5 | 3.8 | 76 | 0.35, 0.61 | 95 |
| Example 16 | Compound 1-2: Compound 2-4 | 5:5 | 3.7 | 78 | 0.36, 0.60 | 80 |
| Example 17 | Compound 1-2: Compound 2-7 | 5:5 | 3.8 | 77 | 0.35, 0.62 | 100 |
| Example 18 | Compound 1-2: Compound 2-11 | 5:5 | 4.0 | 73 | 0.35, 0.63 | 90 |
| Example 19 | Compound 1-2: Compound 2-12 | 5:5 | 3.8 | 79 | 0.36, 0.62 | 85 |
| Example 20 | Compound 1-2: Compound 2-15 | 5:5 | 3.9 | 78 | 0.37, 0.62 | 100 |
| Example 21 | Compound 1-2: Compound 2-21 | 5:5 | 3.7 | 76 | 0.36, 0.61 | 90 |
| Example 22 | Compound 1-2: Compound 2-22 | 5:5 | 3.8 | 75 | 0.35, 0.61 | 90 |
| Example 23 | Compound 1-5: Compound 2-2 | 6:4 | 3.9 | 77 | 0.36,0.61 | 135 |
| Example 24 | Compound 1-8: Compound 2-3 | 5:5 | 3.7 | 79 | 0.35, 0.62 | 105 |
| Example 25 | Compound 1-2: Compound 2-7 | 6:4 | 4.0 | 79 | 0.35, 0.62 | 110 |
| Example 26 | Compound 1-8: Compound 2-15 | 6:4 | 3.8 | 78 | 0.37,0.61 | 110 |
| Example 27 | Compound1 -3: Compound 2-21 | 6:4 | 3.6 | 75 | 0.35, 0.62 | 100 |
| Comparative Example 14 | Compound 1-2: Compound C1 | 5:5 | 4.2 | 55 | 0.35, 0.61 | 55 |
| Comparative Example 15 | Compound 1-2: Compound C2 | 5:5 | 4.6 | 49 | 0.35, 0.62 | 35 |
| Comparative Example 16 | Compound 1-7: Compound C1 | 5:5 | 4.0 | 58 | 0.34, 0.62 | 56 |
| Comparative Example 17 | Compound2 -2 | 100 | 3.6 | 50 | 0.35, 0.61 | 45 |
| Comparative Example 18 | Compound 2-3 | 100 | 3.6 | 45 | 0.34, 0.62 | 20 |
| Comparative Example 19 | Compound 2-4 | 100 | 3.5 | 51 | 0.35, 0.62 | 45 |
| Comparative Example 20 | Compound 2-7 | 100 | 3.5 | 50 | 0.36, 0.62 | 55 |
| Comparative Example 21 | Compound 2-11 | 100 | 3.7 | 55 | 0.35, 0.62 | 50 |
| Comparative Example 22 | Compound 2-12 | 100 | 3.8 | 47 | 0.34, 0.62 | 35 |
| Comparative Example 23 | Compound 2-15 | 100 | 3.8 | 56 | 0.35, 0.61 | 55 |
| Comparative Example 24 | Compound 2-21 | 100 | 3.9 | 49 | 0.35, 0.62 | 40 |
| Comparative Example 25 | Compound 2-22 | 100 | 3.8 | 50 | 0.35 0.62 | 50 |

As shown in Table 3, it was confirmed that when the compounds of Chemical Formula 1 and Chemical Formula 2, which are the compounds of the present invention, were used together as the light emitting layer material, as in the previous examples, excellent characteristics were exhibited in terms of driving voltage and lifetime as compared with the case of using the materials of Comparative Examples. In addition, in the previous examples, it was confirmed to have a long lifetime characteristics with the same tendency, as compared with the light emitting device manufactured with the compound of Chemical Formula 2 alone depending on the type of Chemical Formula and depending on the composition ratio of the compounds of Chemical Formula 1 and Chemical Formula 2,

| [Description of symbols] | |
|---|---|
| 1: substrate, | 2: anode, |
| 3: light emitting layer | 4: cathode, |
| 5: hole injection layer | 6: hole transport layer |
| 7: electron blocking layer | 8: electron transport layer, |
| 9: electron injection layer | 10: hole blocking layer |

The invention claimed is:

1. An organic light emitting device comprising:

an anode;

a cathode; and a light emitting layer disposed between the anode and the cathode;

wherein the light emitting layer includes a compound of the following Chemical Formula 1-1 and a compound of the following Chemical Formula 2 co-deposited in a weight ratio from 5:5 to 7:3 in combination with a dopant material that includes an iridium complex:

< Chemical Formula 1-1 >

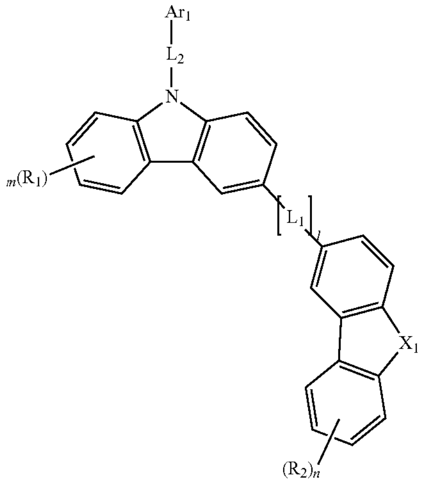

wherein in Chemical Formula 1-1:

$L_1$ and $L_2$ are each a single bond, and l is 1;

$X_1$ is any one selected from among the following:

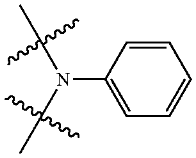

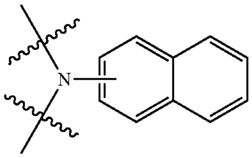

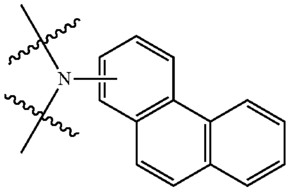

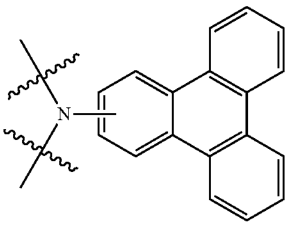

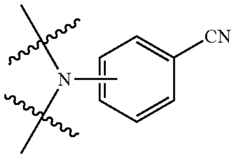

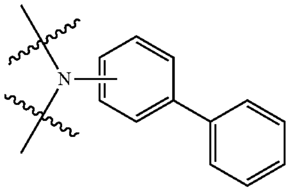

-continued

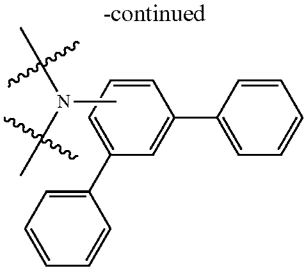

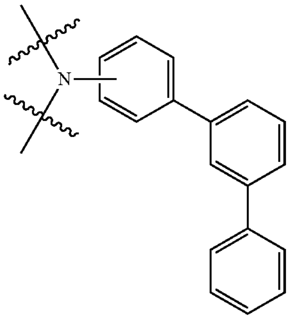

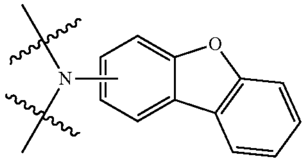

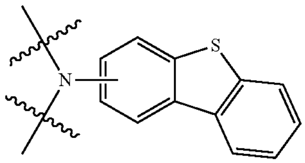

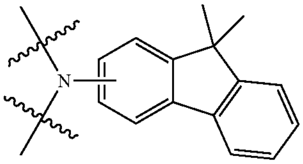

;

$R_1$ and $R_2$ are each hydrogen, and n and m are 4; and $Ar_1$ s a phenyl or biphenyl;

< Chemical Formula 2 >

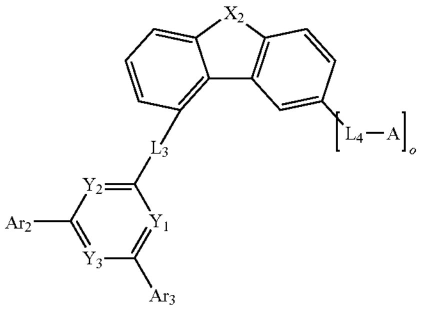

wherein in Chemical Formula 2:

$L_3$ is a single bond or phenylene, and $L_4$ is a single bond;

o is 1;

$X_2$ is O or S;

A is

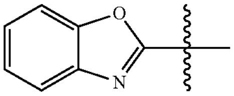

or

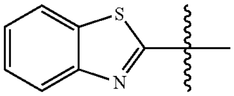

;

$Y_1$, $Y_2$ and $Y_3$ are each independently N or CH, with the proviso that at least two of $Y_1$, $Y_2$ and $Y_3$ are N; and a) $Ar_2$ is phenyl, and $Ar_3$ is biphenyl; or b) $Ar_2$ is phenyl or biphenyl, and $Ar_3$ is terphenylyl, triphenylenyl, diphenylfluorenyl, carbazolyl, phenylcarbazolyl, dibenzofuranyl, dibenzothiophenyl, phenyl substituted with carbazole, phenyl substituted with dibenzofuranyl, phenyl substituted with dibenzothiophenyl, or phenyl substituted with benzothiazolyl.

2. The organic light emitting device according to claim 1, wherein the compound of Chemical Formula 1-1 is any one compound selected from among the following compounds:

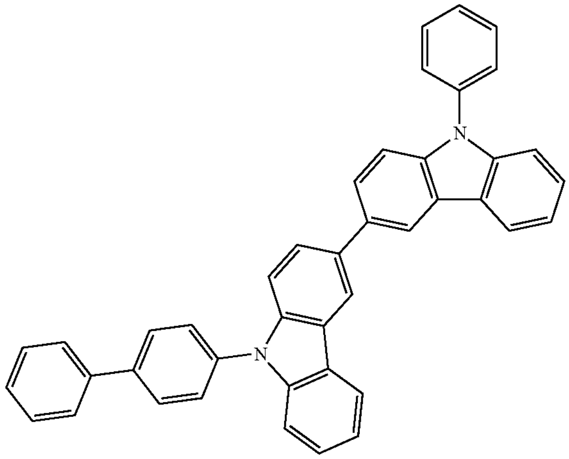 [SMILES: c1ccc(-c2ccc(-n3c4ccccc4c4cc(-c5ccc6c(c5)c5ccccc5n6-c5ccccc5)ccc43)cc2)cc1]

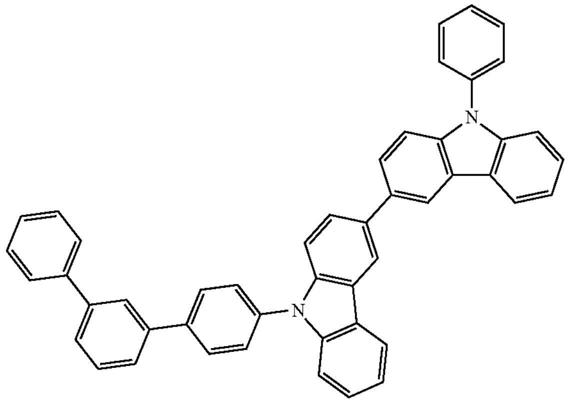

-continued

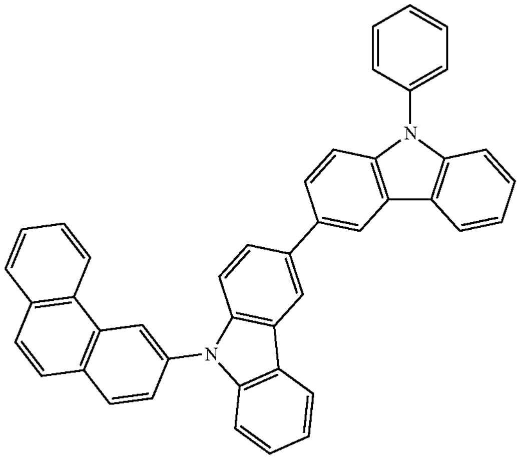

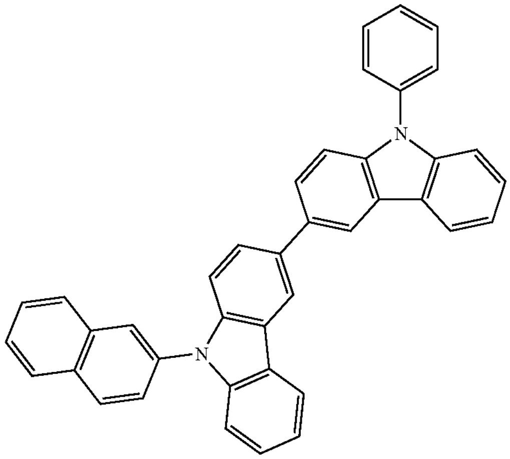

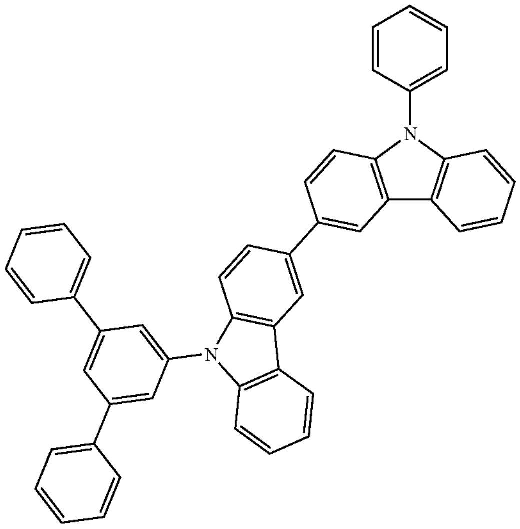

-continued
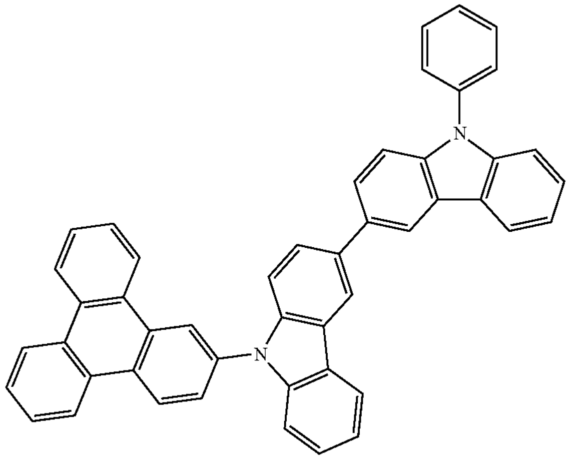
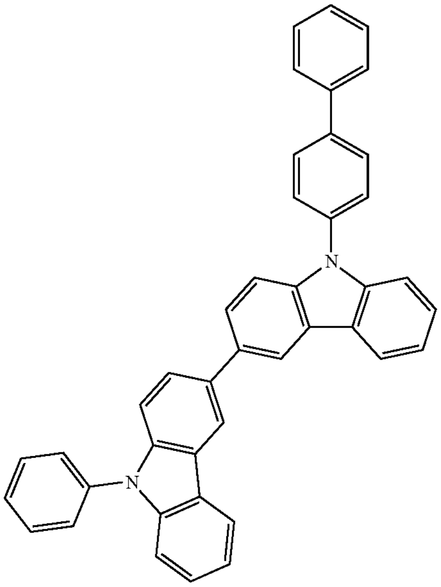
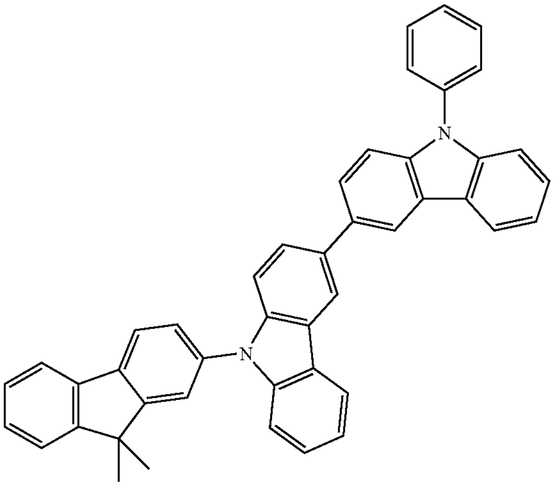
-continued
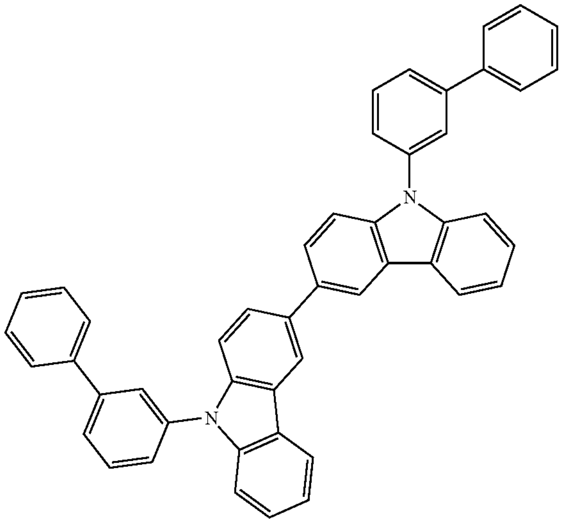
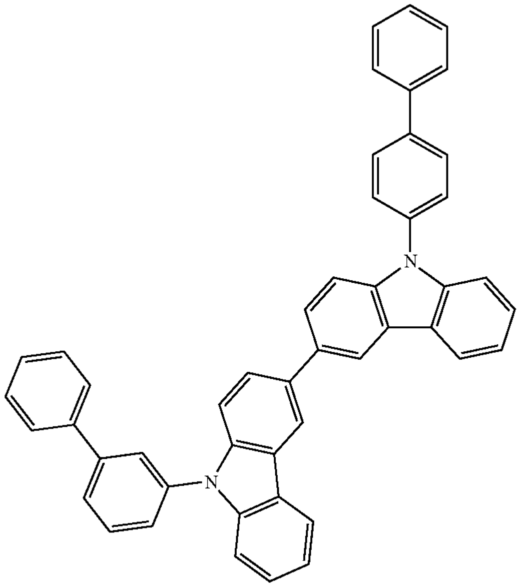
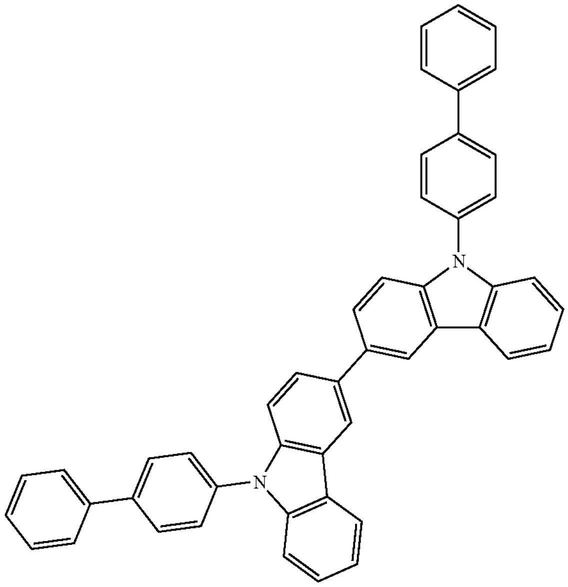

-continued
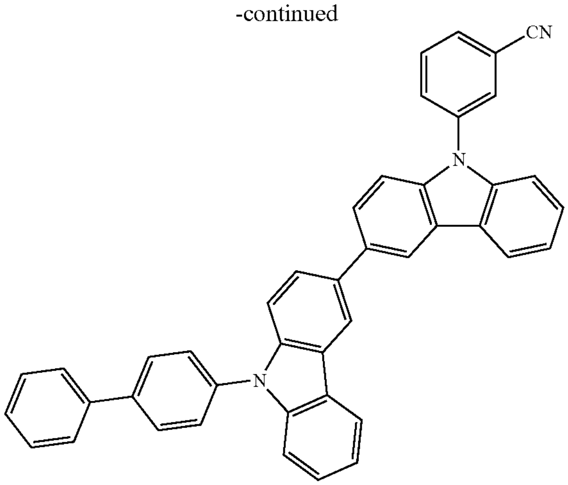
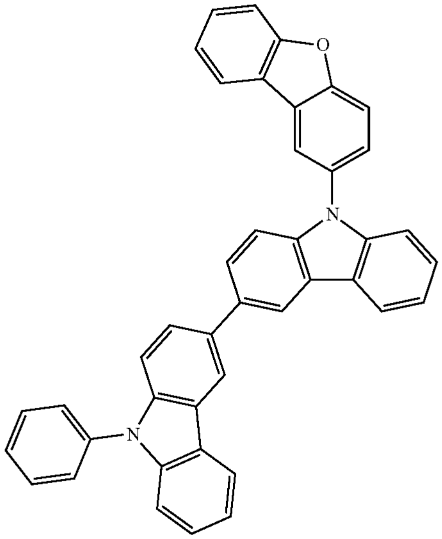
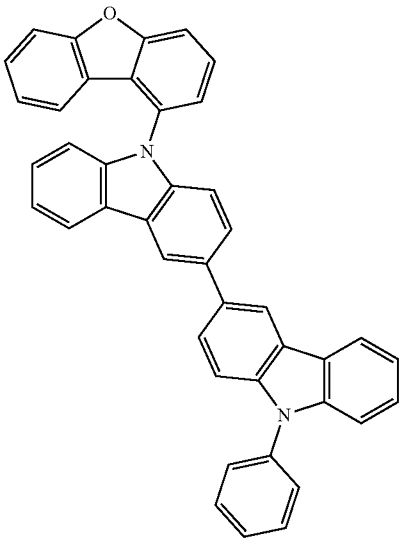
-continued
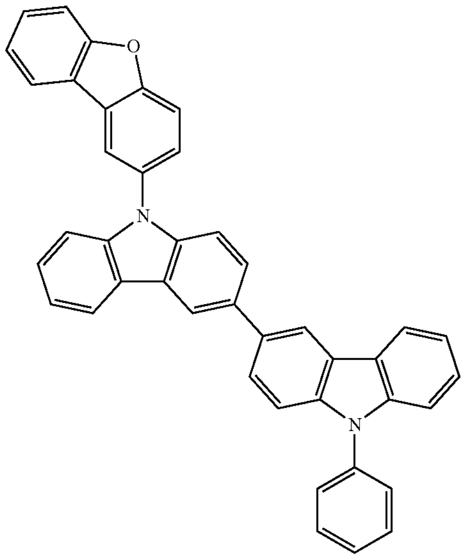
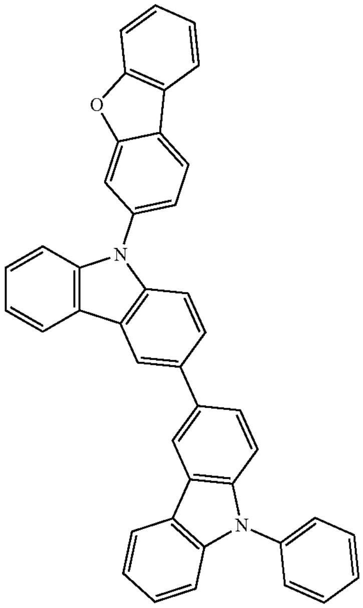
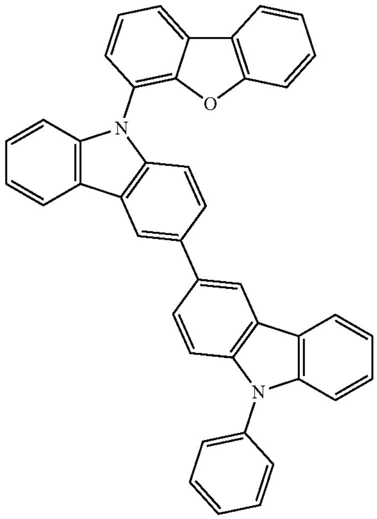

-continued
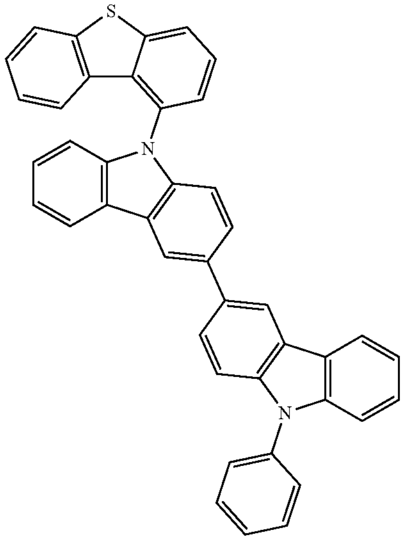
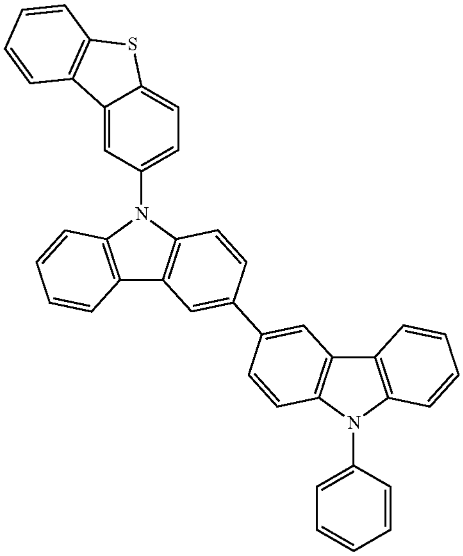
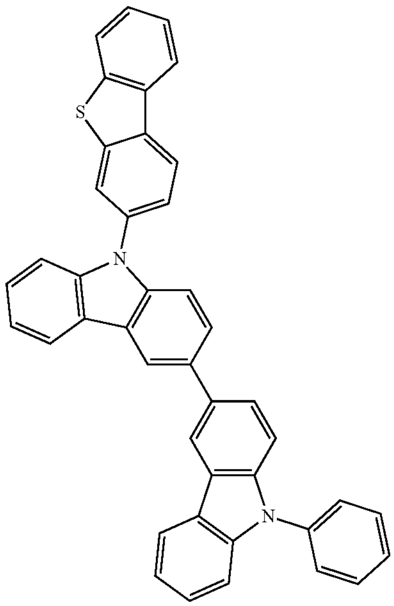
-continued
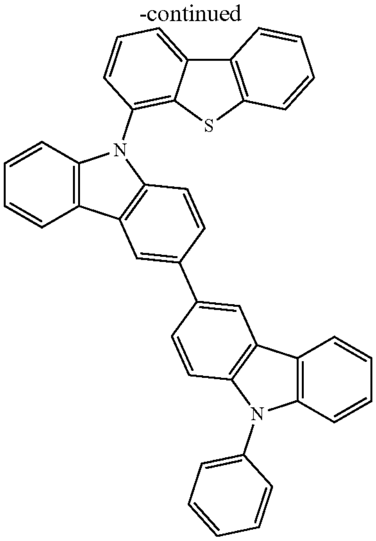
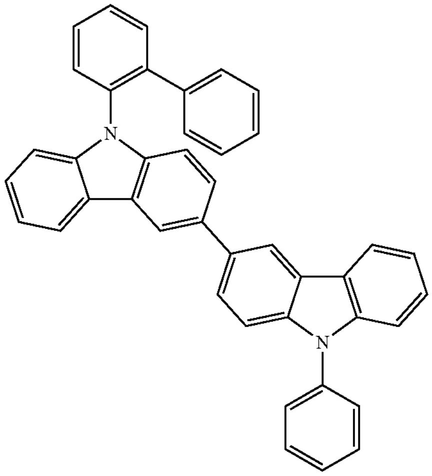
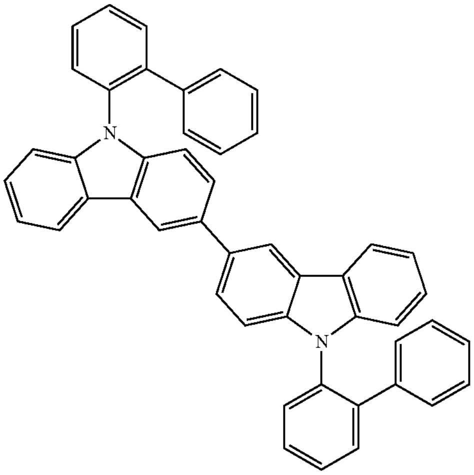

-continued

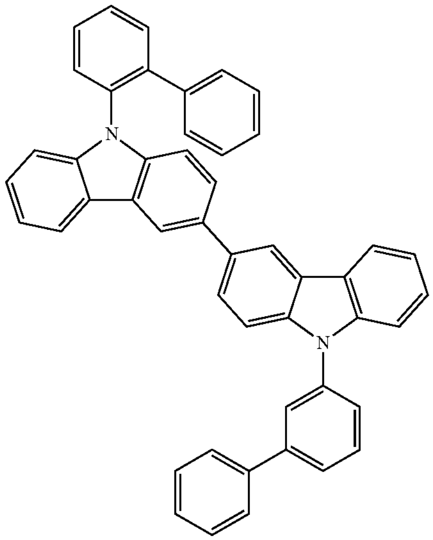

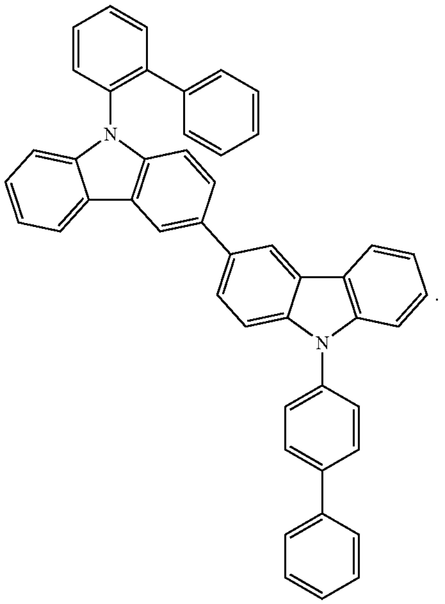

3. The organic light emitting device according to claim 1, wherein Chemical Formula 2 is the following Chemical Formula 2-1 to Chemical Formula 2-4:

Chemical Formula 2-1

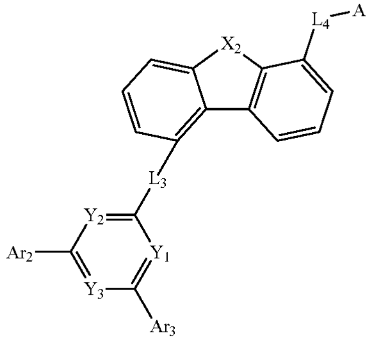

-continued

Chemical Formula 2-2

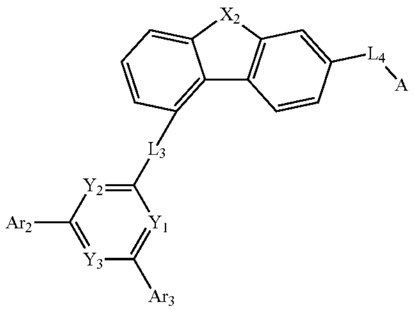

Chemical Formula 2-3

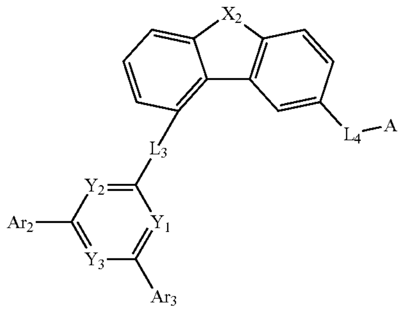

Chemical Formula 2-4

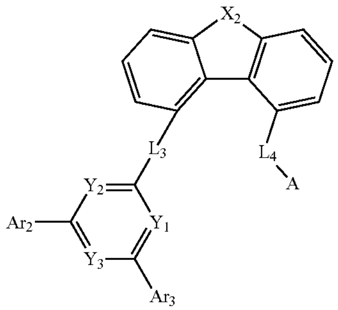

wherein in Chemical Formula 2-1 to Chemical Formula 2-4, $L_3$, $L_4$, $X_2$, A, $Y_1$, $Y_2$, $Y_3$, $Ar_2$ and $Ar_3$ are as defined in claim 1.

4. The organic light emitting device according to claim 1, wherein the compound of Chemical Formula 2 is any one compound selected from among the following compounds:

-continued
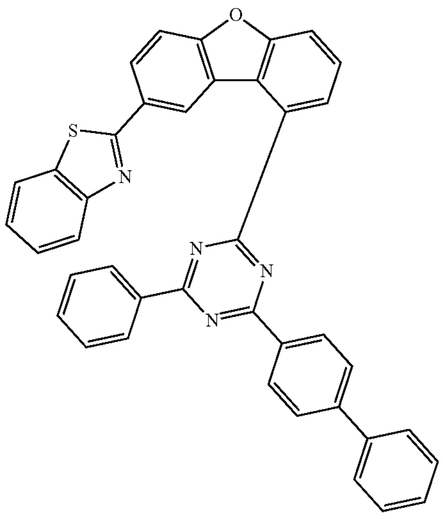
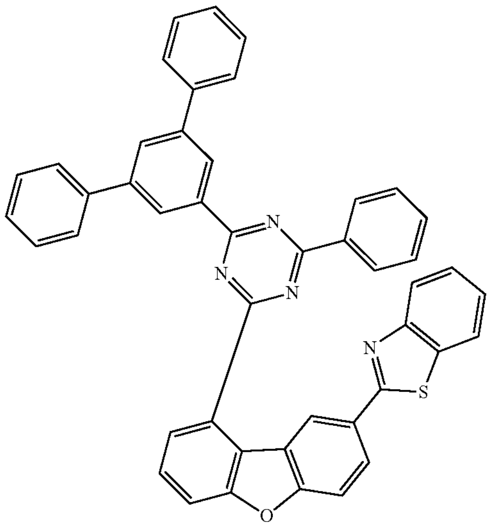
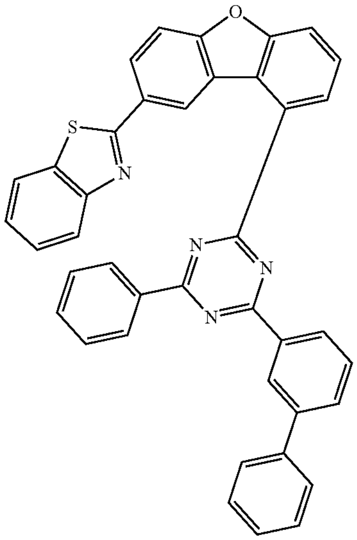
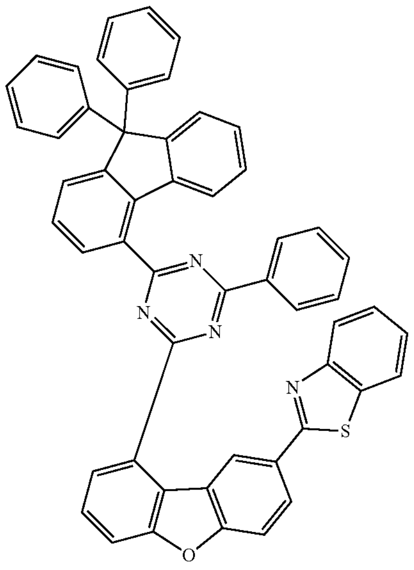
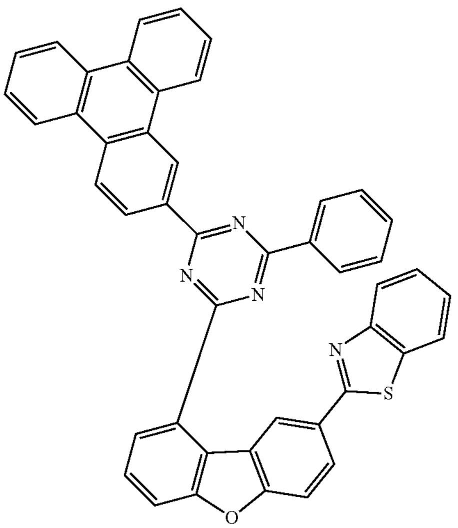
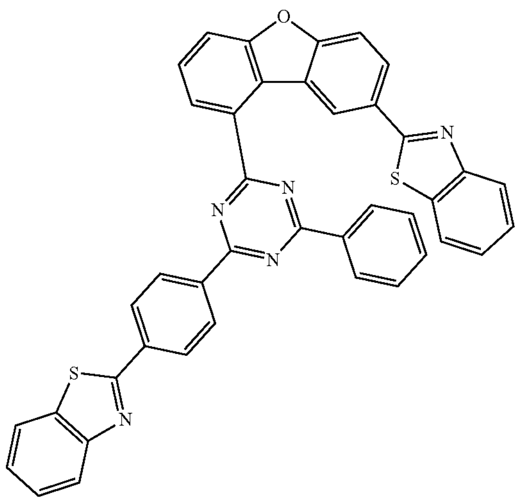

-continued
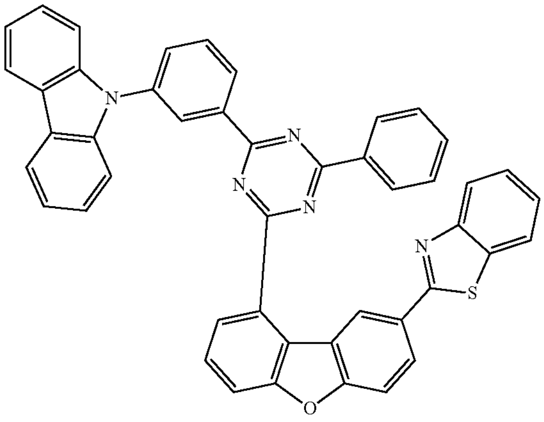
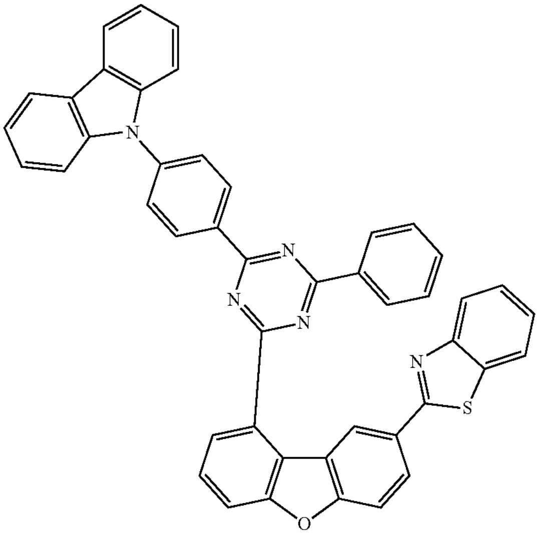
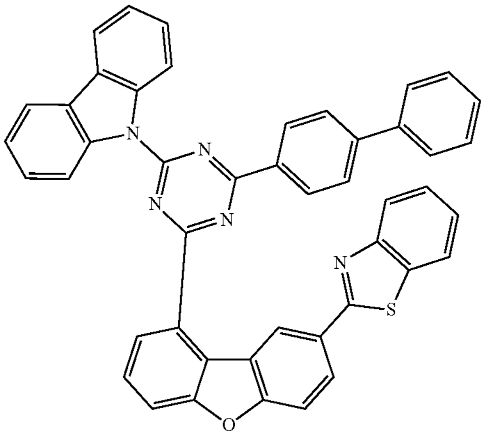
-continued
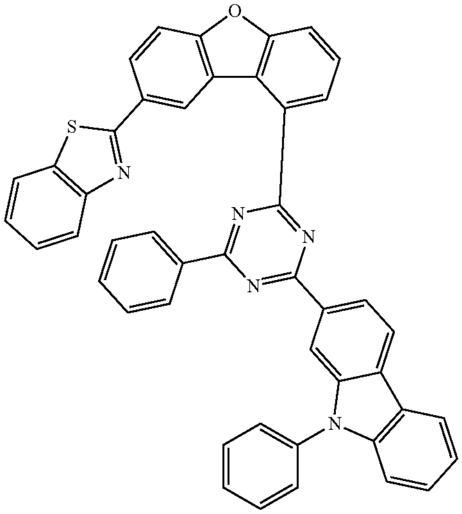
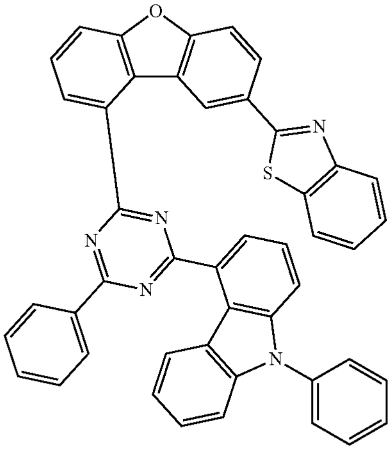
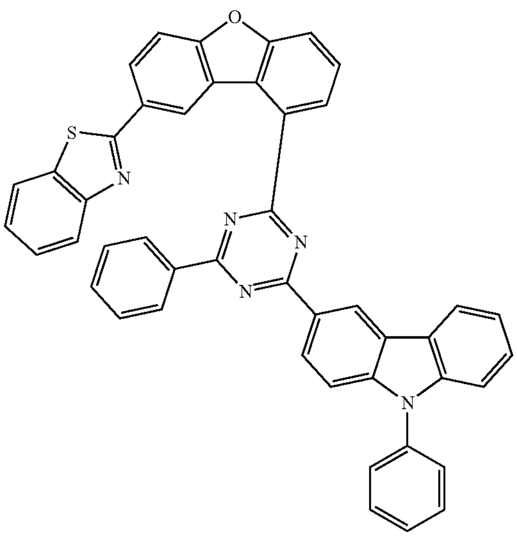

-continued
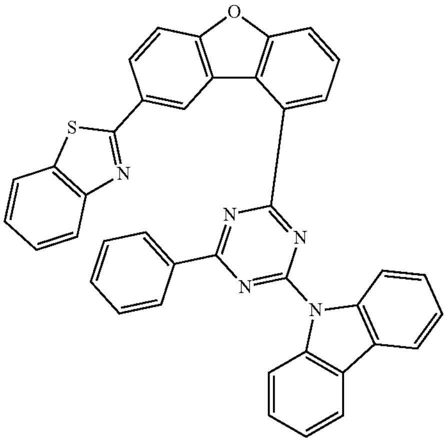
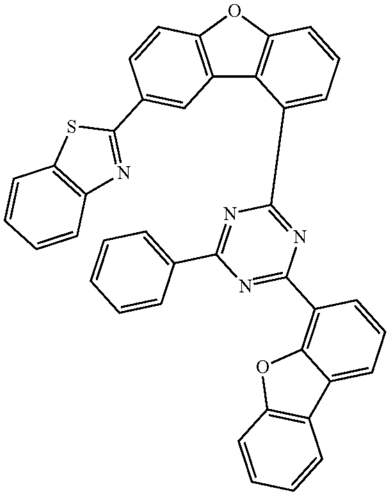
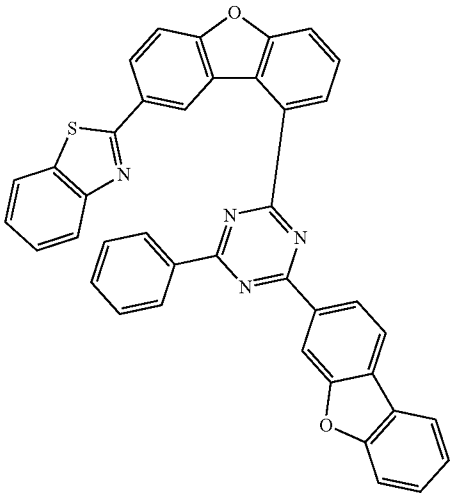
-continued
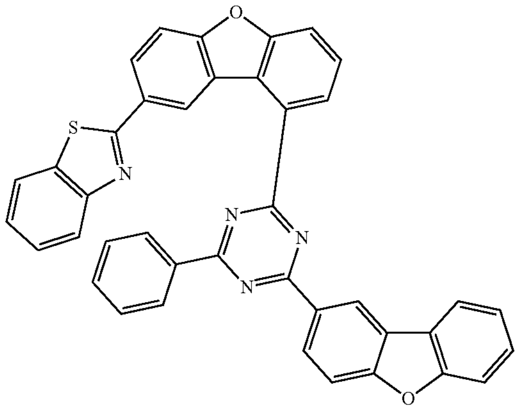
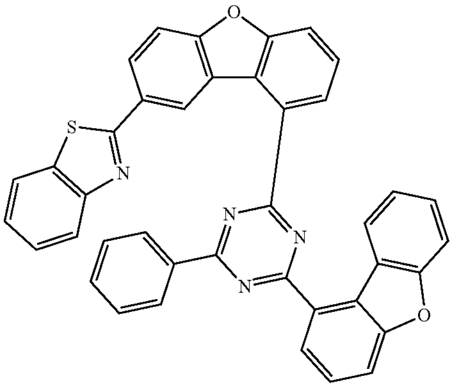
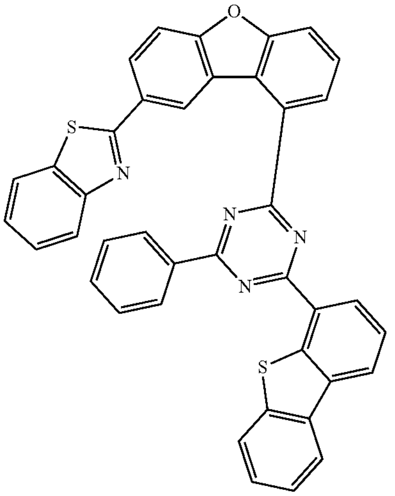

-continued
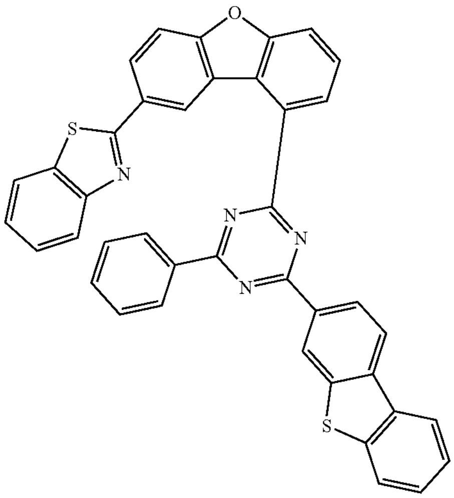
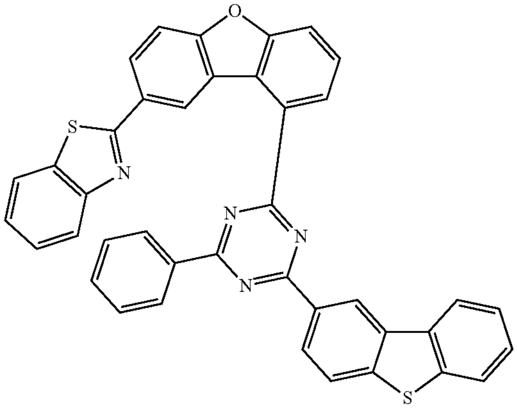
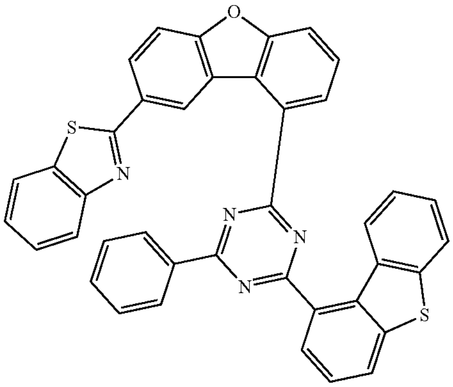
-continued
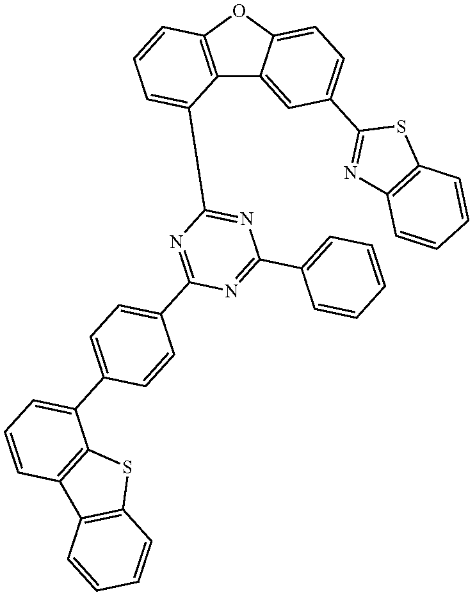
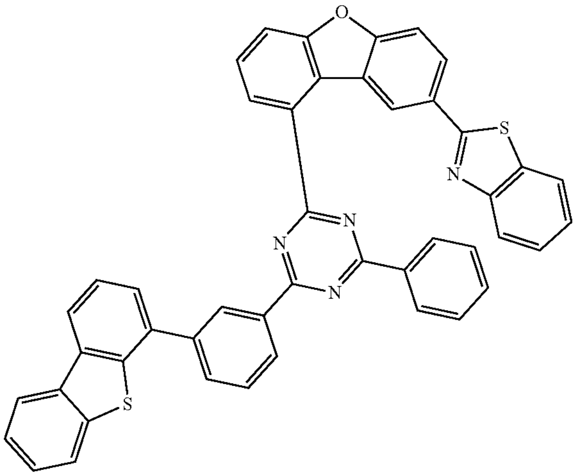
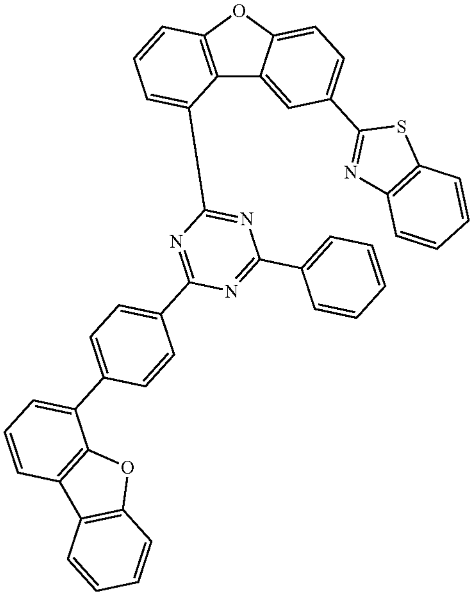

-continued
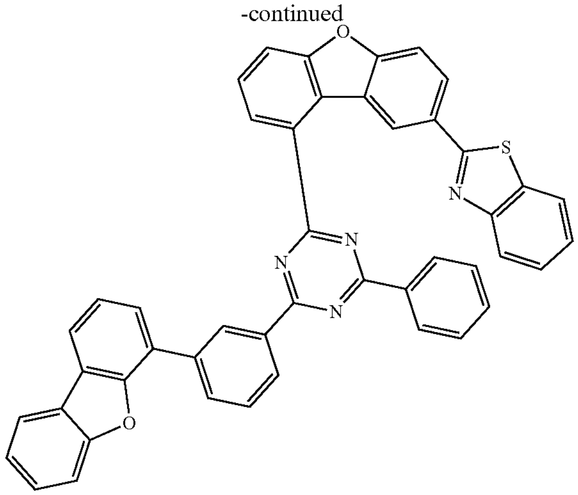
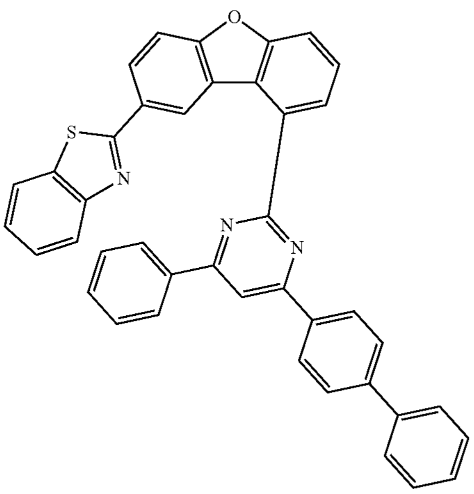
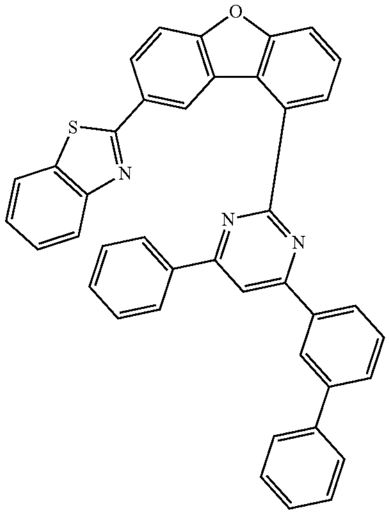
-continued
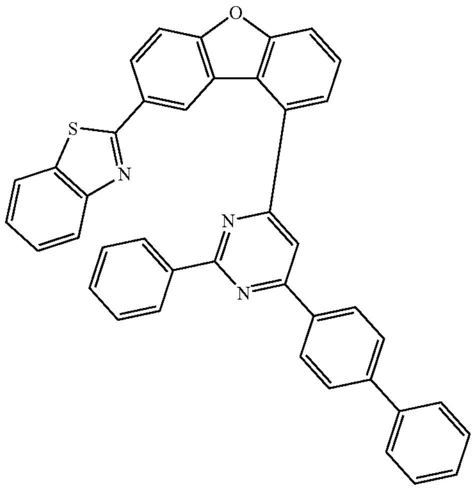
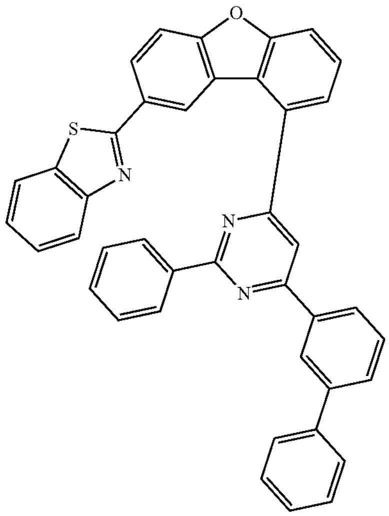
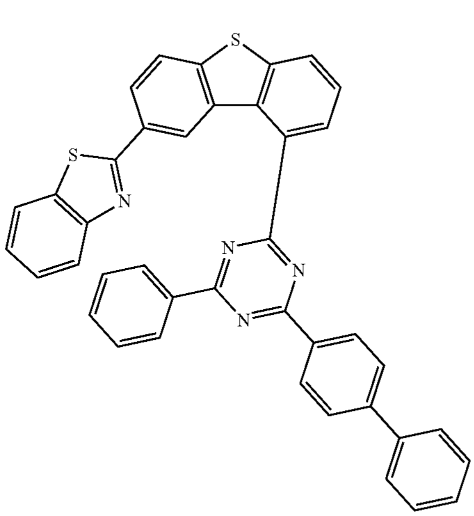

-continued
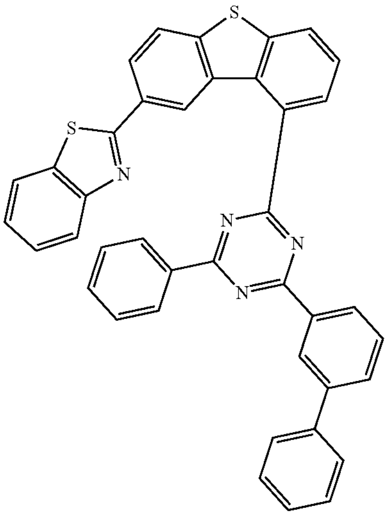
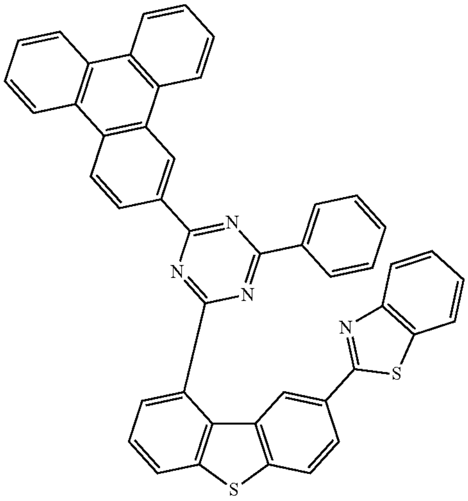
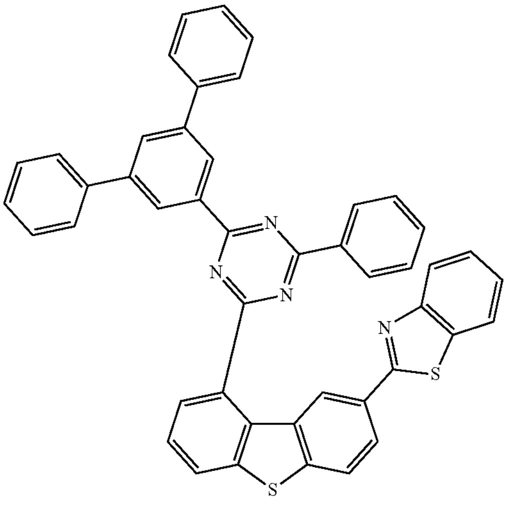
-continued
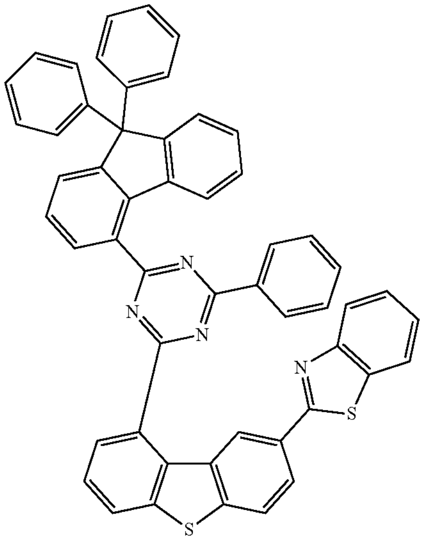
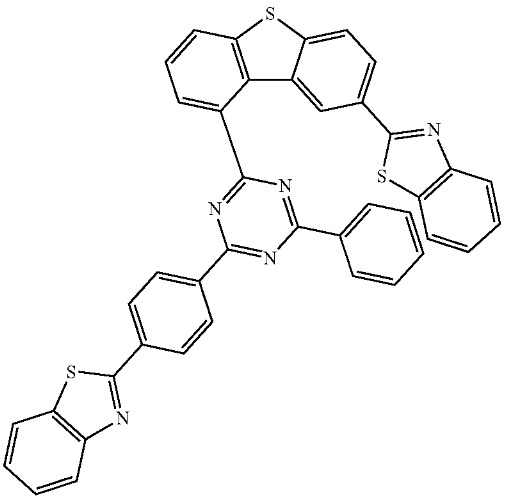
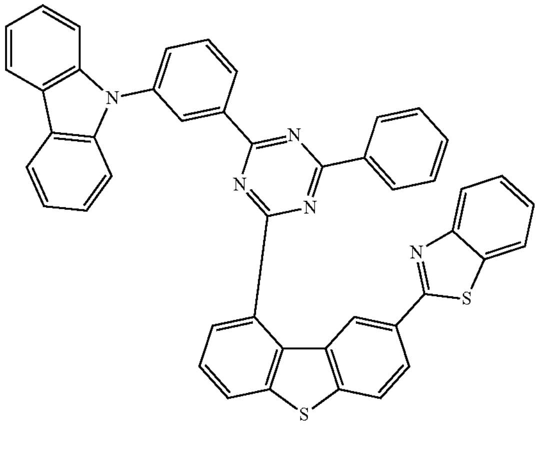

-continued
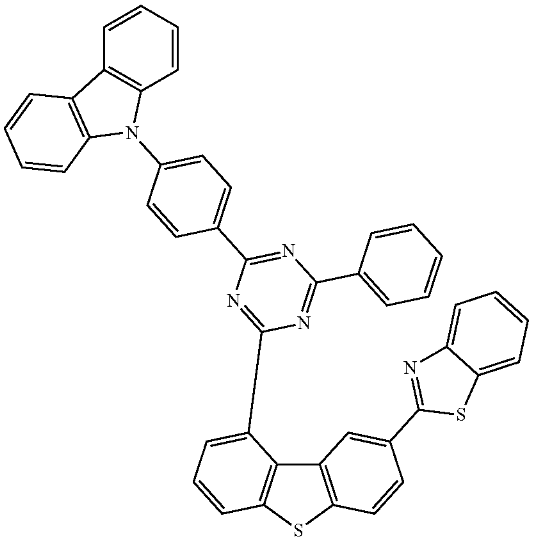
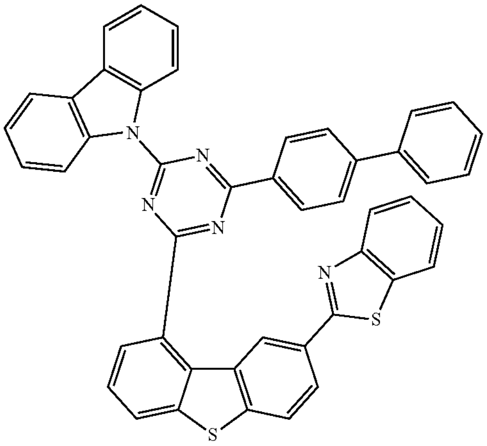
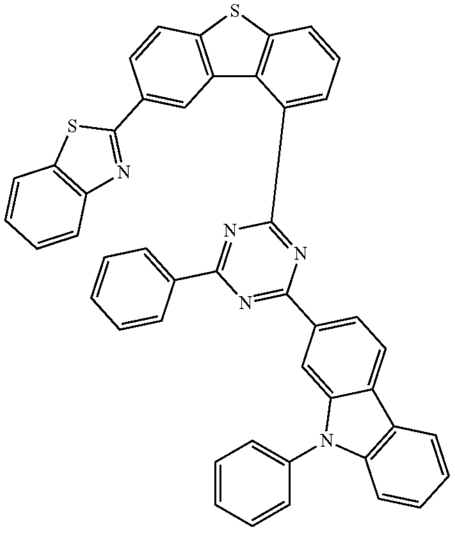
-continued
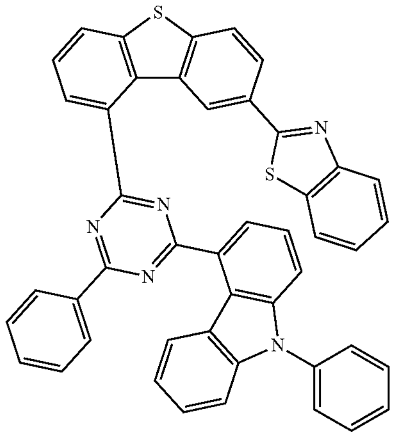
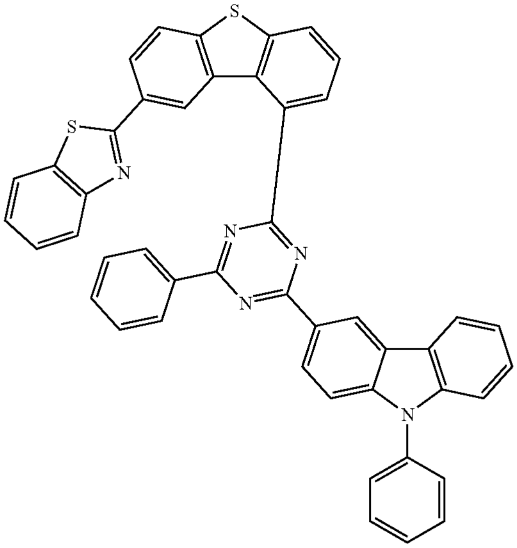
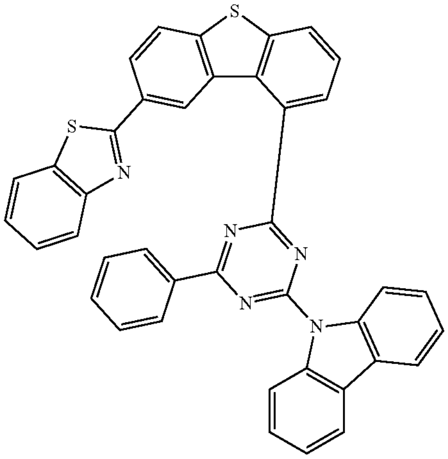

-continued
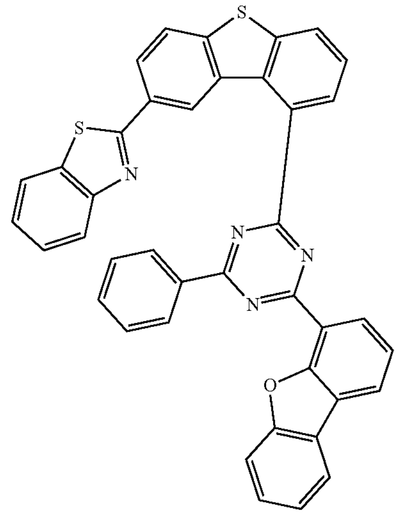
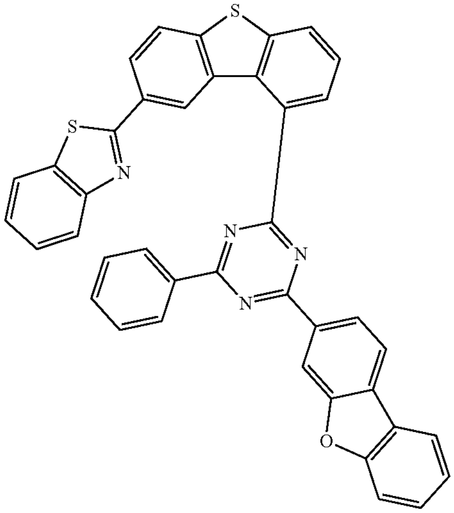
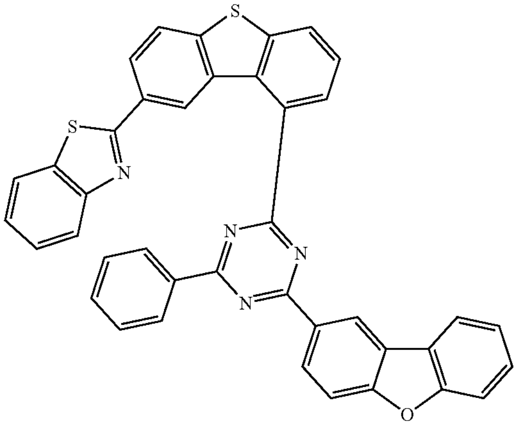
-continued
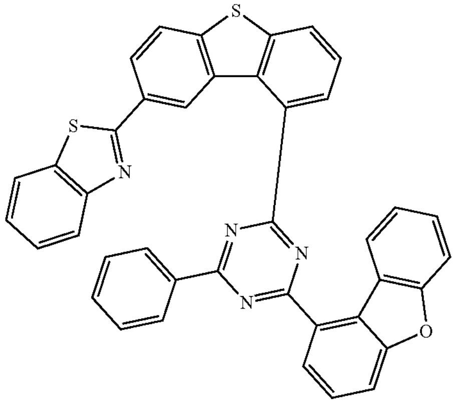
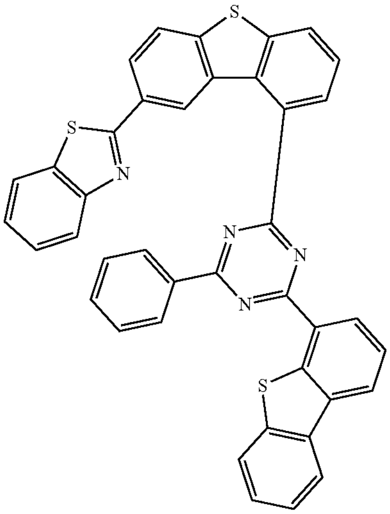
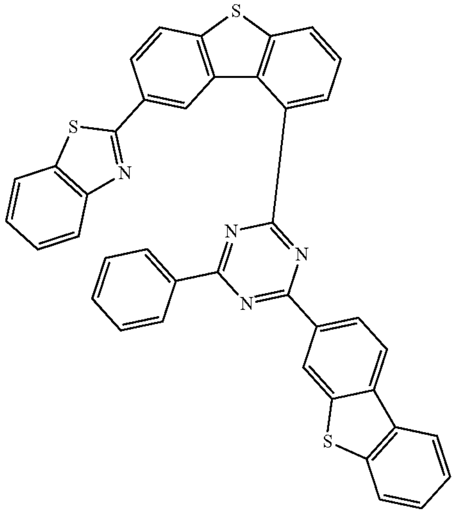

-continued
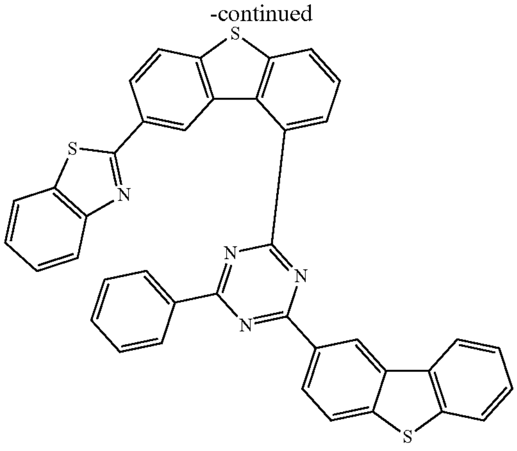
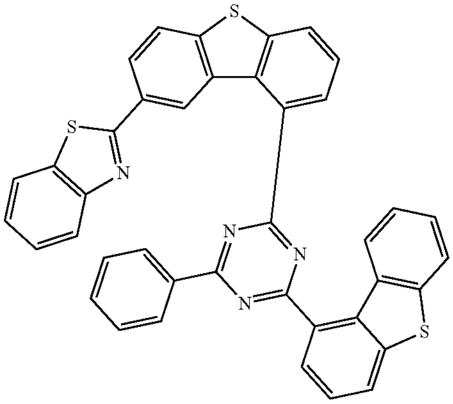 [SMILES: c1ccc(-c2nc(-c3cccc4sc5ccccc5c34)nc(-c3cccc4sc5ccc(-c6nc7ccccc7s6)cc5c34)n2)cc1]
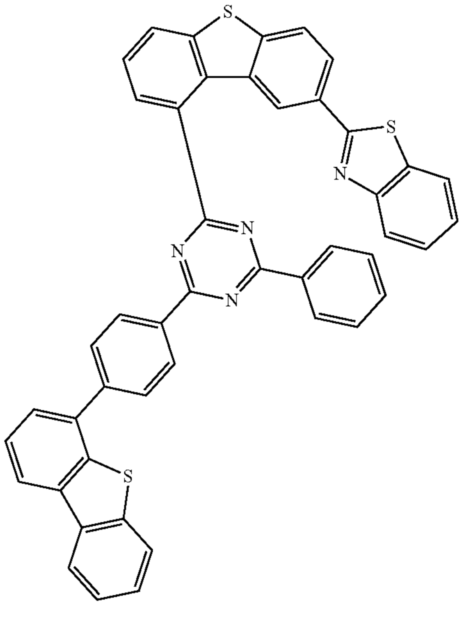
-continued
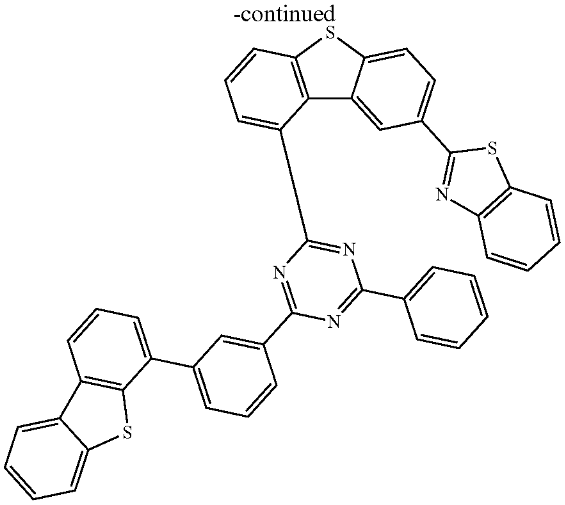
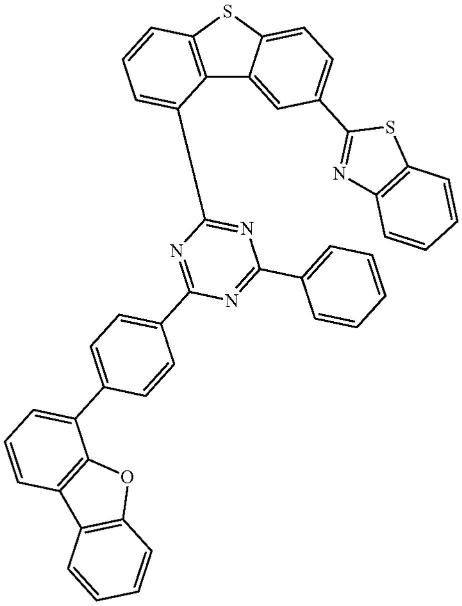
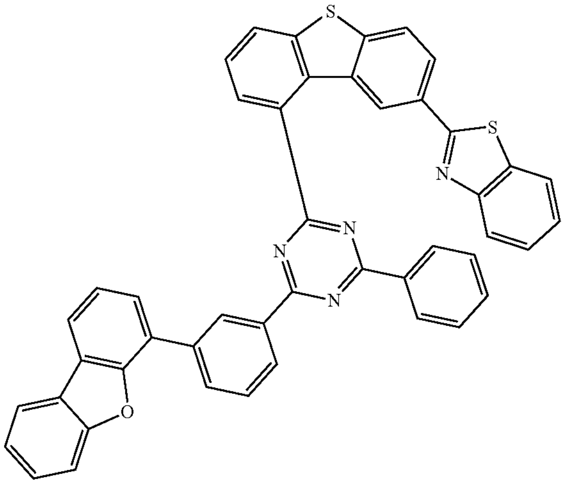

-continued
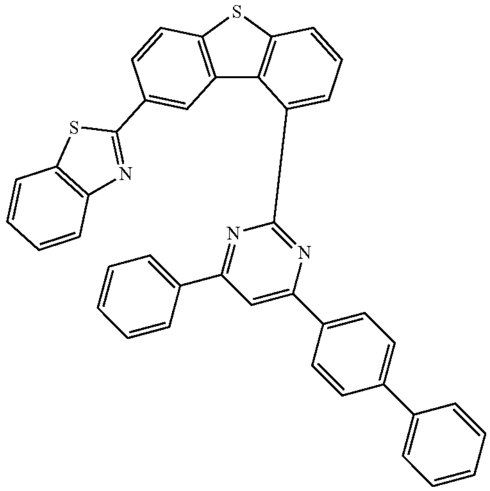
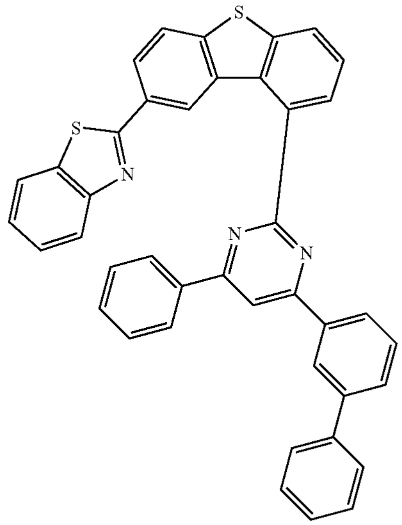
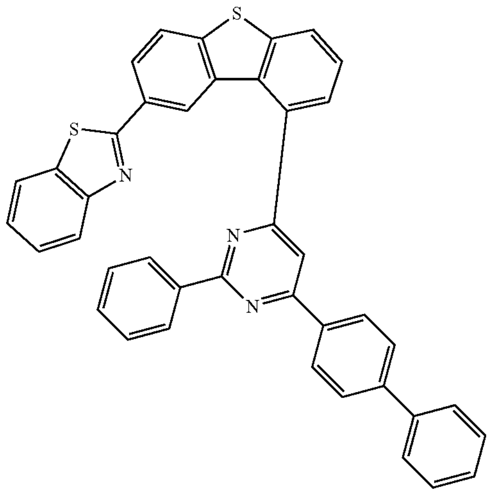
-continued
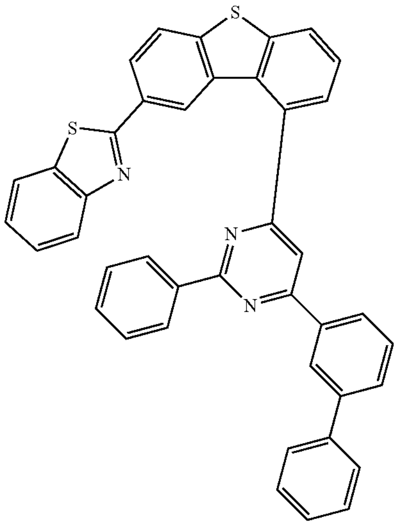
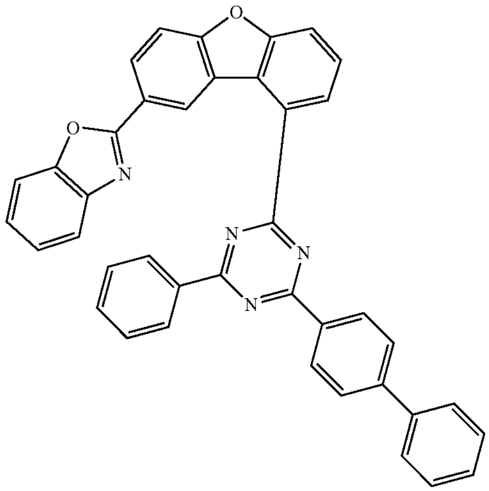
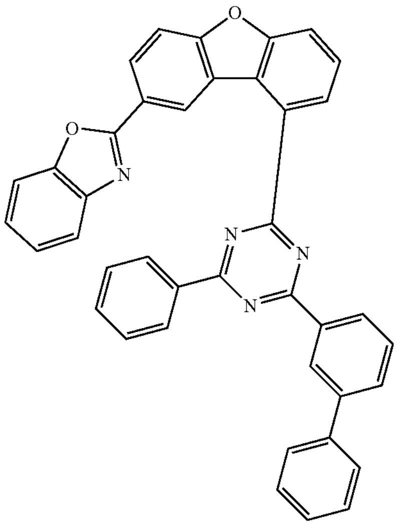

-continued
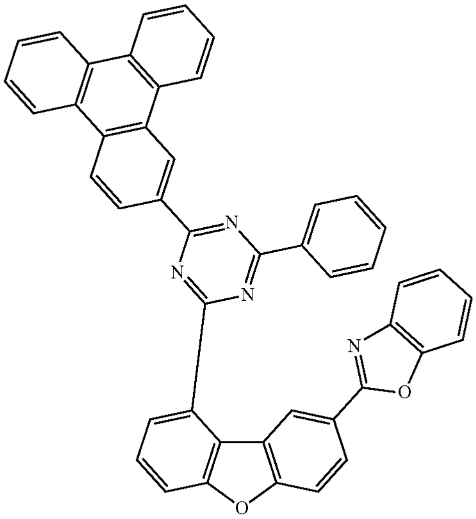
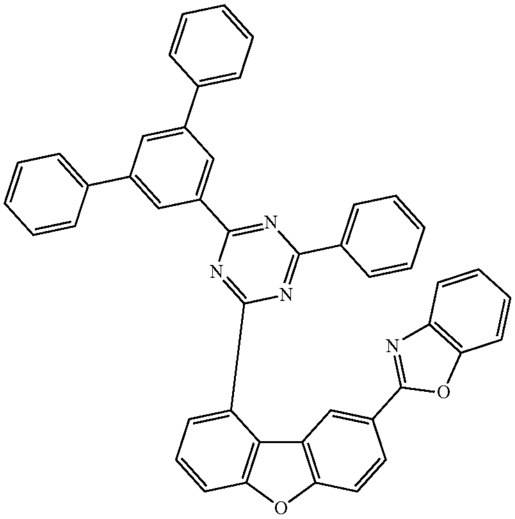
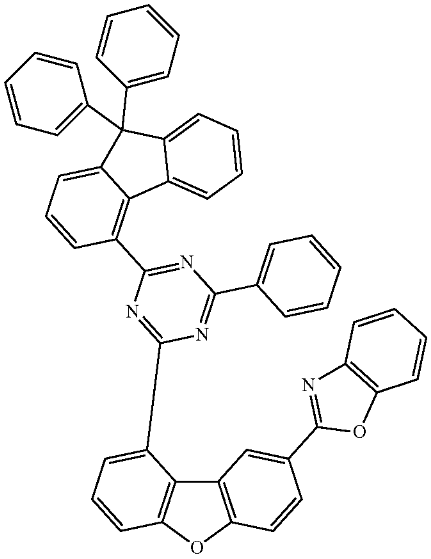 [SMILES: c1ccc(-c2nc(-c3cccc4c3-c3ccccc3C4(c3ccccc3)c3ccccc3)nc(-c3cccc4oc5ccc(-c6nc7ccccc7o6)cc5c34)n2)cc1]
-continued
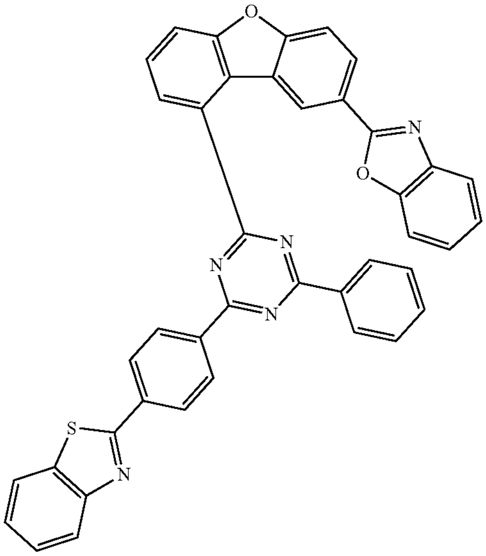
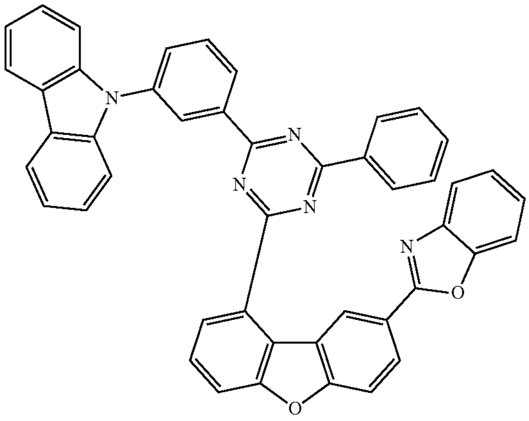
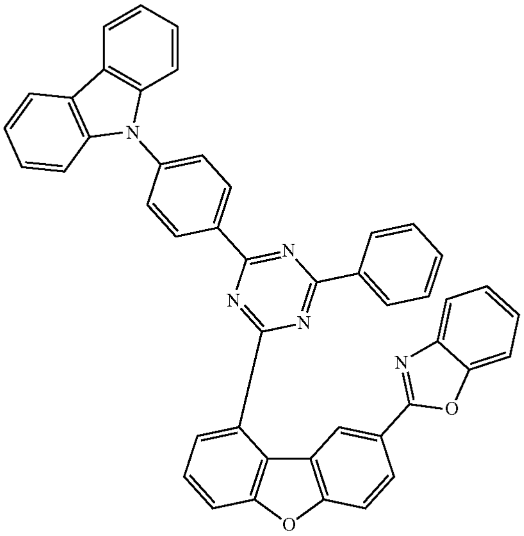

-continued
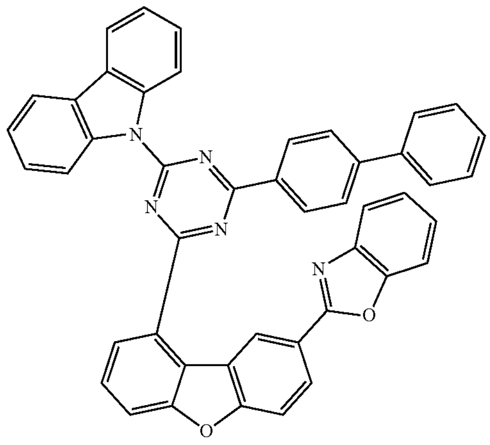
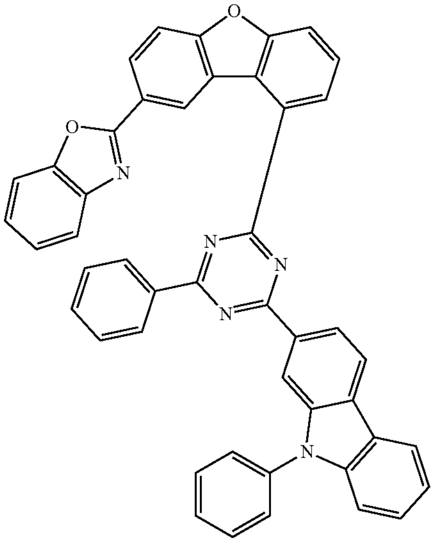
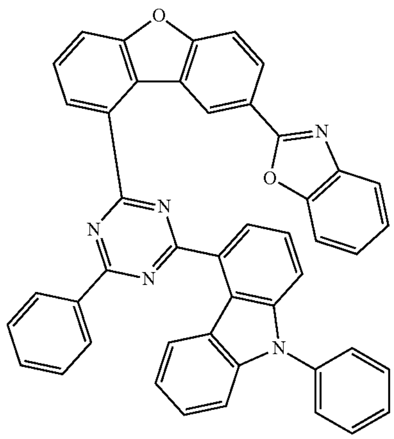
-continued
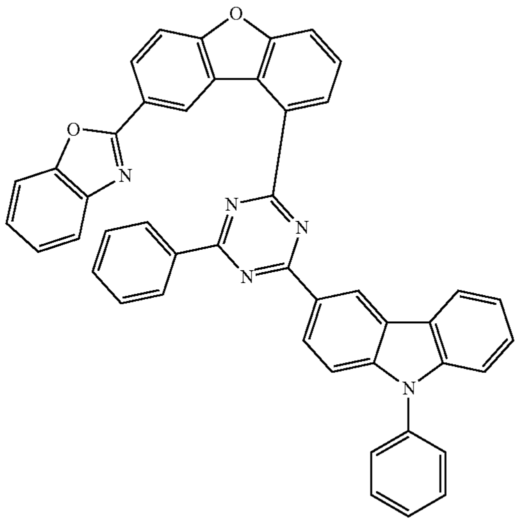
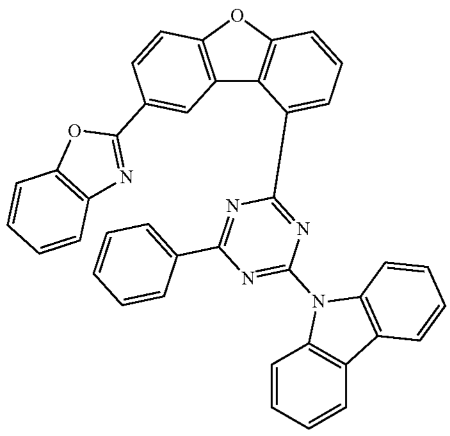
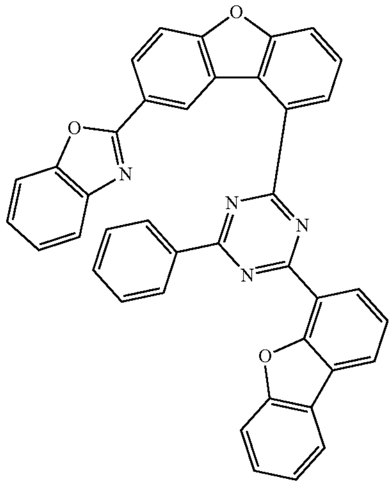

-continued
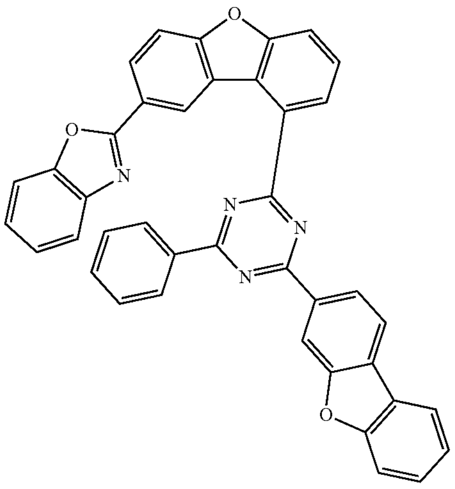
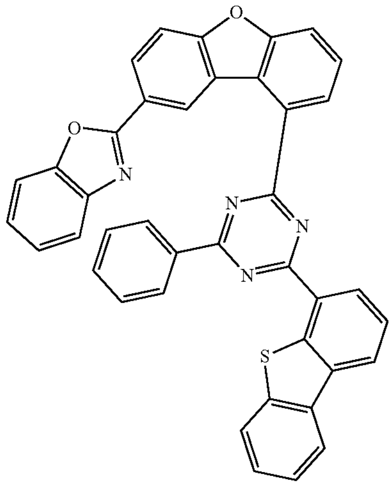
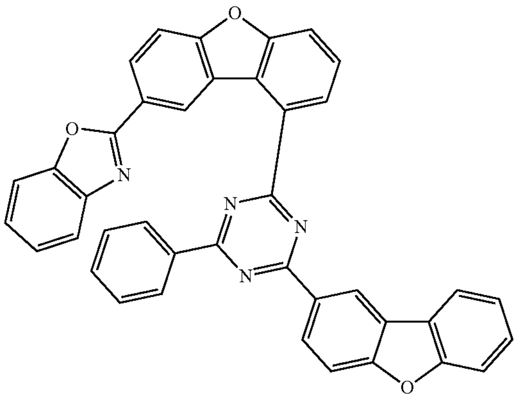
-continued
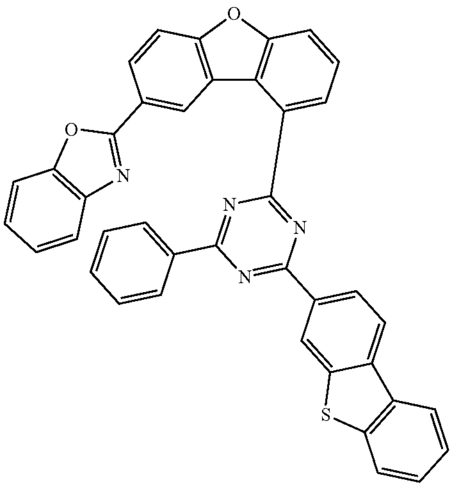
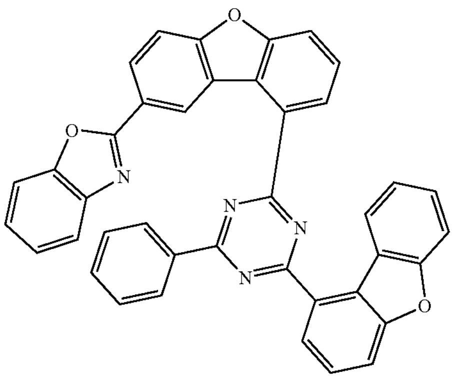
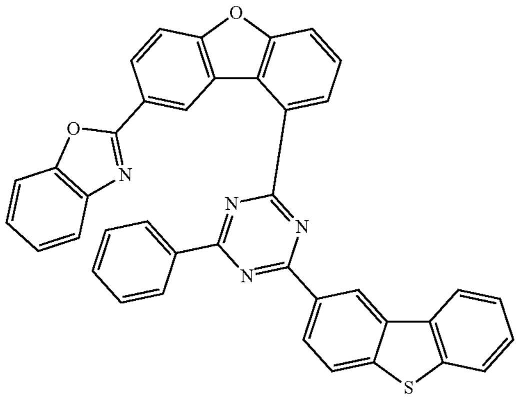

-continued
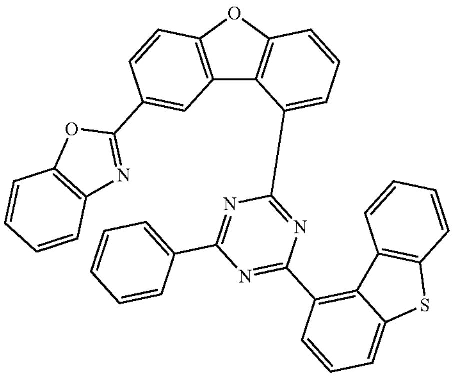
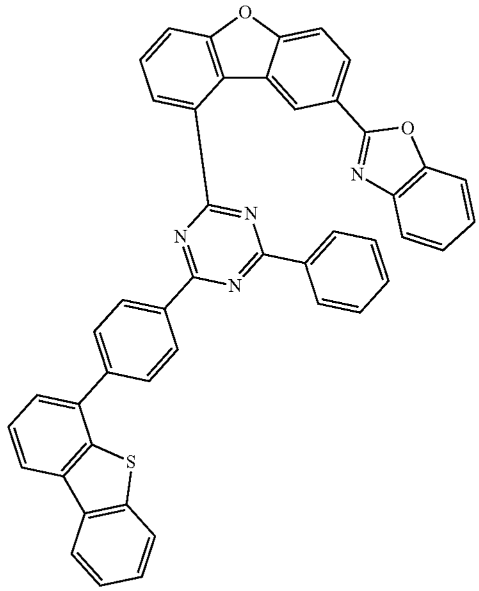
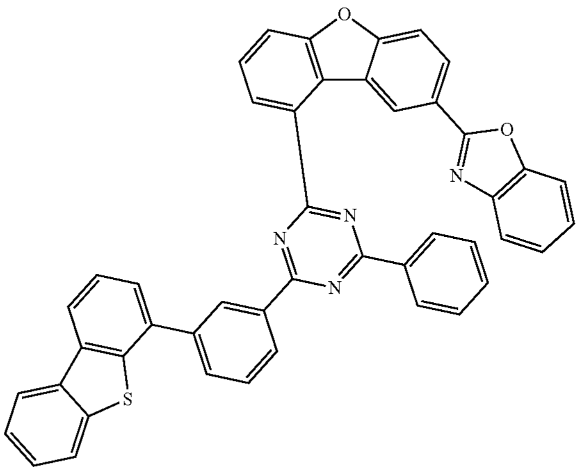
-continued
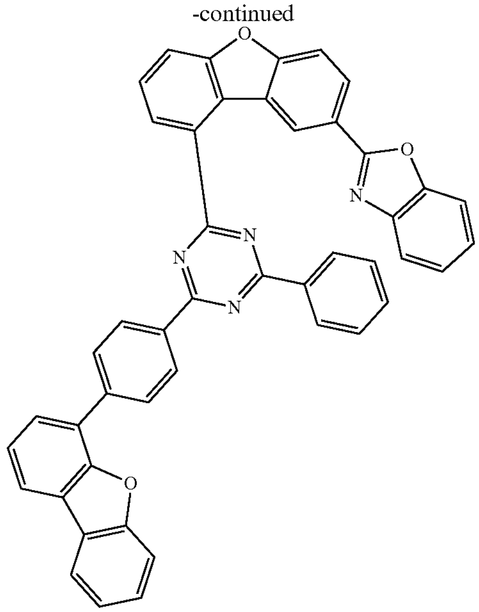
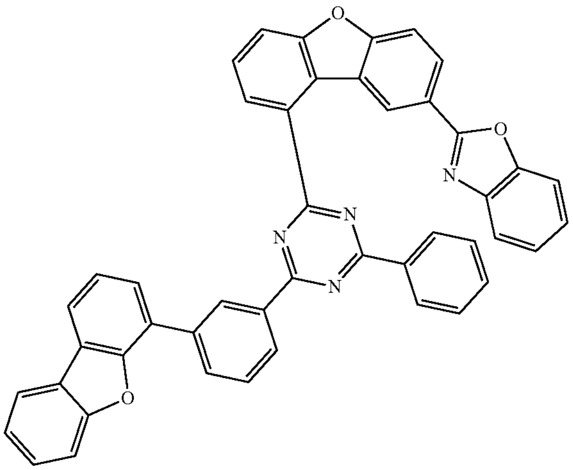
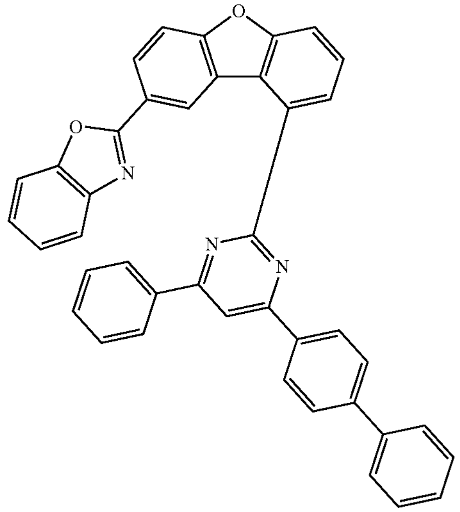

-continued
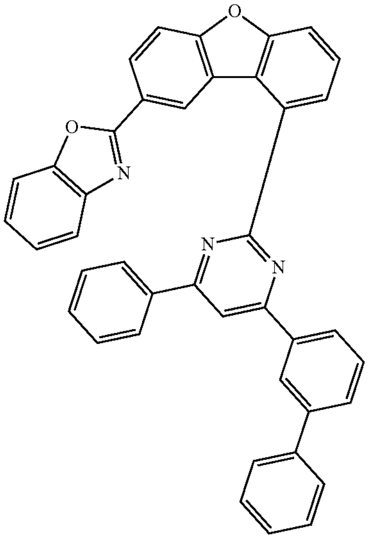
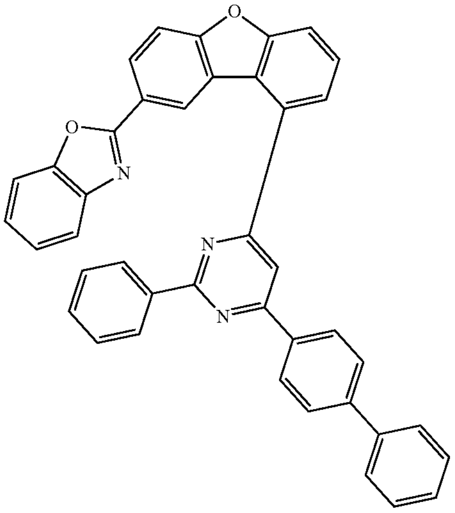
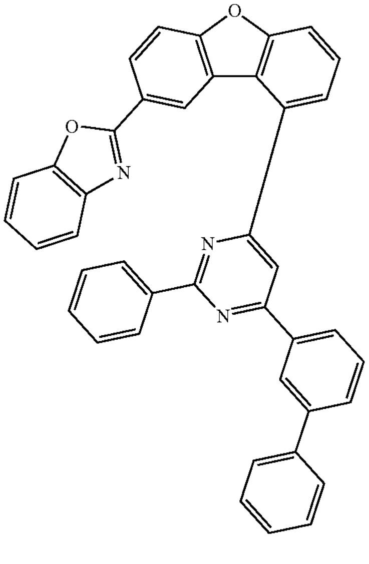
-continued
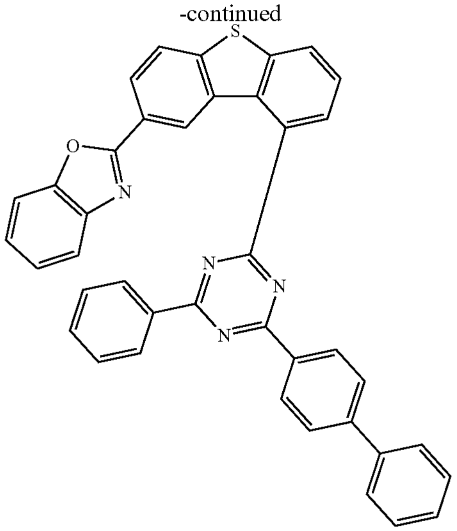
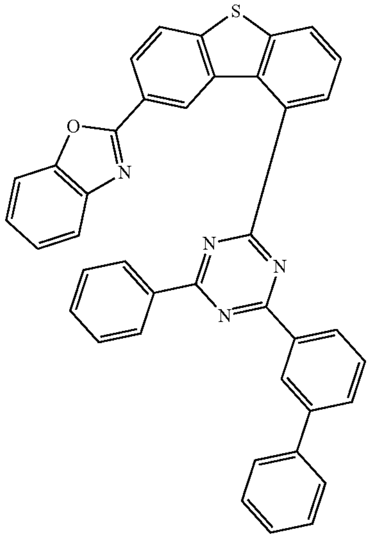
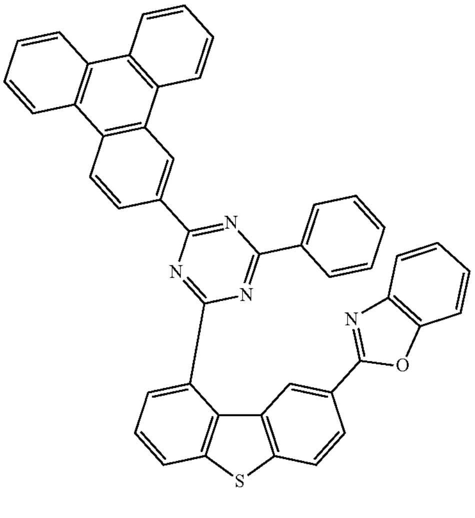

-continued
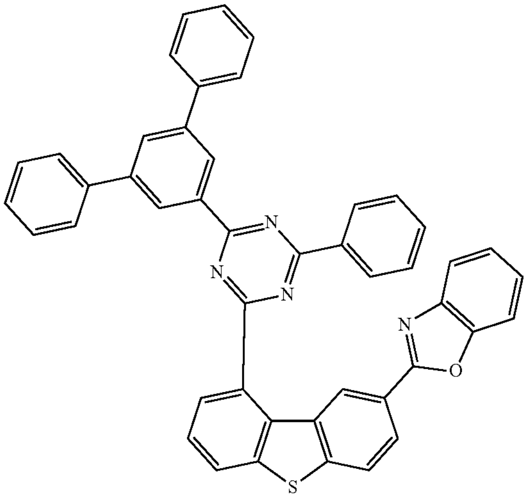
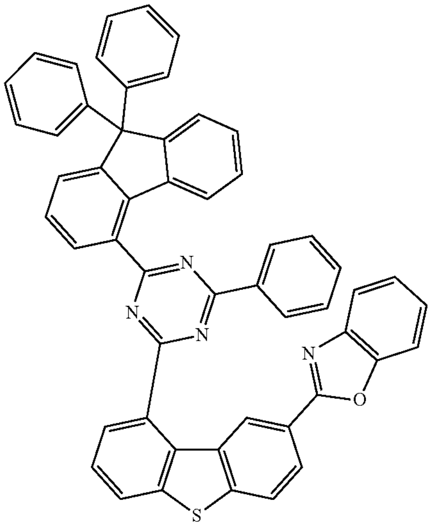
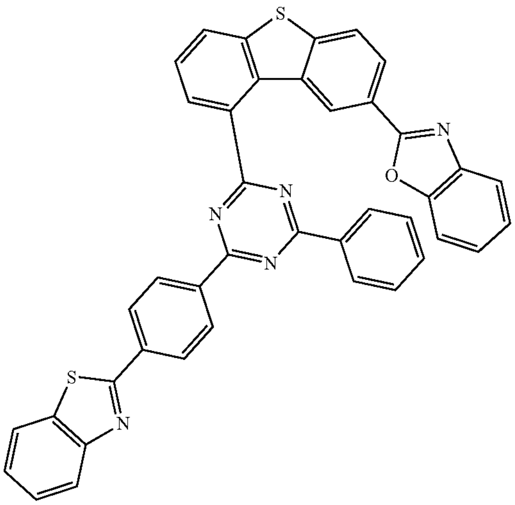
-continued
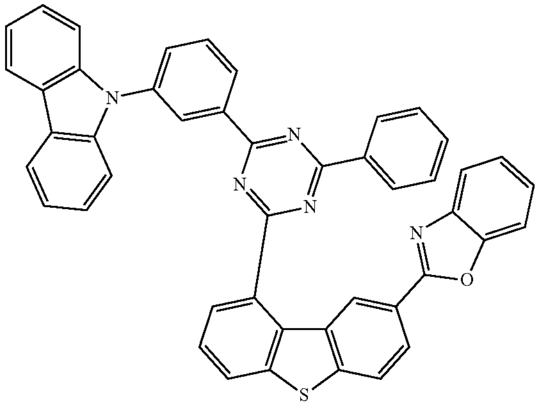
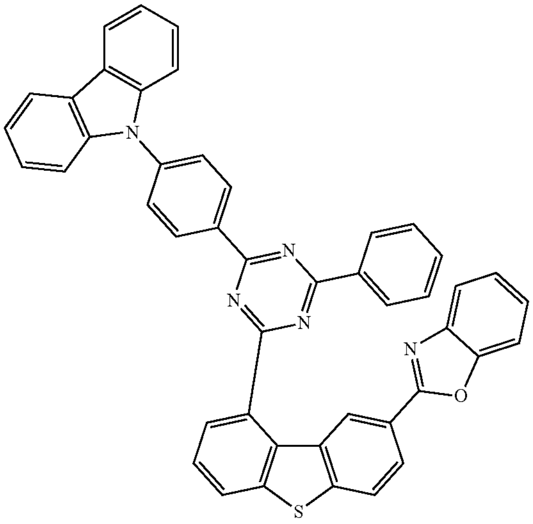
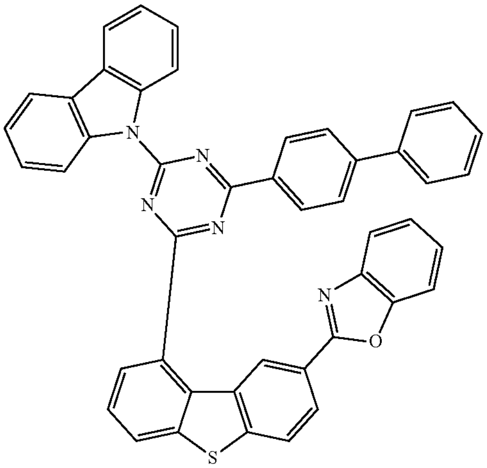 [SMILES: c1ccc(-c2ccc(-c3nc(-c4cccc5sc6ccc(-c7nc8ccccc8o7)cc6c45)nc(-n4c5ccccc5c5ccccc54)n3)cc2)cc1]

-continued
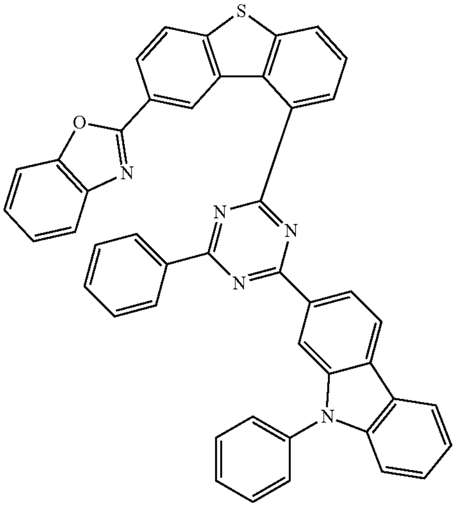 [SMILES: c1ccc(-c2nc(-c3ccc4c5ccccc5n(-c5ccccc5)c4c3)nc(-c3cccc4sc5ccc(-c6nc7ccccc7o6)cc5c34)n2)cc1]
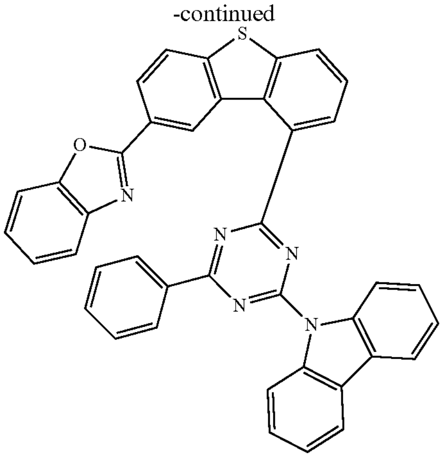
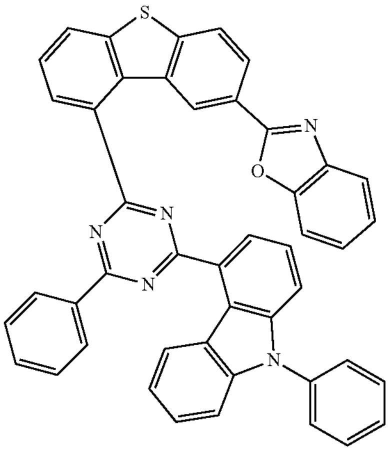
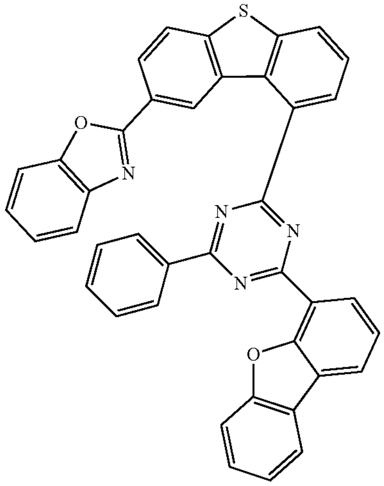
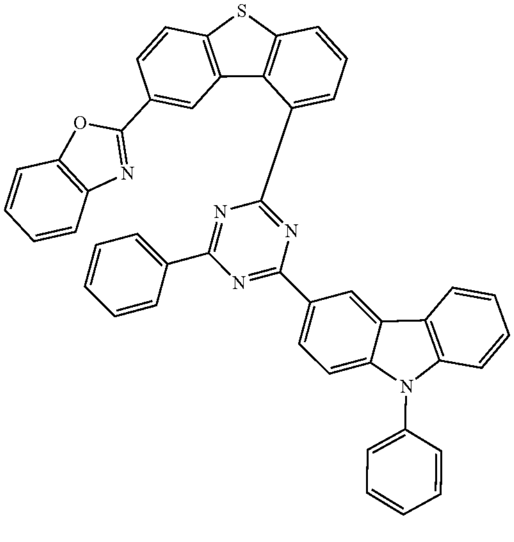
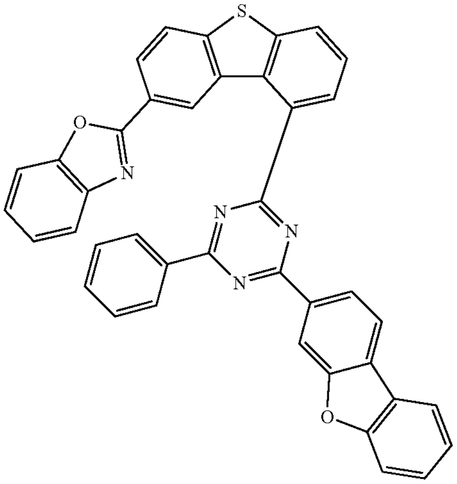

-continued
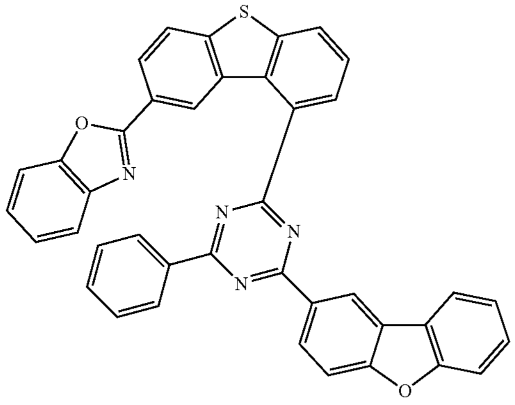
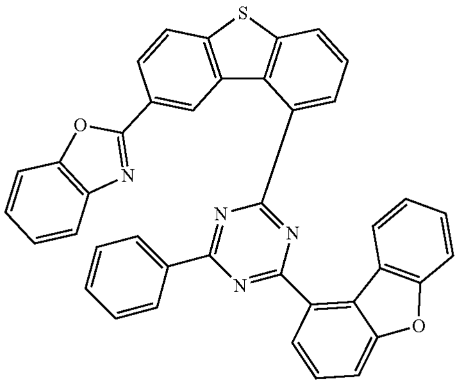
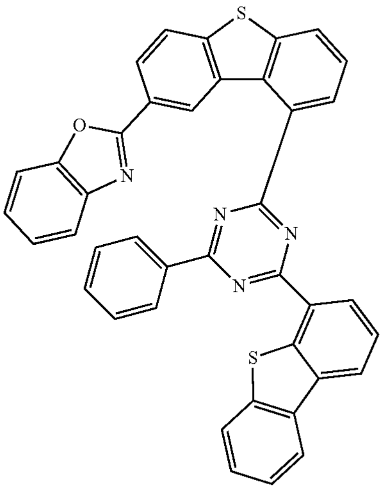
-continued
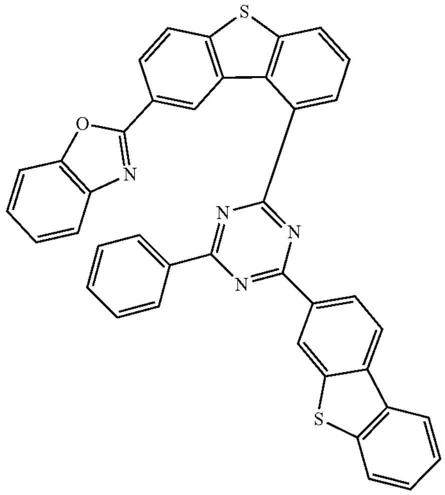
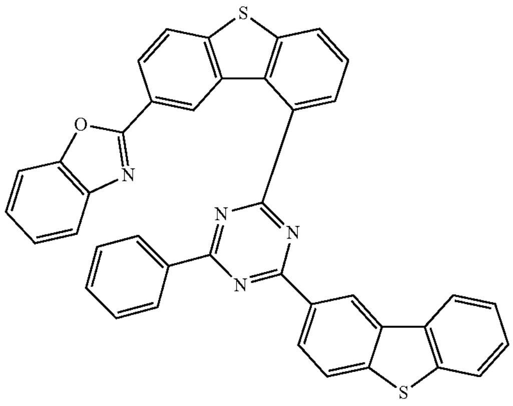
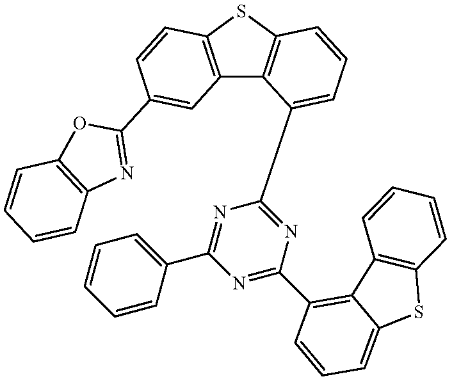

-continued
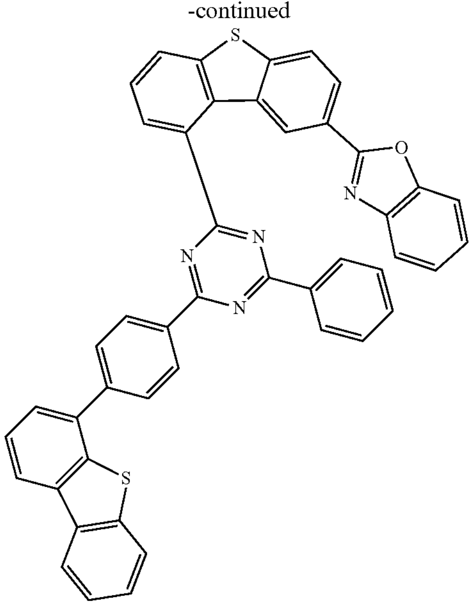
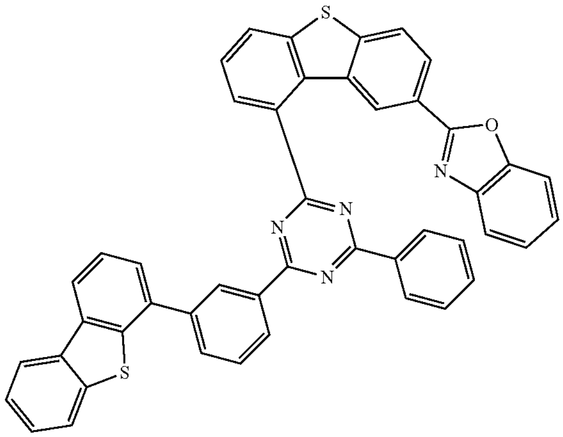
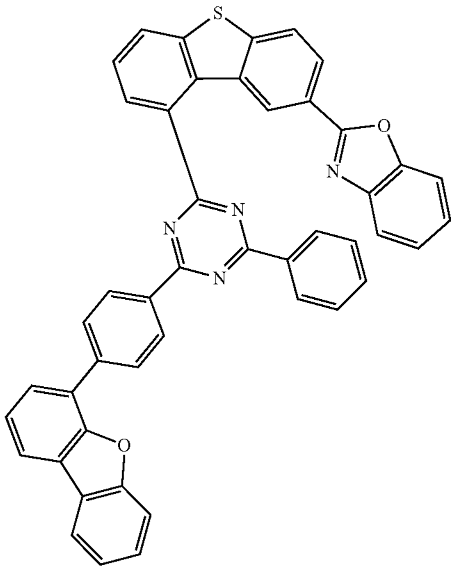
-continued
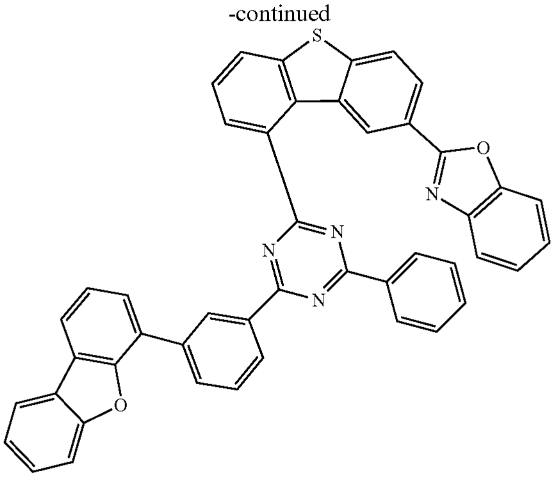
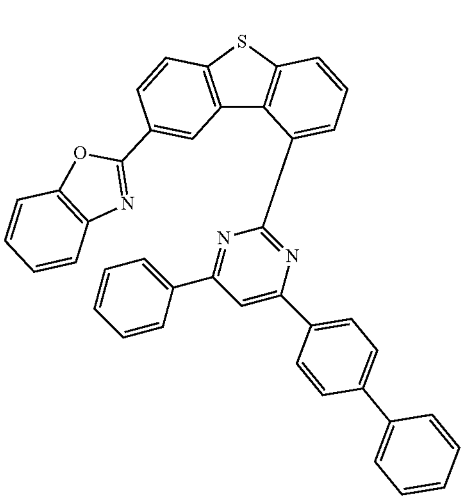

-continued
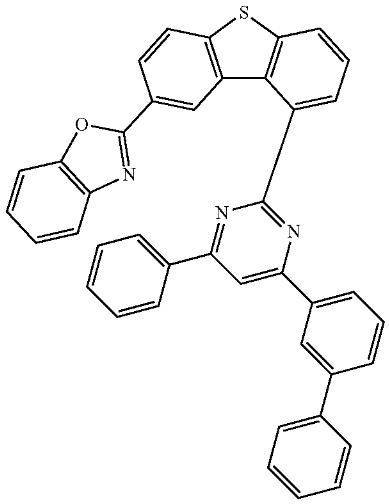
9
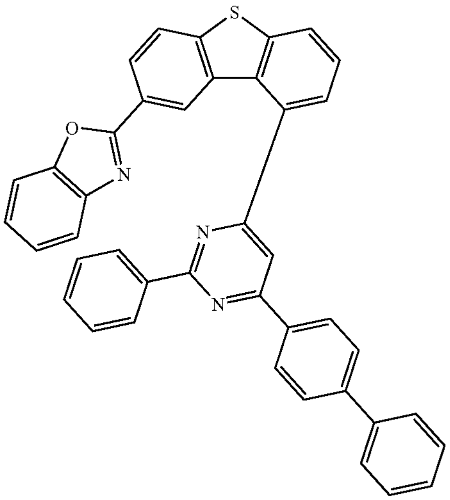
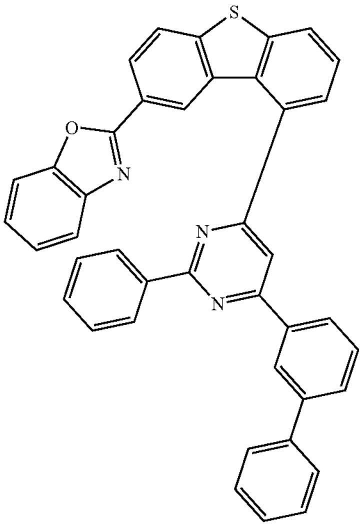
-continued
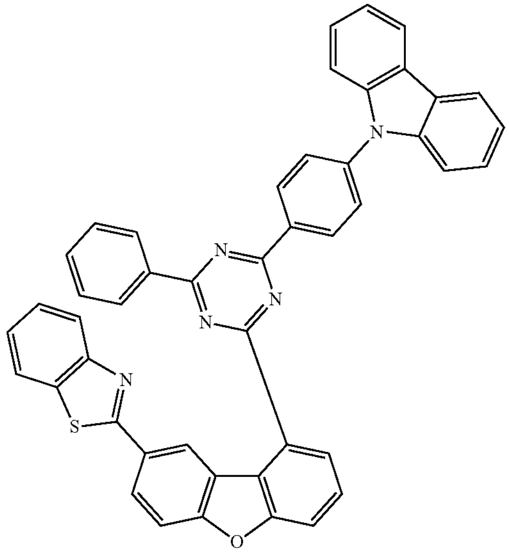
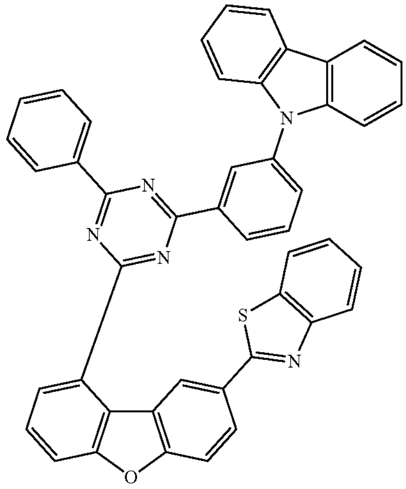
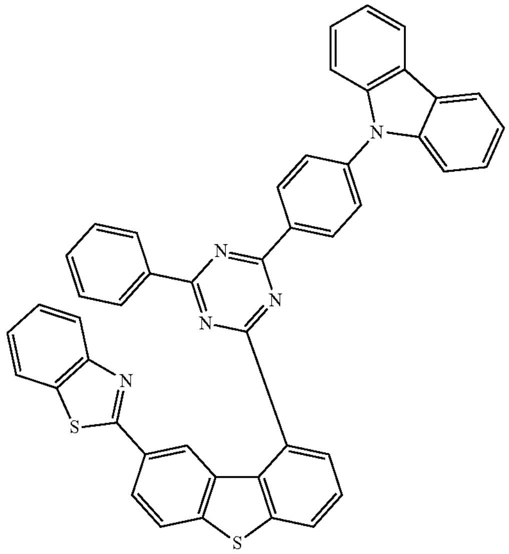

-continued
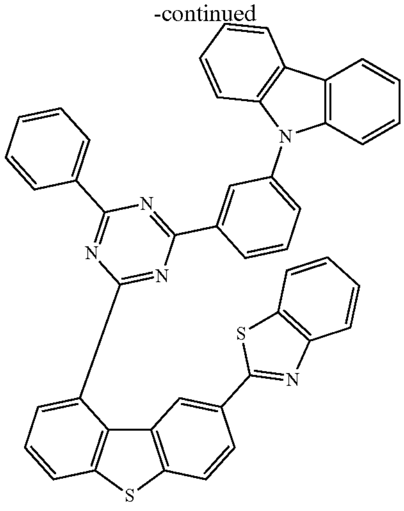
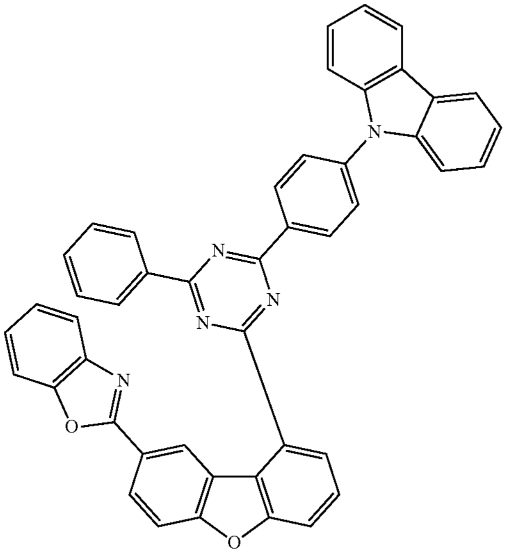
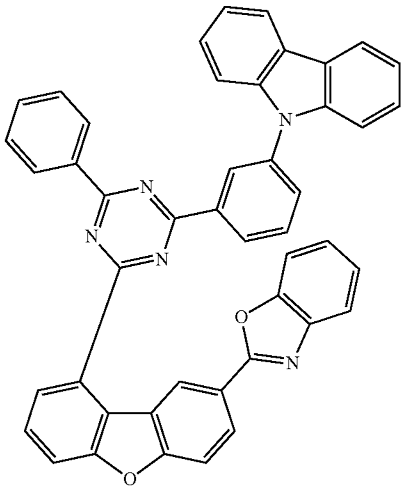
-continued
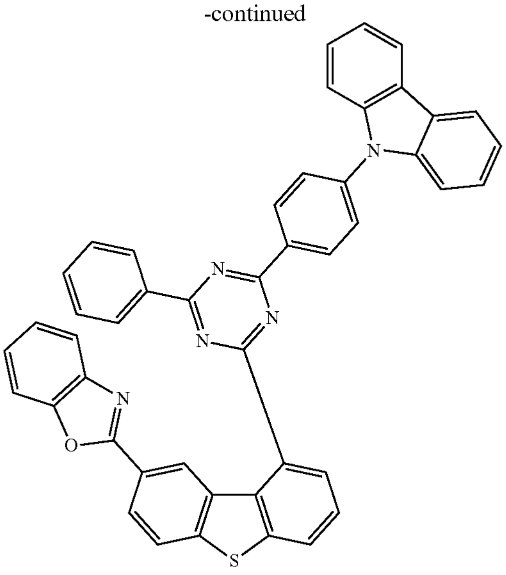
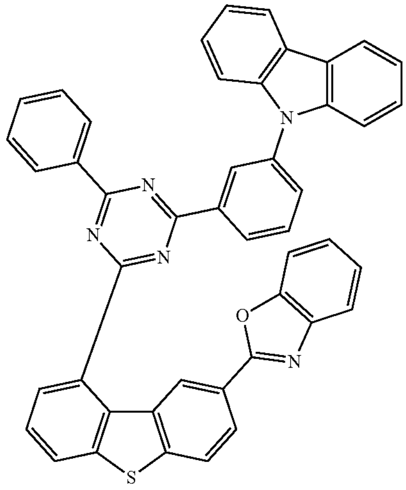
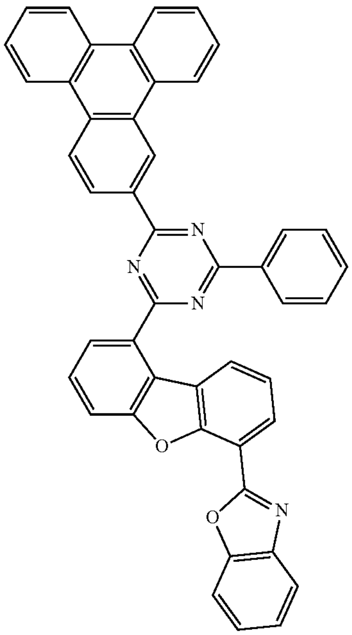

-continued
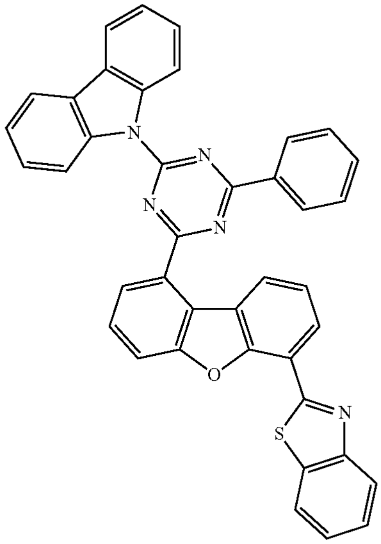
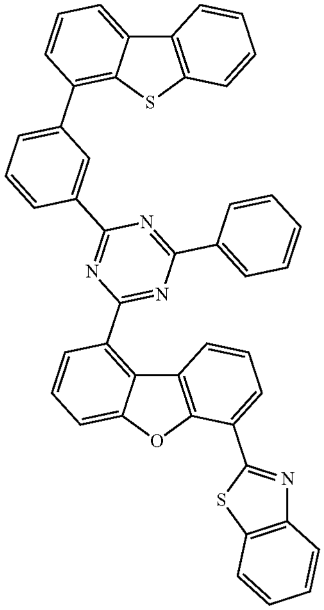
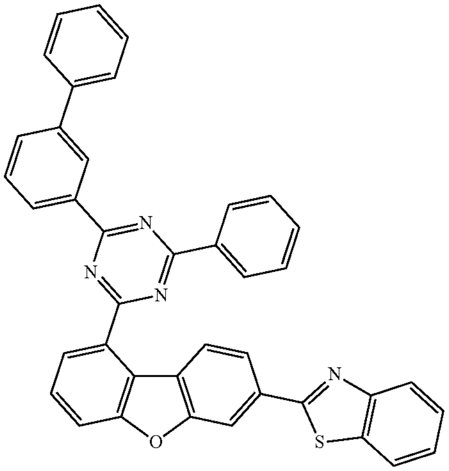
-continued
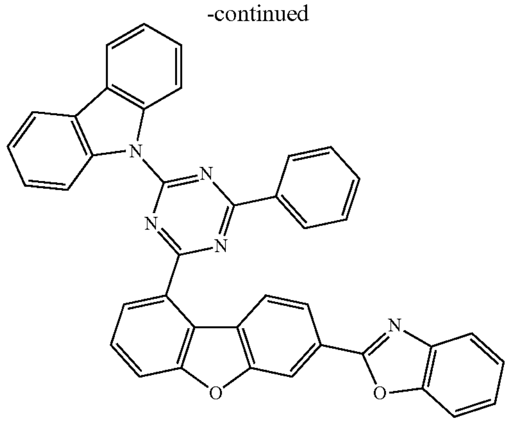
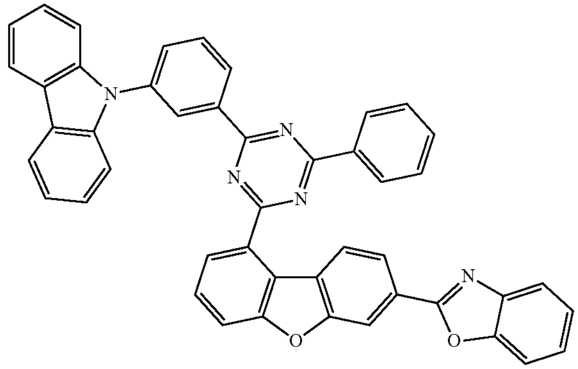
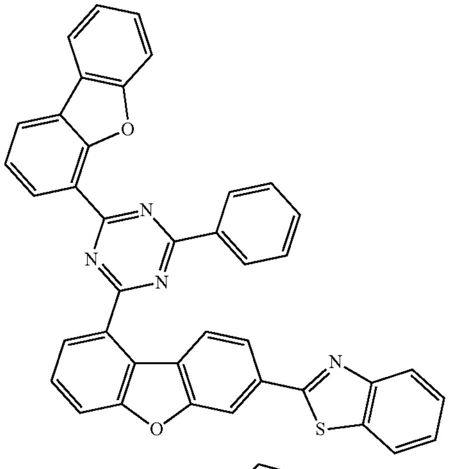
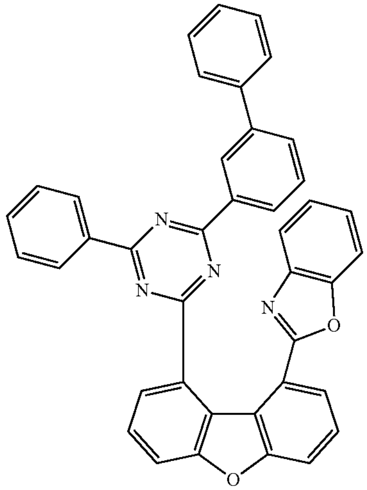

-continued
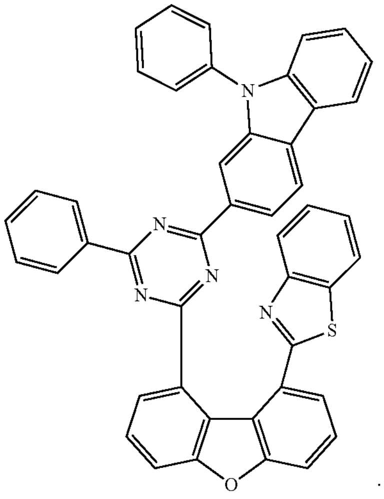
.
5. The organic light emitting device according to claim 1, wherein the dopant material is co-deposited in an amount of 6%-12% based on the total weight of the light emitting layer.
* * * * *